(12) United States Patent
Rogers et al.

(10) Patent No.: US 9,765,934 B2
(45) Date of Patent: Sep. 19, 2017

(54) THERMALLY MANAGED LED ARRAYS ASSEMBLED BY PRINTING

(75) Inventors: John A. Rogers, Champaign, IL (US); Hoon-Sik Kim, Champaign, IL (US); Yonggang Huang, Glencoe, IL (US)

(73) Assignees: THE BOARD OF TRUSTEES OF THE UNIVERSITY OF ILLINOIS, Urbana, IL (US); NORTHWESTERN UNIVERSITY, Evanston, IL (US)

( * ) Notice: Subject to any disclaimer, the term of this patent is extended or adjusted under 35 U.S.C. 154(b) by 650 days.

(21) Appl. No.: 13/472,165

(22) Filed: May 15, 2012

(65) Prior Publication Data

US 2012/0320581 A1 Dec. 20, 2012

Related U.S. Application Data

(60) Provisional application No. 61/486,487, filed on May 16, 2011, provisional application No. 61/608,839, filed on Mar. 9, 2012.

(51) Int. Cl.
*H01L 33/08* (2010.01)
*F21K 9/00* (2016.01)
(Continued)

(52) U.S. Cl.
CPC ............... *F21K 9/00* (2013.01); *F21V 29/70* (2015.01); *H01L 24/24* (2013.01); *H01L 24/82* (2013.01);
(Continued)

(58) Field of Classification Search
CPC ....... H01L 24/24; H01L 24/82; H01L 21/568; H01L 2924/12041; H01L 2924/13091;
(Continued)

(56) References Cited

U.S. PATENT DOCUMENTS

| 3,554,125 A | 1/1971 | Van Dorn et al. |
| 3,689,935 A | 9/1972 | Pressman et al. |

(Continued)

FOREIGN PATENT DOCUMENTS

| CN | 1222758 | 7/1999 |
| CN | 1454045 | 11/2003 |

(Continued)

OTHER PUBLICATIONS

Abbaschian et al. (Dec. 2005) "High Pressure-High Temperature Growth of Diamond Crystals Using Split Sphere Apparatus," *Diamond Relat. Mater.* 14(11-12):1916-1919.
(Continued)

*Primary Examiner* — Hrayr A Sayadian
(74) *Attorney, Agent, or Firm* — Lathrop Gage LLP

(57) ABSTRACT

Provided herein are electronic devices including arrays of printable light emitting diodes (LEDs) having device geometries and dimensions providing enhanced thermal management and control relative to conventional LED-based lighting systems. The systems and methods described provide large area, transparent, and/or flexible LED arrays useful for a range of applications in microelectronics, including display and lightning technology. Methods are also provided for assembling and using electronic devices including thermally managed arrays of printable light emitting diodes (LEDs).

40 Claims, 38 Drawing Sheets

(51) Int. Cl.
*H01L 23/00* (2006.01)
*F21V 29/70* (2015.01)
*H01L 25/075* (2006.01)
*H01L 33/64* (2010.01)
*H05K 1/02* (2006.01)
*H05K 1/16* (2006.01)
*H01L 21/56* (2006.01)
*F21Y 105/12* (2016.01)
*F21Y 105/10* (2016.01)
*F21Y 115/10* (2016.01)

(52) U.S. Cl.
CPC ....... *F21Y 2105/10* (2016.08); *F21Y 2105/12* (2016.08); *F21Y 2115/10* (2016.08); *H01L 21/568* (2013.01); *H01L 25/0753* (2013.01); *H01L 33/647* (2013.01); *H01L 2224/24137* (2013.01); *H01L 2224/73267* (2013.01); *H01L 2924/12041* (2013.01); *H01L 2924/12042* (2013.01); *H01L 2924/12043* (2013.01); *H01L 2924/13063* (2013.01); *H01L 2924/13091* (2013.01); *H01L 2924/1461* (2013.01); *H01L 2924/15788* (2013.01); *H01L 2924/181* (2013.01); *H01L 2924/351* (2013.01); *H05K 1/0201* (2013.01); *H05K 1/16* (2013.01)

(58) Field of Classification Search
CPC . H01L 2224/24137; H01L 2224/73267; H01L 25/0753; H01L 33/647; H01L 2924/00; F21V 29/22; F21K 9/00; F21K 2105/0003; H05K 1/00; H05K 1/0201; H05K 1/16; F21Y 2105/003; F21Y 2101/02
USPC .............. 362/235, 249.02; 257/88, E33.059; 438/28
See application file for complete search history.

(56) References Cited

U.S. PATENT DOCUMENTS

| | | |
|---|---|---|
| 3,949,410 A | 4/1976 | Bassous |
| 4,058,418 A | 11/1977 | Lindmayer |
| 4,280,233 A | 7/1981 | Raab |
| 4,392,451 A | 7/1983 | Mickelsen et al. |
| 4,471,003 A | 9/1984 | Cann |
| 4,487,162 A | 12/1984 | Cann |
| 4,663,828 A | 5/1987 | Hanak |
| 4,688,050 A | 8/1987 | Tsao |
| 4,761,335 A | 8/1988 | Aurichio et al. |
| 4,766,670 A | 8/1988 | Gazdik et al. |
| 4,784,720 A | 11/1988 | Douglas |
| 4,855,017 A | 8/1989 | Douglas |
| 5,041,973 A | 8/1991 | Lebron et al. |
| 5,057,877 A * | 10/1991 | Briley ............... H01L 23/49888 257/468 |
| 5,086,785 A | 2/1992 | Gentile et al. |
| 5,118,400 A | 6/1992 | Wollam |
| 5,178,957 A | 1/1993 | Kolpe et al. |
| 5,204,144 A | 4/1993 | Cann et al. |
| 5,313,094 A | 5/1994 | Beyer et al. |
| 5,339,180 A | 8/1994 | Katoh |
| 5,341,083 A | 8/1994 | Klontz et al. |
| 5,403,700 A | 4/1995 | Heller et al. |
| 5,427,096 A | 6/1995 | Bogusiewicz et al. |
| 5,434,751 A | 7/1995 | Cole, Jr. et al. |
| 5,455,178 A | 10/1995 | Fattinger |
| 5,469,845 A | 11/1995 | Delonzor et al. |
| 5,501,893 A | 3/1996 | Laermer et al. |
| 5,525,815 A | 6/1996 | Einset |
| 5,545,291 A | 8/1996 | Smith et al. |
| 5,625,471 A | 4/1997 | Smith |
| 5,648,148 A | 7/1997 | Simpson |
| 5,687,737 A | 11/1997 | Branham et al. |
| 5,691,245 A | 11/1997 | Bakhit |
| 5,753,529 A | 5/1998 | Chang et al. |
| 5,757,081 A | 5/1998 | Chang et al. |
| 5,767,578 A | 6/1998 | Chang et al. |
| 5,772,905 A | 6/1998 | Chou |
| 5,783,856 A | 7/1998 | Smith et al. |
| 5,790,151 A | 8/1998 | Mills |
| 5,817,242 A | 10/1998 | Biebuyck et al. |
| 5,824,186 A | 10/1998 | Smith et al. |
| 5,904,545 A | 5/1999 | Smith et al. |
| 5,907,189 A | 5/1999 | Mertol |
| 5,915,180 A | 6/1999 | Hara et al. |
| 5,917,534 A | 6/1999 | Rajeswaran |
| 5,928,001 A | 7/1999 | Gillette et al. |
| 5,937,758 A | 8/1999 | Maracas et al. |
| 5,955,781 A | 9/1999 | Joshi et al. |
| 5,976,683 A | 11/1999 | Liehrr et al. |
| 5,984,443 A | 11/1999 | Desie et al. |
| 5,998,291 A | 12/1999 | Bakhit et al. |
| 6,024,702 A | 2/2000 | Iverson |
| 6,057,212 A | 5/2000 | Chan et al. |
| 6,080,608 A | 6/2000 | Nowak |
| 6,097,984 A | 8/2000 | Douglas |
| 6,121,110 A | 9/2000 | Hong et al. |
| 6,127,799 A | 10/2000 | Krishnan |
| 6,150,602 A | 11/2000 | Campbell |
| 6,165,391 A | 12/2000 | Vedamuttu |
| 6,171,730 B1 | 1/2001 | Kuroda et al. |
| 6,193,194 B1 | 2/2001 | Minovitch |
| 6,225,149 B1 | 5/2001 | Gan et al. |
| 6,236,883 B1 | 5/2001 | Ciaccio et al. |
| 6,265,326 B1 | 7/2001 | Ueno |
| 6,274,508 B1 | 8/2001 | Jacobsen et al. |
| 6,276,775 B1 | 8/2001 | Schulte |
| 6,277,712 B1 | 8/2001 | Kang et al. |
| 6,281,038 B1 | 8/2001 | Jacobsen et al. |
| 6,284,418 B1 | 9/2001 | Trantolo |
| 6,291,896 B1 | 9/2001 | Smith |
| 6,300,558 B1 | 10/2001 | Takamoto et al. |
| 6,313,237 B1 | 11/2001 | Pojman et al. |
| 6,316,278 B1 | 11/2001 | Jacobsen et al. |
| 6,316,283 B1 | 11/2001 | Saurer |
| 6,317,175 B1 | 11/2001 | Salerno et al. |
| 6,322,895 B1 | 11/2001 | Canham |
| 6,334,960 B1 | 1/2002 | Wilson et al. |
| 6,380,729 B1 | 4/2002 | Smith |
| 6,403,397 B1 | 6/2002 | Katz |
| 6,413,790 B1 | 7/2002 | Duthaler et al. |
| 6,417,025 B1 | 7/2002 | Gengel |
| 6,420,266 B1 | 7/2002 | Smith et al. |
| 6,433,401 B1 | 8/2002 | Clark et al. |
| 6,451,191 B1 | 9/2002 | Bentsen et al. |
| 6,459,418 B1 | 10/2002 | Comiskey et al. |
| 6,468,638 B2 | 10/2002 | Jacobsen et al. |
| 6,479,395 B1 | 11/2002 | Smith et al. |
| 6,517,995 B1 | 2/2003 | Jacobson et al. |
| 6,527,964 B1 | 3/2003 | Smith et al. |
| 6,555,408 B1 | 4/2003 | Jacobsen et al. |
| 6,559,905 B1 | 5/2003 | Akiyama |
| 6,566,744 B2 | 5/2003 | Gengel |
| 6,580,151 B2 | 6/2003 | Vandeputte et al. |
| 6,586,338 B2 | 7/2003 | Smith et al. |
| 6,590,346 B1 | 7/2003 | Hadley et al. |
| 6,606,079 B1 | 8/2003 | Smith |
| 6,606,247 B2 | 8/2003 | Credelle et al. |
| 6,608,370 B1 | 8/2003 | Chen et al. |
| 6,623,579 B1 | 9/2003 | Smith et al. |
| 6,639,578 B1 | 10/2003 | Comiskey et al. |
| 6,655,286 B2 | 12/2003 | Rogers |
| 6,657,289 B1 | 12/2003 | Craig et al. |
| 6,661,037 B2 | 12/2003 | Pan et al. |
| 6,665,044 B1 | 12/2003 | Jacobsen et al. |
| 6,666,821 B2 | 12/2003 | Keimel |
| 6,667,548 B2 | 12/2003 | O'Connor et al. |
| 6,683,663 B1 | 1/2004 | Hadley et al. |
| 6,693,384 B1 | 2/2004 | Vicentini et al. |
| 6,706,402 B2 | 3/2004 | Ruekes et al. |
| 6,720,469 B1 | 4/2004 | Curtis et al. |

(56) References Cited

U.S. PATENT DOCUMENTS

| | | |
|---|---|---|
| 6,721,104 B2 | 4/2004 | Schachar et al. |
| 6,723,576 B2 | 4/2004 | Nozawa et al. |
| 6,730,990 B2 | 5/2004 | Kondo et al. |
| 6,731,353 B1 | 5/2004 | Credelle et al. |
| 6,743,982 B2 | 6/2004 | Biegelsen et al. |
| 6,780,696 B1 | 8/2004 | Schatz |
| 6,784,450 B2 | 8/2004 | Pan et al. |
| 6,787,052 B1 | 9/2004 | Vaganov |
| 6,814,898 B1 | 11/2004 | Deeman et al. |
| 6,816,380 B2 | 11/2004 | Credelle et al. |
| 6,844,673 B1 | 1/2005 | Bernkopf |
| 6,848,162 B2 | 2/2005 | Arneson et al. |
| 6,850,312 B2 | 2/2005 | Jacobsen et al. |
| 6,856,291 B2 | 2/2005 | Mickle et al. |
| 6,856,830 B2 | 2/2005 | He |
| 6,858,518 B2 | 2/2005 | Kondo |
| 6,863,219 B1 | 3/2005 | Jacobsen et al. |
| 6,864,414 B2 | 3/2005 | Sharps et al. |
| 6,864,435 B2 | 3/2005 | Hermanns et al. |
| 6,864,570 B2 | 3/2005 | Smith |
| 6,872,645 B2 | 3/2005 | Duan et al. |
| 6,878,871 B2 | 4/2005 | Scher et al. |
| 6,881,979 B2 | 4/2005 | Starikov et al. |
| 6,885,030 B2 | 4/2005 | Onozuka et al. |
| 6,887,450 B2 | 5/2005 | Chen et al. |
| 6,887,792 B2 | 5/2005 | Perlov et al. |
| 6,900,094 B2 | 5/2005 | Hammond et al. |
| 6,917,061 B2 | 7/2005 | Pan et al. |
| 6,936,181 B2 | 8/2005 | Bulthaup et al. |
| 6,949,199 B1 | 9/2005 | Gauzner et al. |
| 6,949,206 B2 | 9/2005 | Whiteford |
| 6,950,220 B2 | 9/2005 | Abramson et al. |
| 6,974,110 B2 | 12/2005 | Grandics |
| 6,984,934 B2 | 1/2006 | Moller et al. |
| 6,989,285 B2 | 1/2006 | Ball |
| 7,029,951 B2 | 4/2006 | Chen et al. |
| 7,033,961 B1 | 4/2006 | Smart et al. |
| 7,057,514 B2 | 6/2006 | Mickle et al. |
| 7,067,903 B2 | 6/2006 | Tachibana et al. |
| 7,116,318 B2 | 10/2006 | Amundson et al. |
| 7,118,861 B1 | 10/2006 | Naaman et al. |
| 7,132,313 B2 | 11/2006 | O'Connor et al. |
| 7,148,512 B2 | 12/2006 | Leu et al. |
| 7,158,277 B2 | 1/2007 | Berggren et al. |
| 7,169,546 B2 | 1/2007 | Suzuki et al. |
| 7,169,669 B2 | 1/2007 | Blakers et al. |
| 7,170,164 B2 | 1/2007 | Chen et al. |
| 7,186,624 B2 | 3/2007 | Welser et al. |
| 7,190,051 B2 | 3/2007 | Mech et al. |
| 7,195,733 B2 | 3/2007 | Rogers et al. |
| 7,223,609 B2 | 5/2007 | Anvar et al. |
| 7,223,632 B2 | 5/2007 | Onozuka et al. |
| 7,231,276 B2 | 6/2007 | Silverbrook |
| 7,253,442 B2 | 8/2007 | Huang et al. |
| 7,255,919 B2 | 8/2007 | Sakata et al. |
| 7,291,540 B2 | 11/2007 | Mech et al. |
| 7,374,968 B2 | 5/2008 | Kornlivich et al. |
| 7,399,693 B2 | 7/2008 | Sekiguchi et al. |
| 7,425,523 B2 | 9/2008 | Ikemizu et al. |
| 7,453,646 B2 | 11/2008 | Lo |
| 7,462,891 B2 | 12/2008 | Brar et al. |
| 7,521,292 B2 | 4/2009 | Rogers et al. |
| 7,522,507 B2 | 4/2009 | Hendriks |
| 7,557,367 B2 | 7/2009 | Rogers et al. |
| 7,622,367 B1 | 11/2009 | Nuzzo et al. |
| 7,629,691 B2 | 12/2009 | Roush et al. |
| 7,635,755 B2 | 12/2009 | Kaplan et al. |
| 7,674,882 B2 | 3/2010 | Kaplan et al. |
| 7,675,686 B2 | 3/2010 | Lo et al. |
| 7,687,707 B2 | 3/2010 | Meck et al. |
| 7,700,402 B2 | 4/2010 | Wild et al. |
| 7,701,643 B2 | 4/2010 | Batchko et al. |
| 7,704,684 B2 | 4/2010 | Rogers et al. |
| 7,705,280 B2 | 4/2010 | Nuzzo et al. |
| 7,709,961 B2 | 5/2010 | Greenberg et al. |
| 7,727,575 B2 | 6/2010 | Kaplan et al. |
| 7,741,734 B2 | 6/2010 | Joannopoulos et al. |
| 7,768,373 B2 | 8/2010 | Shudarek |
| 7,799,699 B2 | 9/2010 | Nuzzo et al. |
| 7,826,145 B2 | 11/2010 | Justis et al. |
| 7,842,780 B2 | 11/2010 | Kaplan et al. |
| 7,884,277 B2 | 2/2011 | Perlo et al. |
| 7,927,976 B2 | 4/2011 | Menard |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 7,986,465 B1 | 7/2011 | Lo et al. |
| 7,998,528 B2 | 8/2011 | Hubert et al. |
| 8,004,250 B2 | 8/2011 | Grandics |
| 8,018,658 B2 | 9/2011 | Lo |
| 8,039,847 B2 | 10/2011 | Nuzzo et al. |
| 8,198,621 B2 | 6/2012 | Rogers et al. |
| 8,217,381 B2 | 7/2012 | Rogers et al. |
| 8,242,025 B2 | 8/2012 | Kawashima et al. |
| 8,367,035 B2 | 2/2013 | Rogers et al. |
| 8,394,706 B2 | 3/2013 | Nuzzo et al. |
| 8,426,224 B2 | 4/2013 | Wang et al. |
| 8,440,546 B2 | 5/2013 | Rogers et al. |
| 8,470,701 B2 | 6/2013 | Rogers et al. |
| 8,552,299 B2 | 10/2013 | Rogers et al. |
| 8,562,095 B2 | 10/2013 | Alleyne et al. |
| 8,664,699 B2 | 3/2014 | Nuzzo et al. |
| 8,666,471 B2 | 3/2014 | Rogers et al. |
| 8,679,888 B2 | 3/2014 | Rogers et al. |
| 8,722,458 B2 | 5/2014 | Rogers et al. |
| 8,729,524 B2 | 5/2014 | Rogers et al. |
| 8,754,396 B2 | 6/2014 | Rogers et al. |
| 8,865,489 B2 | 10/2014 | Rogers et al. |
| 8,905,772 B2 | 12/2014 | Rogers et al. |
| 8,934,965 B2 | 1/2015 | Rogers et al. |
| 8,946,683 B2 | 2/2015 | Rogers et al. |
| 9,105,555 B2 | 8/2015 | Rogers et al. |
| 9,105,782 B2 | 8/2015 | Rogers et al. |
| 9,117,940 B2 | 8/2015 | Rogers et al. |
| 2001/0003043 A1 | 6/2001 | Metspalu et al. |
| 2002/0013061 A1 | 1/2002 | Siniaguine et al. |
| 2002/0021445 A1 | 2/2002 | Bozhevolnyi et al. |
| 2002/0094701 A1 | 7/2002 | Biegelsen et al. |
| 2002/0110766 A1 | 8/2002 | Tsai et al. |
| 2002/0115265 A1 | 8/2002 | Iwafuchi et al. |
| 2002/0130326 A1* | 9/2002 | Tamura ............... F21K 9/00 257/79 |
| 2002/0197401 A1 | 12/2002 | Auyeung et al. |
| 2003/0003759 A1 | 1/2003 | Kudelka |
| 2003/0006527 A1 | 1/2003 | Rabolt et al. |
| 2003/0024492 A1 | 2/2003 | Malmquist et al. |
| 2003/0032892 A1 | 2/2003 | Erlach et al. |
| 2003/0082485 A1 | 5/2003 | Bulthaup et al. |
| 2003/0082889 A1 | 5/2003 | Maruyama et al. |
| 2003/0087476 A1 | 5/2003 | Oohata et al. |
| 2003/0138704 A1 | 7/2003 | Mei et al. |
| 2003/0149456 A1 | 8/2003 | Rottenberg et al. |
| 2003/0151118 A1 | 8/2003 | Baude et al. |
| 2003/0170946 A1 | 9/2003 | Kondo |
| 2003/0178316 A1 | 9/2003 | Jacobs et al. |
| 2003/0222282 A1 | 12/2003 | Fjelstad et al. |
| 2003/0227116 A1 | 12/2003 | Halik et al. |
| 2004/0005723 A1 | 1/2004 | Empedocles et al. |
| 2004/0012057 A1 | 1/2004 | Bennett et al. |
| 2004/0026007 A1 | 2/2004 | Hubert et al. |
| 2004/0026684 A1 | 2/2004 | Empedocles et al. |
| 2004/0027675 A1 | 2/2004 | Wu et al. |
| 2004/0079464 A1 | 4/2004 | Kumakura |
| 2004/0081384 A1 | 4/2004 | Datesman et al. |
| 2004/0095658 A1 | 5/2004 | Buretea et al. |
| 2004/0099928 A1 | 5/2004 | Nunan et al. |
| 2004/0112964 A1 | 6/2004 | Empedocles et al. |
| 2004/0114459 A1 | 6/2004 | Lucas et al. |
| 2004/0136866 A1 | 7/2004 | Pontis et al. |
| 2004/0146560 A1 | 7/2004 | Whiteford et al. |
| 2004/0155290 A1 | 8/2004 | Mech et al. |
| 2004/0178390 A1 | 9/2004 | Whiteford |
| 2004/0192062 A1 | 9/2004 | Mikelson et al. |

(56) References Cited

U.S. PATENT DOCUMENTS

| | | |
|---|---|---|
| 2004/0192082 A1 | 9/2004 | Wagner et al. |
| 2004/0200734 A1 | 10/2004 | Co et al. |
| 2004/0206448 A1 | 10/2004 | Dubrow |
| 2004/0211458 A1 | 10/2004 | Gui et al. |
| 2004/0211459 A1 | 10/2004 | Suenaga et al. |
| 2004/0250950 A1 | 12/2004 | Dubrow |
| 2004/0252559 A1 | 12/2004 | Gupta |
| 2005/0006669 A1 | 1/2005 | Mishra et al. |
| 2005/0020094 A1 | 1/2005 | Forbes et al. |
| 2005/0038498 A1 | 2/2005 | Dubrow et al. |
| 2005/0082526 A1 | 4/2005 | Bedell et al. |
| 2005/0124712 A1 | 6/2005 | Anderson et al. |
| 2005/0133954 A1 | 6/2005 | Homola |
| 2005/0167747 A1 | 8/2005 | Apel et al. |
| 2005/0214962 A1 | 9/2005 | Daniels et al. |
| 2005/0227389 A1 | 10/2005 | Bhattacharya et al. |
| 2005/0233546 A1 | 10/2005 | Oohata et al. |
| 2005/0238967 A1 | 10/2005 | Rogers et al. |
| 2005/0243003 A1 | 11/2005 | Morioka |
| 2005/0255686 A1 | 11/2005 | Yamano et al. |
| 2005/0260706 A1 | 11/2005 | Kaplan et al. |
| 2005/0261561 A1 | 11/2005 | Jones et al. |
| 2006/0038182 A1 | 2/2006 | Rogers et al. |
| 2006/0049485 A1 | 3/2006 | Pan et al. |
| 2006/0063351 A1 | 3/2006 | Jain |
| 2006/0076561 A1 | 4/2006 | Hioki et al. |
| 2006/0084012 A1 | 4/2006 | Nuzzo et al. |
| 2006/0085976 A1 | 4/2006 | Eldridge et al. |
| 2006/0102525 A1 | 5/2006 | Volkel et al. |
| 2006/0115917 A1 | 6/2006 | Linden |
| 2006/0119853 A1 | 6/2006 | Baumberg et al. |
| 2006/0127817 A1 | 6/2006 | Ramanujan et al. |
| 2006/0129056 A1 | 6/2006 | Leuthardt et al. |
| 2006/0132025 A1 | 6/2006 | Gao et al. |
| 2006/0134893 A1 | 6/2006 | Savage et al. |
| 2006/0159837 A1 | 7/2006 | Kaplan et al. |
| 2006/0169989 A1 | 8/2006 | Bhattacharya |
| 2006/0173364 A1 | 8/2006 | Clancy et al. |
| 2006/0177479 A1 | 8/2006 | Giachelli et al. |
| 2006/0178655 A1 | 8/2006 | Santini et al. |
| 2006/0180198 A1 | 8/2006 | Takamoto et al. |
| 2006/0244105 A1 | 11/2006 | Forbes et al. |
| 2006/0255341 A1 | 11/2006 | Pinnington et al. |
| 2006/0273279 A1 | 12/2006 | Kaplan et al. |
| 2006/0279191 A1 | 12/2006 | Gehegan et al. |
| 2006/0286488 A1 | 12/2006 | Rogers et al. |
| 2006/0286785 A1 | 12/2006 | Rogers et al. |
| 2007/0009968 A1 | 1/2007 | Cunningham et al. |
| 2007/0031607 A1 | 2/2007 | Dubson et al. |
| 2007/0032089 A1 | 2/2007 | Nuzzo et al. |
| 2007/0035793 A1 | 2/2007 | Hendriks |
| 2007/0043416 A1 | 2/2007 | Callas et al. |
| 2007/0058254 A1 | 3/2007 | Kim |
| 2007/0073130 A1 | 3/2007 | Finch et al. |
| 2007/0077511 A1 | 4/2007 | Tredwell et al. |
| 2007/0164648 A1 | 7/2007 | Jiang et al. |
| 2007/0187862 A1 | 8/2007 | Kaplan et al. |
| 2007/0212730 A1 | 9/2007 | Vepari et al. |
| 2007/0215890 A1 | 9/2007 | Harbers et al. |
| 2007/0227586 A1 | 10/2007 | Zapalac |
| 2007/0233208 A1 | 10/2007 | Kurtz et al. |
| 2008/0000871 A1 | 1/2008 | Suh et al. |
| 2008/0038236 A1 | 2/2008 | Gimble et al. |
| 2008/0041617 A1 | 2/2008 | Chen et al. |
| 2008/0055581 A1 | 3/2008 | Rogers et al. |
| 2008/0085272 A1 | 4/2008 | Kaplan et al. |
| 2008/0090322 A1 | 4/2008 | Mech et al. |
| 2008/0102096 A1 | 5/2008 | Molin et al. |
| 2008/0108171 A1 | 5/2008 | Rogers et al. |
| 2008/0152281 A1 | 6/2008 | Lundquist et al. |
| 2008/0157235 A1 | 7/2008 | Rogers et al. |
| 2008/0183076 A1 | 7/2008 | Witte et al. |
| 2008/0203431 A1 | 8/2008 | Garcia et al. |
| 2008/0212102 A1 | 9/2008 | Nuzzo et al. |
| 2008/0237443 A1 | 10/2008 | Oliver et al. |
| 2008/0239755 A1 | 10/2008 | Parker et al. |
| 2008/0257409 A1 | 10/2008 | Li et al. |
| 2008/0280360 A1 | 11/2008 | Kaplan et al. |
| 2008/0288037 A1 | 11/2008 | Neysmith et al. |
| 2008/0293919 A1 | 11/2008 | Kaplan et al. |
| 2008/0316610 A1 | 12/2008 | Dobrusskin |
| 2009/0004737 A1 | 1/2009 | Borenstein et al. |
| 2009/0014748 A1 | 1/2009 | Hirao et al. |
| 2009/0028910 A1 | 1/2009 | Desimone et al. |
| 2009/0149930 A1 | 6/2009 | Schecnk |
| 2009/0198293 A1 | 8/2009 | Cauller et al. |
| 2009/0199960 A1 | 8/2009 | Nuzzo et al. |
| 2009/0202614 A1 | 8/2009 | Kaplan et al. |
| 2009/0208555 A1 | 8/2009 | Kuttler et al. |
| 2009/0217517 A1 | 9/2009 | Pique et al. |
| 2009/0221896 A1 | 9/2009 | Rickert et al. |
| 2009/0232963 A1 | 9/2009 | Kaplan et al. |
| 2009/0234026 A1 | 9/2009 | Kaplan et al. |
| 2009/0258167 A1 | 10/2009 | Tanaka |
| 2009/0289246 A1 | 11/2009 | Schneider et al. |
| 2009/0294803 A1 | 12/2009 | Nuzzo et al. |
| 2010/0002402 A1 | 1/2010 | Rogers et al. |
| 2010/0028451 A1 | 2/2010 | Kaplan et al. |
| 2010/0046902 A1 | 2/2010 | Kaplan et al. |
| 2010/0052112 A1 | 3/2010 | Rogers et al. |
| 2010/0055438 A1 | 3/2010 | Kaplan et al. |
| 2010/0059863 A1 | 3/2010 | Rogers et al. |
| 2010/0063404 A1 | 3/2010 | Kaplan et al. |
| 2010/0065784 A1 | 3/2010 | Kaplan et al. |
| 2010/0068740 A1 | 3/2010 | Kaplan et al. |
| 2010/0070068 A1 | 3/2010 | Kaplan et al. |
| 2010/0072577 A1 | 3/2010 | Nuzzo et al. |
| 2010/0096763 A1 | 4/2010 | Kaplan et al. |
| 2010/0120116 A1 | 5/2010 | Kaplan et al. |
| 2010/0121420 A1 | 5/2010 | Fiset et al. |
| 2010/0123268 A1 | 5/2010 | Menard |
| 2010/0147370 A1 | 6/2010 | He et al. |
| 2010/0176705 A1 | 7/2010 | Van Herpen et al. |
| 2010/0178304 A1 | 7/2010 | Wang et al. |
| 2010/0178722 A1 | 7/2010 | De Graff et al. |
| 2010/0191328 A1 | 7/2010 | Kaplan et al. |
| 2010/0196447 A1 | 8/2010 | Kaplan et al. |
| 2010/0200752 A1 | 8/2010 | Lee et al. |
| 2010/0203226 A1 | 8/2010 | Kaplan et al. |
| 2010/0252840 A1* | 10/2010 | Ibbetson et al. ............... 257/88 |
| 2010/0279112 A1 | 11/2010 | Kaplan et al. |
| 2010/0283069 A1 | 11/2010 | Rogers et al. |
| 2010/0289124 A1 | 11/2010 | Nuzzo et al. |
| 2010/0290104 A1 | 11/2010 | Imai et al. |
| 2010/0317132 A1* | 12/2010 | Rogers et al. ............... 438/27 |
| 2010/0317156 A1 | 12/2010 | Tsurume et al. |
| 2011/0068672 A1 | 3/2011 | Hasnain |
| 2011/0147715 A1 | 6/2011 | Rogers et al. |
| 2011/0170225 A1 | 7/2011 | Rogers et al. |
| 2011/0171813 A1 | 7/2011 | Rogers et al. |
| 2011/0187798 A1 | 8/2011 | Rogers et al. |
| 2011/0220890 A1 | 9/2011 | Nuzzo et al. |
| 2011/0230747 A1 | 9/2011 | Rogers et al. |
| 2011/0261178 A1 | 10/2011 | Lo et al. |
| 2011/0266561 A1 | 11/2011 | Rogers et al. |
| 2011/0277813 A1 | 11/2011 | Rogers et al. |
| 2011/0297084 A1 | 12/2011 | Hubert et al. |
| 2011/0316120 A1 | 12/2011 | Rogers et al. |
| 2012/0025182 A1 | 2/2012 | Umeda et al. |
| 2012/0083099 A1 | 4/2012 | Nuzzo et al. |
| 2012/0105528 A1 | 5/2012 | Alleyne et al. |
| 2012/0157804 A1 | 6/2012 | Rogers et al. |
| 2012/0165759 A1 | 6/2012 | Rogers et al. |
| 2012/0261551 A1 | 10/2012 | Rogers |
| 2012/0320581 A1 | 12/2012 | Rogers et al. |
| 2012/0321785 A1 | 12/2012 | Rogers et al. |
| 2012/0327608 A1 | 12/2012 | Rogers et al. |
| 2013/0036928 A1 | 2/2013 | Rogers et al. |
| 2013/0041235 A1 | 2/2013 | Rogers et al. |
| 2013/0072775 A1 | 3/2013 | Rogers et al. |
| 2013/0100618 A1 | 4/2013 | Rogers et al. |
| 2013/0140649 A1 | 6/2013 | Rogers et al. |
| 2013/0320503 A1 | 12/2013 | Nuzzo et al. |
| 2013/0333094 A1 | 12/2013 | Rogers et al. |

(56) References Cited

U.S. PATENT DOCUMENTS

| | | |
|---|---|---|
| 2014/0092158 A1 | 4/2014 | Alleyne et al. |
| 2014/0140020 A1 | 5/2014 | Rogers et al. |
| 2014/0163390 A1 | 6/2014 | Rogers et al. |
| 2014/0191236 A1 | 7/2014 | Nuzzo et al. |
| 2014/0216524 A1 | 8/2014 | Rogers et al. |
| 2014/0220422 A1 | 8/2014 | Rogers et al. |
| 2014/0305900 A1 | 10/2014 | Rogers et al. |
| 2014/0323968 A1 | 10/2014 | Rogers et al. |
| 2014/0361409 A1 | 12/2014 | Rogers et al. |
| 2014/0373898 A1 | 12/2014 | Rogers et al. |
| 2014/0374872 A1 | 12/2014 | Rogers et al. |
| 2015/0001462 A1 | 1/2015 | Rogers et al. |
| 2015/0080695 A1 | 3/2015 | Rogers et al. |
| 2015/0132873 A1 | 5/2015 | Rogers et al. |
| 2015/0141767 A1 | 5/2015 | Rogers et al. |
| 2015/0181700 A1 | 6/2015 | Rogers et al. |
| 2015/0207012 A1 | 7/2015 | Rogers et al. |
| 2015/0237711 A1 | 8/2015 | Rogers et al. |
| 2015/0290938 A1 | 10/2015 | Rogers et al. |
| 2016/0027737 A1 | 1/2016 | Rogers et al. |

FOREIGN PATENT DOCUMENTS

| | | |
|---|---|---|
| CN | 101772348 A | 7/2010 |
| DE | 4241045 C1 | 5/1994 |
| DE | 19748173 | 5/1999 |
| EP | 0 929 097 | 7/1999 |
| EP | 1 357 773 | 10/2003 |
| EP | 1 467 224 | 10/2004 |
| EP | 1 477 230 | 11/2004 |
| EP | 1 498 456 | 1/2005 |
| EP | 1 511 096 | 3/2005 |
| EP | 1 558 444 | 8/2005 |
| EP | 1 613 796 | 1/2006 |
| EP | 1 773 240 | 4/2007 |
| EP | 1 915 436 | 4/2008 |
| EP | 1 726 329 | 8/2009 |
| EP | 2 086 749 | 8/2009 |
| EP | 2 101 975 | 9/2009 |
| EP | 2 107 964 | 10/2009 |
| EP | 2 109 634 | 10/2009 |
| EP | 2 129 772 | 12/2009 |
| EP | 2 206 017 | 7/2010 |
| EP | 2 211 876 | 8/2010 |
| EP | 2 249 886 | 11/2010 |
| JP | 6-118441 | 4/1994 |
| JP | 06-140300 | 5/1994 |
| JP | 6-163365 | 6/1994 |
| JP | 09-511710 | 11/1997 |
| JP | 10-012545 | 1/1998 |
| JP | 10-161295 | 6/1998 |
| JP | 10-512683 | 12/1998 |
| JP | 11-026344 | 1/1999 |
| JP | 11-087306 | 3/1999 |
| JP | 11-142878 | 5/1999 |
| JP | 2001-007340 | 1/2001 |
| JP | 2001332383 | 11/2001 |
| JP | 2002092984 | 3/2002 |
| JP | 2002268585 | 9/2002 |
| JP | 2003-197881 | 7/2003 |
| JP | 2003289136 | 10/2003 |
| JP | 2003297974 | 10/2003 |
| JP | 2006-504450 | 2/2006 |
| JP | 2006-186294 | 7/2006 |
| JP | 2007-515391 | 6/2007 |
| JP | 2008-502739 | 1/2008 |
| JP | 2010-508852 | 3/2010 |
| JP | 2010-509593 | 3/2010 |
| JP | 2010-509644 | 3/2010 |
| JP | 2010-509645 | 3/2010 |
| JP | 2010-522583 | 7/2010 |
| JP | 2010-529230 | 8/2010 |
| JP | 2011-517865 | 6/2011 |
| JP | 5271541 | 8/2013 |
| KR | 10-2004-0030298 | 4/2001 |
| KR | 10-2001-0030924 | 4/2004 |
| KR | 10-2008-0069553 | 7/2008 |
| TW | 367570 | 8/1999 |
| TW | 494257 | 7/2002 |
| TW | 200503885 | 2/2005 |
| TW | I229780 | 3/2005 |
| TW | 200710562 | 3/2007 |
| TW | 200838553 | 10/2007 |
| TW | 200836353 | 9/2008 |
| WO | WO 96/21245 | 7/1996 |
| WO | WO 98/49936 | 11/1998 |
| WO | WO 99/18612 | 4/1999 |
| WO | WO 99/45860 | 9/1999 |
| WO | WO 00/46854 | 8/2000 |
| WO | WO 00/49421 | 8/2000 |
| WO | WO 00/49658 | 8/2000 |
| WO | WO 00/55915 | 9/2000 |
| WO | WO 00/55916 | 9/2000 |
| WO | WO 01/31082 | 5/2001 |
| WO | WO 01/33621 | 5/2001 |
| WO | WO 01/66833 | 9/2001 |
| WO | WO 01/98838 | 12/2001 |
| WO | WO 02/27701 | 4/2002 |
| WO | WO 02/43032 | 5/2002 |
| WO | WO 02/45160 | 6/2002 |
| WO | WO 02/071137 | 9/2002 |
| WO | WO 02/073699 | 9/2002 |
| WO | WO 02/092778 | 11/2002 |
| WO | WO 02/097708 | 12/2002 |
| WO | WO 02/097724 | 12/2002 |
| WO | WO 02/099068 | 12/2002 |
| WO | WO 03/030194 | 4/2003 |
| WO | WO 03/032240 | 4/2003 |
| WO | WO 03/049201 | 6/2003 |
| WO | WO 03/063211 | 7/2003 |
| WO | WO 03/085700 | 10/2003 |
| WO | WO 03/085701 | 10/2003 |
| WO | WO 03/092073 | 11/2003 |
| WO | WO 03/099463 | 12/2003 |
| WO | WO 04/000915 | 12/2003 |
| WO | WO 04/001103 | 12/2003 |
| WO | WO 2004/003535 | 1/2004 |
| WO | WO 2004/022637 | 3/2004 |
| WO | WO 2004/022714 | 3/2004 |
| WO | WO 2004/023527 | 3/2004 |
| WO | WO 2004/024407 | 3/2004 |
| WO | WO 2004/027822 | 4/2004 |
| WO | WO 2004/032190 | 4/2004 |
| WO | WO 2004/032191 | 4/2004 |
| WO | WO 2004/032193 | 4/2004 |
| WO | WO 2004/034025 | 4/2004 |
| WO | WO 2004/062697 | 7/2004 |
| WO | WO 2004/086289 | 10/2004 |
| WO | WO 2004/094303 | 11/2004 |
| WO | WO 2004/100252 | 11/2004 |
| WO | WO 2004/105456 | 12/2004 |
| WO | WO 2004/107973 | 12/2004 |
| WO | WO 2005/000483 | 1/2005 |
| WO | WO 2005/005679 | 1/2005 |
| WO | WO 2005/012606 | 2/2005 |
| WO | WO 2005/015480 | 2/2005 |
| WO | WO 2005/017962 | 2/2005 |
| WO | WO 2005/022120 | 3/2005 |
| WO | WO 2005/029578 | 3/2005 |
| WO | WO 2005/033786 | 4/2005 |
| WO | WO 2005/033787 | 4/2005 |
| WO | WO 2005/054119 | 6/2005 |
| WO | WO 2005/091370 | 9/2005 |
| WO | WO 2005/099310 | 10/2005 |
| WO | WO 2005/104756 | 11/2005 |
| WO | WO 2005/106934 | 11/2005 |
| WO | WO 2005/122285 | 12/2005 |
| WO | WO 2005/123114 | 12/2005 |
| WO | WO 2006/001285 | 1/2006 |
| WO | WO 2006/028996 | 3/2006 |
| WO | WO 2006/042287 | 4/2006 |
| WO | WO 2006/076711 | 7/2006 |
| WO | WO 2006/104069 | 10/2006 |
| WO | WO 2006/130558 | 12/2006 |

(56) References Cited

FOREIGN PATENT DOCUMENTS

| | | |
|---|---|---|
| WO | WO 2006/130721 | 12/2006 |
| WO | WO 2007/000037 | 1/2007 |
| WO | WO 2007/016524 | 2/2007 |
| WO | WO 2007/028003 | 3/2007 |
| WO | WO 2007/046656 | 4/2007 |
| WO | WO 2007/056183 | 5/2007 |
| WO | WO 2007/083570 | 7/2007 |
| WO | WO 2007/126412 | 11/2007 |
| WO | WO 2008/005628 | 1/2008 |
| WO | WO 2008/030666 | 3/2008 |
| WO | WO 2008/030960 | 3/2008 |
| WO | WO 2008/036837 | 3/2008 |
| WO | WO 2008/055054 | 5/2008 |
| WO | WO 2008/085904 | 7/2008 |
| WO | WO 2008/103464 | 8/2008 |
| WO | WO 2008/106485 | 9/2008 |
| WO | WO 2008/108838 | 9/2008 |
| WO | WO 2008/118133 | 10/2008 |
| WO | WO 2008/118211 | 10/2008 |
| WO | WO 2008/127401 | 10/2008 |
| WO | WO 2008/127402 | 10/2008 |
| WO | WO 2008/127403 | 10/2008 |
| WO | WO 2008/127404 | 10/2008 |
| WO | WO 2008/127405 | 10/2008 |
| WO | WO 2008/140562 | 11/2008 |
| WO | WO 2008/143635 | 11/2008 |
| WO | WO 2008/150861 | 12/2008 |
| WO | WO 2009/011709 | 1/2009 |
| WO | WO 2009/023615 | 2/2009 |
| WO | WO 2009/034349 | 3/2009 |
| WO | WO 2009/061823 | 5/2009 |
| WO | WO 2009/075625 | 6/2009 |
| WO | WO 2009/076088 | 6/2009 |
| WO | WO 2009/090398 | 7/2009 |
| WO | WO 2009/100280 | 8/2009 |
| WO | WO 2009/111641 | 9/2009 |
| WO | WO 2009/114115 | 9/2009 |
| WO | WO 2009/114689 | 9/2009 |
| WO | WO 2009/118678 | 10/2009 |
| WO | WO 2009/126689 | 10/2009 |
| WO | WO 2009/140588 | 11/2009 |
| WO | WO 2009/155397 | 12/2009 |
| WO | WO 2010/005707 | 1/2010 |
| WO | WO 2010/036807 | 4/2010 |
| WO | WO 2010/036992 | 4/2010 |
| WO | WO 2010/040528 | 4/2010 |
| WO | WO 2010/042798 | 4/2010 |
| WO | WO 2010/049881 | 5/2010 |
| WO | WO 2010/057142 | 5/2010 |
| WO | WO 2010/065957 | 6/2010 |
| WO | WO 2010/126640 | 11/2010 |
| WO | WO 2010/132552 | 11/2010 |
| WO | WO 2010/141133 | 12/2010 |
| WO | WO 2011/005381 | 1/2011 |
| WO | WO 2011/006133 | 1/2011 |
| WO | WO 2011/008842 | 1/2011 |
| WO | WO 2011/011347 | 1/2011 |
| WO | WO 2011/026101 | 3/2011 |
| WO | WO 2011/038401 | 3/2011 |
| WO | WO 2011/041395 | 4/2011 |
| WO | WO 2011/046652 | 4/2011 |
| WO | WO 2011/084450 | 7/2011 |
| WO | WO 2011/112931 | 9/2011 |
| WO | WO 2011/115643 | 9/2011 |
| WO | WO 2012/097163 | 7/2012 |
| WO | WO 2013/010113 | 1/2013 |

OTHER PUBLICATIONS

Adachi et al (1982) "Chemical Etching of InGaAsP/InP DH Wafer," *J. Electrochem. Soc.* 129:1053-1062.

Adachi et al. (1983) "Chemical Etching Characteristics of (001)GaAs," *J. Electrochem. Soc.* 130:2427-2435.

Adrega et al. (2010) "Stretchable Gold Conductors Embedded in PDMS and Patterned by Photolithography: Fabrication and Electromechanical Characterization," *J. Micromech. Microeng.* 20:055025.

Ago et al. (2005) "Aligned Growth of Isolated Single-Walled Carbon Nanotubes Programmed by Atomic Arrangement of Substrate Surface," *Chem. Phys. Lett.* 408:433-438.

Ago et al. (2006) "Synthesis of Horizontally-Aligned Single-Walled Carbon Nanotubes with Controllable Density on Sapphire Surface and Polarized Raman Spectroscopy," *Chem. Phys. Lett.* 421:399-403.

Ahmed et al. (Web Release Oct. 11, 2005) "Extending the 3ω-Method to the MHz Range for Thermal Conductivity Measurements of Diamond Thin Films," *Diamond Relat. Mater.* 15(2-3):389-393.

Ahn et al. (2007) "Bendable Integrated Circuits on Plastic Substrates by Use of Printed Ribbons of Single-Crystalline Silicon," *Appl. Phys. Lett.* 90:213501.

Ahn et al. (Dec. 15, 2006) "Heterogeneous Three-Dimensional Electronics by Use of Printed Semiconductor Nanomaterials," *Science* 314:1754-1757.

Ahn et al. (Jun. 2006) "High-Speed Mechanically Flexible Single-Crystal Silicon Thin-Film Transistors on Plastic Substrates," *IEEE Electron Dev. Lett.* 27(6):460-462.

Al-Halhouli et al. (2008) "Nanoindentation Testing of SU-8 Photoresist Mechanical Properties," *Microelectronic Eng.* 85:942-944.

Aliot, E. M. et al. (2009) "EHRA/HRS Expert Consensus on Catheter Ablation of Ventricular Arrhythmias: Developed in a partnership with the European Heart Rhythm Association (EHRA), a Registered Branch of the European Society of Cardiology (ESC), and the Heart Rhythm Society (HRS); in collaboration with the American College of Cardiology (ACC) and the American Heart Association (AHA)," *Europace* 11:771-817.

Alivisatos et al. (1996) "Semiconductor Clusters, Nanocrystals, and Quantum Dots," *Science* 271:933-937.

Alivisatos et al. (1998) "From Molecules to Materials: Current Trends and Future Directions," *Adv. Mater.* 10:1297-1336.

Allen et al. (Feb. 20,2006) "Nanomaterial Transfer Using Hot Embossing for Flexible Electronic Devices," *Appl. Phys. Lett.* 88:083112.

Al-Sarawi et al. (Feb. 1998) "A Review of 3-D Packaging Technology," *IEEE Trans. Comp. Packag. Manufac. Technol. B* 21(1):2-14.

Altman et al. (2003) "Silk-Based Biomaterials," *Biomaterials* 24:401-416.

Amano et al. (Feb. 3, 1986) "Metalorganic Vapor Phase Epitaxial Growth of a High Quality GaN Film Using an AlN Buffer Layer," *Appl. Phys. Lett.* 48(5):353-355.

Ambrosy et al. (1996) "Silicon Motherboards for Multichannel Optical Modules," *IEEE Trans. Compon. Pack. A* 19:34-40.

Amir et al. (2000) "The Influence of Helium-Neon Irradiation on the Viability of Skin Flaps in the Rat," *Br. J. Plast. Surg.* 53:58-62.

Amsden et al. (Nov. 9, 2009) "Spectral Analysis of Induced Color Change on Periodically Nanopatterned Silk Films," *Opt. Express* 17(23):21271-21279.

Andersen et al. (2004) "Selecting the Signals for a Brain-Machine Interface," *Curr. Opin. Neurobiol.* 14:720-726.

Andersson et al. (Oct. 16, 2002) "Active Matrix Displays Based on All-Organic Electrochemical Smart Pixels Printed on Paper," *Adv. Mater.* 14:1460-1464.

Ando et al. (2004) "Self-Aligned Self-Assembly Process for Fabricating Organic Thin-Film Transistors," *Appl. Phys. Lett.* 85:1849-1851.

Angadi et al. (Web Release Jun. 1, 2006) "Thermal Transport and Grain Boundary Conductance in Ultrananocrystalline Diamond Thin Films," *J. Appl. Phys.* 99:114301.

Anonymous (2003) XThin LEDs: CxxxXT290-Sxx00-A CPR3BV, Rev. H(CREE, Inc., Durham , NC) Available from www.cree.com.

Aoki et al. (2003) "Microassembly of Semiconductor Three Dimensional Photonic Crystals," *Nat. Mater.* 2:117-121.

Arnold et al. (2003) "Field-Effect Transistors Based on Single Semiconducting Oxide Nanobelts," *J. Phys. Chem. B* 107(3):659-663.

(56) References Cited

OTHER PUBLICATIONS

Ayón et al. (Jan. 1999) "Characterization of a Time Multiplexed Inductively Coupled Plasma Etcher," *J. Electrochem. Soc.* 146(1):339-349.
Baca et al. (2008) "Semiconductor Wires and Ribbons for High-Performance Flexible Electronics," *Angew. Chem. Int. Ed.* 47:5524-5542.
Bachtold et al. (Nov. 9, 2001) "Logic Circuits with Carbon Nanotube Transistors," *Science* 294:1317-1320.
Bae et al. (Jul. 1, 2002) "Single-Crystalline Gallium Nitride Nanobelts," *Appl. Phys. Lett.* 81(1):126-128.
Ball et al. (2004) "Towards an Implantable Brain-Machine Interface Based on Epicortical Field Potentials," *Biomed. Tech.* 49:756-759.
Balmer et al. (2005) "Diffusion of Alkanethiols in PDMS and Its Implications on Microcontact Printing (μCP)," *Langmuir* 21(2):622-632.
Banerjee et al. (May 2001) "3-D ICs: A Novel Chip Design for Improving Deep-Submicrometerinterconnect Performance and Systems-on-Chip Integration," *Proc. IEEE* 89(5):602-633.
Bao et al. (1997) "High-Performance Plastic Transistors Fabricated by Printing Techniques," *Chem. Mater.* 9:1299-1301.
Bao et al. (1999) "Printable Organic and Polymeric Semiconducting Materials and Devices," *J. Mater. Chem.* 9:1895-1904.
Barquins, M. (1992) "Adherence, Friction and Wear of Rubber-Like Materials," *Wear* 158:87-117.
Bates, F.S. (1991) "Polymer-Polymer Phase Behavior," *Science* 251:898-905.
Battaglia et al. (2003) "Colloidal Two-Dimensional Systems: CdSe Quantum Shells and Wells," Angew. Chem. Int. Ed. 442:5035-5039.
Bauer et al. (2004) "Biological Applications of High Aspect Ratio Nanoparticles," *J. Mater. Chem.* 14:517-526.
Berg et al. (2003) "Tailored Micropatterns Through Weak Polyelectrolyte Stamping," Langmuir 19:2231-2237.
Bernard et al. (1998) "Printing Patterns of Proteins," *Langmuir* 14(9):2225-2229.
Bett et al. (Aug. 1999) "III-V Compounds for Solar Cell Applications," *Appl. Phys. A. Mater. Sci.* 69(2):119-129.
Bhunia et al. (2004) "Free-Standing and Vertically Aligned InP Nanowires Grown by Metalorganic Vapor Phase Epitaxy," *Physica E* 21:583-587.
Bhushan et al. (Nov. 2004) "Multiwalled Carbon Nanotube AFM Probes for Surface Characterization of Micro/Nanostructures," *Microsyst. Technol.* 10(8-9):633-639.
Bietsch et al. (Oct. 1, 2000) "Conformal Contact and Pattern Stability of Stamps Used for Soft Lithography," *J. Appl. Phys.* 88(7):4310-4318.
Bishay et al. (2000) "Temperature Coefficient of the Surface Resistivity of Two-Dimensional Island Gold Films," *J. Phys. D. Appl. Phys.* 33(18):2218-2222.
Blanchet et al. (2003) "Large Area, High Resolution, Dry Printing of Conducting Polymers for Organic Electronics," *Appl. Phys. Lett.* 82:463-465.
Blanchet et al. (2003) "Printing Techniques for Plastic Electronics," *J. Imag. Sci. Tech.* 47(4):296-303.
Blazdell et al. (Nov. 1999) "Preparation of Ceramic Inks for Solid Freeforming Using a Continuous Jet Printer," *J. Mat. Syn. Process.* 7(6):349-356.
Boltau et al. (1998) "Surface-Induced Structure Formation of Polymer Blends on Patterned Substrates," *Nature* 391:877-879.
Boncheva et al. (Mar. 15, 2005) "Magnetic Self-Assembly of Three-Dimensional Surfaces from Planar Sheets," *Proc. Natl. Acad. Sci. USA* 102(11):3924-3929.
Boncheva et al. (Mar. 8, 2005) "Templated Self-Assembly: Formation of Folded Structures by Relaxation of Pre-Stressed, Planar Tapes," *Adv. Mater.* 17(5):553-557.
Bourzac, K. (May/Jun. 2010) "TR10: Implantable Electronics," *Technology Review*, Published by MIT, http://www.technologyreview.com/biomedicine/25086/?a=f.
Bowden et al. (1997) "Self Assembly of Mesoscale Objects into Ordered Two-Dimensional Arrays," *Science* 276:233-235.
Bowden et al. (1998) "Spontaneous Formation of Ordered Structures in Thin Films of Metals Supported on an Elastomeric Polymer," *Nature* 393:146-149.
Bowden et al. (2001) "Molecule-Mimetic Chemistry and Mesoscale Self-Assembly," *Acc. Chem. Res.* 34:231-238.
Bracher et al. (2009) "Shaped Films of Ionotropic Hydrogels Fabricated Using Templates of Patterns Paper," *Adv. Mater.* 21:445-450.
Bradley et al. (2003) "Flexible Nanotube Electronics," *Nano Lett.*, vol. 3, No. 10, pp. 1353-1355.
Braun et al. (1999) "Electrochemically Grown Photonic Crystals," *Nature* 402:603-604.
Britton et al. (Web Release Oct. 25, 2005) "Microstructural Defect Characterization of a Si:H Deposited by Low Temperature HW-CVD on Paper Substrates," *Thin Solid Films* 501(1-2):79-83.
Brown et al. (Dec. 19, 2001) "Heterogeneous Materials Integration: Compliant Substrates to Active Device and Materials Packaging," *Mater. Sci. Eng. B* 87(3):317-322.
Brown et al. (Jun. 2005) "Evaluation of Polydimethylsiloxane Scaffolds with Physiologically-Relevant Elastic Moduli: Interplay of Substrate Mechanics and Surface Chemistry Effects on Vascular Smooth Muscle Cell Response," *Biomaterials* 26(16):3123-3129.
Brown, H.R. (1991) "The Adhesion Between Polymers," *Ann. Rev. Mater. Sci.* 21:463-489.
Bruschi et al. (2001) "Micromachined Silicon Suspended Wires With Submicrometric Dimensions," *Microelectron. Eng.* 57-58:959-965.
Buma et al. (2001) "High-Frequency Ultrasound Array Element Using Thermoelastic Expansion in an Elastomeric Film," *Appl. Phys. Lett.* 79:548-550.
Burdinski et al. (2005) "Single Etch Patterning of Stacked Silver and Molybdenum Alloy Layers on Glass Using Microcontact Wave Printing," *J. Am. Chem. Soc.* 127(31):10786-10787.
Burdinski, D. (non-dated) "Soft Lithography and Microcontact Wave Printing," http://www.research.philips.com/technologies/light_dev_microsys/softlitho/index.html, Downloaded May 23, 2007.
Burge et al. (Jun. 25, 1997) "X-Ray Holography for VLSI Using Synthetic Bilevel Holograms," *Proc. Int. Soc. Opt. Eng.* 3183:2-13.
Burgin et al. (2000) "Large Area Submicrometer Contact Printing Using a Contact Aligner," *Langmuir* 16:5371-5375.
Burns et al. (2003) "Printing of Polymer Thin-Film Transistors for Active-Matrix-Display Applications," *J. Soc. Inf. Display* 11:599-604.
Campbell et al. (2000) "Fabrication of Photonic Crystals for the Visible Spectrum by Holographic Lithography," *Nature* 404:53-56.
Cao et al. (2006) "Bilayer Organic-Inorganic Gate Dielectrics for High-Performance, Low-Voltage, Single-Walled Carbon Nanotube Thin-Film Transistors, Complementary Logic Gates, and p-n Diodes on Plastic Substrates," *Adv. Funct. Mater.* 16:2355-2362.
Cao et al. (2006) "Highly Bendable,Transparent Thin-Film Transistors That Use Carbon-Nanotube-Based Conductors and Semiconductors with Elastomeric Dielectrics," *Adv. Mater.* 18(3):304-309.
Cao et al. (2006) "Transparent flexible organic thin-film transistors that use printed single-walled carbon nanotube electrodes," *Applied Physics Letters* 88:113511.
Cao et al. (Jan. 5, 2009) "Ultrathin Films of Single-Walled Carbon Nanotubes for Electronics and Sensors: A Review of Fundamental and Applied Aspects," *Adv. Mater.* 21(1):29-53.
Cao et al. (Jul. 24, 2008) "Medium-Scale Carbon Nanotube Thin-Film Integrated Circuits on Flexible Plastic Substrates," *Nature* 454:495-500.
Carr et al. (1998) "Measurement of Nanomechanical Resonant Structures in Single-Crystal Silicon," *J. Vac. Sci. Technol. B* 16:3821-3824.
Chadhury et al. (1991) "Direct Measurement of Interfacial Interactions Between Semispherical Lenses and Flat Sheets of Poly(dimethylsiloxane) and their Chemical Derivatives," *Langmuir* 7:1013-1025.
Chang et al. (1994) "Process Techniques," "Lithography," and "Device-Related Physics and Principles," In; *GaAs High-Speed*

(56) References Cited

OTHER PUBLICATIONS

*Devices: Physics, Technology and Circuit Application*, John Wiley and Sons, New York, pp. 115-278.
Chen et al. (2003) "Characterization of Pd—GaAs Schottly Diodes Prepared by the Electrodes Plating Technique," *Semiconductor. Sci. Technol.* 18:620-626.
Chen et al. (2003) "Electronic Paper: Flexible Active-Matrix Electronics Ink Display," *Nature* 423:136.
Chen et al. (2005) "InGaN Nanorings and Nanodots by Selective Area Epitaxy," *Appl. Phys. Lett.* 87:143111.
Chen et al. (2005) "The Role of Metal-Nanotube Contact in the Performance of Carbon Nanotube Field-Effect Transistors," *Nano Lett.* 5(7):1497-1502.
Chen et al. (Feb. 27, 2006) "Complementary Carbon Nanotube-Gated Carbon Nanotube Thin-Fim Transistor," *Appl. Phys. Lett.* 88:093502.
Chen et al. (Jun. 2002) Effect of Process Parameters on the Surface Morphology and Mechanical Performance of Silicon Structures After Deep Reactive Ion Etching (DRIE) *J. Microelectromech. Syst.* 11(3):264-275.
Chen et al. (Mar. 2004) "A Family of Herringbone Patterns in Thin Films," *Scripta Materialia* 50(6):797-801.
Chen et al. (Mar. 24, 2006) "An Integrated Logic Circuit Assembled on a Single Carbon Nanotube," *Science* 311:1735.
Chen et al. (Sep. 2004) "Herringbone Buckling Patterns of Compressed Thin Films on Compliant Substrates," *J. Appl. Mech.* 71:597-603.
Cheng et al. (2005) "Ink-Jet Printing, Self-Assembled Polyelectrolytes, and Electroless Plating: Low Cost Fabrication of Circuits on a Flexible Substrate at Room Temperature," *Macromol. Rapid Commun.* 26:247-264.
Childs et al. (2002) "Decal Transfer Microlithography: A New Soft-Lithographic Patterning Method," *J. Am. Chem. Soc.* 124:13583-13596.
Childs et al. (2005) "Masterless Soft-Lithography: Patterning UV/Ozone-Induced Adhesion on Poly(dimethylsiloxane) Surfaces," *Langmuir* 21:10096-10105.
Childs et al. (Aug. 14, 2004) "Patterning of Thin-Film Microstructures on Non-Planar Substrate Surfaces Using Decal Transfer Lithography," *Adv. Mater.* 16(15):1323-1327.
Choi et al. (2007) "Biaxially Stretchable 'Wavy' Silicon Nanomembranes," *Nano Lett.* 7(6):1655-1663.
Choi et al. (Web Release Jan. 25, 2005) "Simple Detachment Patterning of Organic Layers and Its Applications to Organic Light-Emitting Diodes," *Adv. Mater.* 17(2):166-171.
Chou et al. (2004) "An Orientation-Controlled Pentacene Film Aligned by Photoaligned Polyimide for Organic Thin-Film Transistor Applications," *Adv. Func. Mater.* 14:811-815.
Chou et al. (Jun. 8, 1999) "Micromachining on (111)-Oriented Silicon," *Sens. Actuators A* 75(3):271-277.
Chu et al. (2005) "High-Performance Organic Thin-Film Transistors with Metal Oxide/Metal Bilayer Electrode," *Appl. Phys. Lett.* 87:193508.
Chung et al. (2000) Silicon Nanowire Devices *Appl. Phys. Lett.* 76(15):2068-2070.
Chung et al. (Jul. 1, 2003) "A Study on Formation of Al and $Al_2O_3$ on the Porous Paper by DC Magnetron Sputtering," *Surf. Coat. Technol.* 171(1-3):65-70.
Clerc, L. (1976) "Directional Differences of Impulse Spread in Trabecular Muscle from Mammalian Heart," *J. Physiol.* 255:335-346.
Cohen-Karni et al. (2009) "Flexible Electrical Recording from Cells Using Nanowire Transistor Arrays," *Proc. Natl. Acad. Sci. USA* 106:7309-7313.
Cole et al. (2008) "Patterned Growth and Transfer of ZnO Micro- and Nanocrystals with Size and Location Control," *Adv. Mater.* 20:1474-1478.
Collins et al. (Apr. 27, 2001) "Engineering Carbon Nanotubes and Nanotube Circuits Using Electrical Breakdown," *Science* 292:706-709.

Corazza et al. (2007) "Photobiomodulation on the Angiogenesis of Skin Wounds in Rats Using Different Light Sources," *Photomedicine Laser Surg.* 25:102-106.
Cox, H. L. (1952) "The Elasticity and Strength of Paper and Other Fibrous Materials," *Br. J. Appl. Phys.* 3:72-79.
Creagh et al. (2003) "Design and Performance of Inkjet Print Heads for Non-Graphic-Arts Applications," *MRS Bull.* 28:807-811.
Crone et al. (Feb. 3, 2000) "Large-Scale Complementary Integrated Circuits Based on Organic Transistors," *Nature* 403:521-523.
Crowder et al. (1998) "Low-Temperature Single-Crystal Si TFTs Fabricated on Si Films Processed via Sequential Lateral Solidification," *IEEE Electron. Dev. Lett.* 19:306-308.
Cui et al. (2001) "Nanowire Nanosensors for Highly Sensitive and Selective Detection of Biological and Chemical Species," *Science* 293:1289-1292.
Dai et al. (2002) "Gallium Oxide Nanoribbons and Nanosheets," *J. Phys. Chem. B* 106(5):902-904.
Dai et al. (2003) "Novel Nanostructures of Functional Oxides Synthesized by Thermal Evaporation," *Adv. Funct. Mater.* 13:9-24.
Davidson et al. (2004) "Supercritical Fluid-Liquid-Solid Synthesis of Gallium Arsenide Nanowires Seeded by Alkanethiol-Stabilized Gold Nanocrystals," *Adv. Mater.* 16:646-649.
de Gans (2004) "Inkjet Printing of Polymers: State of the Art and Future Developments," *Adv. Mater.* 16(3):203-213.
De Sio et al. (Web Release May 18, 2005) "Electro-Optical Response of a Single-Crystal Diamond Ultraviolet Photoconductor in Transverse Configuration," *Appl. Phys. Lett.* 86:213504.
DeBoer et al. (2004) "Organic Single-Crystal Field-Effect Transistors," *Phys. Stat. Sol.* 201:1302-1331.
Deen et al. (2004) "Electrical Characterization of Polymer-Based FETs Fabricated by Spin-Coating Poly(3-alkylthiophene)s," *IEEE Trans. Electron Devices* 51:1892-1901.
Delmerche et al. (1997) "Stability of Molded Polydimethylsiloxane Microstructures," *Adv. Mat.* 9:741-746.
Deruelle et al. (1995) "Adhesion at the Solid-Elastomer Interface: Influence of Interfacial Chains," *Macromol.* 28:7419-7428.
Derycke et al. (Sep. 2001) "Carbon Nanotube Inter- and Intramolecular Logic Gates," *Nano Lett.* 1(9):453-456.
Desai et al. (Feb. 1999) "Nanopore Technology for Biomedical Applications," *Biomed. Microdevices* 2(1):11-40.
Dick et al. (Jun. 2004) "Synthesis of Branched 'Nanotrees' by Controlled Seeding of Multiple Branching Events," *Nat. Mater.* 3:380-384.
Dimroth et al. (Mar. 2007) "High Efficiency Multijunction Solar Cells," *MRS Bull.* 32:230-235.
Ding et al. (Oct. 4, 2004) "Self Catalysis and Phase Transformation in the Formation of CdSe Nanosaws," *Adv. Mater.* 16(19):1740-1743.
Dinsmore et al. (2002) "Colloidosomes: Selectively Permeable Capsules Composed of Colloidal Particles," *Science* 298:1006-1009.
Divliansky et al. (2003) "Fabrication of Three-Dimensional Polymer Photonic Crystal Structures Using Single Diffraction Element Interference Lithography," *Appl. Phys. Lett.* 82(11):1667-1669.
Dodabalapur A. (Apr. 2006) "Organic and Polymer Transistors for Electronics," *Mater Today* 9(4):24-30.
Dodabalapur et al. (1995) "Organic Transistors: Two-Dimensional Transport and Improved Electrical Characteristics," *Science* 268:270-271.
Duan et al. (2000) "General Synthesis of Compound Semiconductor Nanowires," *Adv. Mater.* 12(4):298-302.
Duan et al. (2003) "High-performance Thin-Film Transistors Using Semiconductor Nanowires and Nanoribbons," *Nature* 425:274-278.
Duan X, (2003) "Semiconductor Nanowires: From Nanoelectronics to Macroelectronics," Abstract from a presentation given at the 11th Foresight Conference on Molecular Nanotechnology, Oct. 10-20, Burlingame, CA.
Duboz et al. (1998) "Transistors and Detectors Based on GaN-Related Materials," In; *Group III Nitride Semiconductor Compounds*, Gill, B. ed., Clarendon, Oxford, pp. 343-387.
Duesberg et al. (2000) "Polarized Raman Spectroscopy on Isolated Single-Wall Carbon Nanotubes," *Phys. Rev. Lett.*, vol. 85, No. 25, pp. 5436-5439.

(56) References Cited

OTHER PUBLICATIONS

Duffy et al. (1998) "Rapid Prototyping of Microfluidic Systems in Poly(dimethlysiloxane)," *Anal. Chem.* 70:4974-4984.
Dupuis et al. (2008) "History, Development, and Applications of High-Brightness Visible Light-Emitting Diodes," *IEEE J. Lightwave Tech.* 26:1154-1171.
Durkop et al. (2004) "Extraordinary Mobility in Semiconducting Carbon Nanotube," *Nano Lett.* 4(1):35-39.
Eder et al. (Apr. 5, 2004) "Organic Electronics on Paper," *Appl. Phys. Lett.* 84(14):2673-2675.
Edrington et al. (2001) "Polymer-Based Photonic Crystals," *Adv. Mater.* 13:421-425.
Efimenko et al. (Oct. 15, 2002) "Surface Modification of Sylgard-184 Poly(dimethyl Siloxane) Networks by Ultraviolet and Ultraviolet/Ozone Treatment," *J. Colloid Interface Sci.* 254(2):306-315.
Eftekhari, G. (1993) "Variation in the Effective Richardson Constant of Metal-GaAs and Metal-InP Contacts Due to the Effect of Processing Parameters," *Phys. Status Solid A—Appl. Res.* 140:189-194.
Ensell, G. (1995) "Free Standing Single-Crystal Silicon Microstructures," *J. Micromech. Microeng.* 5:1-4.
Exam Report, Written Opinion and Response to Written Opinion, Corresponding to Singapore Patent Application No. 2007/18082-1, dated Jan. 15, 2009.
Examination Report and Response, Corresponding to Malaysian Patent Application No. PI 20062672, dated Aug. 28, 2009.
Examination Report, Corresponding to European Application No. EP 05 756 327.2, dated Jan. 20, 2010.
Examination Report, Corresponding to European Patent Application No. 07841968.6, dated Apr. 27, 2012.
Examination Report, Corresponding to Malaysian Patent Application No. PI 20092343, dated Jun. 15, 2010.
Examination Report, Corresponding to Malaysian Patent Publication No. PI 20052553, dated Mar. 13, 2009.
Examination Report, Corresponding to Singapore Patent Application No. 200608359-6, dated Aug. 27, 2008.
Examination Report, Response and Search Report, Corresponding to Malaysian Patent Application No. PI 20062537, dated Nov. 20, 2009.
Faez et al. (1999) "An Elastomeric Conductor Based on Polyaniline Prepared by Mechanical Mixing," *Polymer* 40:5497-5503.
Felgner et al. (1996) "Flexural Rigidity of Microtubules Measured with the Use of Optical Tweezers," *J. Cell Sci.* 109:509-516.
Fink et al. (1999) "Block Copolymers as Photonic Bandgap Materials," *J. Lightwave Tech.* 17:1963-1969.
First Office Action, Corresponding to Chinese Patent Application No. 201110077508.8, dated Feb. 17, 2012.
Flewitt et al. (2005) "Low-Temperature Deposition of Hydrogenated Amorphous Silicon in an Electron Cyclotron Resonance Reactor for Flexible Displays," *Proc. IEEE* 93:1364-1373.
Folch et al. (1999) "Wafer-Level In-Registry Microstamping," *J. Microelectromech. Syst.* 8:85-89.
Forment et al. (2004) "Influence of Hydrogen Treatment and Annealing Processes Upon the Schottky Barrier Height of Au/n-GaAs and Ti/n-GaAs Diodes," *Semicond. Sci. Technol.* 19:1391-1396.
Forrest et al. (2004) "The Path to Ubiquitous and Low-Cost Organic Electronic Appliances on Plastic," *Nature* 428:911-918.
Fortunato et al. (2005) "Flexible a-Si: H Position-Sensitive Detectors," *Proc. IEEE* 93:1281-1286.
Fortunato et al. (Sep. 2008) "High-Performance Flexible Hybrid Field-Effect Transistors Based on Cellulose Fiber Paper," *IEEE Electron. Dev. Lett.* 29(9):988-990.
Freeman et al. (2000) "Spatial Spectral Analysis of Human Electrocardiograms Including the Alpha and Gamma Bands," *J. Neurosci. Methods* 95:111-121.
Freire et al. (1999) "Thermal Stability of Polyethylene Terephthalate (PET): Oligomer Distribution and Formation of Volatiles," *Packag. Technol. Sci.* 12:29-36.

Friedman et al. (2005) "High-Speed Integrated Nanowire Circuits," *Nature* 434:1085.
Gan et al. (2002) "Preparation of Thin-Film Transistors With Chemical Bath Deposited CdSe and CdS Thin Films," *IEEE Trans. Electron. Dev.* 49:15-18.
Gao et al. (Sep. 9, 2005) "Conversion of Zinc Oxide Nanobelts into Superlattice-Structures Nanohelices," *Science* 309:1700-1704.
Garcia et al. (2004) "Etchant Anisotropy Controls the Step Bunching Instability in KOH Etching of Silicon," *Phys. Rev. Lett.* 93(16):166102.
Gardner et al. (1965) "Physical Aspects of the Internal Water Relations of Plant Leaves," *Plant Physiol.* 40:705-710.
Garnier et al. (1994) "All-Polymer Field-Effect Transistor Realized by Printing Techniques," *Science* 265:1684-1686.
Geim et al. (Mar. 2007) "The Rise of Graphene," *Nature Mater.* 6:183-191.
Geissler et al. (2003) "Fabrication of Metal Nanowires Using Microcontact Printing," *Langmuir* 19(15):6301-6311.
Geissler et al. (Jun. 2003) "Selective Wet-Etching of Microcontact-Printed Cu Substrates with Control Over the Etch Profile," *Microelec. Eng.* 67-68:326-332.
Gelinck et al. (2000) "High-Performance All-Polymer Integrated Circuits," *Appl. Phys. Lett.* 77:1487-1489.
Gelinck et al. (2004) "Flexible Active-Matrix Displays and Shift Registers Based on Solution-Processed Organic Transistors," *Nat. Mater.* 3:106-110.
Georgakilas et al. (2002) "Wafer-Scale Integration of GaAs Optoelectronic Devices with Standard Si Integrated Circuits Using a Low-Temperature Bonding Procedure," *Appl. Phys. Lett.* 81:5099-5101.
Givargizov, E.I. (1991) "Applications," In; *Oriented Crystallization on Amorphous Substrates*, Plenum Press, New York, pp. 341-363.
Goetting et al. (1999) "Microcontact Printing of Alkanephosphonic Acids on Aluminum: Pattern Transfer by Wet Chemical Etching," *Langmuir* 15:1182-1191.
Goldman et al. (1996) "Correlation of Buffer Strain Relaxation Modes with Transport Properties of Two-Dimensional Electron Gases," *J. Appl. Phys.* 80:6849-6854.
Goldmann et al. (2004) "Hole Mobility in Organic Single Crystals Measured by a "Flip-Crystal" Field-Effect Technique," *J. Appl. Phys.* 96:2080-2086.
Goldsmith, T.H. (Sep. 1990) "Optimization, Constraint, and History in the Evolution of Eyes," *Quart. Rev. Biol.* 65(3):281-322.
Gratz et al. (1991) "Atomic Force Microscopy of Atomic-Scale Ledges and Etch Pits Formed During Dissolution of Quartz," *Science*, 251:1343-1346.
Gray et al. (Dec. 2001) "Screen Printed Organic Thin Film Transistors (OTFTs) on a Flexible Substrate," *Proc. SPIE* 4466:89-94.
Gray et al. (Mar. 5, 2004) "High-Conductivity Elastomeric Electronics," *Adv. Mater.* 16(5):393-397.
Grayson, T. (2002) "Curved Focal Plane Wide Field of View Telescope Design," *Proc. SPIE* 4849:269-274.
Gruen et al. (Mar. 21, 1994) "Fullerenes as Precursors for Diamond Film Growth Without Hydrogen or Oxygen Additions," *Appl. Phys. Lett.* 65(12):1502-1504.
Gudiksen et al. (Web Release Apr. 18, 2001) "Synthetic Control of the Diameter and Length of Single Crystal Semiconductor Nanowires," *J. Phys. Chem. B* 105:4062-4064.
Guo et al. (Aug. 19, 2002) "Metal-Insulator-Semiconductor Electrostatics of Carbon Nanotubes," *Appl. Phys. Lett.* 81(8):1486-1488.
Gur et al. (2005) "Air-Stable All-Inorganic Nanocrystal Solar Cells Processed from Solution," *Science* 310:462-465.
Gurbuz et al. (Jul. 2005) "Diamond Semiconductor Technology for RF Device Applications." *Solid State Electron.* 49(7):1055-1070.
Haisma et al. (2002) "Contact Bonding, Including Direct-Bonding in a Historical and Recent Context of Materials Science and Technology, Physics and Chemistry," *Mater. Sci Eng.* 37:1-60.
Halik et al. (2004) "Low-Voltage Organic Transistors with an Amorphous Molecular Gate Dielectric," *Nature* 431:963-966.
Hamedi et al. (May 2007) "Towards Woven Logic from Organic Electronic Fibres," *Nat. Mater.* 6:357-362.
Hamilton et al. (2004) "Field-Effect Mobility of Organic Polymer Thin-Film Transistors," *Chem. Mater.* 16:4699-4704.

(56) References Cited

OTHER PUBLICATIONS

Han et al. (2005) "Template-Free Directional Growth of Single-Walled Carbon Nanotues on a- and r-Plane Sapphire," *J. Am. Chem. Soc.* 127:5294-5295.
Harada et al. (2001) "Catalytic Amplification of the Soft Lithographic Patterning of Si. Nonelectrochemical Orthogonal Fabrication of Photoluminescent Porous Si Pixel Arrays," *J. Am. Chem. Soc.* 123:8709-8717.
Harkonen et al. (Jun. 8, 2006) "4 W Single-Transverse Mode VECSEL Utilizing Intra-Cavity Diamond Heat Spreader," *Electron Lett.* 42(12):693-694.
Hayase et al. (2001) "Photoangioplasty with Local Motexafin Lutetium Delivery Reduces Macrophages in a Rabbit Post-Balloon Injury Model," *Cardiovascular Res.* 49:449-455.
He et al. (2005) "Si Nanowire Bridges in Microtrenches: Integration of Growth into Device Fabrication," *Adv. Mater.* 17:2098-2102.
Heffelfinger et al. (1997) "Steps and the structure of the (0001) α-alumina surface," *Surf. Sci.*, 370:L168-L172.
Hillbrog et al. (Web Release Dec. 30, 2003) "Nanoscale Hydrophobic Recovery: A Chemical Force Microscopy Study of UV/Ozone-Treated Cross-Linker Poly(dimethylsiloxane)," *Langmuir* 20(3):785-794.
Hines et al. (2005) "Nanotransfer Printing of Organic and Carbon Nanotube Thin-Film Transistors on Plastic Substrates," *Appl. Phys. Lett.* 86:163101.
Hollenberg et al. (2006) "A MEMS Fabricated Flexible Electrode Array for Recording Surface Field Potentials," *J. Neurosci. Methods* 153:147-153.
Holmes et al. (Feb. 25, 2000) "Control of Thickness and Orientation of Solution-Grown Silicon Nanowires," *Science* 287:1471-1473.
Horan et al. (Jun. 2005) "In Vitro Degradation of Silk Fibroin," *Biomaterials* 26(17):3385-3393.
Horn et al. (1992) "Contact Electrification and Adhesion Between Dissimilar Materials," *Science* 256:362-364.
Hoyer, P. (1996) "Semiconductor Nanotube Formation by a Two-Step Template Process," *Adv. Mater.* 8:857-859.
Hsia et al. (2005) "Collapse of Stamps for Soft Lithography Due to Interfacial Adhesion," *Appl. Phys. Lett.* 86:154106.
Hsu et al. (2002) "Amorphous Si TFTs on Plastically Deformed Spherical Domes," *J. Non-Crystalline Solids* 299-302:1355-1359.
Hsu et al. (2003) "Nature of Electrical Contacts in a Metal-Molecule-Semiconductor System," *J. Vac. Sci. Technol. B* 21(4):1928-1935.
Hsu et al. (Jan. 15, 2004) "Spherical Deformation of Compliant Substrates with Semiconductor Device Islands," *J. Appl. Phys.* 95(2):705-712.
Hsu et al. (Mar. 2004) "Effects of Mechanical Strain on TFT's on Spherical Domes," *IEEE Trans. Electron Dev.* 51(3):371-377.
Hu et al. (1997) "Using Soft Lithography to Fabricate GaAs/AlGaAs Heterostructure Field Effect Transistors," *Appl. Phys. Lett.* 71:2020-2022.
Hu et al. (1999) Chemistry and Physics in One Dimension: Synthesis and Properties of Nanowires and Nanotubes, *Acc. Chem. Res.* 32:435-445.
Hu et al. (2004) "Percolation in Transparent and Conducting Carbon Nanotube Networks," *Nano Lett.*, vol. 4, No. 12, pp. 2513-2517.
Hu et al. (2009) "Highly Conductive Paper for Energy-Storage Devices," *Proc. Natl. Acad. Sci. USA* 106:21490-21494.
Hu et al. (2010) "Stretchable, Porous, and Conductive Energy Textiles," *Nano Lett.* 10:708-714.
Huang et al. (2001) "Directed Assembly of One-Dimensional Nanostructures into Functional Networks," *Science* 291:630-633.
Huang et al. (2001) "Room-Temperature Ultraviolet Nanowire Nanolasers," *Science* 292:1897-1899.
Huang et al. (2003) "Growth of Millimeter-Long and Horizontally Aligned Single-Walled Carbon Nanotubes on Flat Substrates," *J. Am. Chem. Soc.*, 125:5636-5637.
Huang et al. (2004) "Long and Oriented Single-Walled Carbon Nanotubes Grown by Ethanol Chemical Vapor Deposition," *J. Phys. Chem. B.* 108:16451-16456.
Huang et al. (2004) "Self-Organizing High-Density Single-Walled Carbon Nanotube Arrays from Surfactant Suspensions," *Nanotechnol.* 15:1450-1454.
Huang et al. (2005) "Nanomechanical Architecture of Strained Bilayer Thin Films: From Design Principles to Experimental Fabrication," *Adv. Mater.* 17(23):2860-2864.
Huang et al. (2005) "Nanowires for Integrated Multicolor Nanophotonics," *Small* 1(1):142-147.
Huang et al. (2005) "Nonlinear Analyses of Wrinkles in a Film Bonded to a Compliant Substrate," *J. Mech. Phys. Solids* 53:2101-2118.
Huang et al. (2005) "Stamp Collapse in Soft Lithography," *Langmuir* 21:8058-8068.
Huang et al. (Jan. 16, 2001) "Catalytic Growth of Zinc Oxide Nanowires by Vapor Transport," *Adv. Mater.* 13(2):113-116.
Huck et al. (2000) "Ordering of Spontaneously Formed Buckles on Planar Surfaces," *Langmuir* 16:3497-3501.
Huie, J.C. (2003) "Guided Molecular Self Assembly: A review of Recent Efforts," *Smart Mater. Struct.* 12:264-271.
Huitema et al. (2001) "Plastic Transistors in Active-Matrix Displays," *Nature* 414:599.
Hur et al. (2005) "Organic Nanodielectrics for Low Voltage Carbon Nanotube Thin Film Transistors and Complementary Logic Gates," *J. Am. Chem. Soc.* 127:13808-13809.
Hur et al. (2005) "Printed thin-film transistors and complementary logic gates that use polymer-coated single-walled carbon nanotube networks," *J. Appl. Phys.*, 98, 114302.
Hur et al. (Dec. 2004) "Nanotransfer Printing by Use of Noncovalent Surface Forces: Applications to Thin-Film Transistors that Use Single-Walled Carbon Nanotube Networks and Semiconducting Polymers," *Appl. Phys. Lett.* 85(23):5730-5732.
Hur et al. (Jun. 13, 2005) "Extreme Bendability of Single Walled Carbon Nanotube Networks Transferred From High-Temperature Growth Substrates to Plastic and Their Use in Thin-Film Transistors," *Appl. Phys. Lett.* 243502.
Hutchinson et al. (1992) "Mixed Mode Cracking in Layered Materials," *Adv. Appl. Mech.* 29:63-191.
Imparato et al. (2005) "Excimer Laser Induced Crystallization of Amorphous Silicon on Flexible Polymer Substrates," *Thin Solid Films* 487:58-62.
International Search Report and Written Opinion, Corresponding to International Application No. PCT/US2006/032125, dated Mar. 21, 2008.
International Search Report and Written Opinion, Corresponding to International Application No. PCT/US2009/058231, dated Nov. 17, 2009.
International Search Report and Written Opinion, Corresponding to International Application No. PCT/2005/014449, dated Jul. 3, 2008.
International Search Report and Written Opinion, Corresponding to International PCT Application No. PCT/US05/19354, dated Apr. 18, 2007.
International Search Report and Written Opinion, Corresponding to International PCT Application No. PCT/US2007/079070, dated Apr. 23, 2008.
International Search Report and Written Opinion, Corresponding to International PCT Application No. PCT/US2007/077759, dated Apr. 11, 2008.
International Search Report and Written Opinion, Corresponding to International PCT Application No. PCT/US2007/022959, dated Oct. 14, 2008.
International Search Report and Written Opinion, Corresponding to International PCT Application No. PCT/US2006/021161, dated Feb. 28, 2008.
International Search Report and Written Opinion, Corresponding to International Application No. PCT/US2009/036192, dated Jul. 6, 2009.
International Search Report and Written Opinion, Corresponding to International Application No. PCT/US2010/034520, dated Sep. 24, 2010.
International Search Report and Written Opinion, Corresponding to International Application No. PCT/US07/74293, dated Jul. 24, 2008.

(56) References Cited

OTHER PUBLICATIONS

International Search Report and Written Opinion, Corresponding to International Application No. PCT/US07/82633, dated May 16, 2008.
International Search Report and Written Opinion, Corresponding to International Application No. PCT/US07/77217, dated Jun. 3, 2008.
International Search Report and Written Opinion, Corresponding to International Application No. PCT/US09/47442, dated Sep. 21, 2009.
International Search Report and Written Opinion, Corresponding to International Application No. PCT/US04/40192, dated Jul. 6, 2005.
International Search Report and Written Opinion, Corresponding to International Application No. PCT/US10/50468, dated Jan. 6, 2011.
International Search Report and Written Opinion, Corresponding to International Application no. PCT/US10/60425, dated May 25, 2011.
International Search Report and Written Opinion, Corresponding to International Application No. PCT/US2011/028094, dated Jul. 14, 2011.
International Search Report and Written Opinion, Corresponding to International Application No. PCT/US2010/042585, dated May 25, 2011.
International Search Report and Written Opinion, Corresponding to International Application No. PCT/US2012/37973, dated Aug. 14, 2012.
Isberg et al. (Sep. 6, 2002) "High Carrier Mobility in Single-Crystal Plasma-Deposited Diamond," *Science* 297:1670-1672.
Islam et al. (Jan. 16, 2003) "High Weight Fraction Surfactant Solubilization of Single-Wall Carbon Nanotubes in Water," *Nano Lett.* 3(2):269-273.
Ismach et al. (2004) "Atomic-Step-Tem plated Formation of Single Wall Carbon Nanotube Patterns," *Angew. Chem. Int. Ed.* 43:6140-6143.
Itoh et al. (1991) "Cathodoluminescence Properties of Undoped and Zn-Doped $Al_xGa_{1-x}N$ Grown by Metalorganic Vapor Phase Epitaxy," *Jap. J. Appl. Phys.* 30:1604-1608.
Jabbour et al. (2001) "Screen Printing for the Fabrication of Organic Light-Emitting Devices," *IEEE J. Select. Top. Quantum. Electron.* 7:769-773.
Jackman et al. (Aug. 4, 1995) "Fabrication of Submicrometer Features on Curved Substrates by Microcontact Printing," *Science* 269:664-666.
Jacobs et al. (2001) "Submicrometer Patterning of Charge in Thin-Film Electrets," *Science* 291:1763-1766.
Jacobs et al. (2002) "Fabrication of a Cylindrical Display by Patterned Assembly," *Science* 296:323-325.
Jain et al. (2000) "III-Nitrides: Growth, Characterization, and Properties," *J. Appl. Phys.* 87:965-1006.
Jain et al. (2005) "Flexible Electronics and Displays: High-Resolution, Roll-to-Roll, Projection Lithography and Photoablation Processing Technologies for High-Throughput Production," *Proc. IEEE* 93:1500-1510.
James et al. (1998) "Patterned Protein Layers on Solid Substrates by This Stamp Microcontact Printing," *Langmuir* 14:742-744.
Jang et al. (2003) "Lateral Growth of Aligned Multiwalled Carbon Nanotubes Under Electric Fields," *Solid State Commun.* 126:305-308.
Jang et al. (2006) "Low-Voltage and High-Field-Effect Mobility Organic Transistors with a Polymer Insulator," *Appl. Phys. Lett.* 88:072101.
Javey et al. (2002) "High-κ Dielectrics for Advanced Carbon-Nanotube Transistors and Logic Gates," *Nature Mater.* 1:241-246.
Javey et al. (2005) "High Performance n-Type Carbon Nanotube Field-Effect Transistors with Chemically Doped Contacts," *Nano Lett.*, vol. 5, No. 2, pp. 345-348.
Javey et al. (Aug. 7, 2003) "Ballistic Carbon Nanotube Field-Effect Transistors," *Nature* 424:654-657.
Jenkins et al. (1994) "Gallium Arsenide Transistors: Realization Through a Molecularly Designed Insulator," *Science* 263:1751-1753.

Jeon et al. (1995) "Patterning of Dielectric Oxide Thin Layers by Microcontact Printing of Self-Assembled Monolayers," *J. Mater. Res.* 10:2996-2999.
Jeon et al. (2003) "Structural and Mechanical Properties of Woven Fabrics Employing Peirce's Model," *Textile Res. J.* 73:929-933.
Jeon et al. (2004) "Fabricating Complex Three-Dimensional Nanostructures with High Resolution Conformable Phase Masks," *Proc. Natl. Acad. Sci. USA* 101:12428-12433.
Jeon et al. (Aug. 4, 2004) "Three Dimensional Nanofabrication with Rubber Stamps and Conformable Photomasks," *Adv. Mater.* 16(15):1369-1375.
Jiang et al. (1999) "Preparation of Macroporous Metal Films from Colloidal Crystals," *J. Am. Chem. Soc.* 121:7957-7958.
Jiang et al. (2002) "Polymer-on-Polymer Stamping: Universal Approaches to Chemically Patterned Surfaces," *Langmuir* 18:2607-2615.
Jiang et al. (2007) "Mechanical Properties of Robust Ultrathin Silk Fibroin Films," *Adv. Funct. Mater.* 17:2229-2237.
Jiang et al. (Oct. 2, 2007) "Finite Deformation Mechanics in Buckled Thin Films on Compliant Supports," *Proc. Natl. Acad. Sci. USA* 104(40):15607-15612.
Jin et al. (2004) "Scalable Interconnection and Integration of Nanowire Devices Without Registration," *Nano Lett.* 4:915-919.
Jin et al. (2004) "Soft Lithographic Fabrication of an Image Sensor Array on a Curved Substrate," *J. Vac. Sci. Technol. B* 22(5):2548-2551.
Jin et al. (Aug. 2005) "Water-Stable Silk Films with Reduced β-Sheet Content," *Adv. Funct. Mater.* 15(8):1241-1247.
Jin et al. (Web Release Jan. 23, 2004) "Biomaterial Films of *Bombyx mori* Silk Fibroin with Poly(ethylene oxide)," *Biomacromolecules* 5(3):711-717.
Jiyun, C.H. (2003) "Guided Molecular Self-Assembly: A Review of Recent Efforts," *Smart Mater. Struct.* 12:264-271.
Joachim et al. (Nov. 30, 2000) "Electronics Using Hybrid-Molecular and Mono-Molecular Devices," *Nature* 408:541-548.
Johnson et al. (1999) "Ordered Mesoporous Polymers of Tunable Pore Size from Colloidal Silica Templates," *Science* 283:963-965.
Jones et al. (Jul./Aug. 2004) "Stretchable Wavy Metal Interconnects," *J. Vac. Sci. Technol. A* 22(4):1723-1725.
Joo et al. (2006) "Low-Temperature Solution-Phase Synthesis of Quantum Well Structures CdSe Nanoribbons," *J. Am. Chem. Soc.* 128(17):5632-5633.
Jortner et al. (2002) "Nanostructured Advanced Materials Perspectives and Directions," *Pure Appl. Chem.* 74(9):1491-1506.
Joselevich (2002) "Vectorial Growth of Metallic and Semiconducting Single-Wall Carbon Nanotubes," *Nano Lett.*, vol. 2, No. 10, pp. 1137-1141.
Kadish et al. (1988) "Interaction of Fiber Orientation and Direction of Impulse Propagation with Anatomic Barriers in Anisotropic Canine Myocardium," *Circulation.* 78:1478-1494.
Kagan (1999) "Organic-Inorganic Hybrid Materials as Semiconducting Channels in Thin-Film Field-Effect Transistors," *Science* 286:945-947.
Kagan et al. (2001) "Patterning Organic-Inorganic Thin-Film Transistors Using Microcontact Printed Templates," *Appl. Phys Lett.* 79(21):3536-3538.
Kagan et al. (2003) *Thin Film Transistors*, Dekker, New York, pp. 1-34.
Kane et al. (2000) "Analog and Digital Circuits Using Organic Thin-Film Transistors on Polyester Substrates," *IEEE Electron. Dev. Lett.* 21:534-536.
Kang et al. (2007) "Printed Multilayer Superstructures of Aligned Single-Walled Carbon Nanotubes for Electronic Applications," *Nano Lett.* 7(11):3343-3348.
Kang et al. (Apr. 2007) "High-Performance Electronics Using Dense, Perfectly Aligned Arrays of Single-Walled Carbon Nanotubes," *Nat. Nanotechnol.* 2(4):230-236.
Kar et al. (2005) "Controlled Synthesis and Photoluminescence Properties of ZnS Nanowires and Nanoribbons," *J. Phys. Chem. B* 109(8):3298-3302.
Kar et al. (2005) "Synthesis and Optical Properties of CdS Nanoribbons," *J. Phys. Chem B.* 109(41):19134-19138.

(56) References Cited

OTHER PUBLICATIONS

Kar et al. (2006) "Shape Selective Growth of CdS One-Dimensional Nanostructures by a Thermal Evaporation Process," *J. Phys. Chem. B.* 110(10):4542-4547.

Karnik et al. (2003) "Lateral Polysilicon $p^+$-p-$n^+$ and $p^+$-n-$n^+$ Diodes," *Solid-State Electronics* 47:653-659.

Karnik et al. (2003) "Multiple Lateral Polysilicon Diodes as Temperature Sensors for Chemical Microreaction Systems," *Jpn. J. Appl. Phys.* 42:1200-1205.

Kato et al. (2004) The Characteristic Improvement of Si(111) Metal-Oxide-Semiconductor Field-Effect Transistor by Long-Time Hydrogen Annealing,*Jpn. J. Appl. Phys.* 43(10):6848-6853.

Katz et al. (2001) "Synthetic Chemistry for Ultrapure, Processable, and High-Mobility Organic Transistor Semiconductors," *Acc. Chem. Res.* 34:359-369.

Katz, H.E. (2004) "Recent Advances in Semiconductor Performance and Printing Processes for Organic Transistor-Based Electronics," *Chem. Mater.* 16:4748-4756.

Kawata et al. (2001) "Finer Features for Functional Microdevices," *Nature* 412:697-698.

Kellis et al. (2009) "Human Neocortical Electrical Activity Recorded on Nonpenetrating Microwire Arrays: Applicability for Neuroprostheses," *Neurosurg. Focus* 27(1):E9.

Kendall, D.L. (1979) "Vertical Etching of Silicon at Very High Apect Ratios," *Ann. Rev. Mater. Sci.* 9:373-403.

Khakani et al. (2006) "Lateral Growth of Single Wall Carbon Nanotubes on Various Substrates by Means of an 'All-Laser' Synthesis Approach," *Diamond Relat. Mater.* 15:1064-1069.

Khan et al. (1993) "High Electron Mobility Transistor Based on a GaN—$Al_xGa_{1-x}$N Heterojunction," *Appl. Phys. Lett.* 63:1214-1215.

Khang et al. (2006) "A Stretchable Form of Single-Crystal Silicon for High-Performance Electronics on Rubber Substrates," *Science* 311:208-212.

Kilby, J.S. (1976) "Invention of the Integrated Circuit," *IEEE Trans. Electron. Dev.* 23:648-654.

Kim et al. (2000) "Field Emission from Carbon Nanotubes for Displays," *Diamond and Related Mater.* 9(3-6):1184-1189.

Kim et al. (2002) "Nanolithography Based on Patterned Metal Transfer and Its Application to Organic Electronic Devices," *Appl. Phys. Lett.* 80:4051-4053.

Kim et al. (2003) "Epitaxial Self-Assembly of Block Copolymers on Lithographically Defined Nanopatterned Substrates," *Nature* 424:411-414.

Kim et al. (2008) "Stretchable Electronics: Materials Strategies and Devices," *Adv. Mater.* 20:4887-4892.

Kim et al. (2009) "Integrated Wireless Neural Interface Based on the Utah Electrode array," *Biomed. Microdevices* 11:453-466.

Kim et al. (2009) "Optimized Structural Designs for Stretchable Silicon Integrated Circuits," *Small* 5(24):2841-2847.

Kim et al. (Apr. 25, 2008) "Stretchable and Foldable Silicon Integrated Circuits," *Science* 320:507-511.

Kim et al. (Dec. 2, 2008) "Materials and Noncoplanar Mesh Designs for Integrated Circuits with Linear Elastic Responses to Extreme Mechanical Deformations," *Proc. Natl. Acad. Sci. USA* 105(48):18675-18680.

Kim et al. (Jan. 2008) "Complementary Logic Gates and Ring Oscillators Plastic Substrates by Use of Printed Ribbons Single-Crystalline Silicon," *IEEE Electron. Dev. Lett.* 29(1):73-76.

Kim et al. (Jun. 21, 2011) "Unusual Strategies for Using Indium Gallium Nitride Grown on Silicon (111) for Solid-State Lighting," *Proc. Natl. Acad. Sci. USA* 108(25):10072-10077.

Kim et al. (Nov. 15, 1999) "Direct Observation of Electron Emission Site on Boron-Doped Polycrystalline Diamond Thin Films Using an Ultra-High-Vacuum Scanning Tunneling Microscope," *Appl. Phys. Lett.* 75(20):3219-3221.

Kim et al. (Oct. 17, 2010) "Waterproof AlInGaP optoelectronics on stretchable substrates with applications in biomedicine and robotics," *Nature Materials* 9:929-937.

Kim et al. (Oct. 2004) "Organic TFT Array on a Paper Substrate," *IEEE Electron. Dev. Lett.* 25(10):702-704.

Kim et al. (Web Release Apr. 18, 2010) "Dissolvable Films of Silk Fibroin for Ultrathin Conformal Bio-Integrated Electronics," *Nature Materials* 9:511-517.

Kim et al. (Web Release Feb. 29, 2008) "Highly Emissive Self-Assembled Organic Nanoparticles Having Dual Color Capacity for Targeted Immunofluorescence Labeling," *Adv. Mater.* 20(6):1117-1121.

Kim et al. (Web Release Jul. 31, 2008) "Complementary Metal Oxide Silicon Integrated Circuits Incorporating Monolithically Integrated Stretchable Wavy Interconnects," *Appl. Phys. Lett.* 93(4):044102.

Kim et al. (Web Release Jul. 6, 2009) "Ultrathin Silicon Circuits with Strain-Isolation Layers and Mesh Layouts for High-Performance Electronics on Fabric, Vinyl, Leather and Paper," *Adv. Mater.* 21(36):3703-3707.

Kim et al. (Web Release Sep. 29, 2009) "Silicon Electronics on Silk as a Path to Bioresorbable, Implantable Devices," *Appl. Phys. Lett.* 95:133701-133703.

Kim, Y.S. (Web Release Aug, 9, 2005) "Microheater-Integrated Single Gas Sensor Array Chip Fabricated on Flexible Polyimide Substrate," *Sens. Actuators B* 114(1):410-417.

Klauk et al. (2002) "High-Mobility Polymer Gate Dielectric Pentacene Thin Film Transistors," *J. Appl. Phys.* 92:5259-5263.

Klein-Wiele et al. (2003) "Fabrication of Periodic Nanostructures by Phase-Controlled Multiple-Beam Interference," *Appl. Phys. Lett.* 83(23):4707-4709.

Knipp et al. (2003) "Pentacine Thin Film Transistors on Inorganic Dielectrics: Morphology, Structural Properties, and Electronic Transport," *Appl. Phys. Lett.* 93:347-355.

Ko et al. (2006) "Bulk Quantities of Single-Crystal Silicon Micro-/Nanoribbons Generated from Bulk Wafers," *Nano Lett.* 6(10):2318-2324.

Ko et al. (2010) "Flexible Carbon Nanofiber Connectors with Anisotropic Adhesion Properties," *Small* 6:22-26.

Ko et al. (Aug. 7, 2008) "A Hemispherical Electronic Eye Camera Based on Compressible Silicon Optoelectronics," *Nature* 454:748-753.

Ko et al. (Web Release Oct. 28, 2009) "Curvilinear Electronics Formed Using Silicon Membrane Circuits and Elastomeric Transfer Elements," *Small* 5(23):2703-2709.

Kocabas et al. (2004) "Aligned Arrays of Single-Walled Carbon Nanotubes Generated from Random Networks by Orientationally Selective Laser Ablation," *Nano Lett.*, vol. 4, No. 12, pp. 2421-2426.

Kocabas et al. (2005) "Guided Growth of Large-Scale, Horizontally Aligned Arrays of Single-Walled Carbon Nanotubes and Their Use in Thin-Film Transistors," *Small* 1(11):1110-1116.

Kocabas et al. (2006) "Large Area Aligned Arrays of SWNTs for High Performance Thin Film Transistors," American Physical Society, APS March Meeting, Mar. 13-17, Abstract # W31.004.

Kocabas et al. (2006) "Spatially Selective Guided Growth of High-Coverage Arrays and Random Networks of Single-Walled Carbon Nanotubes and Their Integration into Electronic Devices," *J. Am. Chem. Soc.* 128:4540-4541.

Kocabas et al. (2007) "Experimental and Theoretical Studies of Transport Through Large Scale, Partially Aligned Arrays of Single-Walled Carbon Nanotubes in Thin Film Type Transistors," *Nano Lett.* 7(5):1195-1202.

Kocabas et al. (Feb. 5, 2008) "Radio Frequency Analog Electronics Based on Carbon Nanotube Transistors," *Proc. Natl. Acad. Sci. USA* 105(5):1405-1409.

Kodambaka et al. (2006) "Control of Si Nanowire Growth by Oxygen," *Nano Lett.* 6(6):1292-1296.

Koide et al. (2000) "Patterned Luminescence of Organic Light-Emitting Diodes by Hot Microcontact Printing (HμCP) of Self-Assembled Monolayers," *J. Am. Chem. Soc.* 122:11266-11267.

Konagai et al. (1978) "High Efficiency GaAs Thin Film Solar Cells by Peeled Film Technology," *J. Cryst. Growth* 45:277-280.

Kong et al. (2004) "Single-Crystal Nanorings Formed by Epitaxial Self-Coating of Polar Nanobelts," *Science* 303:1348-1351.

Kong et al. (Jan. 28, 2000) "Nanotube Molecular Wires as Chemical Sensors," *Science* 287:622-625.

(56) References Cited

OTHER PUBLICATIONS

Kong et al. (Oct. 2003) "Structure of Indium Oxide Nanobelts," *Solid State Commun.* 128(1):1-4.
Kong et al. (Oct. 29, 1998) "Synthesis of Individual Single-Walled Carbon Nonotubes on Patterned Silicon Wafers," *Nature* 395:878-881.
Kudo et al. (Web Release Jun. 13, 2006) "A Flexible and Wearable Glucose Sensor Based on Functional Polymers with Soft-MEMS Techniques," *Biosens. Bioelectron.* 22:558-562.
Kulkarni et al. (2002) "Mesoscale Organization of Metal Nanocrystals," *Pure Appl. Chem* 74(9):1581-1591.
Kumar et al. (1993) "Features of Gold Having Micrometer to Centimeter Dimensions can be Formed Through a Combination of Stamping with an Elastomeric Stamp and an Alkanethiol "Ink" Followed by Chemical Etching," *Appl. Phys. Lett.* 63(4):2002-2004.
Kumar et al. (1994) "Patterning Self-Assembled Monolayers: Applications in Materials Science," *Langmuir* 10:1498-1511.
Kumar et al. (2002) "Thermally-Stable Low-Resistance Ti/Al/Mo/Au Multilayer Ohmic Contacts on n-GaN," *J. Appl. Phys.* 92:1712-1714.
Kumar et al. (2005) "Percolating in Finite Nanotube Networks," *Phys. Rev. Lett.*, 95, 066802.
Kuo et al. (1985) "Effect of Mismatch Strain on Band Gap in III-V Semiconductors," *J. Appl. Phys.* 57:5428-5432.
Kuykendall et al. (Aug. 2004) "Crystallographic Alignment of High Density Gallium Nitride Nanowire Arrays," *Nat. Mater.* 3:524-528.
Lacour et al. (2005) "Stretchable Interconnects for Elastic Electronic Surfaces," *Proc. IEEE* 93:1459-1467.
Lacour et al. (2010) "Flexible and Stretchable Micro-Electrodes for in Vitro and n Vivo Neural Interfaces," *Med. Biol. Eng. Comput.* 48:945-954.
Lacour et al. (Apr. 14, 2003) "Stretchable Gold Conductors on Elastomeric Substrates," *Appl. Phys. Lett.* 82(15):2404.
Lacour et al. (Apr. 2004) "Design and Performance of Thin Metal Film Interconnects for Skin-Like Electronic Circuits," *IEEE Electron. Dev. Lett.* 25(4):179-181.
Lacour et al. (Dec. 2004) "An Elastically Stretchable TFT Circuit," *IEEE Electron Dev. Lett.* 25(12):792-794.
Lacour et al. (Web Release Jul. 14, 2006) "Stiff Subcircuit Islands of Diamondlike Carbon for Stretchable Electronics," *J. Appl. Phys.* 100:014913.
Lacour et al. (Web Release May 16, 2006) "Mechanisms of Reversible Stretchability of Thin Metal Films on Elastomeric Substrates," *Appl. Phys. Lett.* 88:204103.
Laimer et al. (Mar. 1997) "Diamond Growth in a Direct-Current Low-Pressure Supersonic Plasmajet," *Diamond Relat. Mater.* 6:406-410.
Lambacher et al. (2004) "Electrical Imaging of Neuronal Activity by Multi-Transistor-Array (MTA) Recording at 7.8 µm Resolution," *Appl. Phys. A* 79:1607-1611.
Landes et al. (2002) "Some Properties of Spherical and Rod-Shaped Semiconductor and Metal Nanocrystals," *Pure Appl. Chem.* 74(9):1675-1692.
Law et al. (2004) "Semiconductor Nanowires and Nanotubes," *Ann. Rev. Mater. Res.* 34:83-122.
Law et al. (Aug. 27, 2004) "Nanoribbon Waveguides for Subwavelength Photonics Integration," *Science* 305:1269-1273.
Lawrence et al. (2008) "Bioactive Silk Protein Biomaterial Systems for Optical Devices," *Biomacromolecules* 9:1214-1220.
Lay et al. (2004) "Simple Route to Large-Scale Ordered Arrays of Liquid-Deposited Carbon Nanotubes," *Nano Lett.*, vol. 4, No. 4, pp. 603-606.
Leclercq et al. (1998) "III-V Micromachined Devices for Microsystems," *Microelectronics J.* 29:613-619.
Lecomte et al. (Apr. 2006) "Degradation Mechanism of Diethylene Glycol Units in a Terephthalate Polymer," *Polym. Degrade. Stab.* 91(4):681-689.
Lee et al. (2000) "Thin Film Transistors for Displays on Plastic Substrates," *Solid State Electron.* 44:1431-1434.
Lee et al. (2003) "High-Performance Poly-Si TFTs on Plastic Substrates Using a Nano-Structured Separation Layer Approach," *IEEE Elec. Dev. Lett.* 24:19-21.
Lee et al. (2004) "Organic Light-Emitting Diodes Formed by Soft Contact Lamination," *Proc. Natl. Acad. Sci. USA* 101(2):429-433.
Lee et al. (2005) "A Printable Form of Single-Crystalline Gallium Nitride for Flexible Optoelectronic Systems," *Small* 1:1164-1168.
Lee et al. (2005) "Large-Area, Selective Transfer of Microstructured Silicon (µs-Si): A Printing-Based Approach to High-Performance Thin-Film Transistors Supported on Flexible Substrates," *Adv. Mater.* 17:2332-2336.
Lee et al. (2006) "Micron and Submicron Patterning of Polydimethylsiloxane Resists on Electronic Materials by Decal Transfer Lithography and Reactive Ion-Beam Etching: Application to the Fabrication of High-Mobility, Thin-Film Transistors," *Appl. Phys. Lett.* 100:084907/1-7.
Lee et al. (Apr. 2005) "Fabrication of Stable Metallic Patterns Embedded in Poly(dimethylsiloxane) and Model Applications in Non-Planar Electronic and Lab-on-a-Chip Device Patterning," *Adv. Funct. Mater.* 15(4):557-566.
Lee et al. (Dec. 1999) "The Surface/Bulk Micromachining (SBM) Process: A New Method for Fabricating Released MEMS in Single Crystal Silicon," *J. Microelectromech. Syst.* 8(4):409-416.
Lee et al. (Feb. 2001) "Application of Carbon Nanotubes to Field Emission Displays," *Diamond and Related Mater.* 10(2):265-270.
Lee et al. (Feb. 2005) "Weave Patterned Organic Transistors on Fiber for E-Textiles," *IEEE Trans. Electron. Dev.* 52(2):269-275.
Leong et al. (2009) "Tetherless Thermobiochemicall Actuated Microgrippers," *Proc. Natl. Acad. Sci. USA* 106:703-709.
Létant et al. (Jun. 2003) "Functionalized Silicon Membranes for Selective Bio-Organisms Capture," *Nat. Mater.* 2:391-395.
Li et al. (2002) "High-Resolution Contact Printing with Dendrimers," *Nano Lett.* 2(4):347-349.
Li et al. (2003) "Ultrathin Single-Crystalline-Silicon Cantilever Resonators: Fabrication Technology and Significant Specimen Size effect on Young's Modulus," *Appl. Phys. Lett.* 83:3081-3083.
Li et al. (2004) "Electrospinning of Nanofibers: Reinventing the Wheel," *Adv. Mater.* 16(14):1151-1170.
Li et al. (2006) "Catalyst-Assisted Formation of Nanocantilever Arrays on ZnS Nanoribbons by Post-Annealing Treatment," *J. Phys. Chem. B* 110(13):6759-6762.
Li et al. (Dec. 2005) "Compliant Thin Film Patterns of Stiff Materials as Platforms for Stretchable Electronics," *J. Mater. Res.* 20(12):3274-3277.
Li et al. (Jul. 1, 2002) "ZnO Nanobelts Grown on Si Substrate," *Appl. Phys. Lett.* 81:144-146.
Lieber, C. (2001) "The Incredible Shrinking Circuit," *Sci. Am.* 285(3):58-64.
Lieber, C.M. (2003) "Nanoscale Science and Technology: Building a Big Future from Small Things," *MRS Bull.* 28:486-491.
Lim et al. (2005) "Flexible Membrane Pressure Sensor," *Sens. Act. A* 119:332-335.
Lima et al. (2007) "Creating Micro- and Nanostructures on Tubular and Spherical Surfaces," *J. Vac. Sci. Technol. B* 25(6):2412-2418.
Lin et al. (Sep. 2005) "High-Performance Carbon Nanotube Field-Effect Transistor With Tunable Polarities," *IEEE Trans. Nano* 4(5):481-489.
Linder et al. (1994) "Fabrication Technology for Wafer Through-Hole Interconnections and Three-Dimensional Stacks of Chips and Wafers," *Proc. IEEE Micro. Electro Mech. Syst.* 349-354.
Ling et al. (2004) "Thin Film Deposition, Patterning, and Printing in Organic Thin Film Transistors," *Chem. Mater.* 16:4824-4840.
Liu et al. (1999) "Controlled deposition of individual single-walled carbon nanotubes on chemically functionalized templates," *Chem. Phys. Lett.*, 303:125-129.
Long et al. (1990) "Heterostructure FETs and Bipolar Transistors," In; *Gallium Arsenide Digital Integrated Circuit Design*, McGraw-Hill, New York, pp. 58-69.
Loo et al. (2002) "Additive, Nanoscale Patterning of Metal Films with a Stamp and a Surface Chemistry Mediated Transfer Process: Applications in Plastic Electronics," *Appl. Phys. Lett.* 81:562-564.

(56) References Cited

OTHER PUBLICATIONS

Loo et al. (2002) "High-Resolution Transfer Printing on GaAs Surfaces Using Alkane Dithiol Monolayers," *J. Vac. Sci. Technol. B* 20(6):2853-2856.

Loo et al. (2002) "Interfacial Chemistries for Nanoscale Transfer Printing," *J. Am. Chem. Soc.* 124:7654-7655.

Loo et al. (2002) "Soft, Conformable Electrical Contacts for Organic Semiconductors: High-Resolution Plastic Circuits by Lamination," *Proc. Natl. Acad. Sci. USA* 99(16):10252-10256.

Loo et al. (2003) "Electrical Contacts to Molecular Layers by Nanotransfer Printing," *Nano Lett.* 3(7):913-917.

Lopes et al. (Sep. 2004) "Thermal Conductivity of PET/(LDPE/Al) Composites Determined by MDSC," *Polym. Test.* 23(6):637-643.

Lu et al. (Apr. 2010) "Water-Insoluble Silk Films with Silk I Structure," *Acta Biomater.* 6(4):1380-1387.

Lu et al. (Dec. 2006) "Electronic Materials—Buckling Down for Flexible Electronics," *Nat. Nanotechnol.* 1:163-164.

Lu et al. (Jul. 19, 2005) "One Dimensional Hole Gas in Germanium/Silicon Nanowire Heterostructures," *Proc. Nat. Acad. Sci. USA* 102(29):10046-10051.

Lu et al. (Nov. 2008) "Nanowire Transistor Performance Limits and Applications," *IEEE Trans Electron Dev.* 55(11):2859-2876.

Luan et al. (1992) "An Experimental Study of the Source/Drain Parasitic Resistance Effects in Amorphous Silicon Thin Film Transistors," *J. Appl. Phys.* 72:766-772.

Ma et al. (2004) "Single-Crystal CdSe Nanosaws," *J. Am. Chem. Soc.* 126(3):708-709.

Mack et al. (2006) "Mechanically Flexible Thin-Film Transistors that Use Ultrathin Ribbons of Silicon Derived from Bulk Wafers," *Appl. Phys. Lett.* 88:213101.

Madou, M. (1997) "Etch-Stop Techniques," In; *Fundamentals of Microfabrication*, CRC Press, New York, pp. 193-199.

Maikap et al. (2004) "Mechanically Strained-Si NMOSFETs," *IEEE Electron. Dev. Lett.* 25:40-42.

Maldovan et al. (2004) "Diamond-Structured Photonic Crystals," *Nature Materials* 3:593-600.

Mandlik et al. (Aug. 2006) "Fully Elastic Interconnects on Nanopatterned Elastomeric Substrates," *IEEE Electron Dev. Lett.* 27(8):650-652.

Manna et al. (Web Release May 25, 2003) "Controlled Growth of Tetrapod-Branched Inorganic Nanocrystals," *Nat. Mater.* 2:382-385.

Markovich et al. (1999) "Architectonic Quantum Dot Solids," *Acc. Chem. Res.* 32:415-423.

Marquette et al. (2004) "Conducting Elastomer Surface Texturing: A Path to Electrode Spotting Application to the Biochip Production," *Biosens. Bioelectron.* 20:197-203.

Martensson et al. (2004) "Nanowire Arrays Defined by Nanoimprint Lithography," *Nano Lett.* 4:699-702.

Martin, C.R. (1995) "Template Synthesis of Electronically Conductive Polymer Nanostructures," *Acc. Chem. Res.* 28:61-68.

Mas-Torrent et al. (2006) "Large Photoresponsivity in High-Mobility Single-Crystal Organic Field-Effect Phototransistors," *ChemPhysChem* 7:86-88.

Masuda et al. (2000) "Fabrication of Ordered Diamonds/Metal Nanocomposite Structures," *Chem. Lett.* 10:1112-1113.

Matsunaga et al. (2003) "An Improved GaAs Device Model for the Simulation of Analog Integrated Circuit," *IEEE Trans. Elect. Dev.* 50:1194-1199.

McAlpine et al. (2003) "High-Performance Nanowire Electronics and Photonics on Glass and Plastic Substrates," *Nano Lett.* 3:1531-1535.

McAlpine et al. (2005) "High-Performance Nanowire Electronics and Photonics and Nanoscale Patterning on Flexible Plastic Substrates," *Proc. IEEE* 93:1357-1363.

McCaldin et al. (1971) "Diffusivity and Solubility of Si in the Al Metallization of Integrated Circuits," *Appl. Phys. Lett.* 19:524-517.

Mehring C. et al. (2003) Inference of hand movements from local field potentials in monkey motor cortex. *Nature Neurosci.* 6, 1253-1254.

Meisel et al. (2004) "Three-Dimensional Photonic Crystals by Holographic Lithography Using the Umbrella Configuration: Symmetries and Complete Photonic Band Gaps," *Phys. Rev. B.* 70:165101:1-10.

Meitl et al. (2004) "Solution Casting and Transfer Printing Single-Walled Carbon Nanotube Films," *Nano Lett.* 4:1643-1647.

Meitl et al. (2006) "Transfer Printing by Kinetic Control of Adhesion to an Elastomeric Stamp," *Nat. Mater.* 5:33-38.

Meitl et al. (Web Release Feb. 22, 2007) "Stress Focusing for Controlled Fracture in Microelectromechanical Systems," *Appl. Phys. Lett.* 90:083110.

Melosh et al. (2003) "Ultrahigh-Density Nanowire Lattices and Circuits," *Science* 300:112-115.

Menard et al. (2004) "A Printable Form of Silicon for High Performance Thin Film Transistors on Plastic Substrates," *Appl. Phys. Lett.* 84:5398-5400.

Menard et al. (2004) "Improved Surface Chemistries, Thin Film Deposition Techniques, and Stamp Designs for Nanotransfer Printing," *Langmuir* 20:6871-6878.

Menard et al. (2004) "High-Performance n- and p-Type Single-Crystal Organic Transistors with Free-Space Gate Dielectrics," *Adv. Mat.* 16:2097-2101.

Menard et al. (2005) "Bendable Single Crystal Silicon Thin Film Transistors Formed by Printing on Plastic Substrates," *Appl. Phys. Lett.* 86(093507):1-3.

Menard et al. (2007) Micro- and Nanopatterning Techniques for Organic Electronic and Optoelectronic Systems, *Chem. Rev.* 107:1117-1160.

Miao et al. (2003) "Micromachining of Three-Dimensional GaAs Membrane Structures Using High-Energy Nitrogen Implantation," *J. Micromech. Microeng.* 13:35-39.

Michalske et al. (1985) "Closure and Repropagation of Healed Cracks in Silicate Glass," *J. Am. Ceram. Soc.* 68:586-590.

Michel et al. (2001) Printing Meets Lithography: Soft Approaches to High-Resolution Printing, *IBM J. Res. Dev.* 45:697-719.

Miller et al. (2002) "Direct Printing of Polymer Microstructures on Flat and Spherical Surfaces Using a Letterpress Technique," *J. Vac. Sci. Technol. B* 20(6):2320-2327.

Milliron et al. (2004) "Colloidal Nanocrystal Heterostructures with Linear and Branched Topology," *Nature* 430:190-195.

Min, G. (Apr. 4, 2003) "Plastic Electronics and Their Packaging Technologies," *Syn. Metals.* 135:141-143.

Minev et al. (2010) "Impedance Spectroscopy on Stretchable Microelectrode Arrays," *Appl. Phys. Lett.* 97:043707.

Mirkin et al. (2001) "Emerging Methods for Micro- and Nanofabrication," *MRS Bulletin* 26(7):506-507.

Misewich et al. (May 2, 2003) "Electronically Induced Optical Emission from a Carbon Nanotube FET," *Science* 300:783-786.

Mishra et al. (2002) "AlGaN/GaN HEMTs—an Overview of Device Operation and Applications," *Proc. IEEE* 90:1022-1031.

Mitzi et al. (2004) "High-Mobility Ultrathin Semiconducting Films Prepared by Spin Coating," *Nature* 428:299-303.

Moon et al. (2002) "Ink-Jet Printing of Binders for Ceramic Components," *J. Am. Ceram. Soc.* 85:755-762.

Moore et al. (Sep. 9, 2003) "Individually Suspended Single-Walled Carbon Nanotubes in Various Surfactants," *Nano Lett.* 3(10):1379-1382.

Morales et al. (Jan. 9, 1998) "A Laser Ablation Method for the Synthesis of Crystalline Semiconductor Nanowires," *Science* 279:208-211.

Morent et al. (2007) "Adhesion Enhancement by a Dielectric Barrier Discharge of PDMS used for Flexible and Stretchable Electronics," *J. Phys. D. Appl. Phys.* 40:7392-7401.

Mori et al. (1978) "A New Etching Solution System, $H_3PO_4$—$H_2O_2$—$H_2O$, for GaAs and Its Kinetics," *J. Electrochem. Soc.* 125:1510-1514.

Morkoc et al. (1995) "High-Luminosity Blue and Blue-Green Gallium Nitride Light-Emitting Diodes," *Science* 267:51-55.

Morkved et al. (1994) "Mesoscopic Self-Assembly of Gold Islands on Diblock-Copolymer Films," *Appl. Phys. Lett.* 64:422-424.

Morra et al. (1990) "On the Aging of Oxygen Plasma-Treated Polydimthylsiloxane Surfaces," *J. Colloid Interface Sci.* 137:11-24.

(56) References Cited

OTHER PUBLICATIONS

Murakami et al. (2005) "Polarization Dependence of the Optical Absorption of Single-Walled Carbon Nanotubes," *Phys. Rev. Lett.*, 94, 087402.

Murphy et al. (2008) "Modification of Silk Fibroin Using Diazonium Coupling Chemistry and the Effects on hMSC Proliferation and Differentiation," *Biomaterials* 29:2829-2838.

Namazu et al. (2000) "Evaluation of Size Effect on Mechanical Properties of Single Crystal Silicon by Nanoscale Bending Test Using AFM," *J. MEMS* 9:450-459.

Nath et al. (2002) "Nanotubes of the Disulfides of Groups 4 and 5 Metals," *Pure Appl. Chem.* 74(9):1545-1552.

Nathan et al. (2000) "Amorphous Silicon Detector and Thin Film Transistor Technology for Large-Area Imaging of X-Rays," *Microelectron J.* 31:883-891.

Nathan et al. (2002) "Amorphous Silicon Technology for Large Area Digital X-Ray and Optical Imaging," *Microelectronics Reliability* 42:735-746.

Newman et al. (2004) "Introduction to Organic Thin Film Transistors and Design of n-Channel Organic Semiconductors," *Chem. Mater.* 16:4436-4451.

Nirmal et al. (1999) "Luminescence Photophysics in Semiconductor Nanocrystals," *Acc. Chem. Res.* 32:407-414.

Noda et al. (1996) "New Realization Method for Three-Dimensional Photonic Crystal in Optical Wavelength Region," *Jpn. J. Appl. Phys.* 35:L909-L912.

Nomura et al. (2004) "Room-Temperature Fabrication of Transparent Flexible Thin-Film Transistors Using Oxide Semiconductors," *Nature* 432:488-492.

Notice of Reasons for Rejection, Corresponding to Japanese Patent Application No. P2006-165159, Dispatched Apr. 24, 2012.

Novoselov et al. (Oct. 22, 2004) "Electric Field Effect in Atomically Thin Carbon Films," *Science* 306:666-669.

O'Connell et al. (Jul. 26, 2002) "Bang Gap Fluorescence from Individual Single-Walled Carbon Nanotubes," *Science* 297:593-596.

O'Riordan et al. (2004) "Field Configured Assembly: Programmed Manipulation and Self-Assembly at the Mesoscale," *Nano Lett.* 4:761-765.

Odom et al. (2002) "Improved Pattern Transfer in Soft Lithography Using Composite Stamps," *Langmuir* 18(13):5314-5320.

Office Action and Response, Corresponding to Malaysian Patent Publication No. PI 20052553, dated Mar. 13, 2009 and Dec. 8, 2009.

Office Action and Response, Corresponding to U.S. Appl. No. 11/423,287, dated Feb. 13, 2008.

Office Action and Response, Corresponding to U.S. Appl. No. 11/421,654, dated Sep. 29, 2009.

Office Action and Response, Corresponding to U.S. Appl. No. 11/858,788, dated Jan. 28, 2011.

Office Action Corresponding to Chinese Patent Application No. 200780049982.1, dated May 12, 2010.

Office Action Corresponding to Chinese Patent Application No. 200680019640.0, dated Nov. 3, 2010.

Office Action Corresponding to Japanese Patent Application No. P2007-515549, dated Dec. 20, 2011.

Office action Corresponding to Korean Patent Application No. 10-2006-7010632, dated Nov. 22, 2007.

Office Action Corresponding to Taiwanese Patent Application No. 095121212, dated May 7, 2010.

Office Action, Corresponding to Chinese Patent Application No. 200780048002.6, dated Apr. 13, 2010.

Office Action, Corresponding to Chinese Patent Application No. 200580013574.1, dated May 11, 2010.

Office Action, Corresponding to Indian Patent Application No. 1366/DEL/2006, dated Jun. 10, 2011.

Office Action, Corresponding to U.S. Appl. No. 12/405,475, dated Jun. 8, 2011.

Office Actions and Responses, Corresponding to U.S. Appl. No. 11/145,542, dated between Apr. 5, 2007 and Dec. 23, 2008.

Office Actions and Responses, Corresponding to U.S. Appl. No. 11/981,380, dated Sep. 23, 2010.

Office Actions Corresponding to Chinese Patent Application No. 200480035731.4, dated Mar. 27, 2009 and Dec. 3, 2010.

Office Actions Corresponding to U.S. Appl. No. 11/851,182, dated Apr. 1, 2010, Oct. 29, 2010 and Jun. 7, 2011.

Office Actions, Corresponding to Chinese Patent Application No. 200580018159.5, dated Jan. 23, 2009 and Feb. 12, 2010.

Ohzono et al. (2004) "Ordering of Microwrinkle Patterns by Compressive Strain," *Phys. Rev. B* 69(13):132202.

Ohzono et al. (Web Release Jul. 7, 2005) "Geometry-Dependent Stripe Rearrangement Processes Induced by Strain on Preordered Microwrinkle Patterns," *Langmuir* 21(16):7230-7237.

Omenetto et al. (2008) "A New Route for Silk," *Nature Photon.* 2:641-643.

Ong et al. (2004) "High-Performance Semiconducting Polythiophenes for Organic Thin-Film Transistors," *J. Am. Chem. Soc.* 126:3378-3379.

Ong et al. (2005) "Design of High-Performance Regioregular Polythiophenes for Organic Thin-Film Transistors," *Proc. IEEE* 93:1412-1419.

Origin Energy (May 2004) "Fact Sheet—Sliver Cells,", www.originenergy.com.au/sliver.

Ouyang et al. (2002) "High-Performance, Flexible Polymer Light-Emitting Diodes Fabricated by a Continuous Polymer Coating Process," *Adv. Mat.* 14:915-918.

Ouyang et al. (2008) "High Frequency Properties of Electro-Textiles for Wearable Antenna Applications," *IEEE Trans. Antennas Propag.* 56(2):381-389.

Ouyang et al. (Web Release Mar. 20, 2000) "Conversion of Some Siloxane Polymers to Silicon Oxide by UV/Ozone Photochemical Processes," *Chem. Mater.* 12(6):1591-1596.

Overholt et al. (2005) "Photodynamic Therapy for Esophageal Cancer using a 180° Windowed Esophageal Balloon," *Lasers in Surg. Med.* 14:27-33.

Pan et al. (2001) "Nanobelts of Semiconducting Oxides," *Science* 291:1947-1949.

Panev et al. (2003) "Sharp Excitation from Single InAs Quantum Dots in GaAs Nanowires," *Appl. Phys. Lett.* 83:2238-2240.

Pardo et al. (2000) "Application of Screen Printing in the Fabrication of Organic Light-Emitting Devices," *Adv. Mater.* 12(17):1249-1252.

Park et al. (1997) "Block Copolymer Lithography: Periodic Arrays of ~$10^{11}$ Holes in 1 Square Centimeter," *Science* 276:1401-1404.

Park et al. (1998) "Fabrication of Three-Dimensional Macroporous Membranes with Assemblies of Microspheres as Templates," *Chem. Mater.* 10:1745-1747.

Park et al. (Aug. 2009) "Printed Assemblies of Inorganic Light-Emitting Diodes for Deformable and Semitransparent Displays," *Science* 325:977-981.

Park et al. (Web Release Feb. 22, 2009) "Biodegradable Luminescent Porous Silicon Nanoparticles for in Vivo Applications," *Nature Mater.* 8:331-336.

Parker et al. (2009) "Biocompatible Silk Printed Optical Waveguides," *Adv. Mater.* 21:2411-2415.

Patolsky et al. (2006) "Stimulation, and Inhibition of Neuronal Signals with High-Density Nanowire Transistor Arrays," *Science* 313:1100-1104.

Patton et al. (Mar. 1998) "Effect of Diamond like Carbon Coating and Surface Topography on the Performance of Metal Evaporated Magnetic Tapes," *IEEE Trans Magn.* 34(2):575-587.

Paul et al. (Apr. 2003) "Patterning Spherical Surfaces at the Two Hundred Nanometer Scale Using Soft Lithography," *Adv. Func. Mater.* 13(4):259-263.

Pearton et al. (1999) "GaN: Processing, Defects, and Devices," *J. Appl. Phys.* 86:1-78.

Peng et al. (Mar. 2, 2000) "Shape Control of CdSe Nanocrystals," *Nature* 404:59-61.

Perry et al. (2008) "Nano- and Micropatterning of Optically Transparent, Mechanically Robust, Biocompatible Silk Fibroin Films," *Adv. Mater.* 20:3070-3072.

Piazza et al. (2005) "Protective Diamond-Like Carbon Coatings for Future Optical Storage Disks," *Diamond Relat. Mater.* 14:994-999.

(56) References Cited

OTHER PUBLICATIONS

Pimparkar et al. (Feb. 2007) "Current-Voltage Characteristics of Long-Channel Nanobundle Thin-Film Transistors: A 'Bottom-Up' Perspective," *IEEE Electron Dev. Lett.* 28(2):157-160.
Podzorov et al. (2005) "Hall Effect in the Accumulation Layers on the Surface of Organic Semiconductors," *Phys. Rev. lett.* 95:226601.
Pushpa et al. (2002) "Stars and Stripes. Nanoscale Misfit Dislocation Patterns on Surfaces," *Pure Appl. Chem.* 74(9):1663-1671.
Qian et al. (2006) "Scaling Effects of Wet Adhesion in Biological Attachment Systems," *Acta Biomaterialia* 2:51-58.
Quake et al (2000) "From Micro- to Nanofabrication with Soft Materials," *Science* 290:1536-1540.
Radtke et al. (Feb. 5, 2007) "Laser-Lithography on Non-Planar Surfaces," *Opt. Exp.* 15(3):1167-1174.
Raman et al. (1989) "Study of Mesa Undercuts Produced in GaAs with $H_3PO_4$-Based Etchants," *J. Electrochem. Soc.* 136:2405-2410.
Randall et al. (2005) "Permeation-driven flow in poly(dimethylsiloxane) microfluidic devices," *Proc. Nat. Acad. Sci. USA* 102(31):10813-10818.
Rao et al. (2003) "Large-scale assembly of carbon nanotubes," *Nature*, 425:36-37.
Razavi et al. (2009) "Three Dimensional Nanopillar Array Photovoltaics on Low Cost and Flexible Substrates," *Nature Materials* 8:648-653.
Razeghi et al. (1994) "High-Power Laser Diode Based on InGaAsP Alloys," *Nature* 369:631-633.
Razouk et al. (Sep. 1979) "Dependence of Interface State Density on Silicon Thermal Oxidation Process Variables," *J. Electrochem. Soc.* 126(9):1573-1581.
Reuss et al. (Jul. 2005) "Macroelectronics: Perspectives on Technology and Applications," *Proc. IEEE* 93(7):1239-1256.
Reuss et al. (Jun. 2006) "Macroelectronics," *MRS Bull.* 31:447-454.
Ribas et al. (1998) "Bulk Micromachining Characterization of 1.2 µm HEMT MMIC Technology for GaAs MEMS Design," *Mater. Sci. Eng. B* 51:267-273.
Ridley et al. (1999) "All-Inorganic Field Effect Transistors Fabricated by Printing," *Science* 286:746-749.
Roberts et al. (1979) "Looking at Rubber Adhesion," *Rubber Chem. Technol.* 52:23-42.
Roberts et al. (Mar. 2006) "Elastically Relaxed Free-Standing Strained-Silicon Nanomembranes," *Nat. Mater.* 5:388-393.
Robinson et al. (1983) "GaAs Readied for High-Speed Microcircuits," *Science* 219:275-277.
Roelkens et al. (Dec. 2005) "Integration of InP/InGaAsP Photodetectors onto Silicon-on-Insulator Waveguide Circuits," *Optics Express* 13(25):10102-10108.
Rogers et al. (1997) "Using an Elastomeric Phase Mask for Sub-100 nm Photolithography in the Optical Near Field," *Appl. Phys. Lett.* 70:2658-2660.
Rogers et al. (1998) "Generating ~90 Nanometer Features Using Near Field Contact Mode Photolithography with an Elastomeric Phase Mask," *J. Vac. Sci. Technol.* 16(1):59-68.
Rogers et al. (1998) "Quantifying Distortions in Soft Lithography," *J. Vac. Sci. Technol.* 16:88-97.
Rogers et al. (1998) "Using Printing and Molding Techniques to Produce Distributed Feedback and Bragg Reflector Resonators for Plastic Lasers," *Appl. Phys. Lett.* 73:1766-1768.
Rogers et al. (1999) Printing Process Suitable for Reel-to-Reel Production of High-Performance Organic Transistors and Circuits, *Adv. Mater.* 11(9):741-745.
Rogers et al. (2002) "Paper-Like Electronic Displays: Large-Area Rubber-Stamped Plastic Sheets of Electronics and Microencapsulated Electrophoretic Inks," *Proc. Nat. Acad. Sci. USA* 98:4835-4840.
Rogers et al. (2002) "Printed Plastic Electronics and Paperlike Displays," *J. Polym. Sci. Part A. Polym. Chem.* 40:3327-3334.
Rogers et al. (Mar. 2000) "Organic Smart Pixels and Complementary Inverter Circuits Formed on Plastic Substrates by Casting and Rubber Stamping," *IEEE Electron Dev. Lett.* 21(3):100-103.
Rogers, J.A. (2001) "Rubber Stamping for Plastic Electronics and Fiber Optics," *MRS Bulletin* 26(7):530-534.
Rogers, J.A. (2001) "Toward Paperlike Displays," *Science* 291:1502-1503.
Rosenblatt et al. (2002) "High Performance Electrolyte Gated Carbon Nanotube Transistors," *Nano Lett.* 2(8):869-872.
Rotkin et al. (2003) "Universal Description of Channel Conductivity for Nanotube and Nanowire Transistors," *Appl. Phys. Lett.* 83:1623-1625.
Roundy et al. (2003) "Photonic Crystal Structure with Square Symmetry within Each Layer and a Three-Dimensional Band Gap," *Appl. Phys Lett.* 82:3835-3837.
Rubehn et al. (2009) "A MEMS based Flexible Multichannel ECoG-Electrode Array," *J. Neural Eng.* 6:036003.
Ruchehoeft et al. (2000) "Optimal Strategy for Controlling Linewidth on Spherical Focal Surface Arrays," *J. Vac. Sci. Technol. B* 18(6):3185-3189.
Ryu et al. (2009) "Human Cortical Prostheses: Lost in Translation?" *Neurosurg Focus* 27(1):E5.
Samuelson et al. (2004) "Semiconductor Nanowires for Novel One-Dimensional Devices," *Physica E* 21:560-567.
Sangwal et al. (1997) "Nature of multilayer steps on the {100} cleavage planes of MgO single crystals," *Surf. Sci.*, 383:78-87.
Santin et al. (1999) "In vitro Evaluation of the Inflammatory Potential of the Silk Fibroin," *J. Biomed. Mater. Res.* 46:382-389.
Sanyal et al. (2002) "Morphology of NanostructureD Materials," *Pure Appl. Chem.* 74(9):1553-1570.
Sazonov et al. (2005) "Low-Temperature Materials and Thin-Film Transistors for Flexible Electronics," *Proc. IEEE* 93:1420-1428.
Scherlag et al. (1969) "Catheter Technique for Recording His Bundle Activity in Man," *Circulation* 39:13-18.
Schermer et al. (Web Release Apr. 28, 2005) "Thin-Film GaAs Epitaxial Lift-Off Solar Cells for Space Applications," *Prog. Photovoltaics: Res. Applic.* 13:587-596.
Schermer et al. (Web Release Jan. 19, 2006) "Photon Confinement in High-Efficiency, Thin-Film III-V Solar Cells Obtained by Epitaxial Lift-Off," *Thin Solid Films* 511-512:645-653.
Schindl et al. (2003) "Direct Stimulatory Effect of Low-Intensity 670-nm Laser Irradiation on Human Endothelial Cell Proliferation," *Br. J. Dermatol.* 148:334-336.
Schlegel et al. (2002) "Structures of quartz (1010)- and (1011)- water interfaces determined by X-ray reflectivity and atomic force microscopy of natural growth surfaces," *Geochim. Cosmochim. Acta*, vol. 66, No. 17, pp. 3037-3054.
Schmid et al. (2003) "Preparation of Metallic Films on Elastomeric Stamps and Their Application on Contact Processing and Contact Printing," *Adv. Funct. Mater.* 13:145-153.
Schmid et al. (Mar. 25, 2000) "Siloxane Polymers for High-Resolution, High-Accuracy Soft Lithography," *Macromolecules* 33(8):3042-3049.
Schmid et al. (May 11, 1998) "Light-Coupling Masks for Lensless, Sub-wavelength Optical Lithography," *Appl. Phys. Lett.* 72(19):2379-2381.
Schmidt et al. (Mar. 8, 2001) "Thin Solid Films Roll up into Nanotubes," *Nature* 410:168.
Schnable et al. (1969) "Aluminum Metallization; Advantages and Limitations for Integrated Circuit Applications," *IEEE* 57:1570-1580.
Schneider et al. (2008) "Mechanical Properties of Silicones for MEMS," *J. Micromech. Microeng.* 18:065008.
Schon et al. (1995) "Ambipolar Pentacene Field-Effect Transistors and Inverters," *Science* 287:1022-1023.
Schrieber et al. (1998) "The Effectiveness of Silane Adhesion Promotors in the Performance of Polyurethane Adhesives," *J. Adhesion* 68:31-44.
Scorzoni et al. (Oct. 4, 2004) "On the Relationship Between the Temperature Coefficient of Resistance and the Thermal Conductance of Integrated Metal Resistors," *Sens Actuators A* 116(1):137-144.
Search Report and Examination Report Corresponding to Singapore Patent Application No. 200901178-4, dated Mar. 13, 2010.
Search Report and First Written Opinion, Corresponding to Singapore Patent Application No. 200902530-5, dated Jun. 10, 2010.

(56) References Cited

OTHER PUBLICATIONS

Search Report and Written Opinion, Corresponding to Singapore Application No. 200901451-5, dated Dec. 22, 2010.
Search Report Corresponding to Singapore Patent Application No. SG 200607372-0, dated Oct. 17, 2007.
Search Report Corresponding to Taiwanese Patent Application No. 095121212, dated Oct. 8, 2010.
Search Report, Corresponding to Republic of China (Taiwan) Patent Application No. 094118507, dated Feb. 24, 2007.
Second Office Action Corresponding to Chinese Patent Application No. 200780041127.6, dated May 2, 2012.
Seidel et al. (2004) "High-Current Nanotube Transistors," *Nano Lett.*, vol. 4, No. 5, pp. 831-834.
Sekitani et al. (2005) "Bending Experiment on Pentacene Field-Effect Transistors on Plastic Films," *Appl. Phys. Lett.* 86:073511.
Sekitani et al. (2009) "Stretchable Active-Matrix Organic Light-Emitting Diode Display Using Printable Elastic Conductors," *Nature Mater.* 8:494-499.
Sekitani et al. (Sep. 12, 2008) "A Rubberlike Stretchable Active Matrix Using Elastic Conductors," *Science* 321:1468-1472.
Sen et al. (2002) "Nonequilibrium Processes for Generating Silicon Nanostructures in Single-Crystalline Silicon," *Pure Appl. Chem.* 74(9):1631-1641.
Serikawa et al. (May 1, 2000) "High-Mobility Poly-Si Thin Film Transistors Fabricated on Stainless-Steel Foils by Low-Temperature Processes Using Sputter-Depositions," *Jpn. J. Appl. Phys.* 39:L393-L395.
Servanti et al. (2005) "Functional Pixel Circuits for Elastic AMOLED displays," *Proc. IEEE* 93:1257-1264.
Service, R.F. (Aug. 15, 2003) "Electronic Textiles Charge Ahead," *Science* 301:909-911.
Shan et al. (2004) "From Si Source Gas Directly to Positioned, Electrically Contained Si Nanowires: The Self-Assembling 'Grow-in-Place' Approach," *Nano Lett.* 4(11):2085-2089.
Sharp et al. (2003) "Holographic Photonic Crystals with Diamond Symmetry," *Phys. Rev. B* 68:205102/1-205102/6.
Sheraw et al. (2002) "Organic Thin-Film Transistor-Driven Polymer-Dispersed Liquid Crystal Displays on Flexible Polymeric Substrates," *Appl. Phys. Lett.* 80:1088-1090.
Shetty et al. (2005) "Formation and Characterization of Silicon Films on Flexible Polymer Substrates," *Mater. Lett.* 59:872-875.
Shi et al. (2001) "Free-Standing Single Crystal Silicon Nanoribbons," *J. Am. Chem. Soc.* 123(44):11095-11096.
Shi et al. (Sep. 2000) "Synthesis of Large Areas of Highly Oriented, Very Long Silicon Nanowires," *Adv. Mater.* 12(18):1343-1345.
Shin et al. (2003) "PDMS-Based Micro PCR Chip with Parylene Coating," *J. Micromech. Microeng.* 13:768-774.
Shtein et al. (Oct. 15, 2004) "Direct Mask-Free Patterning of Molecular Organic Semiconductors Using Organic Vapor Jet Printing," *J. Appl. Phys.* 96(8):4500-4507.
Shull et al. (1998) "Axisymmetric Adhesion Tests of Soft Materials," *Macromol. Chem. Phys.* 199:489-511.
Siegel et al. (2009) "lightweight, Foldable Thermochromic Displays on Paper," *Lab Chip* 9:2775-2781.
Siegel et al. (2010) "Foldable Printed Circuit Boards on Paper Substrates," *Adv. Funct. Mater.* 20:28-35.
Siegel et al. (Web Release Feb. 7, 2007) "Microsolidics: Fabrication of Three-Dimensional Metallic Microstructures in Poly(dimethylsiloxane)," *Adv. Mater.* 19(5):727-733.
Sim et al. (1993) "An Analytical Back-Gate Bias Effect Model for Ultrathin SOI CMOS Devices," *IEEE Trans. Elec. Dev.* 40:755-765.
Sirringhaus et al. (2003) "Inkjet Printing of Functional Materials," *MRS Bull.* 28:802-806.
Sirringhaus et al. (Dec. 15, 2000) "High-Resolution Inkjet Printing of All-Polymer Transistor Circuits," *Science* 290:2123-2126.
Sirringhaus, H. (2005) "Device Physics of Solution-Processed Organic Field-Effect Transistors," *Adv. Mater.* 17:2411-2425.
Smay et al. (2002) "Colloidal Inks for Directed Assembly of 3-D Periodic Structures," *Langmuir* 18:5429-5437.

Smith et al. (2000) "Electric-Field Assisted Assembly and Alignment of Metallic Nanowires," *Appl. Phys. Lett.* 77(9):1399-1401.
Snow et al. (2003) "Random networks of carbon nanotubes as an electronic material," *Appl. Phys. Lett.*, vol. 82, No. 13, pp. 2145-2147.
Snow et al. (2005) "High-mobility carbon-nanotube transistors on a polymeric substrate," *Appl. Phys. Lett.*, 86, 033105.
So et al. (2008) Organic Light-Emitting Devices for Solid-State Lighting, *MRS Bull.* 33:663-669.
Sofia et al. (2001) "Functionalized Silk-Based Biomaterials for Bone Formation," *J. Biomed. Mater. Res.* 54:139-148.
Someya et al. (2005) "Conformable, Flexible, Large-Area Networks of Pressure and Thermal Sensors with Organic Transistor Active Matrixes," *Proc. Nat. Acad. Sci. USA* 102:12321-12325.
Someya et al. (2005) "Integration of Organic FETs with Organic Photodiodes for a Large Area, Flexible, and Lightweight Sheet Image Scanners," *IEEE Trans. Electron Devices* 52:2502-2511.
Someya et al. (Jul. 6, 2004) "A Large-Area, Flexible, Pressure Sensor Matrix with Organic Field-Effect Transistors for Artificial Skin Applications," *Proc. Nat. Acad. Sci. USA* 101(27):9966-9970.
Soole et al. (Mar. 1991) "InGaAs Metal-Semiconductor-Metal Photodetectors for Long Wavelength Optical Communications," *IEEE J. Quantum Electron.* 27(3):737-752.
Soong et al. (1984) "Adverse Reactions to Virgin Silk Sutures in Cataract Surgery," *Ophthalmology* 91:479-483.
Srinivasan et al. (Web Release Mar. 26, 2007) "Piezoelectric/Ultrananocrystalline Diamond Heterostructures for High-Performance Multifunctional Micro/Nanoelectromechanical Systems," *Appl. Phys. Lett.* 90:134101.
Stafford et al. (Aug. 2004) "A Buckling-Based Metrology for Measuring the Elastic Moduli of Polymeric Thin Films," *Nature Mater.* 3:545-550.
Star et al. (2004) "Nanotube Optoelectric Memory Devices," *Nano Lett.*, vol. 4, No. 9, pp. 1587-1591.
Storm et al. (Aug. 2003) "Fabrication of Solid-State Nanopores with Single-Nanometre Precision," *Nat. Mater.* 2:537-540.
Streetman et al. (2000) "Intrinsic Material," In; *Solid State Electronic Devices*, $5^{th}$ Ed., Prentice Hall; Upper Saddle River, NJ; pp. 74-75.
Strukov et al. (2005) "CMOL FPGA: A Reconfigurable Architecture for Hybrid Digital Circuits with Two-Terminal Nanodevices," *Nanotechnology* 16:888-900.
Su et al. (2000) "Lattice-Oriented Growth of Single-Walled Carbon Nanotubes," *J. Phys. Chem. B* 104(28):6505-6508.
Substantive Examination Adverse Report, Corresponding to Malaysian Patent Application No. PI 20090622, Dated Sep. 28, 2012.
Substantive Examination Adverse Report, Corresponding to Malaysian Patent Application No. PI 20062672, Mailed Aug. 28, 2009.
Substantive Examination Adverse Report, Corresponding to Malaysian Patent Application No. PI 20094997, Mailed Aug. 15, 2012.
Sum et al. (2009) "Near-Infrared Spectroscopy for the Detection of Lipid Core Coronary Plaques," *Curr. Cardiovasc. Imag. Rep.* 2:307-315.
Sumant et al. (Apr. 2005) "Toward the Ultimate Tribological Interface: Surface Chemistry and Nanotribology of Ultrananocrystalline Diamond," *Adv. Mater.* 17(8):1039-1045.
Sun et al. (2004) "Fabricating Semiconductor Nano/Microwires and Transfer Printing Ordered Arrays of Them onto Plastic Substrates," *Nano Lett.* 4:1953-1959.
Sun et al. (2005) "Advances in Organic Field-Effect Transistors," *J. Mater. Chem.* 15:53-65.
Sun et al. (2005) "Bendable GaAs Metal-Semiconductor Field-Effect Transistors Formed with Printed GaAs Wire Arrays on Plastic Substrates," *Appl. Phys. Lett.* 87:083501.
Sun et al. (2005) "Photolithographic Route to the Fabrication of Micro/Nanowires of III-V Semiconductors," *Adv. Fuct. Mater.* 15:30-40.
Sun et al. (2007) "Controlled Buckling of Semiconductor Nanoribbons for Stretchable Electronics," *Nat. Nanotechnol.* 1:201-207.
Sun et al. (2007) "Structural Forms of Single Crystal Semiconductor Nanoribbons for High-Performance Stretchable Electronics," *J. Mater Chem.* 17:832-840.

(56) References Cited

OTHER PUBLICATIONS

Sun et al. (Aug. 2007) "Inorganic Semiconductors for Flexible Electronics," *Adv. Mater.* 19(15):1897-1916.
Sun et al. (Nov. 2006) "Buckled and Wavy Ribbons of GaAs for High-Performance Electronics on Elastomeric Substrates," *Adv. Mater.* 18(21):2857-2862.
Sundar et al. (2004) "Elastomeric Transistor Stamps: Reversible Probing of Charge Transport in Organic Crystals," *Science* 303:1644-1646.
Suo et al. (Feb. 22, 1999) "Mechanics of Rollable and Foldable Film-on-Foil Electronics," *Appl. Phys. Lett.* 74(8):1177-1179.
Supplemental European Search Report. Corresponding to European Application No. EP 0907106695, dated Jun. 25, 2012.
Supplementary European Search Report, Corresponding to European Application No. 05 75 6327, dated Sep. 25, 2009.
Supplementary European Search Report, Corresponding to European Application No. 04 81 2651, dated Oct. 19, 2010.
Swain et al. (2004) "Curved CCD Detector Devices and Arrays for Multi-Spectral Astrophysical Application and Terrestrial Stereo Panoramic Cameras," *Proc. SPIE* 5499:281-301.
Sze et al. (1985) *Semiconductor Devices, Physics and Technology*, $2^{nd}$ ed., Wiley, New York, pp. 190-192.
Sze, S. (1985) *Semiconductor Devices: Physics and Technology*, New York: Wiley, pp. 428-467.
Sze, S. (1988) *VLSI Technology*, Mcgraw-Hill, 327-374, 566-611.
Sze, S. (1994) *Semiconductor Sensors*, John Wiley and Sons: New York, pp. 17-95.
Takamoto et al. (Jan. 20, 1997) "Over 30% Efficient InGaP/GaAs Tandem Solar Cells," *Appl. Phys. Lett.* 70(3):381-383.
Talapin et al. (Oct. 7, 2005) "PbSe Nanocrystal Solids for n- and p-Channel Thin Film Field-Effect Transistors," *Science* 310:86-89.
Tan et al. (Apr. 12, 2004) "Performance Enhancement of InGaN Light Emitting Diodes by Laser-Lift-off and Transfer from Sapphire to Copper Substrate," *Appl. Phys. Lett.* 84(15):2757-2759.
Tanase et al. (2002) "Magnetic Trapping and Self-Assembly of Multicomponent Nanowires," *J. Appl. Phys.* 91:8549-8551.
Tang et al. (2005) "One-Dimensional Assemblies of Nanoparticles: Preparation, Properties, and Promise," *Adv. Mater.* 17:951-962.
Tao et al. (2003) "Langmuir-Blodgett Silver Nanowire Monolayers for Molecular Sensing Using Surface-Enhanced Raman Spectroscopy," *Nano Lett.* 3:1229-1233.
Tate et al. (2000) "Anodization and Microcontact Printing on Electroless Silver: Solution-Based Fabrication Procedures for Low-Voltage Electronic Systems with Organic Active Components," *Langmuir* 16:6054-6060.
Teshima et al. (2001) "Room-Temperature Deposition of High-Purity Silicon Oxide Films by RF Plasma-Enhanced CVD," *Surf. Coat. Technol.* 146-147:451-456.
Theiss et al. (1998) "PolySilicon Thin Film Transistors Fabricated at 100° C. on a Flexible Plastic Substrate," *IEDM* 98:257-260.
Thornwood et al. (Oct. 1, 1990) "Utilizing Olptical Lithography in the Sub-Micron Dimensional Regime," *IBM Tech. Disc. Bull.* 33(5):187-188.
Timko et al. (2009) "Electrical Recording from Hearts with Flexible Nanowire Device Arrays," *Nano Lett.* 9:914-918.
Toader et al. (2004) "Photonic Band Gap Architectures for Holographic Lithography," *Phy. Rev. Lett.* 043905/1-043905/4.
Toader et al. (2004) "Photonic Band Gaps Based on Tetragonal Lattices of Slanted Pores," *Phys. Rev. Lett.* 90:233901/1-233901/4.
Tong (1999) *Semiconductor Wafer Bonding: Science and Technology*, John Wiley; New York, pp. 187-221.
Trau et al. (1997) "Microscopic Patterning of Orientated Mesoscopic Silica Through Guided Growth," *Nature* 390:674-676.
Trentler et al. (1995) "Solution-Liquid-Solid Growth of Crytalline III-V Semiconductors: An Analogy to Vapor-Liquid-Solid Growth," *Science* 270:1791-1794.
Tseng et al. (Web Release Dec. 19, 2003) "Monolithic Integration of Carbon Nanotube Devices with Silicon MOS Technology" *Nano Lett.* 4(1):123-127.

Ucjikoga, S. (2002) "Low-Temperature Polycrystalline Silicon Thin-Film Transistor Technologies for System-on-Glass Displays," *MRS Bull.* 27:881.
Urruchi et al. (2000) "Etching of DLC Films Using a Low Intensity Oxygen Plasma Jet," *Diamond Relat. Mater.* 9:685-688.
Vanhollenbeke et al. (2000) "Compliant Substrate Technology: Integration of Mismatched Materials for Opto-Electronic Applications," *Prog. Cryst. Growth Charact. Mater.* 41(1-4):1-55.
Velev et al. (1997) "Porous silica via colloidal crystallization," *Nature* 389:447-448.
Vepari et al. (Aug. Sep. 2007) "Silk as a Biomaterial," *Prog. Polym. Sci.* 32(8-9):991-1007.
Vilan et al. (2000) "Molecular Control Over Au/GaAs Diodes," *Nature* 404:166-168.
Vinck et al. (2003) "Increased Fibroblast Proliferation Induced by Light Emitting Diode and Low Power Laser Irradiation," *Lasers Med. Sci.* 18:95-99.
Viventi et al. (Mar. 2010) "A Conformal, Bio-Interfaced Class of Silicon Electronics for Mapping Cardiac Electrophysiology," *Sci. Trans. Med.* 2(24):24ra22.
Vlasov et al. (2001) "On-Chip Natural Assembly of Silicon Photonic Bandgap Crystals," *Nature* 414:289-293.
Voss, D. (2000) "Cheap and Cheerful Circuits," *Nature* 407:442-444.
Wagner et al. (2003) "Silicon for Thin-Film Transistors," *Thin Solid Films* 430:15-19.
Wagner et al. (2005) "Electronic Skin: Architecture and Components," *Physica E* 25:326-334.
Wagner et al. (Mar. 1, 1964) "Vapor-Liquid-Solid Mechanism of Single Crystal Growth," *Appl. Phys. Lett.* 4(5):89-90.
Waksman et al.(2008) "Photopoint Photodynamic Therapy Promotes Stabilization of Atherosclerotic Plaques and Inhibits Plaque Progression," *J. Am. Coll. Cardiol.* 52:1024-1032.
Wang et al. (2003) "A Solution-Phase, Precursor Route to Polycrystalline $SnO_2$ Nanowires that can be Used for Gas Sensing under Ambient Conditions," *J. Am. Chem. Soc.* 125:16176-16177.
Wang et al. (2005) "Electronically Selective Chemical Functionalization of Carbon Nanotubes: Correlation between Raman Spectral and Electrical Responses," *J. Am. Chem. Soc.*, 127:11460-11468.
Wang et al. (2005) "Oxidation Resistant Germanium Nanowires: Bulk Synthesis, Long Chain Alkanethiol Functionalization, and Langmuir-Blodgett Assembly," *J. Am. Chem. Soc.* 127(33):11871-11875.
Wang et al. (2006) "Direct Synthesis and Characterization of CdS Nanobelts," *Appl. Phys. Lett.* 89:033102.
Wang et al. (Aug-Sep. 2008) "In Vivo Degradation of Three-Dimensional Silk Fibroin Scaffolds," *Biomaterials* 29(24-25):3415-3428.
Waxman et al. (2009) "In vivo Validation of a Catheter-Based Near-Infrared Spectroscopy System for Detection of Lipid Core Coronary Plaques: Initial Results of the Spectacl Study," *J. Am. Coll. Cardiol. Img.* 2:858-868.
Waxman, S. (2008) "Near-Infrared Spectroscopy for Plaque Characterization," *J. Interv. Cardiol.* 21:452-458.
Weber et al. (Jan. 2004) "A Novel Low-Cost, High Efficiency Micromachined Silicon Solar Cell," *IEEE Electron Device Lett.* 25(1):37-39.
Wen et al. (Web Release Dec. 4, 2004) "Controlled Growth of Large-Area, Uniform, Vertically Aligned Arrays of $\alpha\text{-}Fe_2O_2$ Nanobelts and Nanowires," *J. Phys. Chem. B* 109(1):215-220.
Whang et al. (2003) "Large-Scale Hierarchical Organization of Nanowire Arrays for Integrated Nanosystems," *Nano Lett.* 3(9):1255-1259.
Williams et al. (Oct. 2006) "Growth and Properties of Nanocrystalline Diamond Films," *Phys. Stat. Sol. A* 203(13):3375-3386.
Williams et al. (Web Release Jan. 23, 2006) "Comparison of the Growth and Properties of Ultrananocrystalline Diamond and Nanocrystalline Diamond," *Diamond Relat. Mater.* 15:654-658.
Willner et al. (2002) "Functional Nanoparticle Architectures for Senoric, Optoelectronic, and Bioelectronic Applications," *Pure Appl. Chem.* 74(9):1773-1783.

(56) References Cited

OTHER PUBLICATIONS

Wilson et al. (2006) "ECoG Factors Underlying Multimodal Control of a Brain-Computer Interface," *IEEE Trans. Neural Syst. Rehabil. Eng.* 14:246-250.
Wind et al. (May 20, 2002) "Vertical Scaling of Carbon Nanotube-Field-Effect Transitors Using Top Gate Electrodes," *Appl. Phys. Lett.* 80(20):3871-3819.
Wise et al. (Jul. 2008) "Microelectrodes, Microelectronics, and Implantable Neural Microsystems," *Proc. IEEE* 96(7):1184-1202.
Won et al. (2004) "Effect of Mechanical and Electrical Stresses on the Performance of an a-Si:H TFT on Plastic Substrate," *J. Electrochem. Soc.* 151:G167-G170.
Wong-Riley et al. (2005) "Photobiomodulation Directly Benefits Primary Neurons Functionally Inactivated by Toxins," *J. Biol. Chem.* 280:4761-4771.
Woodburn et al. (1996) "Phototherapy of Cancer and Atheromatous Plaque with Texaphyrins," *J. Clin. Laser Med. Surg.* 14:343-348.
Written Opinion and Response, Corresponding to Singapore Patent Application No. 200904643-4, Mailed Jun. 2, 2011.
Wu et al. (2001) "Amorphous Silicon Crystallization and Polysilicon Thin Film Transistors on SiO2 Passivated Steel Foil Substrates," *Appl. Surf. Sci* 175-176:753-758.
Wu et al. (2001) "Direct Observation of Vapor-Liquid-Solid Nanowire Growth," *J. Am. Chem. Soc.* 123(13):3165-3166.
Wu et al. (2001) "Thermal Oxide of Polycrystalline Silicon on Steel Foil as a Thin-Film Transistor Gate Dielectric," *Appl. Phys. Lett.* 78:3729-2731.
Wu et al. (2002) "Block-by-Block Growth of Single-Crystalline Si/SiGe Superlattice Nanowires," *Nano Lett.* 2(2):83-86.
Wu et al. (2002) "Growth of Au-Catalyzed Ordered GaAs Nanowire Arrays by Molecular-Beam Epitaxy," *Appl. Phys. Lett.* 81:5177-5179.
Wu et al. (2002) "Inorganic Semiconductor Nanowires: Rational Growth, Assembly, and Novel Properties," *Chem. Eur. J.* 8(6):1261-1268.
Wu et al. (2003) "Growth, Branching, and Kinking of Molecular-Beam Epitaxial (110) GaAs Nanowires," *Appl. Phys. Lett.* 83:3368-3370.
Wu et al. (Jul. 1, 2004) "Single-Crystal Metallic Nanowires and Metal/Semiconductor Nanowire Heterostructures," *Nature* 430:61-65.
Wu et al. (Nov. 2002) "Complementary Metal-Oxide-Semiconductor Thin-Film Transistor Circuits from a High-Temperature Polycrystalline Silicon Process on Steel Foil Substrates," *IEEE Trans. Electr. Dev.* 49(11):1993-2000.
Xia (1998) "Soft Lithography" *Angew. Chem. Int. Ed.* 37:551-575.
Xia et al. (1996) "Shadowed Sputtering of Gold on V-Shaped Microtrenches Etched in Silicon and Applications in Microfabrication," *Adv. Mater.* 8(9):765-768.
Xia et al. (1998) "Soft Lithography," *Annu. Rev. Mater. Sci.* 28:153-184.
Xia et al. (1999) "Unconventional Methods for Fabricating and Patterning Nanostructures," *Chem. Rev.* 99:1823-1848.
Xia et al. (2003) "One-Dimensional Nanostructures: Synthesis, Characterization and Applications," *Adv. Mater.* 15:353-389.
Xia et al. (Jul. 19, 1996) "Complex Optical Surfaces Formed by Replica Molding Against Elastomeric Masters," *Science* 273:347-349.
Xiang et al. (Mar. 25, 2006) "Ge/Si Nanowire Heterostructures as High-Performance Field-Effect Transistors," *Nature* 441:489-493.
Xiao et al. (2003) "High-mobility thin-film transistors based on aligned carbon nanotubes," *Appl. Phys. Lett.*, vol. 83, No. 1, pp. 150-152.
Xie et al. (May 2003) "Polymer-Controlled Growth of $Sb_2Se_3$ Nanoribbons via a Hydrothermal Process," *J. Cryst. Growth* 252(4):570-574.
Yang et al. (1997) "Mesoporous Silica with Micrometer-Scale Designs," *Adv. Mater.* 9:811-814.
Yang et al. (2000) "Stability of Low-Temperature Amorphous Silicon Thin Film Transistors Formed on Glass and Transparent Plastic Substrates," *J. Vac. Sci. Technol. B* 18:683-689.
Yang et al. (2002) "Creating Periodic Three-Dimensional Structures by Multibeam Interface of Visible Laser," *Chem. Mater.* 14:2831-2833.
Yang et al. (Dec. 2007) "RFID Tag and RF Structures on a Paper Substrate Using Inkjet-Printing Technology," *IEEE Trans. Microw. Theory Tech.* 55(12):2894-2901.
Yang, P. (2005) "The Chemistry and Physics of Semiconductor Nanowires," *MRS Bull.* 30:85-91.
Yanina et al. (2002) "Terraces and ledges on (001) spinel surfaces," *Surf. Sci.*, 513:L402-L412.
Yao et al. (2008) "Seeing Molecules by Eye: Surface Plasmon Resonance Imaging at Visible Wavelengths with High Spatial Resolution and Submonolayer Sensitivity," *Angew. Chem.* 47:5013-5017.
Yao et al. (2010) "Functional Nanostructured Plasmonic Materials," *Adv. Mater.* 22:1102-1110.
Yao et al. (Mar. 2000) "High-Field Effect Electrical Transport in Single-Walled Carbon Nanotubes," *Phys. Rev. Lett.* 84(13):2941-2944.
Yeager et al. (Aug. 30, 2008) "Characterization of Flexible ECoG Electrode Arrays for Chronic Recording in Awake Rats," *J. Neurosci. Methods* 173(2):279-285.
Yeh et al. (1994) "Fluidic Self-Assembly for the Integration of GaAs Light Emitting Diodes on Si Substrates," *IEEE Photon. Techn. Lett.* 6:706-708.
Yin et al. (2000) "A Soft Lithography Approach to the Fabrication of Nanostructures of Single Crystalline Silicon with Well-Defined Dimensions and Shapes," *Adv. Mater.* 12:1426-1430.
Yin et al. (2005) "Colloidal Nanocrystal Synthesis and the Organic-Inorganic Interface," *Nature* 437:664-670.
Yoon et al. (2005) "Low-Voltage Organic Field-Effect Transistors and Inverters Enabled by Ultrathin Cross-Linked Polymers as Gate Dielectrics," *J. Am. Chem. Soc.* 127:10388-10395.
Yu et al. (2000) "Silicon Nanowires: Preparation, Device Fabrication, and Transport Properties," *J. Phys. Chem. B* 104(50):11864-11870.
Yu et al. (2003) "Solution-Liquid-Solid Growth of Soluble GaAs Nanowires," *Adv. Mater.* 15:416-419.
Yu et al. (2003) "Two-Versus Three-Dimensional Quantum Confinement in Indium Phosphide Wires and Dots," *Nat. Mater.* 2:517-520.
Yu et al. (2004) "The Yield Strength of Thin Copper Films on Kapton," *J. Appl. Phys.* 95:2991-2997.
Yuan et al. (2006) "High-Speed Strained-Single-Crystal-Silicon Thin-Film Transistors on Flexible Polymers," *J. Appl. Phys.* 100:013708.
Yurelki et al. (Jul. 24, 2004) "Small-Angle Neutron Scattering from Surfactant-Assisted Aqueous Dispersions of Carbon Nanotubes," *J. Am. Chem. Soc.* 126(32):9902-9903.
Zakhidov et al. (1998) "Carbon Structure with Three-Dimensional Periodicity at Optical Wavelengths," *Science* 282:897-901.
Zaumseil et al. (2003) "Nanoscale Organic Transistors that use Source/Drain Electrodes Supported by High Resolution Rubber Stamps," *Appl. Phys. Lett.* 82(5):793-795.
Zaumseil et al. (2003) "Three-Dimensional and Multilayer Nanostructures Formed by Nanotransfer Printing," *Nano Lett.* 3(9):1223-1227.
Zhang et al. (2001) "Electric-field-directed growth of aligned single-walled carbon nanotubes," *Appl. Phys. Lett.*, vol. 79, No. 19. pp. 3155-3157.
Zhang et al. (2005) "Low-Temperature Growth and Photoluminescence Property of ZnS Nanoribbons," *J. Phys. Chem. B* 109(39):18352-18355.
Zhang et al. (2006) "Anomalous Coiling of SiGe/Si and SiGe/Si/Cr Helical Nanobelts," *Nano Lett.* 6(7):1311-1317.
Zhang et al. (Apr. 2003) "Oxide-Assisted Growth of Semiconducting Nanowires," *Adv. Mater.* 15(7-8):635-640.
Zhang et al. (Apr. 5, 2004) "Structure and Photoluminescence of ZnSe Nanoribbons Grown by Metal Organic Chemical Vapor Deposition," *Appl. Phys. Lett.* 84(14):2641-2643.

(56) References Cited

OTHER PUBLICATIONS

Zhang et al. (Feb. 9, 2006) "Electronic Transport in Nanometre-Scale Silicon-on-Insulator Membranes," *Nature* 439:703-706.
Zhao et al. (Mar. 2007) "Improved Field Emission Properties from Metal-Coated Diamond Films," *Diamond Relat Mater.* 16(3):650-653.
Zheng et al. (1998) "Sudden Cardiac Death in the United States, 1989 to 1998," *Circulation* 104, 2158-2163 (1998.
Zheng et al. (2004) "Shape-and Solder-Directed Self-Assembly to Package Semiconductor Device Segments," *Appl. Phys. Lett.* 85:3635-3637.
Zheng et al. (Aug. 31, 2004) "Sequential Shape-and-Solder-Directed Self Assembly of Functional Microsystems," *Proc. Natl. Acad. Sci. USA* 101(35):12814-12817.
Zhou et al. (2002) "An Efficient Two-Photon-Generated Photoacid Applied to Positive-Tone 3D Microfabrication," *Science* 296:1106-1109.
Zhou et al. (2004) "p-Channel, n-Channel Thin Film Transistors and p-n Diodes Based on Single Wall Carbon Nanotube Networks," *Nano Lett.* 4:2031-2035.
Zhou et al. (2005) "Band Structure, Phonon Scattering, and the Performance Limit of Single-Walled Carbon Nanotube Transistors," *Phys. Rev. Lett.* 95:146805.
Zhou et al. (2005) "Mechanism for Stamp Collapse in Soft Lithography," *Appl. Phys. Lett.* 87:251925.
Zhu et al. (2005) "Spin on Dopants for High-Performance Single Crystal Silicon Transistors on Flexible Plastic Substrates," *Appl. Phys. Lett.* 86(133507)1-3.
Zipes et al. (2006) "ACC/AHA/ESC 2006 Guidelines for Management of Patients With Ventricular Arrhythmias and the Prevention of Sudden Cardiac Death: A Report of the American College of Cardiology/American Heart Association Task Force and the European Society of Cardiology Committee for Practice Guidelines (Writing Committee to Develop Guidelines for Management of Patients With Ventricular Arrhythmias and the Prevention of Sudden Cardiac Death," *Circulation* 114:385-484.
International Search Report and Written Opinion dated Aug. 14, 2012, for International Application No. PCT/US12/37973.
Dinyari et al. (2008) "Curving Monolithic Silicon for Nonplanar Focal Plane Array Applications," *Appl. Phys. Lett.* 92:091114.
Hoskins (1990) "Metamorphosis of the Amphibian Eye," *J. Neurobiol.* 21:970-989.
Yeoh (1993) "Some Forms of the Strain Energy Function for Rubber," *Rubber Chemistry and Technology.* 66:754-771.
Zhu et al. (2010) "Tunable-Focus Microlens Arrays on Curved Surfaces," *Appl. Phys. Lett.* 96:081111.
Arik et al. (2004) "Chip Scale Thermal Management of High Brightness LED Packages," *Proc. SPIE* 5530:214-223.
Assmus et al (2005) In *Handbook of Condensed Matter and Materials Data*, (Eds: W. Martinessen and H. Warlimont), Springer, Berlin, Germany Part 2.
Baca et al. (2007) "Printable single-crystal silicon micro/nanoscale ribbons, platelets and bars generated from bulk wafers," *Adv Funct Mater* 17:3051-3062.
Bean, K.E. (1978) "Anisotropic etching of silicon," *IEEE T Electron Dev* 25:1185-1193.
Bourgoin et al. (2010) "Thermal conduction in thin films measured by optical surface thermal lensing," *J Appl Phys* 108:073520.
Campbell (2001) "The Science and Engineering of Microelectronic Fabrication", Oxford University Press, New York.
Chen et al. (2008) "Performance of high-power III-nitride light emitting diodes," *Phys. Stat. Aol. a* 205:1086-1092.
Choi et al. (2003) "Fabrication and Performance of Parallel-Addresses InGaN Micro-LED Arrays," *IEEE Photonic Tech L* 15:510-512.
Choi et al. (2003) "High Extraction Efficiency InGaN Micro-Ring Light-Emitting Diodes," *Appl. Phys. Lett.* 83:4483-4485.
Christiaens et al. (2005) "Thin-film devices fabricated with benzocyclobutene adhesive wafer bonding," *J. Lightwave Technol.* 23:517-523.

Chung et al. (2010) *Science* 330:655.
Dhorajiya et al. (2010) "Finite element thermal/mechanical analysis of transmission laser microjoining of titanium and polyimide," *J. Eng. Mater. Technol.* 32:011004.
Energy USDo Solid-state lighting research and development: Multi-year program plan, (Energy USDo). available from http://www1.eere.energy.gov/buildings/ssl/techroadmaps.html (2010.
Gong et al. (2010) "Size-dependent light output, spectral shift, and self-heating of 400 nm InGaN light-emitting diodes," *J Appl Phys* 107:013103.
Ho et al. (1999) "Low-Resistance Ohmic Contacts to P-Type GaN," *Appl. Phys Lett.* 74:1275-1277.
Hu et al. (2009) "Modeling of nanostructured polymer-metal composite for thermal interface material applications" 2009 International Conference on Electronic Packaging Technology & High Density Packaging, 481-484.
Hu et al. (2011) *Adv. Mater.* 23:2933.
Huie et al. (2003) "Guided molecular self-assembly: a review of recent efforts", Jiyun C Huie *Smart Mater. Struct.* (2003) 12, 264-271.
Karlicek Jr. RF (2005) High power LED packaging. CLEO.
Kim et al. (2008) "Materials and noncoplanar mesh designs for integrated circuits with linear elastic responses to extreme mechanical deformations," *Proc Natl Acad Sci USA* 105:18675-18680.
Kim et al. (2010) "Waterproof AlInGaP optoelectronics on stretchable substrates with applications in biomedicine and robotics," *Nat Mater* 9:929-937.
Kim et al. (2011) *Nano Lett.* 11: 3881.
Kim et al. (Aug. 12, 2011) "Epidermal Electronics," *Science* 333(6044):838-843.
Kim et al. (Jun. 11, 2012) "High-Efficiency, Microscale GaN-Light-Emitting Diodes and their Thermal Properties on Unusual Substrates," *Small* 8(11):1643-1649.
Krames et al. (2007) "Status and Future of High-Power Light-Emitting Diodes for Solid-State Lighting," *J. Disp. Tech.* 3:160-175.
Kumar et al. (2002) "Thermally-stable low-resistance Ti/Al/Mo/Au multilayer ohmic contacts on n-GaN," *J Appl Phys* 92:1712-1714.
Lee et al. (1997) "Heat transport in thin dielectric films," *J. Appl. Phys.* 81:2590-2595.
Lee et al. (2005) *Small* 1:1164.
Lee et al. (2011) "Growth of high-quality InGaN/GaN LED structures on (111) Si substrates with internal quantum efficiency exceeding 50%," *J Cryst Growth* 315:263-266.
Lee et al. (2011) *Adv Mater.* 23:4614.
Llewellyn et al. (2010) *Nat. Med.* 16:1161.
Mark, J.E. (ed.) "Polymer Data Handbook", Oxford University Press, New York (1999.
Mattsson et al. (2007) "Development of an infrared thermopile detector with a thin self-supporting SU-8 membrane," IEEE Sensors 2007 Conference, 836-839.
Meitl et al. (2006) "Transfer printing by kinetic control of adhesion to an elastomeric stamp," *Nat Mater* 5:33-38.
Modafe et al. (2005) "Embedded benzocyclobutene in silicon: An integrated fabrication process for electrical and thermal isolation in MEMS," *Microelectronic Engineering* 82:154-167.
Moon et al. (2009) "High-Current Electro-Optical Degradation of InGaN/GaN Light-Emitting Diodes Fabricated with Ag-Based Reflectors," *J. Korean Phys. Soc.* 55:1128-1131.
Narukawa et al. (2010) "White light emitting diodes with super-high luminous efficacy," *J Phys D: Appl Phys* 43:354002.
Park et al. (2009) "Printed assemblies of inorganic light-emitting diodes for deformable and semitransparent displays," *Science* 325:977-981.
Pong et al. (2006) *Solid State Electron.* 50:1588.
Reineke et al. (2009) "White Organic Light-Emitting Diodes with Fluorescent Tube Efficiency," *Nature* 459:234-239.
Sarua et al. (2006) "Combined Infrared and Raman temperature measurements on device structures," CS Mantech Conf: 179-182.
Satarkar et al. (2011) "Remote actuation of hydrogel nanocomposites: heating analysis, modeling and simulations," *AICHE Journal* 57:852-860.
Schmidt et al. (2010) "Characterization of thin metal films via frequency-domain thermoreflectance," *J Appl Phys* 107:024908.

(56) References Cited

OTHER PUBLICATIONS

Schubert et al. (2005) "Solid-state light sources getting smart," *Science* 308:1274-1278.
Senawiratne et al. (2008) "Junction Temperature Measurements and Thermal Modeling of GaInN/GaN Quantum Well Light-Emitting Diodes," *J. Electron. Mater.* 37:607-610.
Smith et al. (2000) "Electric-field assisted assembly and alignment of metallic nanowires," *Appl. Phys. Lett.* (2000) 77(9):1399-1401.
Solano et al. (2007) "Thermal and mechanical analysis of an SU8 polymeric actuator using infrared thermography," *Proc. IMechE 222 Part C: J. Mechanical Engineering Science*, 73-86.
Sou et al. (1999) "Mechanics of Rollable and Foldable Film-on-Foil Electronics," *Appl. Phys. Lett.* 74:1177-1179.
Spina et al. (2006) "MEMS test structure for measuring thermal conductivity of thin films," Proc IEEE International Conference on Microelectronic Test Structures Austin, USA:137-142.
Stojanovic et al. (2007) "Thin-film thermal conductivity measurement using microelectrothermal test structures and finite-element-model-based data analysis," *J Microelectromech S* 16:1269-1275.
Tsao et al. (2010) "Solid-state lighting: An integrated human factors, technology, and economic perspective," *Proc. IEEE* 98:1162-1179.
Webb, P.W. (1991) "Thermal Imaging of Electronic Devices with Low Surface Emissivity," *Proc. Int. Electr. Eng.* 138:390-400.
Wong et al. (2000) *Appl. Phys Lett.* 77:2822.
Wong, W.S. (1999) "Integration of GaN thin films with dissimilar substrate materials by wafer bonding and laser lift-off," PhD thesis, University of California at Berkeley.
Yeh et al. (1994) "Fluidic self-assembly for the integration of GaAs light-emitting diodes on Si substrates," *IEEE Photonic Tech L* 6:706-708.
Yoon et al. (2008) "Ultrathin silicon solar microcells for semitransparent, mechanically flexible and microconcentrator module designs," *Nat Mater* 7:907-915.
Yoon et al. (2010) "GaAs photovoltaics and optoelectronics using releasable multilayer epitaxial assemblies," *Nature* 465:329-334.
Zhu et al. (2011) "Efficiency Measurement of GaN-Based Quantum Well and Light Emitting Diode Structures Grown on Silicon Substrates," *J. Appl. Phys.* 109:014502.
U.S. Appl. No. 11/465,317, filed Aug. 17, 2006.
U.S. Appl. No. 12/372,605, filed Feb. 17, 2009.
U.S. Appl. No. 12/522,582, filed Jul. 9, 2009.
U.S. Appl. No. 13/095,502, filed Apr. 27, 2011.
U.S. Appl. No. 14/800,363, filed Jul. 15, 2015.
U.S. Appl. No. 14/251,259, filed Aug. 4, 2015.
U.S. Appl. No. 14/766,333, filed Aug. 6, 2015.
U.S. Appl. No. 14/766,301, filed Aug. 6, 2015.
U.S. Appl. No. 14/766,926, filed Aug. 10, 2015.
U.S. Appl. No. 14/772,312, filed Sep. 2, 2015.
U.S. Appl. No. 14/772,354, filed Sep. 2, 2015.
U.S. Appl. No. 14/944,039, filed Nov. 17, 2015.
Ahn et al. (2009) "Omnidirectional Printing of Flexible, Stretchable, and Spanning Silver Microelectrodes," *Science*. 323:1590-1593.
Axisa et al. (Sep. 1-4, 2008) "Laser based fast prototyping methodology of producing stretchable and conformable electronic systems," In; 2nd Electronics System-integration Technology Conference (ESTC 2008). Greenwich, UK. pp. 1387-1390.
Bour et al. (1994) "Strained $Ga_xIn_{1-x}P/(AlGa)_{0.5}In_{0.5}P$ Heterostructures and Quantum-Well Laser Diodes," *IEEE J. Quantum Electron.* 30:593-607.
Camperi-Ginestet et al. (1991) "Alignable epitaxial liftoff of GaAs material with selective deposition using polyimide diaphragms," *IEEE Trans. Photon. Tech. Lett.* 3, 1123 (1991).
Carter-Coman et al. (1997) "Analysis of layers on GaAs compliant substrates by double crystal x-ray diffraction," *Appl. Phys. Lett.* 70:1754.
Chandrasekhar et al. (1977) "Effects of uniaxial stress on the electroreflectance spectrum of Ge and GaAs," *Phys. Rev. B* 15:2127.
Chang et al. (2009) "A Large Area Flexible Array Sensors Using Screen Printing Technology," *J. Display Technol.* 5:178-183.
Chen et al. (1986) "Low resistance Pd/Ge/Au and Ge/Pd/Au ohmic contacts to n-type GaAs," *Appl. Phys. Lett.* 48:535.
Fan et al. (2008) "Wafer-Scale Assembly of Highly Ordered Semiconductor Nanowire Arrays by Contact Printing," Nano Lett. 8:20-25.
Fan et al. (2009) "Three-dimensional nanopillar-array photovoltaics on low-cost and flexible substrates," *Nat. Mater.* 8:648-653.
Gaul et al. (2000) "True Blue Inorganic Optoelectronic Devices," *Adv. Mater.* 12, 935-946.
Haberer et al. (2005) "Freestanding, optically-pumped, GaN/InGaN microdisk lasers fabricated by photoelectrochemical etching," *Appl. Phys. Lett.* 85:5179.
Hua et al. (2006) "Processing Dependent Behavior of Soft Imprint Lithography on the 1-10-nm Scale," *IEEE Trans. Nanotechnol.* 5:301-308.
Javey et al. (2007) "Layer-by-Layer Assembly of Nanowires for Three-Dimensional, Multifunctional Electronics," *Nano Lett.* 7:773-777.
Jiang et al. (2001) "III-nitride blue microdisplays," *Appl. Phys. Lett.* 78:1303.
Kim et al. (2007) "Organic thin film transistor using silver electrodes by the ink-jet printing technology," *Thin Solid Films* 515:7692-7696.
Lo et al. (2007) "Development of Dendrimers: Macromolecules for Use in Organic Light-Emitting Diodes and Solar Cells," *Chem. Rev.* 107:1097-1116.
Murata et al. (2005). "Super-fine ink-jet printing: toward the minimal manufacturing system" Microsystem Technologies 12:2-7.
Pan et al. (1988) "Photoreflectance study of narrow-well strained-layer $InxGa1-xAs/GaAs$ coupled multiple-quantum-well structures," *Phys. Rev. B* 38:3375.
Pan et al. (1999) "Screen Printing Process Design of Experiments for Fine Line Printing of Thick Film Ceramic Substrates," *J. Electronics Manufacturing* 9:203.
Park et al. (2007) "High Resolution Electrohydrodynamic Jet Printing," Nature Materials. 6:782-789.
Pollak (1973) "Modulation spectroscopy under uniaxial stress," *Surf. Sci.* 37:863-895.
Sekitani et al. (Apr. 1, 2008) "Organic Transistors Manufactured Using Inkjet Technology with Subfemtoliter Accuracy," Proc. Nat. Acad. Sci. USA 105(13):4976-4980.
Sharma et al. (2005) "Vertically Oriented GaN-Based Air-Gap Distributed Bragg Reflector Structure Fabricated Using Band-Gap-Selective Photoelectrochemical Etching," *Appl. Phys. Lett.* 87:051107.
Stareev (1993) "Formation of extremely low resistance Ti/Pt/Au ohmic contacts to p-GaAs," *Appl. Phys. Lett.* 62:2801.
Stauth et al. (2006) "Self-assembled single-crystal silicon circuits on plastic," *Proc. Natl. Acad. Sci. USA* 103:13922-13927.
Stocker et al. (1998) "Crystallographic wet chemical etching of GaN," *Appl. Phys. Lett.* 73:2654.
Tamura et al. (1998) "Estimation of Sidewall Nonradiative Recombination in GaInAsP/InP Wire Structures Fabricated by Low Energy Electron-Cyclotron-Resonance Reactive-Ion-Beam-Etching," *Jpn. J. Appl. Phys.* 37:3576-3584.
Tekin et al. (2008) "Inkjet printing as a deposition and patterning tool for polymers and inorganic particles," *Soft Matter.* 4:703-713.
Whitesides et al. (2002), "Beyond molecules: Self-assembly of mesoscopic and macroscopic components", PNAS, vol. 99, No. 8, pp. 4769-4774.
Yablonovitch et al. (1987) "Extreme selectivity in the lift-off of epitaxial GaAs films," *Appl. Phys. Lett.* 51:2222.
Yablonovitch et al. (1990) "Van der Waals bonding of GaAs epitaxial liftoff films onto arbitrary substrates," *Appl. Phys. Lett.* 56:2419.
Yoon et al. (2008) "Ultrathin Silicon Solar Microcells for Semitransparent, Mechanically Flexible and Microconcentrator Module Designs," *Nat. Mater.* 7:907-915.
Zheng et al. (2006) "Fluidic heterogeneous microsystems assembly and packaging," *J. Microelectromech. Syst.* 15:864.

(56) References Cited

OTHER PUBLICATIONS

BIOFLEX—Biocompatible Flexible Electronic Circuits. Available at http://tfcg.elis.ugent.be/projects/bioflex. Accessed Feb. 8, 2012.
Extended European Search Report dated Jan. 30, 2015, corresponding to European Patent Application No. 10775462.4.
International Preliminary Report on Patentability dated Nov. 28, 2013, corresponding to International Application No. PCT/2012/037973.
J. Vanfleteren. SWEET: Stretchable and Washable Electronics for Embedding Textiles. Available at ftp://ftp.cordis.europa.eu/pub/ist/docs/mnd/ws-sfit_en.pdf. Accessed Feb. 8, 2012.
Office Action Corresponding to Chinese Patent Application No. 200780041127.6, dated Apr. 8, 2011.
Office Action of the Intellectual Property Office of Taiwan dated Dec. 31, 2014, corresponding to ROC (Taiwan) Patent Application No. 099115162.
Rogers, J. (Jul. 9, 2010) "Farewell to Flatland," Science 329:138-139.
Someya, T. (Aug. 7, 2008) "Electronic Eyeballs," Nature 454:703-704.
STELLA Project—Stretchable Electronics for Large-Area Applications. Available at www.stella-project.de. Accessed Feb. 8, 2012.
Supplementary European Search Report Corresponding to European Patent Application No. 07 84 1968, dated Mar. 31, 2011.
SWEET: Stretchable and Washable Electronics for Embedding Textiles. Available at http://tfcg.elis.ugent.be/projects/sweet. Accessed Feb. 8, 2012.
Alavi et al. (1992) "Fabrication of Microchannels by Laser Machining and Anisotropic Etching of Silicon," *Sensors and Actuators A.* 299-302.
Armani et al. (1999) "Re-configurable fluid circuits by PDMS elastomer Micromachining," MEMS '99 Twelfth IEEE International Conference, Orlando, FL, 222-227.
Bohandy et al. (1986) "Metal deposition from a supported metal film using an excimer laser," J. Appl. Phys. 60:1538-1539.
Bulthaup et al. (2001) "Direct Fabrication of All-Inorganic Logic Elements and Microelectromechanical Systems from Nanoparticle Precursors," Mat. Res. Soc. Symp. Proc. 636.
Camino et al. (2001) "Polydimethylsiloxane thermal degradation Part 1. Kinetic aspects," Polymer 42:2395-2402.
Decision of Refusal corresponding to Japanese Patent Application No. P2007-515549, dated Sep. 4, 2012—English translation only.
Dong et al. (2006) "Adaptive Liquid Microlenses Activated by Stimuli-Responsive Hydrogels," Nature. 442:551-554.
Dong et al. (2007) "Variable Focus Liquid Microlenses and Microlens Arrays Actuated by Thermoresponsive Hydrogels," Adv. Mater. 19:401-405.
Examination Report corresponding to European Application No. 04 81 2651, dated Mar. 9, 2011.
Examination Report corresponding to Indian Patent Application No. 5832/DELNP/2006, dated Sep. 20, 2010.
Examination Report corresponding to Singapore Application No. 200901451-5, dated Sep. 29, 2011.
Examination Report corresponding to Singapore Patent Application No. 200718082-1, dated Aug. 26, 2009.
Examination Report, Corresponding to Malaysian Patent Publication No. PI 20052553, dated Jul. 15, 2011.
Examination Report, Corresponding to Malaysian Patent Publication No. PI 20062537, dated May 13, 2011.
Examination Report, Corresponding to Malaysian Patent Publication No. PI 20062537, dated May 31, 2013.
Examination Report, Corresponding to Malaysian Patent Publication No. PI 20062537, dated Oct. 30, 2009.
Examination Report, Corresponding to Malaysian Patent Publication No. PI 200904643-4, dated May 25, 2012.
Examination Report, Corresponding to Malaysian Patent Publication No. PI 20092343, dated Sep. 30, 2013.
Examination Report, Corresponding to Malaysian Patent Publication No. PI 2011003695, dated Apr. 30, 2013.

Freund et al. (2003) Thin Film Materials—Stress, Defect Formation, and Surface Evolution. Cambridge University Press, Cambridge pp. 86-93.
Freund, L.B. (2000) "The Mechanics of Electronic Materials," *Int. J. Solids Struct.* 37:185-196.
Friedman et al. (2005) "Nanotechnology: High-Speed Integrated Nanowire Circuits," *Nature* 434:1085.
Fu et al. (Jan. 10, 2003) "Patterning of Diamond Microstructures on Si Substrate by Bulk and Surface Micromachining," *J. Mater. Process. Technol.* 132(1-3):73-81.
Furneaux et al. (1989) "The Formation of Controlled-Porosity Membranes from Anodically Oxidized Aluminum," *Nature* 337:147-149.
Germain et al. (2007) "Electrodes for microfluidic devices produced by laser induced forward transfer," *Applied Surface Science*, 253:8328-8333.
Green et al. (1995) "Optical Properties of Intrinsic Silicon at 300 K," Progress in Photovoltaics, 3(3):189-192.
Holke and Henderson (1999) "Ultra-Deep Anisotropic Etching of (110) Silicon," *J. Micromech. Microeng.* 9: 51-57.
Holmes et al. (Dec. 1998) "Sacrificial layer process with laser-driven release for batch assembly operations," J. Microelectromechanical Syst. 7(4):416-422.
Hung et al. (2004) "Microfabricated Suspensions for Electrical Connections on the Tunable Elastomer Membrane," Appl. Phys. Lett. 85:6051-6053.
Incropera, D. P. DeWitt, T. L. Bergman, and A. S. Lavine A.S., "Fundamentals of Heat and Mass Transfer", Wiley, Hoboken (2007) pp. 540-571.
International Search Report and Written Opinion corresponding to International Application No. PCT/US2012/021092, dated May 23, 2012.
International Search Report corresponding to International Application No. PCT/US2012/046744, dated Oct. 5, 2012.
Ishikawa et al. (2009) "Transparent Electronics Based on Transfer Printed Aligned Carbon Nanotubes on Rigid and Flexible Substrates," ACS Nano 3:73-79.
Jung et al. (2010) "Paraboloid Electronic Eye Cameras Using Deformable Arrays of Photodetectors in Hexagonal Mesh Layouts," Appl. Phys. Lett. 96:021110.
Jung et al. (2011) "Dynamically Tunable Hemispherical Electronic Eye Camera System with Adjustable Zoom Capability," Proc. Natl. Acad. Sci. USA.108(5):1788-1793.
Kim et al. (2010) "Microstructured Elastomeric Surfaces with Reversible Adhesion and Examples of Their Use in Deterministic Assembly by Transfer Printing," Proc. Nat. Acad. Sci. USA 107(40):17095-17100.
Kim et al. (published online Mar. 30, 2012) "High-Efficiency, Microscale GaN Light-Emitting Diodes and Their Thermal Properties on Unusual Substrates," *Small.* 11:1643-1649.
Lambros et al. (1999) "A Novel Technique for the Fabrication of Laboratory Scal Model Functionality Graded Materials," *Experimental Mechanics.* 39(3):184-190.
Lee et al. (2006) "Bendable GaN High Electron Mobility Transistors on Plastic Substrates," Journal of Applied Physics 100(12):124507.
Malyarchuk et al. (2010) "Experimental and Modeling Studies of Imaging with Curvilinear Electronic Eye Cameras," Optics Express. 18:27346-27358.
Newport "Gaussian Beam Optics," http://www.rpgroup.caltech.edu/courses/aph162/2007/Protocols/Optics/e3872_Gaussian-Beam-Optics.pdf; 484-485.
Notice of Allowance corresponding to Korean Patent Application No. 10-2006-7022369, dated Jun. 26, 2012—includes English translation.
Notice of Allowance corresponding to Korean Patent Application No. 10-2007-7000216, dated Jun. 26, 2013—includes English translation.
Notice of Allowance corresponding to Korean Patent Application No. 10-2008-7000080, dated Mar. 7, 2013—includes English translation.

(56) References Cited

OTHER PUBLICATIONS

Notice of Allowance corresponding to Korean Patent Application No. 10-2012-7010094, dated Feb. 25, 2013—includes English translation.
Notice of Allowance corresponding to Korean Patent Application No. 10-2012-7032629, dated Jul. 10, 2013—includes English translation.
Notice of Allowance corresponding to Korean Patent Application No. 10-2013-7011761, dated Oct. 15, 2013—includes English translation.
Notice of Allowance corresponding to U.S. Appl. No. 11/115,954, dated Dec. 21, 2006.
Notice of Allowance corresponding to U.S. Appl. No. 11/145,574, dated Aug. 26, 2009.
Notice of Allowance corresponding to U.S. Appl. No. 11/421,654, dated May 5, 2010.
Notice of Allowance corresponding to U.S. Appl. No. 12/564,566, dated Apr. 7, 2011.
Notice of Allowance with Search Report corresponding to Taiwan Patent Application No. 095119520, dated Oct. 7, 2013—includes English translation.
Notice of Reasons for Rejection corresponding to Japanese Patent Application No. P2006-541498, dated Jul. 27, 2010—includes English translation.
Notice of Reasons for Rejection corresponding to Japanese Patent Application No. P2006-541498, dated Nov. 22, 2011—includes English translation.
Notice of Reasons for Rejection corresponding to Japanese Patent Application No. P2007-510931, dated Dec. 14, 2010—English translation only.
Notice of Reasons for Rejection corresponding to Japanese Patent Application No. P2007-510931, dated Sep. 13, 2011—includes English translation.
Notice of Reasons for Rejection corresponding to Japanese Patent Application No. P2009-529401, dated Jan. 15, 2013—includes English Translation.
Notice of Reasons for Rejection corresponding to Japanese Patent Application No. P2008-514820, dated May 8, 2012—includes English translation.
Notice of Reasons for Rejection corresponding to Japanese Patent Application No. P2009-546361, dated Jul. 3, 2012—includes English translation.
Notice of Reasons for Rejection corresponding to Japanese Patent Application No. P2009-546361, dated Sep. 17, 2013—includes English translation.
Office Action corresponding to Chinese Patent Application No. 200780034881.7, dated Feb. 16, 2012—includes English translation.
Office Action corresponding to Chinese Patent Application No. 200780034881.7, dated Jul. 3, 2013—includes English translation.
Office Action corresponding to Chinese Patent Application No. 200780034881.7, dated Jul. 7, 2010—includes English translation.
Office Action corresponding to Chinese Patent Application No. 200780034881.7, dated Nov. 23, 2012—English translation only.
Office Action corresponding to Chinese Patent Application No. 201010294409.0, dated Aug. 11, 2011—includes English translation.
Office Action corresponding to Chinese Patent Application No. 201010294409.0, dated Mar. 31, 2012—includes English translation.
Office Action corresponding to Chinese Patent Application No. 201010519400.5, dated Nov. 3, 2011—includes English translation.
Office Action corresponding to Chinese Patent Application No. 201010519400.5, dated Oct. 30, 2012—includes English translation.
Office Action corresponding to Chinese Patent Application No. 201110077508.8, dated Jan. 5, 2013—includes English translation.
Office Action corresponding to Chinese Patent Application No. 201110077508.8, dated Sep. 17, 2013—includes English translation.
Office Action corresponding to European Patent Application No. 05 755 193.9, dated Jul. 7, 2011.
Office Action corresponding to Korean Patent Application No. 10-2006-7022369, dated Apr. 19, 2012—includes English translation.
Office Action corresponding to Korean Patent Application No. 10-2006-7022369, dated May 25, 2011—includes English translation.
Office Action corresponding to Korean Patent Application No. 10-2007-7000216, dated Feb. 21, 2013—includes English translation.
Office Action corresponding to Korean Patent Application No. 10-2007-7000216, dated Oct. 19, 2011—includes English translation.
Office Action corresponding to Korean Patent Application No. 10-2008-7000080, dated Jul. 13, 2012—includes English translation.
Office Action corresponding to Korean Patent Application No. 10-2009-7007923, dated Sep. 17, 2013—includes English translation.
Office Action corresponding to Korean Patent Application No. 10-2009-7017067, dated Aug. 30, 2013—includes English translation.
Office Action corresponding to Korean Patent Application No. 10-2012-7010094, dated May 25, 2012—includes English translation.
Office Action corresponding to Korean Patent Application No. 10-2012-7030789, dated Feb. 25, 2013—includes English translation.
Office Action corresponding to Korean Patent Application No. 10-2012-7032629, dated Mar. 4, 2013—includes English translation.
Office Action corresponding to Korean Patent Application No. 10-2013-7011761, dated Jul. 4, 2013—includes English translation.
Office Action corresponding to Korean Patent Application No. 10-2013-7022416, dated Nov. 29, 2013—includes English translation.
Office Action corresponding to Korean Patent Application No. 10-2013-7022417, dated Nov. 29, 2013—includes English translation.
Office Action corresponding to Korean Patent Application No. 10-2007-7000216, dated Sep. 19, 2012—includes English translation.
Office Action corresponding to U.S. Appl. No. 11/858,788, dated Jul. 21, 2010.
Office Action Corresponding to U.S. Appl. No. 12/398,811, dated Nov. 26, 2012.
Office Action corresponding to U.S. Appl. No. 13/071,027, dated Jul. 29, 2013.
Office Action corresponding to U.S. Appl. No. 13/071,027, dated Oct. 12, 2012.
Office Action corresponding to U.S. Appl. No. 13/100,774, dated Jul. 18, 2013.
Office Action corresponding to U.S. Appl. No. 12/376,245, dated Dec. 22, 2011.
Office Action corresponding to U.S. Appl. No. 12/376,245, dated Oct. 10, 2012.
Office Action corresponding to U.S. Appl. No. 11/001,689, dated Aug. 26, 2009.
Office Action corresponding to U.S. Appl. No. 11/001,689, dated Nov. 25, 2008.
Office Action corresponding to U.S. Appl. No. 13/228,041, dated Apr. 19, 2013.
Office Action corresponding to U.S. Appl. No. 13/228,041, dated Nov. 7, 2013.
Okada et al. (1984) "Precise determination of lattice parameter and thermal expansion coefficient of silicon between 300 and 1500K," J. Appl. Phys. 56(2):314-320.
Parameswaran et al. (2000) "Processing a Characterization of a Model Functionality Gradient Material," *J. Mater. Sci.* 35:21-29.
Pique et al. (2006) "Laser Forward Transfer of Electronic and Power Generating Materials," Ch14., In; Laser Ablation and its Applications, Springer, pp. 339-373.

(56) References Cited

OTHER PUBLICATIONS

Rim et al. (2008) "The Optical Advantages of Curved Focal Plane Arrays," Opt. Express. 16:4965-4971.
Saeidpourazar et al. (2011) "Laser-driven Non-contact Transfer Printing of Prefabricated Microstructures," Submitted to IEEE/ASME J MEMS.
Saeidpourazar et al. (2012) "A Prototype Printer for Laser Driven Micro-Transfer Printing," Proc. NAMRI/SME 40.
Search and Examination Report, Corresponding to Singapore Application No. 200904208-6, dated Nov. 8, 2010.
Search Report and Examination Corresponding to Singapore Patent Application No. 200607372-0, dated Oct. 17, 2007.
Second Office Action corresponding to Chinese Patent Application No. 201110076041.5, dated Nov. 5, 2012—includes English Translation.
Shaw et al. (2010) "A Study of the Sensor Shape of a Hemispherical Electronic Eye Variable Focus Camera Lens," Optical Review. 17(6):541-548.
Shin et al. (2010) "Micromechanics and Advanced Designs for Curved Photodetector Arrays in Hemispherical Electronic-Eye Cameras," Small. 6:851-856.
Song et al. (2009) "Mechanics of Noncoplanar Mesh Designs for Stretchable Electronic Circuits," J. Appl. Phys. 105:123516.
Stoney GG (1909) "The tension of metallic films deposited by electrolysis," Proc. R Soc. Lond A 82(553)172-175.
Substantive Examination Report corresponding to Malaysian Patent Application No. PI 20092671, mailed Aug. 15, 2012.
Suo (1989) "Singularities interacting with interfaces and cracks," Int. J. Solids Struct. 25(10):1133-1142.
Supplementary European Search Report corresponding to European Patent Application No. 05 755 193.9, dated Mar. 3, 2011.
Supplementary European Search Report, Corresponding to European Application No. 06 77 1761, dated Apr. 4, 2012.
Tang et al. (2008) "Dynamically Reconfigurable Liquid-Core Liquid-Cladding Lens in a Microfluidic Channel," Lab on a Chip. 8:395-401.
Third Office Action corresponding to Chinese Patent Application No. 201110076041.5, dated May 17, 2013—includes English Translation.
Tsai et al. (2008) "Miniaturized Universal Imaging Device Using Fluidic Lens," Optics Letters. 33(3):291-293.
Tsai et al. (2010) "Fluidic Lens Laparoscopic Zoom Camera for Minimally Invasive Surgery," Journal of Biomedical Optics Letters. 15(3):030504.
U.S. Department of Energy (2010) Solid-state lighting research and development: Multi-year program plan, (Energy USDo). available from http://www1.eere.energy.gov/buildings/ssl/techroadmaps.html.
Wang et al. (2009) "Mechanics of Hemispherical Electronics," Appl. Phys. Lett. 95:181912.
Wartena et al. (2004) Li-ion Microbatteries Generated by a Laser Direct-Write Method. Journal of Power Sources, 126(1-2):193-202.
Written Opinion corresponding to Singapore Patent Application No. 200718082-1, dated Jan. 15, 2009.
Xin et al. (Jun. 2005) "Evaluation of Polydimethylsiloxane Scaffolds with Physiologically-Relevant Elastic Moduli: Interplay of Substrate Mechanics and Surface Chemistry Effects on Vascular Smooth Muscle Cell Response," *Biomaterials* 26(16):3123-3129.
Xu et al. (2008) "Direct Transfer Patterning on Three Dimensionally Deformed Surfaces at Micrometer Resolutions and its Application to Hemispherical Focal Plane Detector Arrays," Org. Electron. 9:1122-1127.
Yu et al. (2010) "Tunable Liquid-Filled Lens Integrated with Aspherical Surface for Spherical Aberration Compensation," Opt. Express. 18:9945-9954.
Zhang et al. (2003) "Fluidic Adaptive Lens with High Focal Length Tunability," Appl. Phys. Lett. 82:3171-3172.

\* cited by examiner

THERMALLY MANAGED LED ARRAYS ASSEMBLED BY PRINTING

CROSS-REFERENCE TO RELATED APPLICATIONS

This application claims the benefit of priority from U.S. Provisional Patent Application Nos. 61/486,487, filed May 16, 2011, and 61/608,839, filed Mar. 9, 2012, each of which is hereby incorporated by reference in its entirety.

STATEMENT REGARDING FEDERALLY SPONSORED RESEARCH OR DEVELOPMENT

This invention was made with United States governmental support under Award No. DEFG02-91 ER45439 awarded by the U.S. Department of Energy. The U.S. government has certain rights in the invention.

BACKGROUND

This invention is in the field of printable electronics and optical systems. This invention relates generally to methods for making and assembling electronic devices and printable electronic devices, including light devices such as arrays of light emitting diodes.

A variety of platforms are available for fabricating and assembling printable structures and/or device components on substrates, including printing based assembly of nano- and micro-structures for applications in macroelectronics, flexible electronics, and optical systems (e.g., photovoltaics, displays, lighting, etc.). For example, a number of patents and patent applications describe different methods and systems for making and printing a wide range of structures, including U.S. Pat. Nos. 7,195,733, 7,557,367, 7,622,367 and 7,521,292, U.S. Patent Application Publication Nos. 2009/0199960, 2007/0032089, 2008/0108171, 2008/0157235, 2010/0059863, 2010/0052112, 2010/0002402, 2010/0283069 and 2010/0317132, and U.S. patent application Ser. Nos. 13/046,191 (filed Mar. 11, 2011); all of which are hereby incorporated by reference in their entireties to the extent not inconsistent herewith.

SUMMARY

Provided herein are electronic devices including arrays of printable light emitting diodes (LEDs) having device geometries and dimensions providing enhanced thermal management and control relative to conventional LED-based lighting systems. LED arrays of some embodiments, for example, have physical dimensions and form factors that distribute high quality single crystalline semiconductor LEDs so as to achieve a combination of high performance attributes (e.g., useful luminous efficacy, radiant power, and power consumption) and beneficial thermal properties (e.g., useful heat dissipation rates and maximum LED temperatures for reasonable power consumptions). The systems and methods described provide large area, transparent, and/or flexible LED arrays useful for a range of applications in microelectronics, including display and lightning technology. Methods are also provided for assembling and using electronic devices including thermally managed arrays of printable light emitting diodes (LEDs).

Devices of some aspects of the invention utilize printable semiconductor diode structures provided in a sparse array device geometry to achieve useful radiant output characteristics while efficiently managing heat generation and dissipation. Devices of some aspects of the invention utilize printable semiconductor LED structures characterized by a size scale small enough so as to access efficient passive heat dissipation by other structures and/or components of the device array. In some embodiments, printable LEDs having micro- and/or nano-sized physical dimensions are interconnected by electrical interconnects having physical dimensions and physical properties, such as thermal mass and thermal conductivity, such that they simultaneously function to electrically interconnect the LEDs in the array and efficiently dissipate heat generated by the LEDs in the array. In some embodiments, the physical dimensions of the LEDs and electrical interconnects are selected such that the electrical interconnects function as efficient heat sinks during operation of the device. In some embodiments, the LED arrays of embodiments have component dimensions and geometries such that electrical interconnects of the device provide an effective route for passively cooling the device during operation. Accordingly, device geometries and LED dimensions of the present systems are useful for reducing peak operating temperatures so as to avoid temperatures wherein LED performance, longevity and functionality is degraded or destroyed.

Aspects of the invention provide device geometries and process strategies for efficiently distributing semiconductor material in the form of thin printable LED structures on a substrate to achieve LED arrays exhibiting useful radiant and thermal management properties, for example. Benefits of the present include providing an economically viable and technically robust platform for assembling a wide variety of displays systems including large area display devices, flexible display devices and plastic electronics.

In an embodiment, for example, provided is an electronic device comprising: a substrate; an array of light emitting diodes (LEDs) supported by the substrate, the array of LEDs comprising: a plurality of printable light emitting diode (LED) elements, wherein each LED element in the array of LEDs has one or more lateral dimensions, and optionally all lateral dimensions, less than or equal to 1000 µm and a thickness dimension less than or equal to 50 µm, and wherein a spacing between adjacent LED elements in the array of LEDs is greater than or equal to at least one lateral dimension of an LED element in the array; and a plurality of electrical interconnects, wherein each LED element in the array of LEDs is positioned in electrical communication and thermal communication with at least two of the plurality of electrical interconnects, wherein each of the electrical interconnects has lateral dimensions and a thickness large enough to provide dissipation of heat from the array of LEDs at a rate greater than or equal to 5 µJ s$^{-1}$. In an embodiment, for example, the lateral dimensions and a thickness of the interconnects is large enough to provide dissipation of heat from the array of LEDs at a rate equal to or greater than the heat power. In an embodiment, each of the electrical interconnects is in physical contact with one or more of the printable LED elements of the array.

In an embodiment, for example, provided is an electronic device comprising: a substrate; and an array of light emitting diodes (LEDs) supported by the substrate, the array of LEDs comprising: a plurality of printable LED elements, wherein each LED element in the array of LEDs has one or more lateral dimensions, and optionally all lateral dimensions, less than or equal to 1000 µm and a thickness dimension less than or equal to 50 µm, and wherein a spacing between adjacent LED elements in the array of LEDs is greater than or equal to 2 µm; and a plurality of electrical interconnects, wherein each LED element in the array of LEDs is positioned in electrical communication with at least two of the plurality of electrical interconnects, wherein each of the electrical interconnects is characterized by lateral dimensions and an average thickness. In an embodiment, LED elements of the array are provided in a sparse geometry. In an embodiment, each of the electrical interconnects is in thermal communication and/or physical contact with one or more of the printable LED elements of the array.

In an embodiment, an electronic device further comprises one or more encapsulating layers provided to at least partially encapsulate one or more components of the array. In an embodiment, for example, the device further comprises an encapsulating layer provided on at least a portion of the array, wherein the encapsulating layer has a thickness selected over the range of 1 μm to 10 mm, and optionally a thickness selected over the range of 10 μm to 1 mm. In an embodiment, the device further comprises one or more adhesive layers on a receiving surface of the substrate for affixing at least a portion of the LED elements. In an embodiment, the device further comprises one or more planarizing layers on a receiving surface of the substrate for planarizing at least a portion of the LED elements. In an embodiment, an electronic device further comprises one or more planarizing layers on a receiving surface of the substrate for accommodating at least a portion of the LED elements. In an embodiment, the printable LED elements of the array and/or the electrical interconnects are positioned proximate to the neutral mechanical surface of the electronic device.

In an embodiment, one or more of the electrical interconnects are stretchable or flexible interconnects, for example, provided in a bent configuration and/or at least partially not in physical contact with the substrate. In an embodiment, the electronic device has an island—interconnect geometry wherein the printable LED elements comprise device island and the electrical interconnects provide bridge structures between the LED elements, for example, wherein the electrical interconnects provide bridge structures comprising stretchable interconnects.

Thermally managed devices are also provided herein, wherein the physical dimensions, properties and integration of individual LED structures and electrical interconnect structures of the array are selected to achieve efficient dissipation of heat generated by the LEDs during operation, for example, so as to avoid peak operating temperatures capable of degrading LED performance and longevity. Electronic device embodiments are provided, for example, wherein the physical dimensions of the electrical interconnects of the array, such as lateral dimensions and thickness dimensions, are sufficiently large to provide heat dissipation from each of the LEDs in the array during operation at rate selected over the range of 5 μJ s$^{-1}$ to 100 J s$^{-1}$, and optionally for some applications selected over the range of 5 μJ s$^{-1}$ to 5 J s$^{-1}$. Certain embodiment are provided, for example, wherein the physical dimensions of electrical interconnects, such as lateral dimensions and thickness dimension, are sufficiently large to provide a maximum temperature of each of the LEDs in the array less than or equal to 373 K for a power consumption equal to or greater than 5 μW.

In some devices of this aspect, the thermal properties of the electrical interconnects are selected so as to achieve efficient dissipation of heat generated by the LED structures of the array during operation. In an embodiment, for example, the heat capacity of the electrical interconnects is greater than or equal to $7.3 \times 10^{-11}$ J/K per LED in the array and optionally selected from the range of $7.3 \times 10^{-11}$ J/K to $7.3 \times 10^{-10}$ J/K per LED in the array. In an embodiment, for example, the electrical interconnects of the array have an average heat capacity that is equal to or greater than $7.3 \times 10^{-11}$ J/K, and optionally selected from the range of $7.3 \times 10^{-11}$ J/K to $7.3 \times 10^{-10}$ J/K. In an embodiment, for example, the specific heat capacity of the electrical interconnect is 2.422 J/cm$^{-3}$/K and the specific heat capacity of the LEDs, such as GaN LEDs, is 2.99 J/cm$^{-3}$/K. In an embodiment, for example, the volumetric specific heat capacity of an interconnect is 2.422 J/cm$^3$/K and, thus, a heat capacity of $7.3 \times 10^{-11}$ J/K is obtained for an interconnect volume equal to approximately 30 μm$^3$.

In an embodiment, the average thermal conductivity of the electrical interconnects is larger than the average thermal conductivity of that of the LED elements. In an embodiment, for example, the average thermal conductivity of each of the electrical interconnects is a factor of 0.4 to 50 of the average thermal conductivity of the LED elements, and optionally wherein the average thermal conductivity of each of the electrical interconnects is a factor of 0.44 to 1.54 of the average thermal conductivity of the LED elements. Electronic devices of this aspect are provided, for example, wherein the thermal conductivity of each of the interconnects is 70, 160, or 247 W/m/k and the thermal conductivity of the LEDs, such as GaN LEDs, is 160 W/m/k.

In some devices of this aspect, LEDs of the array are provided in a sparse device geometry. As used herein, a "sparse geometry" refers to arrays having sufficient spacing between adjacent LEDs in the array to allow effective thermal management, while also providing radiant properties useful for a given optical application. Sparse geometries useful in embodiments include a diffuse assembly of LEDs printed onto a device substrate and/or arrays characterized by low spatial densities of LEDs. In embodiments, for example, arrays of electronic devices feature a density of the LED elements less than or equal to 100 LEDs mm$^{-2}$, optionally for some applications less than or equal to 10 LEDs mm$^{-2}$, and optionally for some applications less than or equal to 1 LED mm$^{-2}$. In an embodiment, for example, embodiments provide a thermally managed device having an array with a density of the LED elements less than or equal to 81 LEDs mm$^{-2}$, and optionally for some applications a density of the LED elements selected over the range of 1 to 81 LEDs mm$^{-2}$. In an embodiment, for example, the spacing between adjacent LED elements in the array of LEDs is greater than or equal to 2 μm and optionally for some applications greater than or equal to 10 μm. As used herein, the term "spacing" with reference to LED structures in an LED array refers to the shortest distance separating adjacent LEDs in the array. In an embodiment, for example, the spacing between adjacent LED elements in the array of LEDs is selected over the range of 2 μm to 10 cm, and optionally for some applications selected over the range of 10 μm to 100 μm. In an embodiment, for example, the array has an average spacing between adjacent LED elements selected over the range of 10 μm to 1 μm, and optionally for some applications selected over the range of 2 μm to 100 μm. In an embodiment, thermally managed devices are provided having an array comprising LEDs with lateral dimensions equal to or less than 10 μm, wherein the spacing between adjacent LEDs in the array is greater than or equal to 2 μm.

In some devices of this aspect, the physical dimensions of the LEDs of the array are selected so as to achieve efficient heat removal via electrical interconnect components provided in thermal communication with the LEDs. In an embodiment, for example, each LED element in the array of LEDs has one or more, and optionally all, lateral dimensions less than or equal to 500 µm, and optionally for some applications less than or equal to 100 µm. In an embodiment, for example, provided is a device wherein the lateral dimensions of each of the LED elements are selected over the range of 10 µm to 500 µm, and optionally for some applications wherein each of the LED elements in the array has average lateral dimensions selected over the range of 10 µm to 500 µm. In an embodiment, for example, the thickness dimension of each of the LED elements is less than or equal to 50 µm, and optionally for some embodiments less than or equal to 10 µm. In an embodiment, for example, the thickness dimension of each of the LED elements is selected over the range of 500 nm to 50 µm, and optionally for some applications 1 µm to 50 µm. In an embodiment, for example, each of the LED elements in the array has an average thickness dimension selected over the range of 500 nm to 50 µm and optionally for some applications 1 µm to 50 µm. In an embodiment, for example, an electronic device of the invention features one or more lateral dimensions of each LED element, and optionally all lateral dimensions of each LED element, selected over the range of 10 µm to 500 µm, selected over the range of 50 µm to 300 µm, or selected over the range of 50 µm to 250 µm. In an embodiment, for example, the thickness of each LED element is selected over the range of 30 nm to 500 nm, selected over the range of 50 nm to 300 nm or selected over the range of 100 nm to 200 nm. In an embodiment, for example, each of the electrical interconnects has a thickness selected over the range of 300 nm to 5 µm, selected over the range of 500 nm to 2000 nm, selected over the range of 500 nm to 800 nm or selected over the range of 1000 nm to 1500 nm. In an embodiment, for example, each of the electrical interconnects has one or more lateral dimensions, and optionally all lateral dimensions, selected over the range of 10 µm to 100 mm, selected over the range of 100 µm to 100 mm or selected over the range of 200 µm to 100 mm.

In some devices of this aspect, the physical dimensions of the electrical interconnects of the array are selected so that they efficiently dissipate heat generated by the LEDs of the array during operation. In an embodiment, for example, each of the electrical interconnects has an average thickness greater than or equal to 10 nm, and optionally for some applications greater than or equal to 100 nm, and optionally for some applications greater than or equal to 300 nm, and optionally for some applications, greater than or equal to 1 µm. In an embodiment, for example, each of the electrical interconnects has an average thickness selected over the range of 10 nm to 100 µm, and optionally for some applications selected over the range of 300 nm to 100 µm. In an embodiment, for example, each of the electrical interconnects has a thickness greater than or equal to 10 nm, and optionally for some applications greater than or equal to 300 nm, and optionally for some applications greater than or equal to 1 µm. In an embodiment, for example, each of the electrical interconnects has an average thickness selected over the range of 10 nm to 1.5 µm, and optionally for some applications selected over the range of 300 nm to 1 µm. In an embodiment, for example, each of the electrical interconnects has lateral dimensions selected over the range of 10 µm to 10 cm, and optionally for some applications selected over the range of 500 µm to 100 mm. As used herein, "lateral dimensions" refer to dimensions perpendicular to the thickness dimension, and optionally dimensions parallel to a receiving surface of the substrate. Lateral dimensions include, for example, length and width dimensions. In embodiments, the term "thickness" refers to a dimension of a component perpendicular to a supporting substrate.

Electronic devices of this aspect are compatible with a wide range of LED devices, device geometries and device configurations, including LED structures that are assembled on the receiving surface of the substrate via printing-based techniques such as dry transfer contact printing or solution printing. In an embodiment, for example, each LED element in the array comprises a vertical type LED. In an embodiment, for example, each LED element in the array is encapsulated by one or more polymer encapsulants, such as one or more elastomer encapsulating layers. In an embodiment, for example, a plurality of the LED elements is electrically connected in a series configuration. In an embodiment, for example, a plurality of the LED elements is electrically connected in a parallel configuration. In an embodiment, for example, each of the LED elements in the array is independently electrically addressable. In an embodiment, for example, the LED array consumes a power selected over the range of 5 µW to 100 W, and optionally selected over the range of 5 µW to 5 W. In an embodiment, for example, the LED array has a luminous efficacy greater than or equal to 0.1 lm/W, and/or optionally for some applications a luminous efficacy selected over the range of 0.1 lm/W to 250 lm/W.

Electronic devices of this aspect are compatible with LEDs comprising a wide range of semiconductor materials. In an embodiment, for example, the LEDs of the array comprise printable semiconductor structures, for example, semiconductor structures that are assembled via soft lithography printing techniques such as dry transfer contact printing. In an embodiment, for example, the LEDs of the array comprise one or more inorganic semiconductor materials including single crystalline inorganic semiconductors, polycrystalline semiconductors and doped semiconductors. In an embodiment, for example, each LED element independently comprises a material selected from the group consisting of: GaN, p-type GaN, n-type GaN, InGaN, AlGaN and any combination of these. In an embodiment, for example, each LED element independently comprises a material selected from the group consisting of: a semiconductor, Si, Ga, Al, N, As, P, In and any combination of these. In an embodiment, for example, each LED element independently comprises a material selected from the group consisting of: GaN, GaP AlN, GaAs, InAlP, AlGaAs, AlGaN, InGaP, InGaN, AlGaInP, and any combination of these.

A range of electrical interconnect geometries and materials are useful in the devices described herein. In embodiments, electrical interconnects are positioned in both electrical contact and thermal contact with LEDs in the array. In an embodiment, the plurality of electrical interconnects provides a current path to and from one or more LED elements. In an embodiment, the plurality of electrical interconnects provides a path for flow of heat generated by one or more LED elements. In an embodiment, the plurality of electrical interconnects functions as a heat sink for heat generated by one or more LED elements. In an embodiment, the plurality of electrical interconnects provides electrical interconnects between individual LED elements. In an embodiment, each of the electrical interconnects comprises a thin film structure. In an embodiment, each of the electrical interconnects comprises a unitary structure. In an embodiment, each of the electrical interconnects independently comprises a metal, for example, a metal selected from the group consisting of aluminum, copper, gold, platinum, nickel, titanium or any combination of these. In certain embodiments, metals useful for electrical interconnects of devices of this aspect include metals capable of use in sputtering or e-beam evaporation systems.

A range of substrate geometries and materials are useful in the devices of this aspect. In an embodiment, the substrate has a receiving surface for supporting the LED elements and electrical interconnects. The LED elements and/or electrical interconnects may be in physical contact with the substrate or alternatively in physical contact with one or more intermediate structures (e.g., layers) provided between the LED elements and/or electrical interconnects and the substrate. In some embodiments, for example, the receiving surface has an adhesive layer to receive and secure the LED elements and/or the electrical interconnects on the substrate. In some embodiments, for example, the receiving surface has a planarizing layer to receive and accommodate the LED elements and/or the electrical interconnects, thereby planarizing the LED elements and/or the device. In some embodiments, for example, the receiving surface has an encapsulating layer to receive and at least partially encapsulate the LED elements and/or the electrical interconnects. Useful adhesive layers, planarizing layers and encapsulating layers for some applications include polymer layers and/or prepolymer layers. In an embodiment, the receiving surface is planar. Alternatively, useful substrates have a contoured receiving surface, such as a convex surface, a concave surface or a surface having a plurality of convex and/or concave regions. In an embodiment, the substrate is a flexible substrate, such as a polymer substrate. In an embodiment, the substrate is at least partially optically transparent, for example, at least partially optically transparent in the visible region of the electromagnetic spectrum or at least partially optically transparent in the ultraviolet region of the electromagnetic spectrum. In an embodiment, the substrate comprises a dielectric material. In an embodiment, the substrate comprises a material selected from the group consisting of: a flexible material, a stretchable material, an inorganic material, a ceramic, a polymer, an elastomer and any combination of these. In an embodiment, the substrate comprises a material selected from the group consisting of: a polymer, an inorganic polymer, an organic polymer, a plastic, an elastomer, a biopolymer, a thermoset, a rubber, fabric, paper, silk, a hydrogel and any combination of these.

Additional optical and device components are useful with the devices and methods described herein. In one embodiment, a device of this aspect further comprises an array of phosphors positioned in optical communication with the LED array. In a specific embodiment, an array of phosphor elements is provided, for example, as a polymer mold at least partially encapsulating an array of phosphor elements. In specific embodiments, phosphor elements useful with devices and methods described herein include those having one or more lateral dimensions, and optionally all lateral dimensions, less than or equal to 1000 µm, and optionally for some applications having lateral dimensions matching underlying LED elements. In some embodiments, phosphor elements useful with the devices and methods described herein include those having one or more thickness dimensions selected over the range of 50 µm to 250 µm, or optionally for some applications selected over the range of 60 µm to 105 µm. In embodiments, devices of this aspect optionally further comprise an optical diffuser positioned in optical communication with the LED array and/or a phosphor array, if present in the device. For certain embodiments, an optical diffuser has a thickness greater than 1 µm. Optionally, an optical diffuser has a thickness greater than 10 µm. In certain embodiments, a phosphor array and/or an optical diffuser are laminated over the top of an LED array. In some embodiments, spacing layers and/or adhesive layers are provided between an LED array and a phosphor array. In some embodiments, spacing layers and/or adhesive layers are provided between an LED array and an optical diffuser. In certain embodiments, both phosphor arrays and optical diffusers are incorporated into devices of this aspect, with optional spacing layers and/or adhesive layers positioned adjacent to each. Useful spacing layers and/or adhesive layers include polymer and prepolymer layers.

In an embodiment, for example, the electronic device further comprises a phosphor patterned polymer layer in optical contact with the array of printable LED elements, the phosphor patterned polymer layer having a plurality of phosphor-containing reservoirs aligned with one or more of the printable LED elements such that electromagnetic radiation from the printable LED elements is transmitted to the phosphor-containing reservoirs. In an embodiment, for example, the electronic device further comprises a thin film optical diffuser in optical contact with the array of printable LED elements such that electromagnetic radiation from the printable LED elements or the phosphor-containing reservoirs in optical communication with the printable LED elements is transmitted through the thin film optical diffuser.

In another aspect, provided are methods of making electronic devices. Specific embodiments of this aspect provide methods for making electronic devices, for example devices described in the above aspects. One embodiment of this aspect comprises the steps of providing a substrate; assembling a plurality of printable LED elements onto the substrate by transfer printing the printable LED elements onto a receiving surface of the substrate, thereby making an array of LED elements, wherein each LED element has one or more lateral, and optionally all lateral dimensions, dimensions less than or equal to 1000 µm and a thickness dimension less than or equal to 50 µm and wherein a spacing between adjacent LED elements in the array of LED elements is greater than or equal to at least one lateral dimension of an LED element in the array of LED elements; providing a plurality of electrical interconnects to the array of LED elements, wherein each LED element in the array of LED elements is positioned in electrical communication and thermal communication with two or more of the plurality of electrical interconnects, wherein each of the electrical interconnects has lateral dimensions and an average thickness large enough to provide dissipation of heat from the array of LED elements at a rate greater than or equal to 5 µJ s$^{-1}$. In a an embodiment, the step of assembling a plurality of printable LED elements onto the substrate by transfer printing the printable LED elements onto a receiving surface of the substrate is achieved via dry contact transfer printing.

In an embodiment, for example, the invention provides a method of making an electronic device comprising the steps of: (1) providing a substrate; (2) assembling a plurality of printable LED elements onto the substrate by transfer printing the printable LED elements onto a receiving surface of the substrate, thereby making an array of LED elements, wherein each LED element has one or more lateral dimensions less than or equal to 1000 µm and a thickness dimension less than or equal to 50 µm and wherein a spacing between adjacent LED elements in the array of LED elements is greater than or equal to 2 µm; (3) providing a plurality of electrical interconnects to the array of LED elements, wherein each LED element in the array of LED elements is positioned in electrical communication with two or more of the plurality of electrical interconnects, wherein each of the electrical interconnects is characterized by lateral dimensions and an average thickness, thereby making the electronic device.

In an embodiment, for example, the invention provides a method of making an electronic device further comprising the steps of (1) providing a conformal patterning device, such as an elastomeric stamp, (2) contacting at least a portion of the printable LED elements with a conformable transfer device having a contact surface, wherein contact between the contact surface and the printable LED elements binds at least a portion of the printable LED elements to the contact surface, thereby forming the contact surface having the printable LED elements disposed thereon; (3) contacting the printable LED elements disposed on the contact surface with the receiving surface of the substrate; and (4) separating the contact surface of the conformable transfer device and the printable LED elements, wherein the LED elements are transferred onto the receiving surface, thereby assembling the printable LED elements on the receiving surface of the substrate. In an embodiment, for example, the printable LED elements are provided in a selected pattern, for example providing a preselected spacing between adjacent printable LED elements, and the selected pattern is maintain using the transfer printing process, for example, by maintaining the relative positions and orientations of the printable LED elements during transfer printing. In an embodiment, for example, conformal contact is established between the contact surface of the conformable transfer device and external surfaces of the printable LED elements. In an embodiment, for example, conformal contact is established between the contact surface having the printable LED elements disposed thereon and the receiving surface of the substrate. In an embodiment, for example, an adhesive layer is provided on the receiving surface, wherein the printable LED elements are contacted with the adhesive layer during transfer of the printable LED elements to the receiving surface of the substrate.

In an embodiment, a method of the invention further comprises the step of generating the printable LED elements via epitaxial growth of a semiconductor multilayer structure on a host substrate, for example, wherein the semiconductor multilayer structure is an InGaN multilayer. In an embodiment, the method further comprises selectively removing material from the InGaN multilayer so as to generate a plurality of InGaN multilayer relief structures on the host substrate, for example, wherein the InGaN multilayer relief structures are defined lithographically. In an embodiment, the method further comprises at least partially releasing the InGaN multilayer relief structures so as to generate freestanding InGaN multilayer structures or InGaN multilayer structures at least partially physically separated from the host substrate, for example, wherein the InGaN multilayer structures are connected to the host substrate via a supporting anchor structure, such as an uncut GaN anchor structure. In an embodiment, the step of at least partially releasing the InGaN multilayer relief structures generates the printable LED elements. In an embodiment, the method further comprises depositing one or more metal contact pads on the InGaN multilayer and/or the InGaN multilayer relief structures.

In an embodiment, the host substrate is a Si host substrate having a (111) orientation, and the step of at least partially releasing the InGaN multilayer relief structures comprises: (i) selectively removing material from the InGaN multilayer by vertically etching through selected regions of the InGaN multilayer to a selected depth in the Si host substrate, thereby generating a plurality of recessed regions in the Si host substrate having the (111) orientation; and (ii) anisotropically etching the Si host substrate, wherein etching occurs along <110> directions of the Si host between the recessed features. In an embodiment, the step of anisotropically etching the Si host substrate is achieved by exposure to a solution of KOH, such as a solution of KOH at a temperature greater than 298 K. In an embodiment, the host substrate is a sapphire host substrate, wherein the step of at least partially releasing the InGaN multilayer relief structures comprises exposing one or more interfaces between the sapphire host substrate and the InGaN multilayer structures to electromagnetic radiation, such as electromagnetic radiation having a power, wavelength, fluence or any combination of these to provide for decomposition of GaN at the interface, thereby generating Ga metal and nitrogen gas.

In embodiments, methods of this aspect incorporate phosphors into electronic devices. A specific method of this aspect further comprises the steps of providing a phosphor-containing island mold comprising an array of phosphor-containing islands at least partially encapsulated in a polymer mold; and providing the phosphor-containing island mold on the electronic device, wherein at least a portion of the phosphor-containing islands are positioned in optical communication with at least a portion of the LED elements. Optionally, the array of phosphor-containing islands is supported by and/or aligned over the array of LED elements. Optionally, the array of phosphor-containing islands are in physical contact with the array of LED elements. Useful phosphor arrays include those incorporated into a phosphor-containing island mold, as described above.

Methods of this aspect optionally utilize a strategy for forming self-aligned vias, for example vias useful for providing positions for thermal and electrical communication between an LED element and electrical interconnects. In a specific embodiment, a method for making an electronic device further comprises the steps of providing a photosensitive prepolymer layer over the array of LED elements, thereby encapsulating the array of LED elements; exposing portions of the photosensitive prepolymer layer to electromagnetic radiation, wherein the electromagnetic radiation is passed through the substrate and portions of the array of LED elements, thereby forming developed portions and undeveloped portions of the photosensitive prepolymer layer; and removing the undeveloped portions of the photosensitive prepolymer layer, thereby exposing portions of each LED element in the array of LED elements. In certain embodiments, the prepolymer layer is exposed to ultraviolet electromagnetic radiation.

In another aspect, provided are methods for generating electromagnetic radiation, for example methods for generating electromagnetic radiation using an electronic device comprising a substrate and an array of LEDs supported by the substrate. A specific method of this aspect comprises the steps of providing an electronic device comprising a substrate and an array of LEDs supported by the substrate, the array of LEDs comprising a plurality of printable LED elements, wherein each LED element in the array of LEDs has one or more lateral dimensions less than or equal to 1000 µm and a thickness dimension less than or equal to 50 µm, and wherein a spacing between adjacent LED elements in the array of LEDs is greater than or equal to at least one lateral dimension of an LED element in the array, and the array of LEDs further comprises a plurality of electrical interconnects, wherein each LED element in the array of LEDs is positioned in electrical communication and thermal communication with at least two of the plurality of electrical interconnects, wherein each of the electrical interconnects has lateral dimensions and an average thickness large enough to provide dissipation of heat from the array of LEDs at a rate greater than or equal to 5 µJ s$^{-1}$; and providing a voltage and/or current across two or more of the plurality of electrical interconnects to generate electromagnetic radiation from at least a portion of the array of LEDs.

In an embodiment, for example, the invention provides a method of generating electromagnetic radiation comprising the steps of: (1) providing an electronic device comprising: a substrate; and an array of light emitting diodes (LEDs) supported by the substrate, the array of LEDs comprising: a plurality of printable LED elements, wherein each LED element in the array of LEDs has one or more lateral dimensions less than or equal to 1000 µm and a thickness dimension less than or equal to 50 µm, and wherein a spacing between adjacent LED elements in the array of LEDs is greater than or equal to 2 µm; and a plurality of electrical interconnects, wherein each LED element in the array of LEDs is positioned in electrical communication with at least two of the plurality of electrical interconnects, wherein each of the electrical interconnects is characterized by lateral dimensions and an average thickness; and (2) providing a voltage across two or more of the plurality of electrical interconnects, thereby generating electromagnetic radiation from at least a portion of the array of LEDs.

As described above, various parameters of the LED elements, electrical interconnects, and device configurations can be selected to achieve efficient heat removal from the LED elements while they are generating light. In an embodiment, the lateral dimensions and the average thickness of the interconnects are provided with large enough dimension to provide heat dissipation from each LED in the array sufficient to maintain a steady state temperature of each LED in the array less than or equal to 373 K, for example, for a power consumption equal to or greater than 5 µW. In an embodiment, for example, each of the electrical interconnects has an average thickness greater than or equal to 300 nm. In an embodiment, for example, the LED array consumes power equal to or greater than 5 µW. Optionally, the LED array is assembled on the substrate using a dry transfer contact printing method. In one embodiment, an electronic device further comprises a controller positioned in electrical communication with the plurality of electrical interconnects. A controller is useful for aspects of the methods and devices described herein for selecting one or more individual LED elements for generation of light. Specific electrical configurations of LED elements in an array, for example multiple LED elements in a series configuration, multiple LED elements in a parallel configuration or independently addressable LED elements further enhance the utility of a controller.

In certain embodiments, the components of electronic devices described herein can be optimized for generation of electromagnetic radiation of a specific wavelength or wavelength region. For example, in one embodiment, electromagnetic radiation generated by an electronic device described herein has a wavelength or wavelength range selected over the range of 350 nm to 800 nm. Optionally, an array of phosphors is incorporated into an electronic device. Devices incorporating an array of phosphors optionally provide an additional level of configurability in the selection of output electromagnetic radiation. In one embodiment, an array of phosphor absorbs at least a portion of electromagnetic radiation generated by an LED array and emits electromagnetic radiation having a wavelength or wavelength range selected over the range of 400 nm to 800 nm. Specific configurations, for example phosphor thickness and identity, can be used to further tune the output electromagnetic energy. In an exemplary embodiment, the phosphor array and LED array together generate electromagnetic radiation having an x chromaticity coordinate in a CIE 1931 color space selected over the range of 0.25 to 0.4. In an exemplary embodiment, the phosphor array and LED array together generate electromagnetic radiation having an y chromaticity coordinate in a CIE 1931 color space selected over the range of 0.25 to 0.45.

Various features discussed here in relation to one or more of the exemplary embodiments can be incorporated into any of the described aspects of the present invention alone or in any combination. Certain exemplary aspects of the invention are set forth herein. It should be understood that these aspects are presented merely to provide the reader with a brief summary of certain forms the invention might take and that these aspects are not intended to limit the scope of the invention. Indeed, the invention may encompass a variety of aspects that may not be explicitly set forth herein as would be understood by one of ordinary skill in the relevant art without undue experimentation.

Color chromaticity plotted on a CIE 1931 color space diagram for μ-ILEDs integrated with phosphors with thicknesses of 60 μm, 80 μm, and 105 μm. Optical images of a fully interconnected array of μ-ILEDs (C) without phosphor, (D) with a laminated film of encapsulated YAG:Ce phosphor-containing islands (500×500 μm$^2$), and (E) with a laminated diffuser film.

Figure 6:
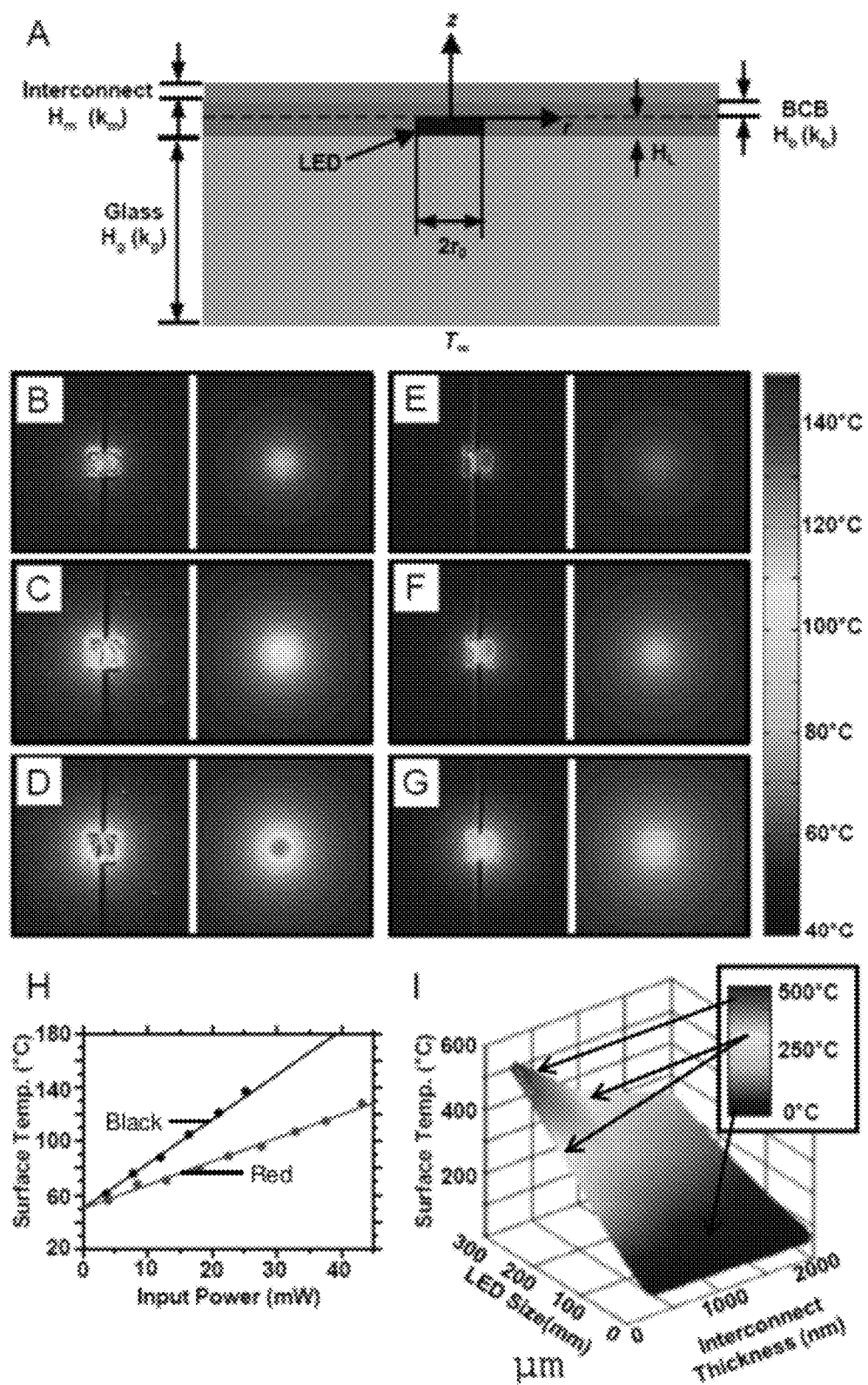

FIG. 6. (A) Schematic illustration of the device geometry and parameters used in the analytical model of heat flow. (B-G) Temperature distributions for isolated InGaN μ-ILEDs with Al interconnects (300 nm and 1000 nm thick for (B-D) and (E-G), respectively) at input powers of (B) 7.8 mW, (C) 16.4 mW, (D) 25.2 mW, (E) 8.4 mW, (F) 18.0 mW, (G) 27.6 mW captured using a QFI Infra-Scope Micro-Thermal Imager (left) and calculated by analytical models (right). (H) Surface temperature for μ-ILEDs with Al interconnect thicknesses of 300 nm (black) and 1000 nm (red) extracted from experiments (dots) and computed using the analytical model (lines) as a function of input power. (H) 3D plot of the surface temperature as function of device size and interconnect thickness, at a constant heat flux of 400 W/cm$^2$.

Figure 7:
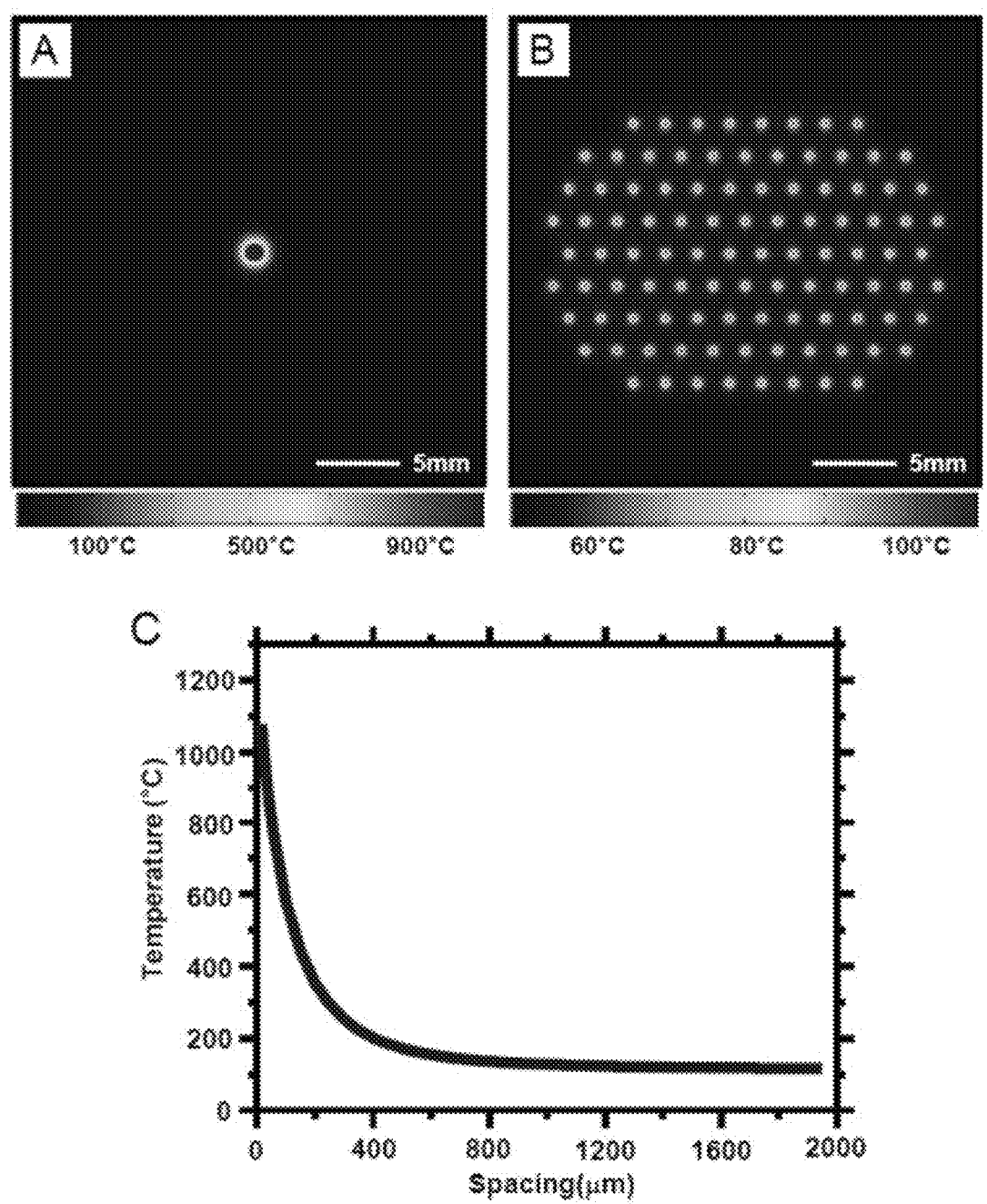

FIG. 7. Temperature distribution for (A) a macro-size LED (i.e. 1×1 mm$^2$), and (B) an array of 100 μ-ILEDs (i.e. 100×100 μm$^2$) at a spacing of 2 mm. (C) μ-ILEDs surface temperature versus spacing for an array of 100 μ-ILEDs.

Figure 8:
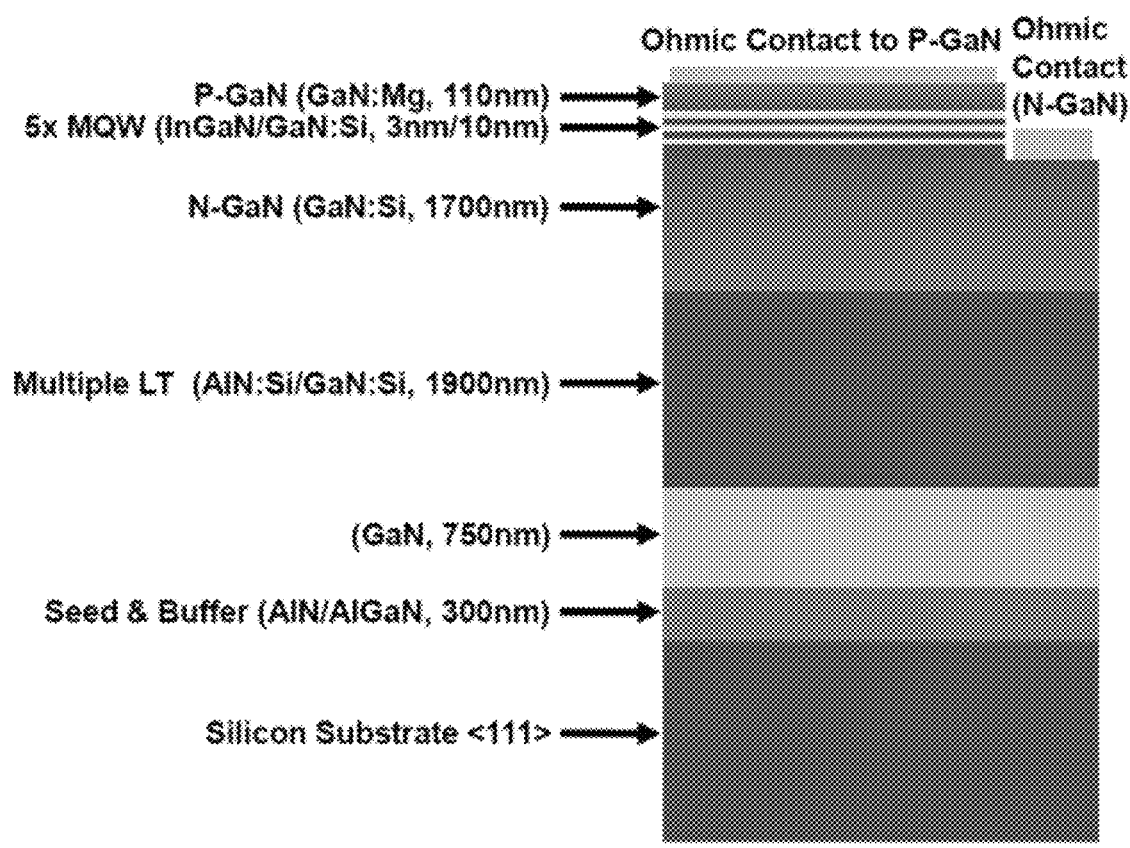

FIG. 8. Schematic illustration of epitaxial stack of InGaN MQW LED on Si (111) wafer.

Figure 9:
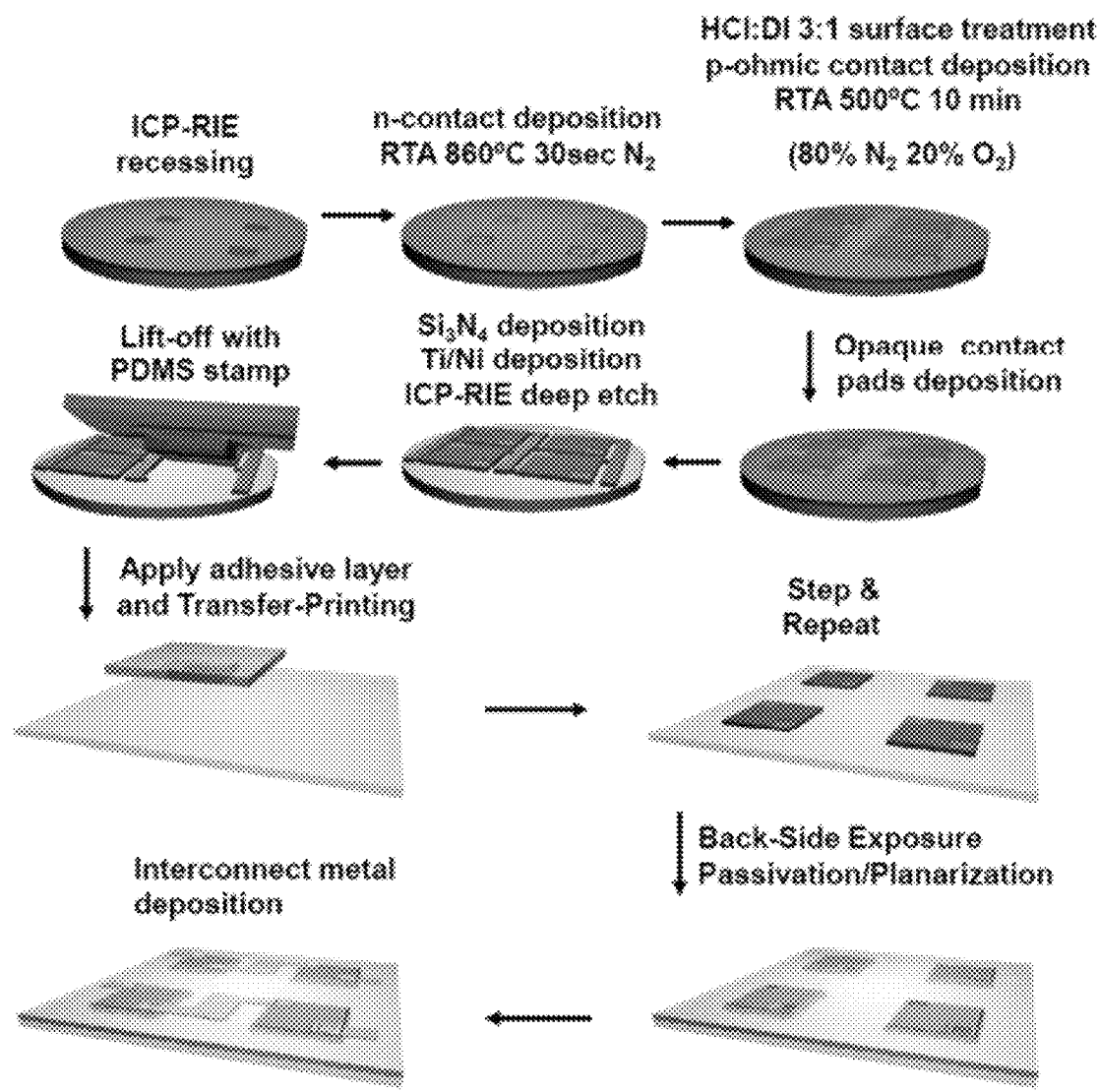

FIG. 9. Schematic overview of a fabrication process for making an electronic device embodiment.

Figure 10:
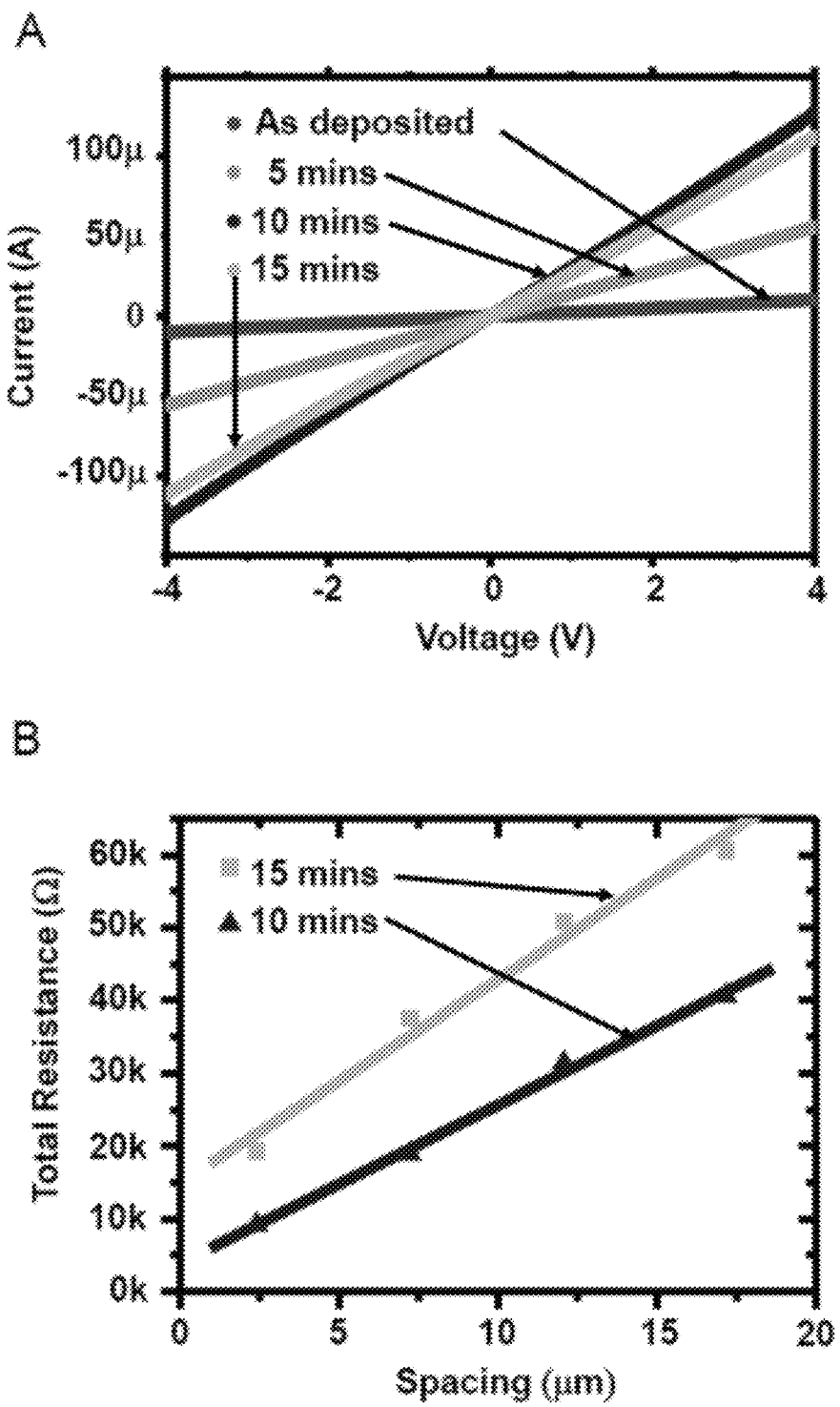

FIG. 10. Ohmic contact characteristics of Ni (10 nm)/Au (10 nm) to p-GaN. (a) Current-voltage characteristics of Ni/Au contact to p-GaN with TLM pad spacing of 21 μm in three different annealing conditions (i.e. As deposited, 5 mins, 10 mins, and 15 mins annealing). (b) Plot of total resistance at four different pad spacing of 2.5 μm, 7.25 μm, 12 μm, and 17 μm.

Figure 11:
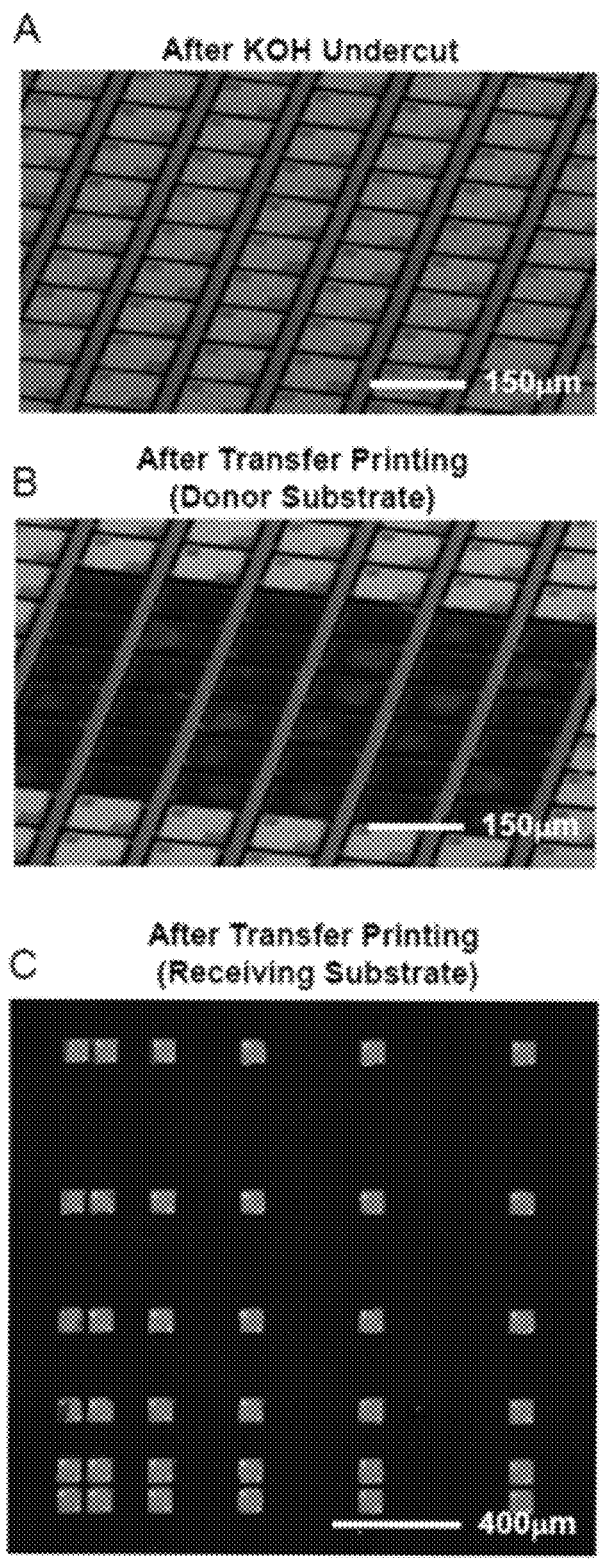

FIG. 11. Scanning electron microscopy (SEM) images of μ-ILEDs on (a) donor substrate after KOH undercut process, (b) donor substrate after transfer-printing process, and (c) receiving substrate (i.e. glass) after the transfer-printing process. μ-ILEDs are transfer-printed onto a glass substrate with varying pitches ranging from 25 μm to 500 μm.

Figure 12:
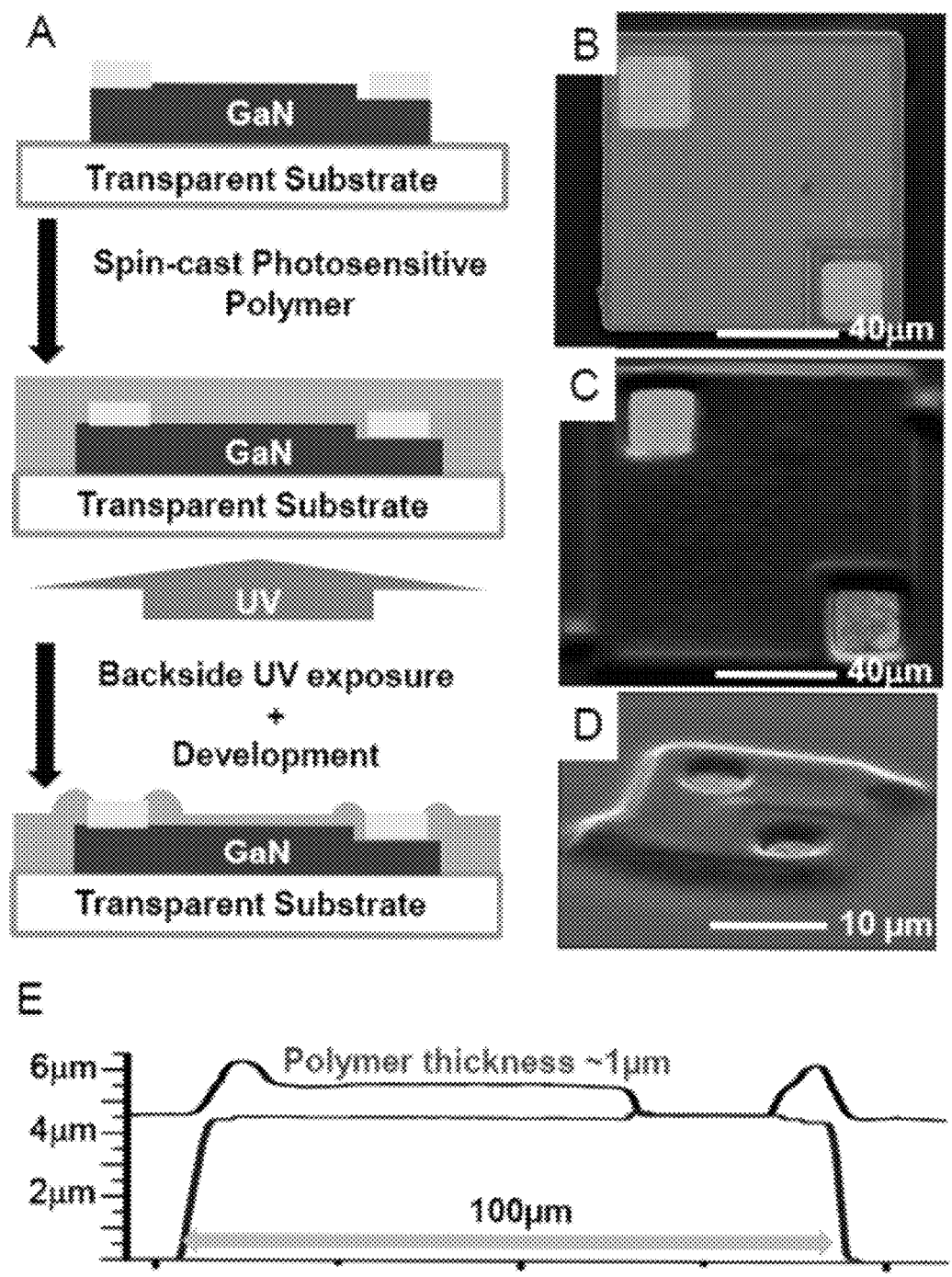

FIG. 12. (a) Schematic illustration of Back-Side Exposure (BSE) process for self-aligned passivation and via formation. Scanning electron microscopy (SEM) image of a 100×100 μm$^2$ printed μ-ILED (b) before, and (c) after BSE process. (d) SEM image of 25×25 μm$^2$ μ-ILED after BSE process (colorized for easy of viewing). (E) Cross-sectional profile of μ-ILEDs after BSE process.

Figure 13:
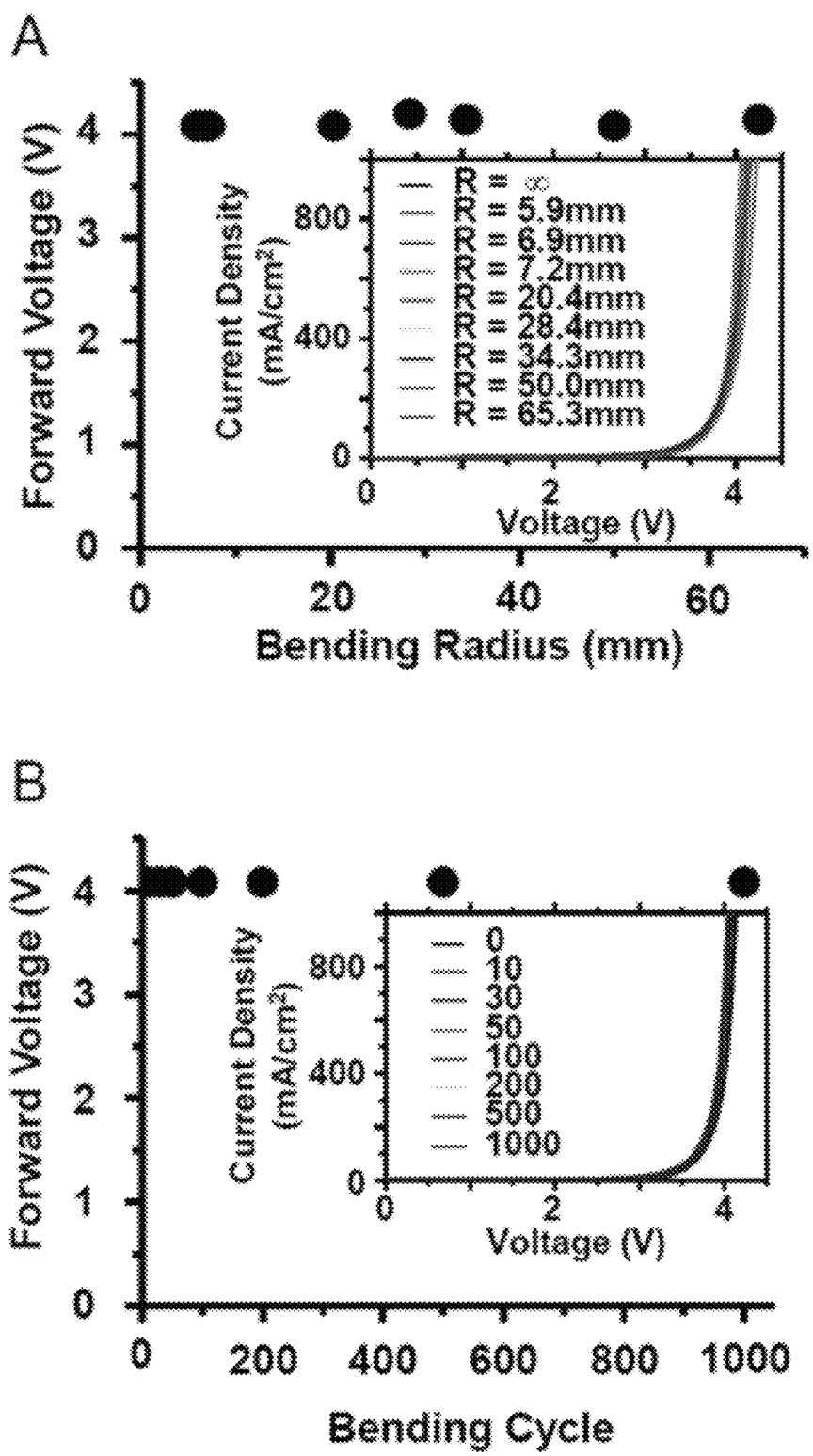

FIG. 13. (a) Forward voltage at 10 mA of current and corresponding current-voltage characteristics (inset) for representative μ-ILEDs printed on a PET substrate measured for varying bending radii. (b) Forward voltage at 10 mA of current and corresponding current-voltage characteristics (inset) for representative μ-ILEDs printed on a PET substrate measured for repetitive cycles.

Figure 14:
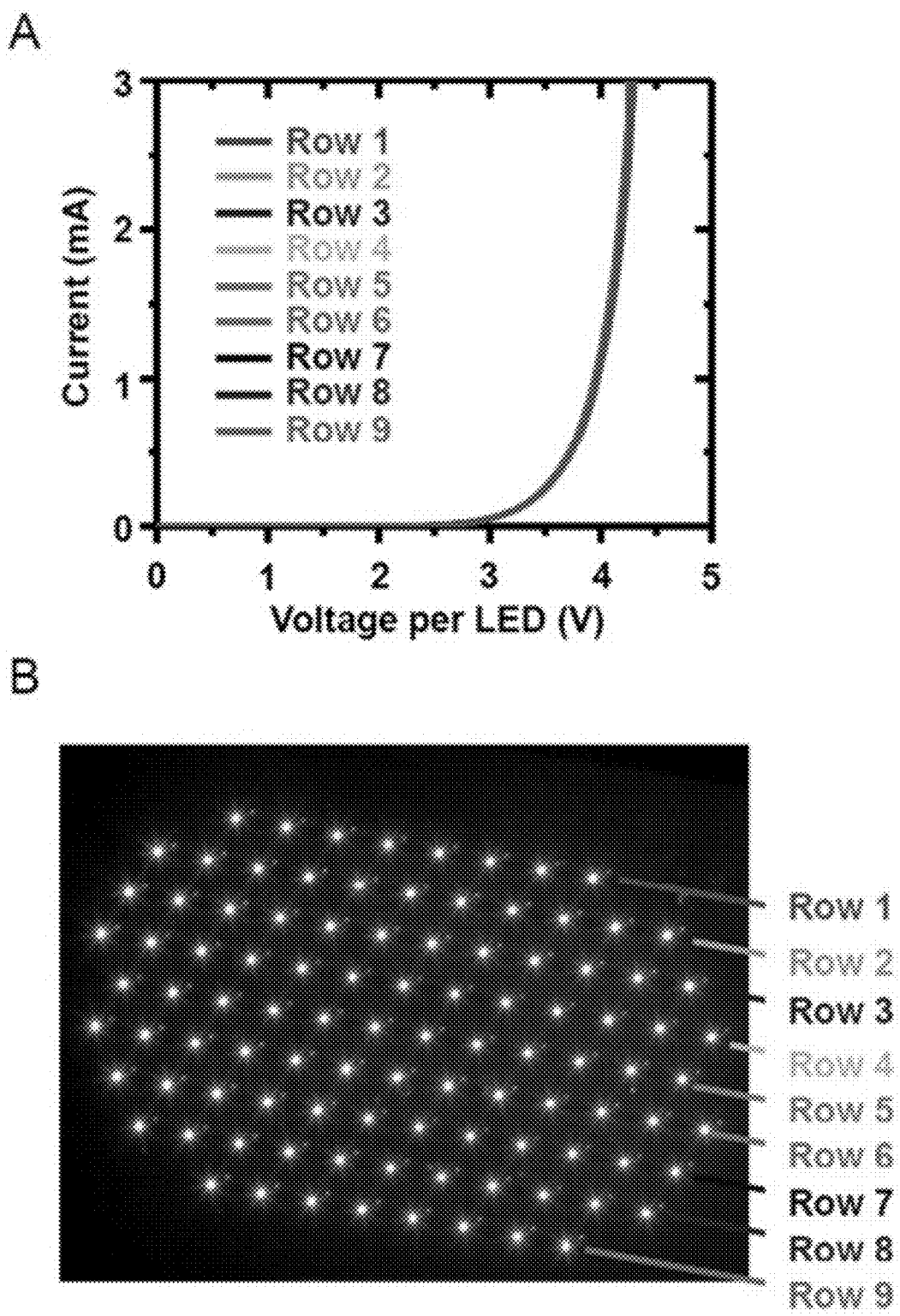

FIG. 14. (a) Current-voltage (I-V) characteristics of 100 μ-ILEDs from an array. (b) Optical image of an array consisting of 100 μ-ILEDs.

Figure 15:
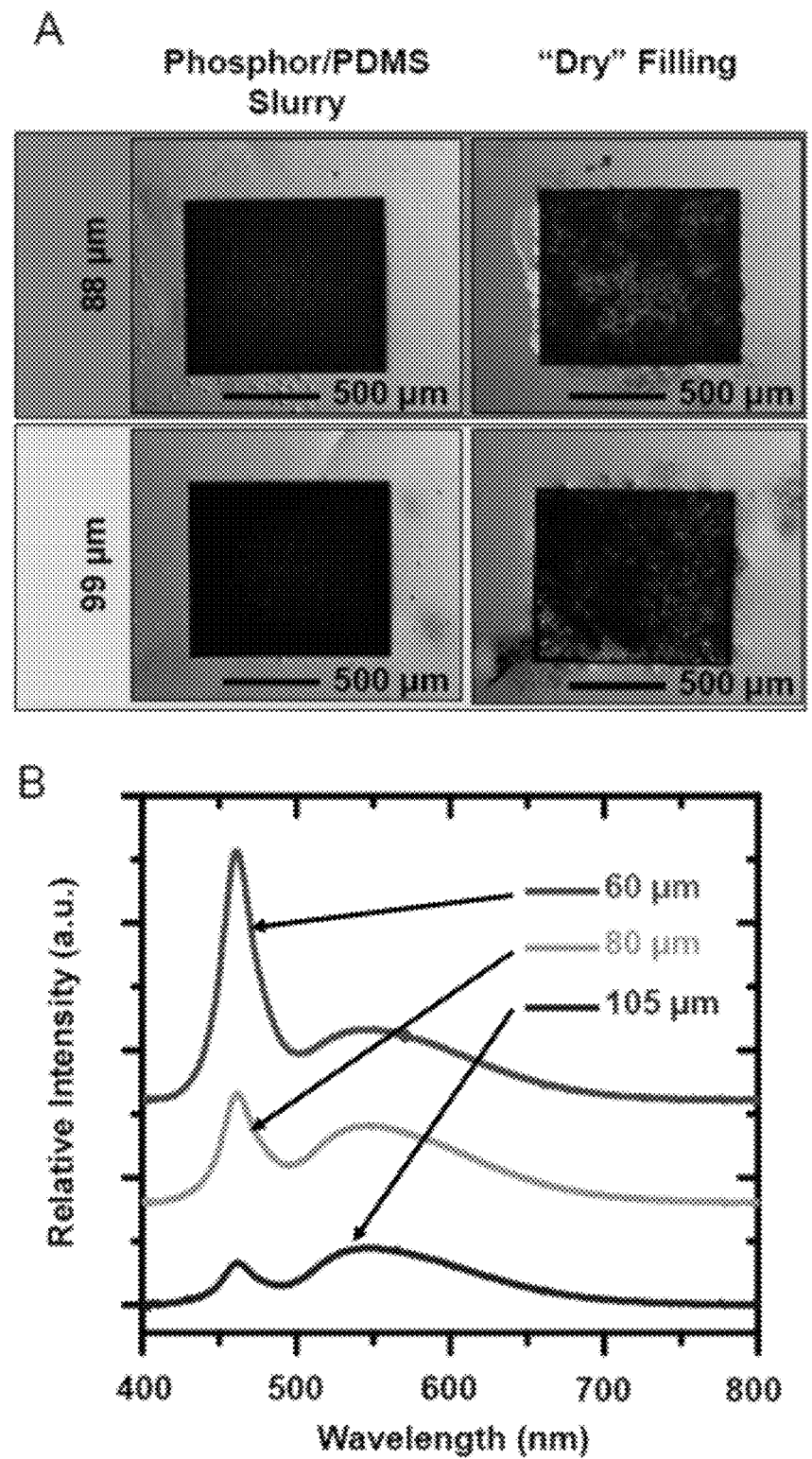

FIG. 15. (a) Optical microscopy images of relief features filled with a PDMS/phosphor slurry (left column) and filled with the phosphor powder only (right column). (b) Emission spectra of white μ-ILEDs with phosphor layer thickness of 60 μm, 80 μm, and 105 μm.

Figure 16:
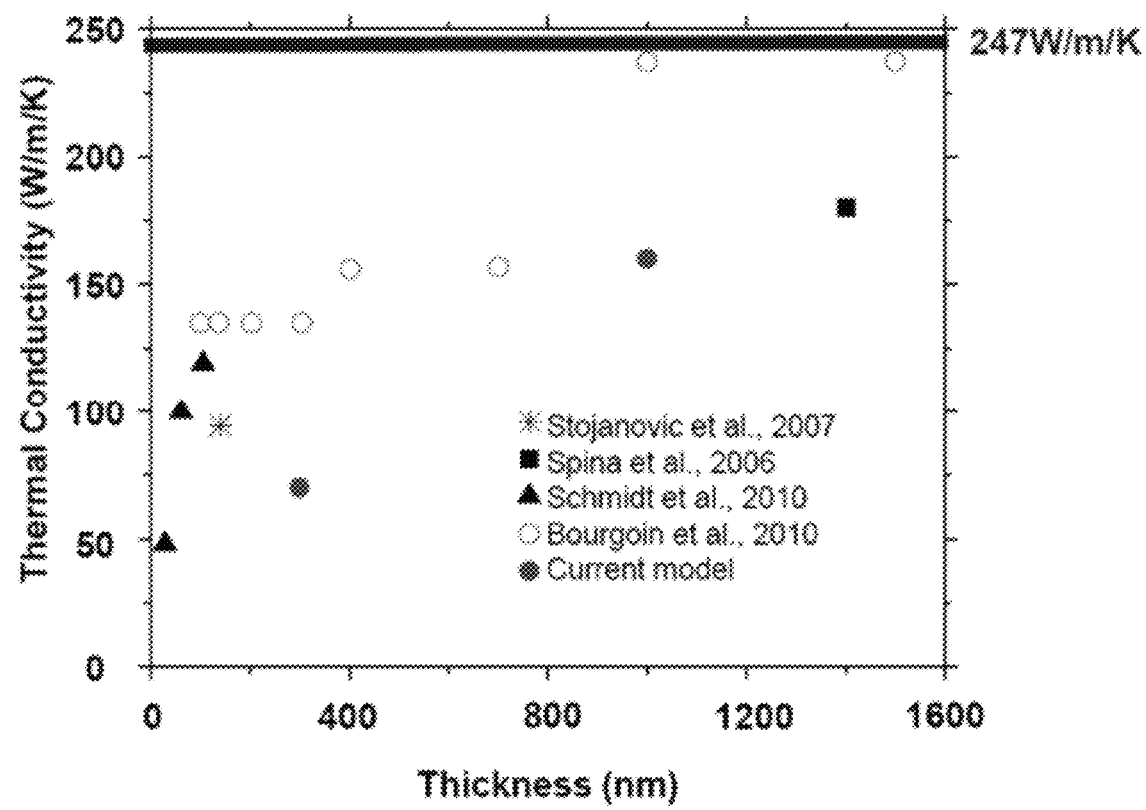

FIG. 16. Reported thermal conductivities of a thin-film Al from several references.

Figure 17:
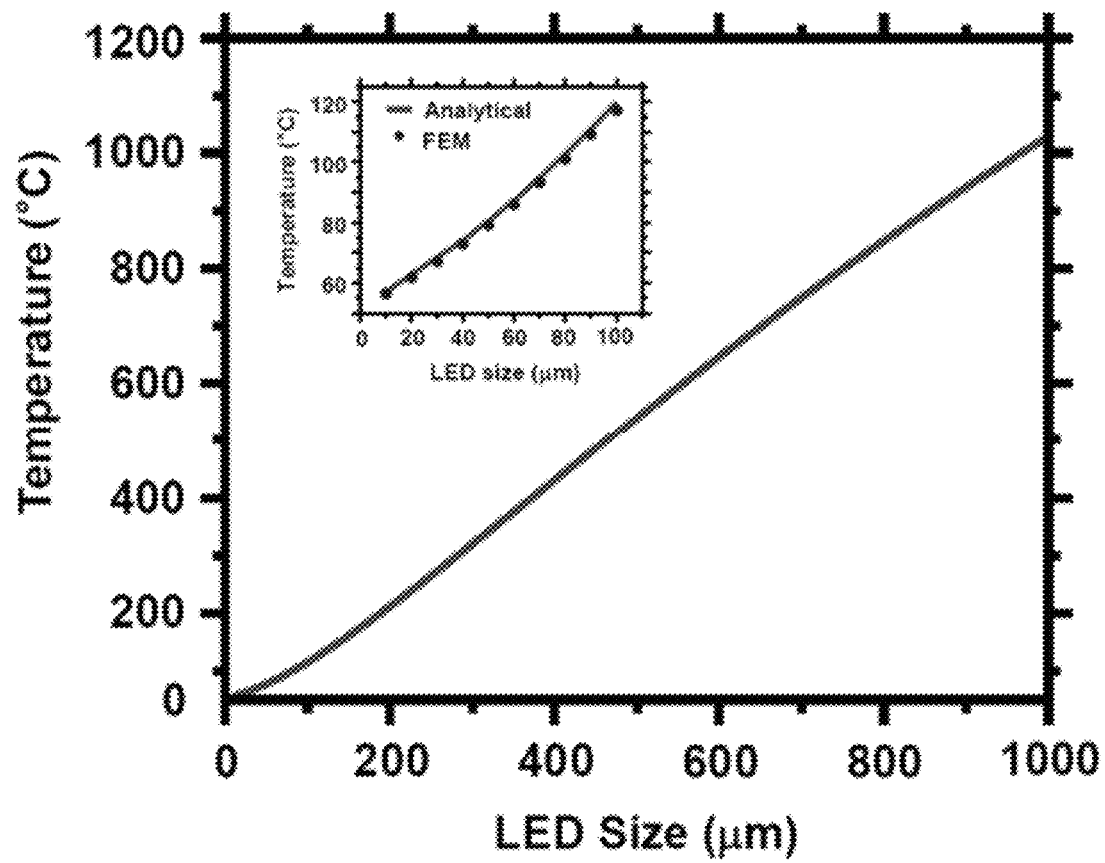

FIG. 17. (a) A plot from analytical results on the surface temperature as a function of LED size up to 1×1 mm$^2$. Inset provides comparison between analytical solution and FEM simulations on the surface temperature as a function of LED size ranging from 10×10 μm$^2$ up to 100×100 μm$^2$.

Figure 18:
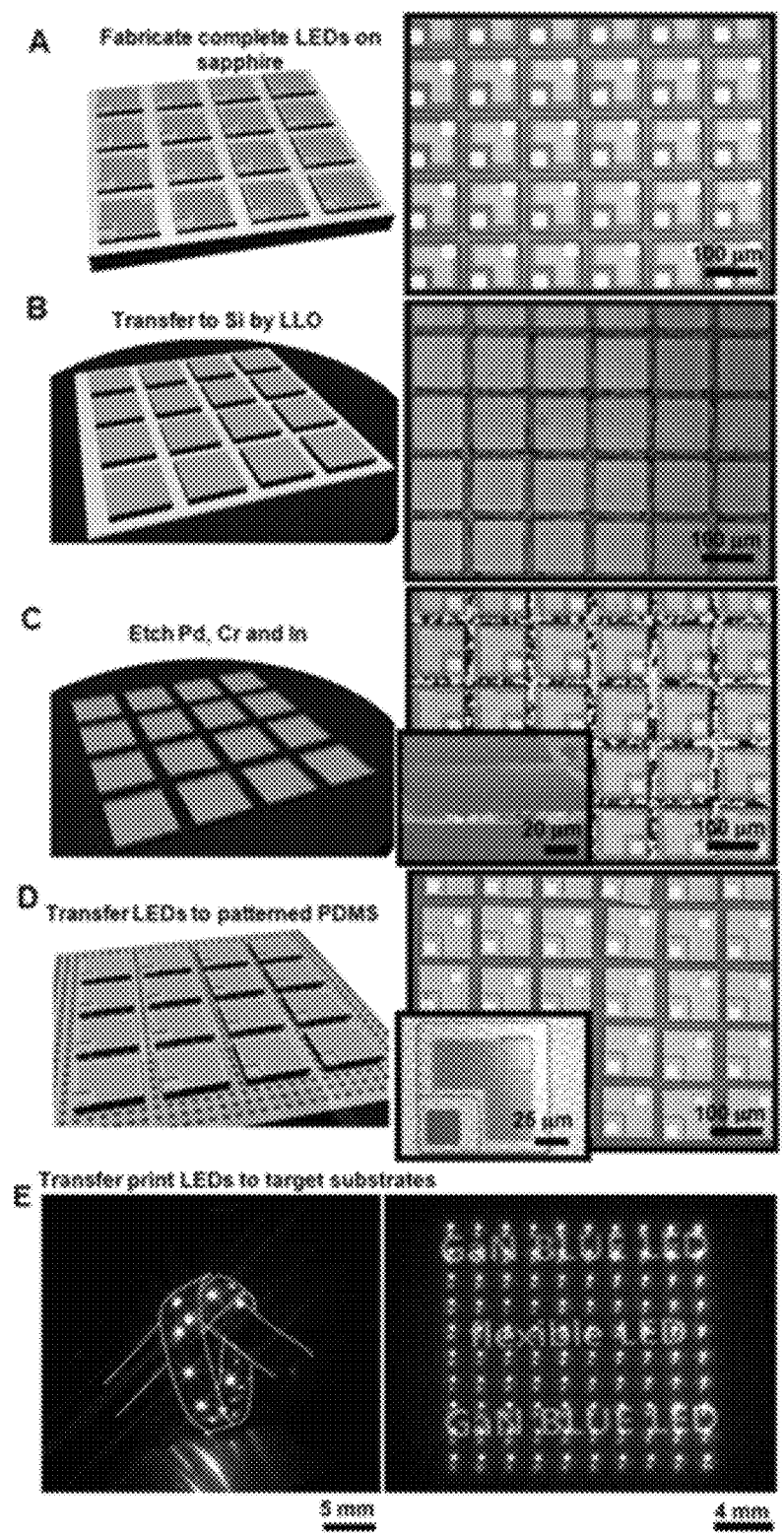

FIG. 18. Schematic illustrations and images corresponding to steps for forming, integrating and interconnecting ultrathin (~6 μm), microscale inorganic light emitting diodes (μ-ILEDs) based on GaN materials grown epitaxially on sapphire substrates. (A) Arrays of μ-ILEDs (100×100 μm$^2$ separated by 20 μm; left: schematic; right: optical micrograph) are first defined, completely, on the sapphire substrate, including L-shaped current spreading p-contacts (Ni: 15 nm/Au:15 nm) and square (25×25 μm$^2$) n- and p-contact pads (Cr: 15 nm/Au:300 nm). (B) Bonding to a silicon wafer using an In—Pd alloy, followed by laser liftoff and removal of the sapphire substrate yields arrays of μ-ILEDs on Si (dark blue). The top sides of the devices (left: schematic; right: optical micrograph), coated with Ga (gray) from the LLO process, can be cleaned by etching with HCl. This etchant also removes unalloyed In, to leave only In—Pd alloy. (C) Schematic illustration (left), optical micrograph (right) and colorized, tilted view scanning electron microscope (SEM) image (right inset) after these etching processes. Only isolated agglomerates of In—Pd (black dots in the optical micrograph and schematic; pink structures in the SEM) remain. (D) Arrays of μ-ILEDs after transfer to the structured surface of a slab of PDMS (arrays of pillars diameters, heights and spacings of 3 μm, 1.4 μm and 5 μm, respectively) and complete removal of residual metal by etchants for Cr and Pd (left: schematic; right: optical micrograph). A layer of SiN$_x$ protects the μ-ILED metallization from these etchants. The inset on the right shows an individual device. (E) Arrays of μ-ILEDs (12 devices) on a 4×15 mm$^2$ strip of PET, tied into a knot to illustrate its deformability (left) and on glass (100 devices; right).

Figure 19:
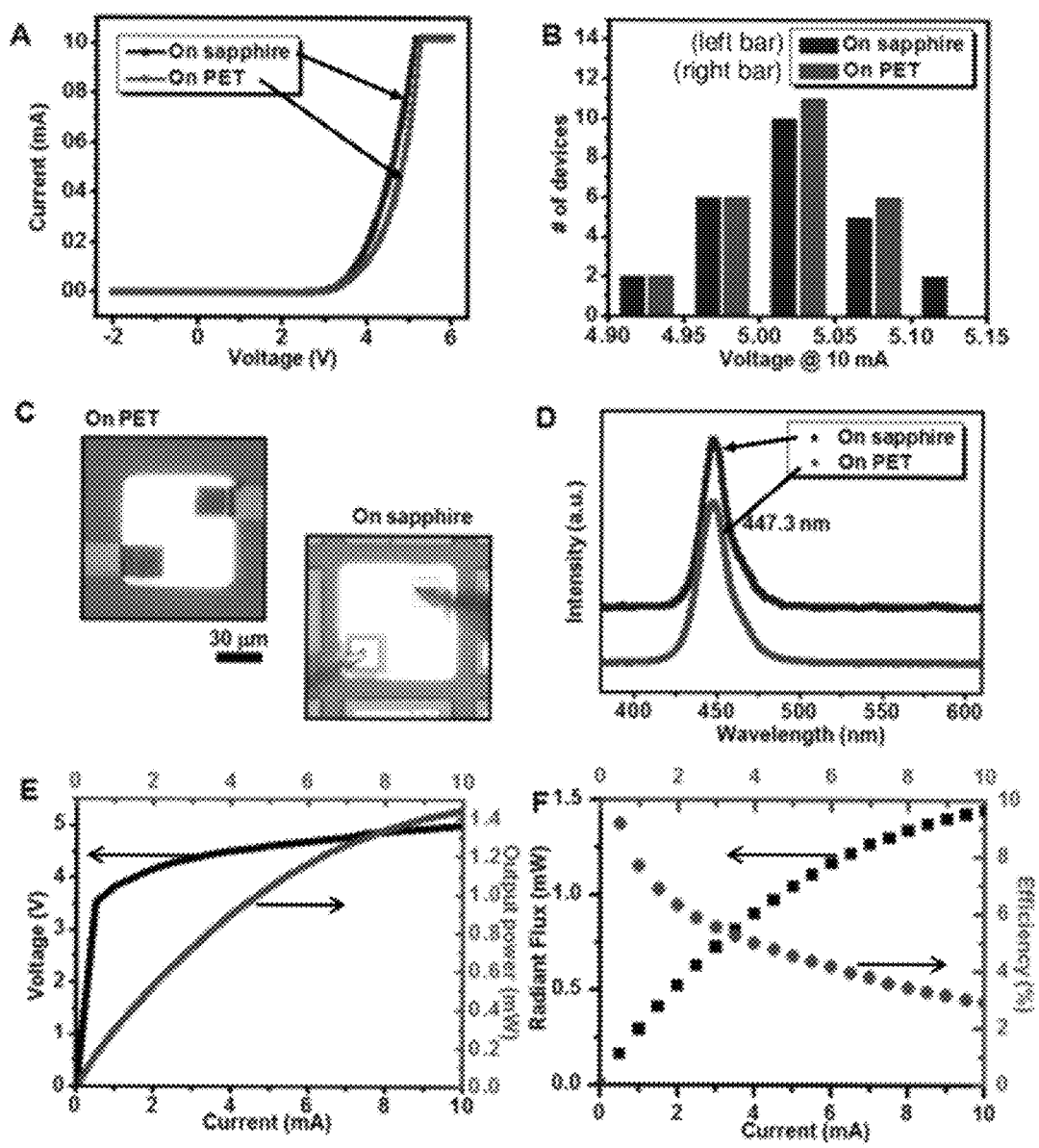

FIG. 19. Electrical (A and B) and optical properties (C-F) of representative p-ILEDs (100×100 μm$^2$) on a sapphire substrate, and on PET. (A) Current-voltage (I-V) characteristics. (B) Histogram of forward voltage at 10 mA current, measured on 25 p-ILEDs on sapphire and on PET, respectively. (C) Images of single μ-ILED on PET (left; at 3 mA) and sapphire (right; at 3 mA). (D) Spectral properties of the emission from the devices shown in (C). (E) Light output-current and -voltage (LIV) measurements for a μ-ILED on PET. (F) Radiant flux and radiant efficiency (energy conversion efficiency) as functions of applied current, for a μ-ILED on PET.

Figure 20:
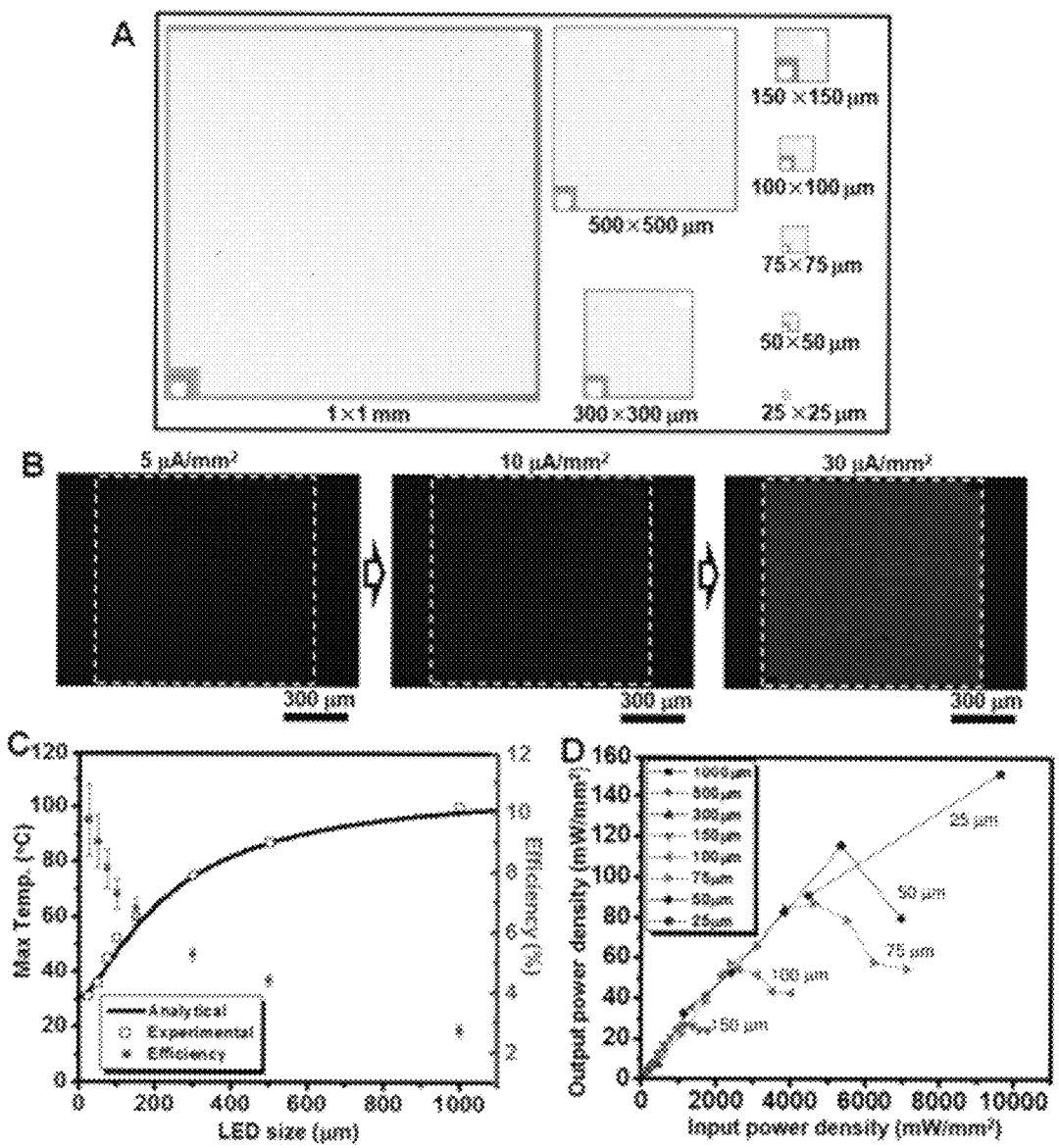

FIG. 20. Size scaling effects in the operation of μ-ILEDs on 50 μm thick PET substrate. (A) Optical micrographs of μ-ILEDs with lateral dimensions from 1×1 mm$^2$, 500×500 μm$^2$, 300×300 μm$^2$, 150×150 μm$^2$, 100×100 μm$^2$, 75×75 μm$^2$, 50×50 μm$^2$, to 25×25 μm$^2$. (B) Micrographs of emission from a representative 1×1 mm$^2$ device, showing uniform output at three current densities: 5, 10, to 30 μA/mm$^2$. (C) Measured (black symbols) and simulated (black line) maximum temperature as a function of μ-ILED size (lateral dimension), at 160 mW/mm$^2$ (For example, 40 mW at 500×500 μm$^2$μ-ILED and 160 mW at 1000×1000 μm$^2$μ-ILED) Red symbols show radiant efficiencies. (D) Output (optical) power density as a function of input (electrical) power density, for μ-ILEDs with different sizes.

Figure 21:
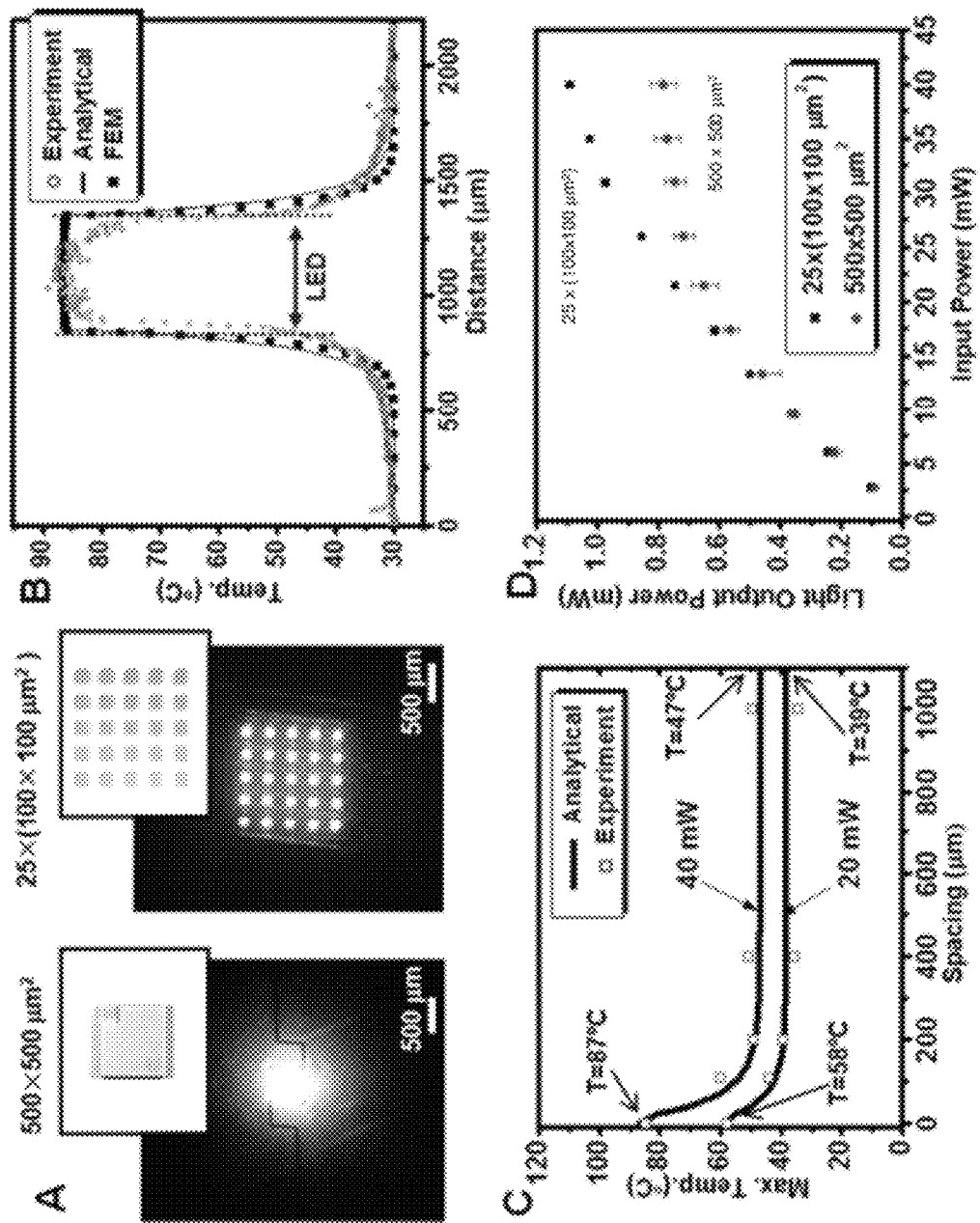

FIG. 21. Thermal management by control of size and spatial distributions of μ-ILEDs on PET. Optical images and emission profiles of a single device with size 500×500 μm$^2$ and an equivalent active area consisting of a 5×5 array of devices with sizes of 100×100 μm$^2$. (B) Measured (red symbols) and calculated (line—analytical model; black squares—FEM) temperature distribution along a dimension in the plane of a μ-ILED (500×500 μm$^2$) on PET, perpendicular to an edge and running through its center, for an applied power of 40 mW. (C) Measured (red symbols) and calculated (line—analytical model) maximum temperature of regular, square arrays (5×5) of μ-ILEDs (100×100 μm$^2$), with spacings of 0, 100, 200, 400 and 1000 μm. (D) Total light output power as a function of electrical input power, for a single μ-ILED with size 500×500 μm$^2$ and for a regular, square array of 100×100 μm$^2$μ-ILEDs (5×5), corresponding to the case shown in (A).

Figure 22:
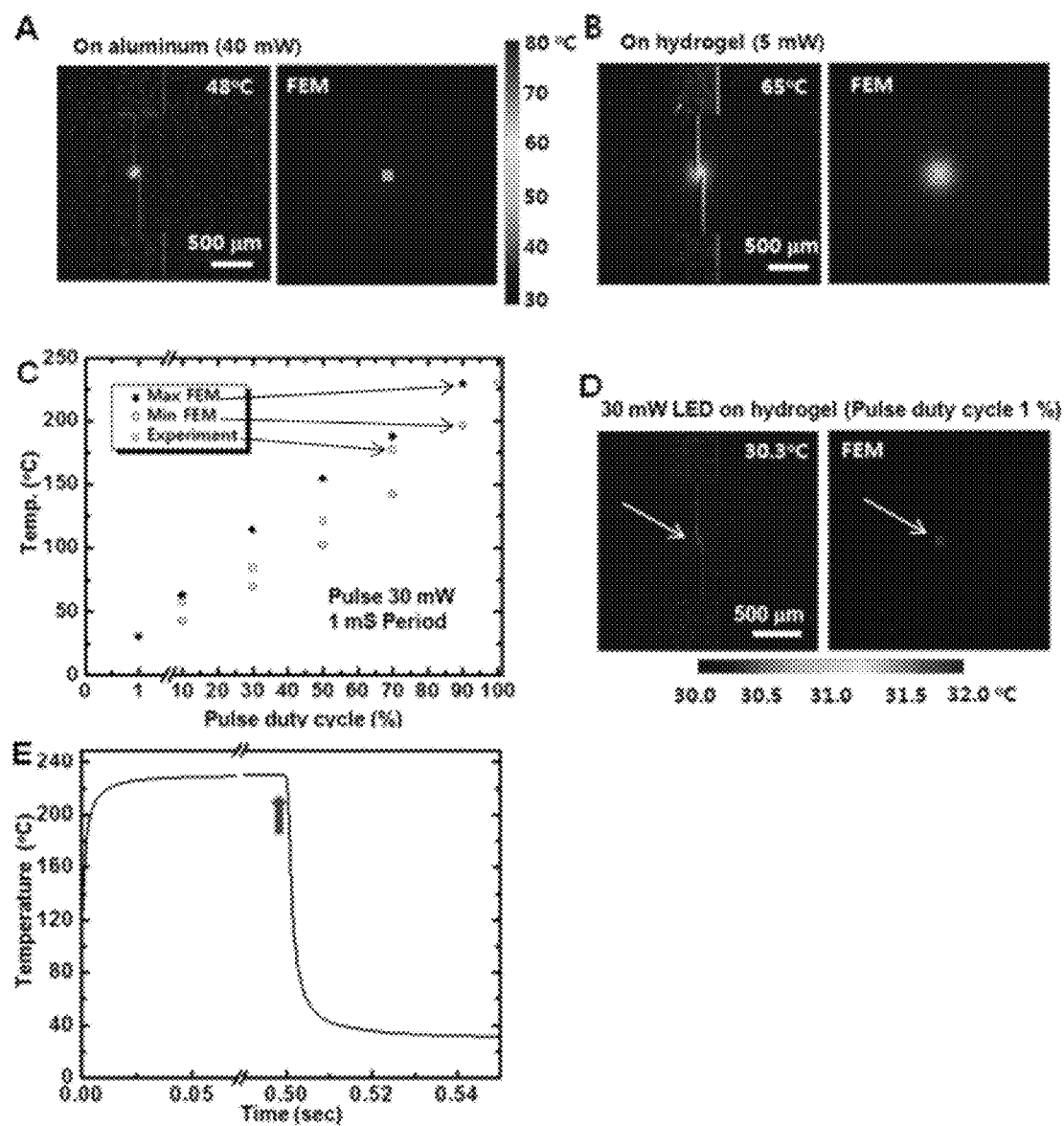

FIG. 22. Thermal behaviors of μ-ILEDs on unusual substrate materials. (A) Measured (left) and calculated (right) temperature distributions for isolated μ-ILEDs (100×100 μm$^2$). 700 μm thick Al foil at an input power of 40 mW. (B) Results similar to those in (A), for the case of a hydrogel substrate and power of 5 mW. (C) Temperature for a similar μ-ILED on hydrogel with 100 (constant power), 70, 50, 30, 10 and 1 (D) % duty ratio cycle pulse (30 mW input power with 1 mS period). The peak temperature decreased from 232° C. (at constant power) to 30.3° C. (at 1% pulsed duty cycle), as duty cycle decreases. (E) Calculated time dependence of the peak temperature, near the switching point (red arrow).

Figure 23:
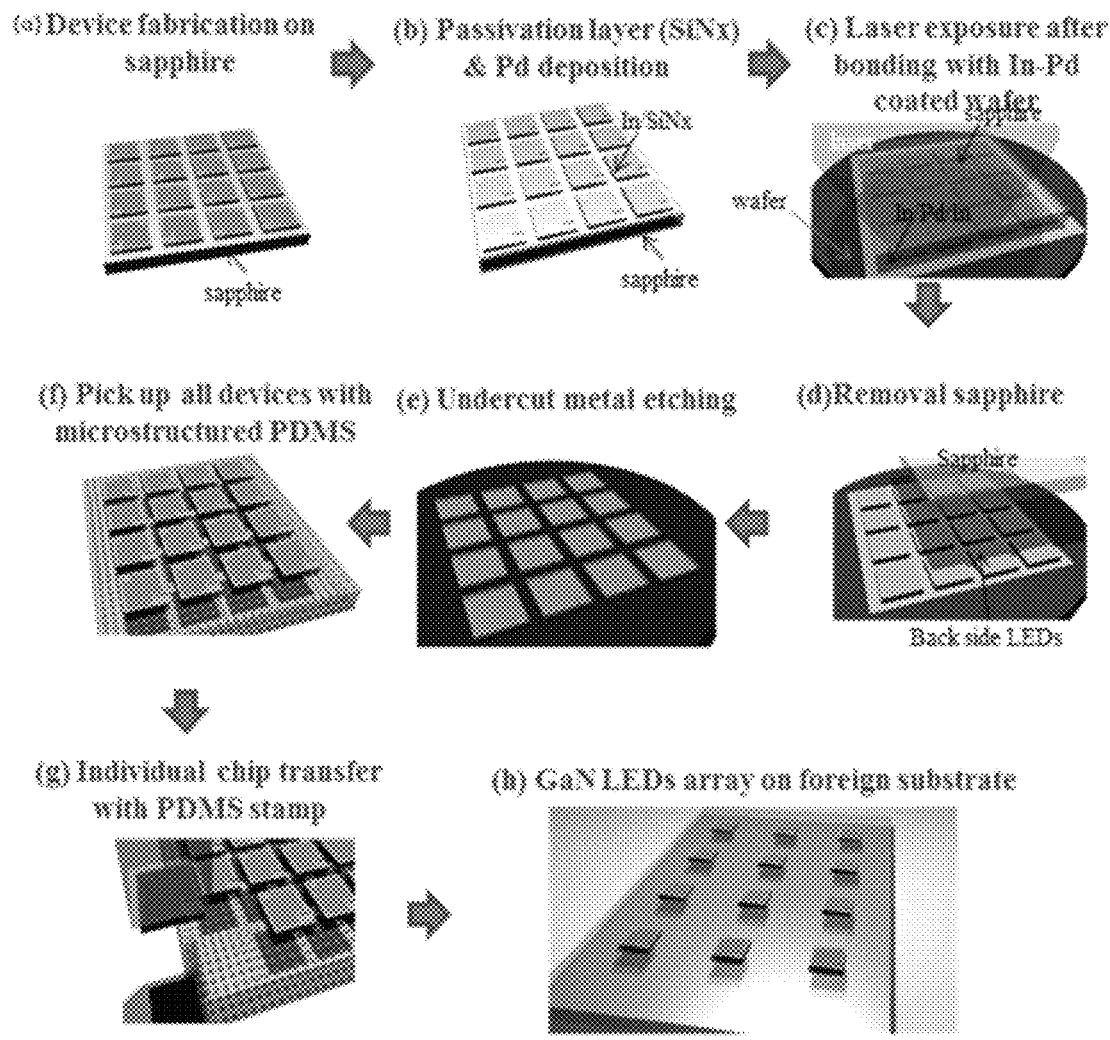

FIG. 23. Illustration of full process.

Figure 24:
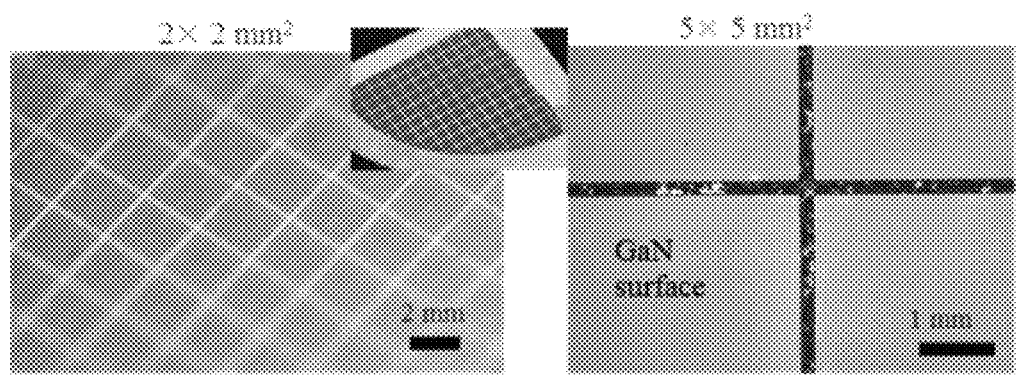

FIG. 24. LLO results with GaN material delineated at various lateral dimensions (left: 2×2 mm$^2$, right: 5×5 mm$^2$) (25 μm wide trench).

Figure 25:
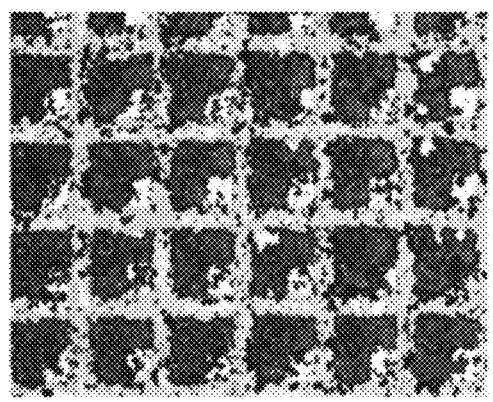

FIG. 25. Image of a Si wafer removal of LEDs. Residual In—Pd particles remain.

Figure 26:
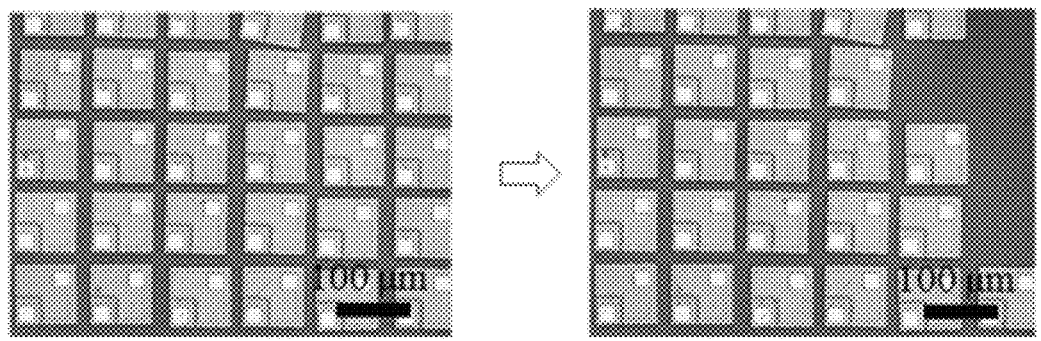

FIG. 26. Array of LEDs on a patterned PDMS slab (before transfer printing (left) and after (right)).

Figure 27:
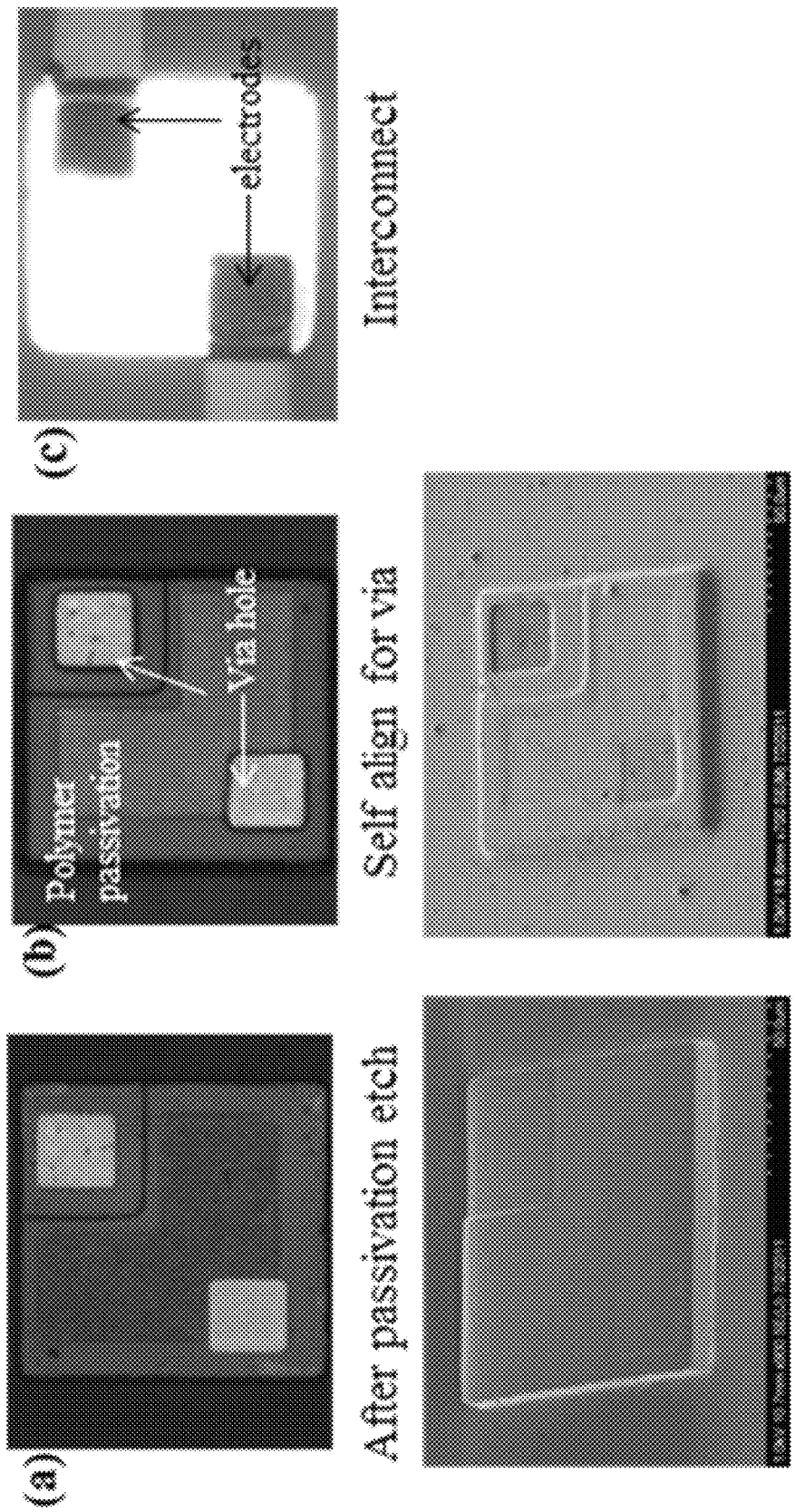

FIG. 27. Via holes formed by backside exposure of a BCB coating.

Figure 28:
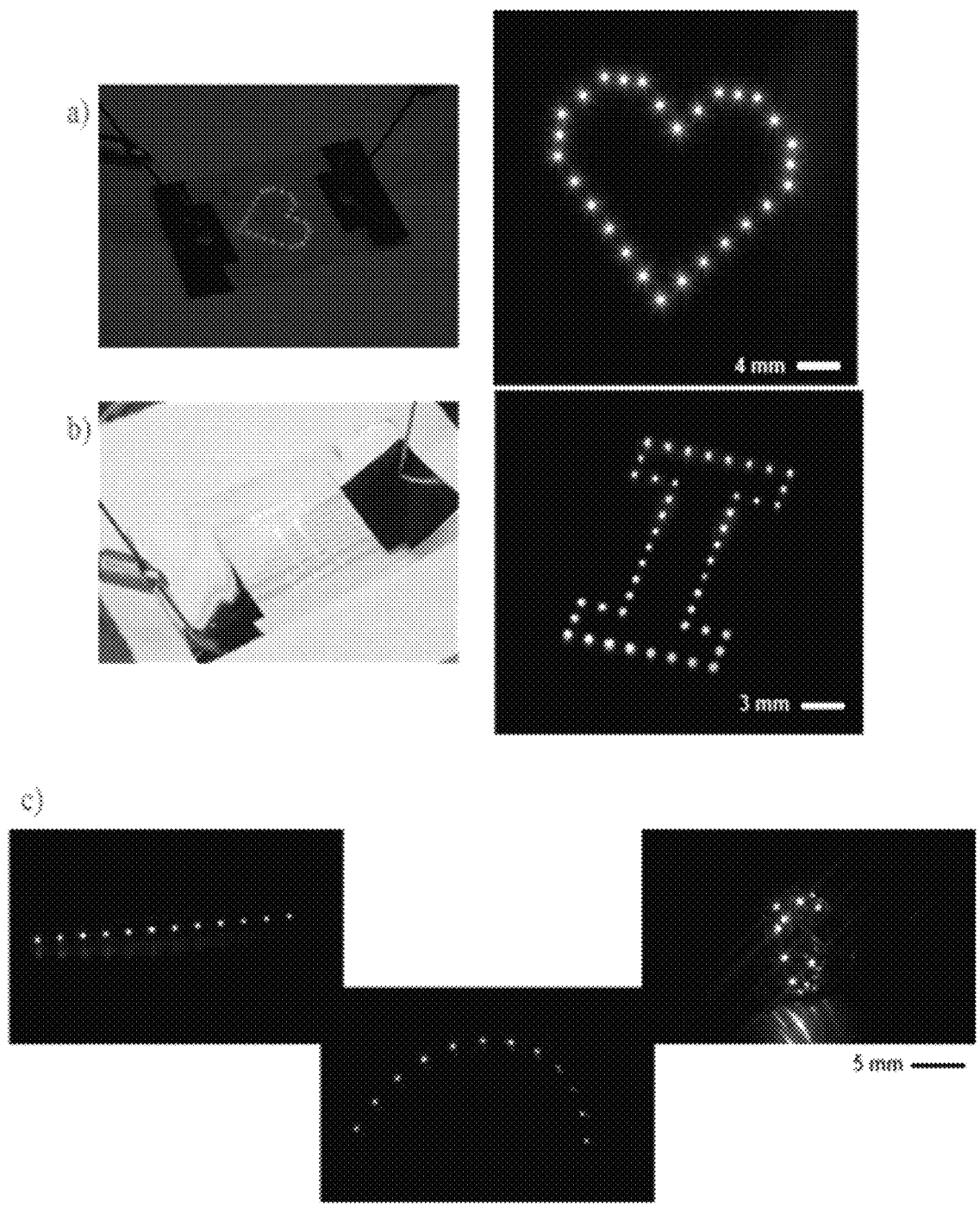

FIG. 28. LED arrays on 50 μm thick PET a) 28 LEDs (2 by 14), b) 46 LEDs (2 by 23) and c) 12 LEDs on 5×40 mm$^2$ strip shape PET.

Figure 29:
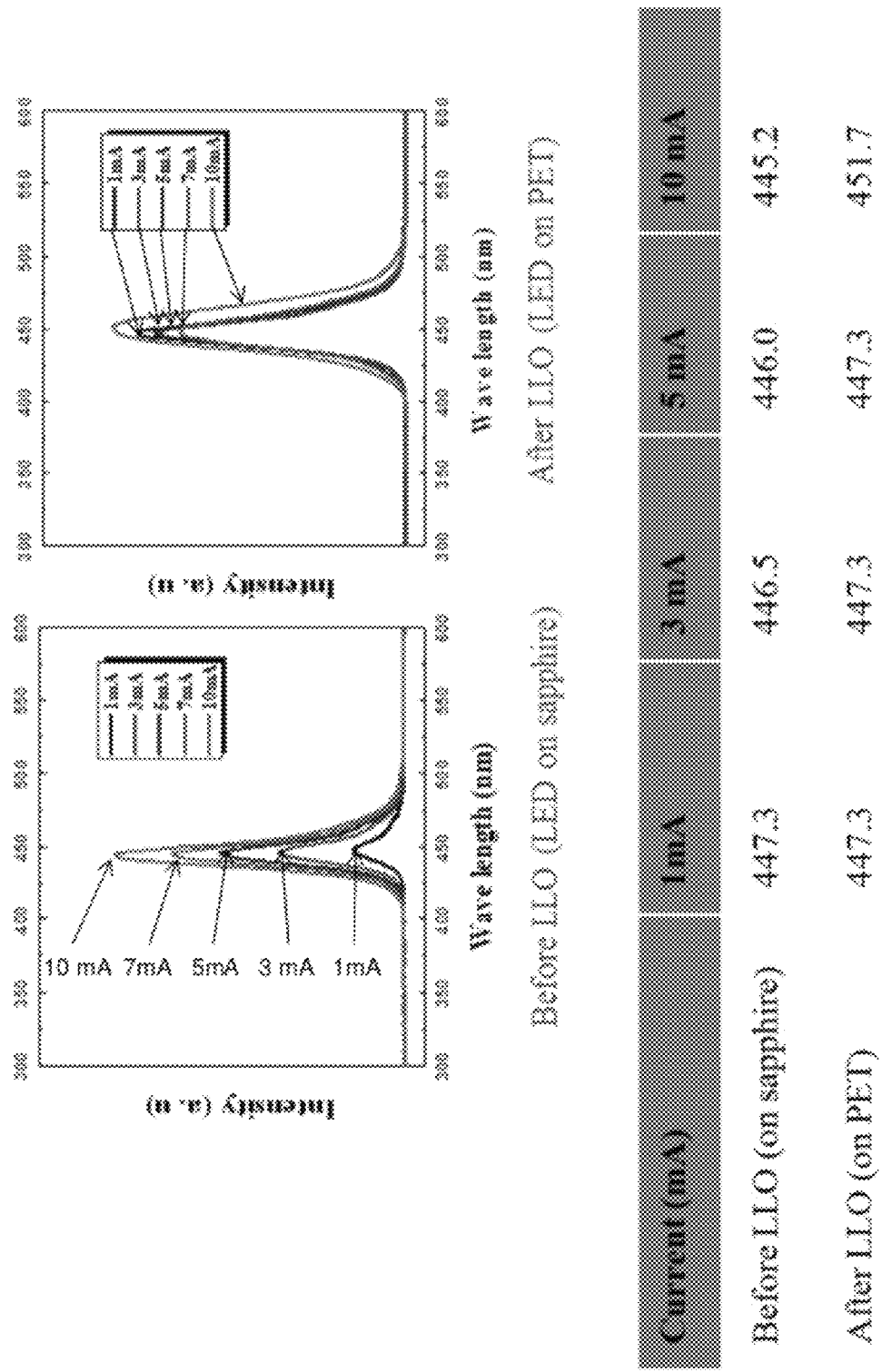

FIG. 29. Wavelength shift with various applied current.

Figure 30:
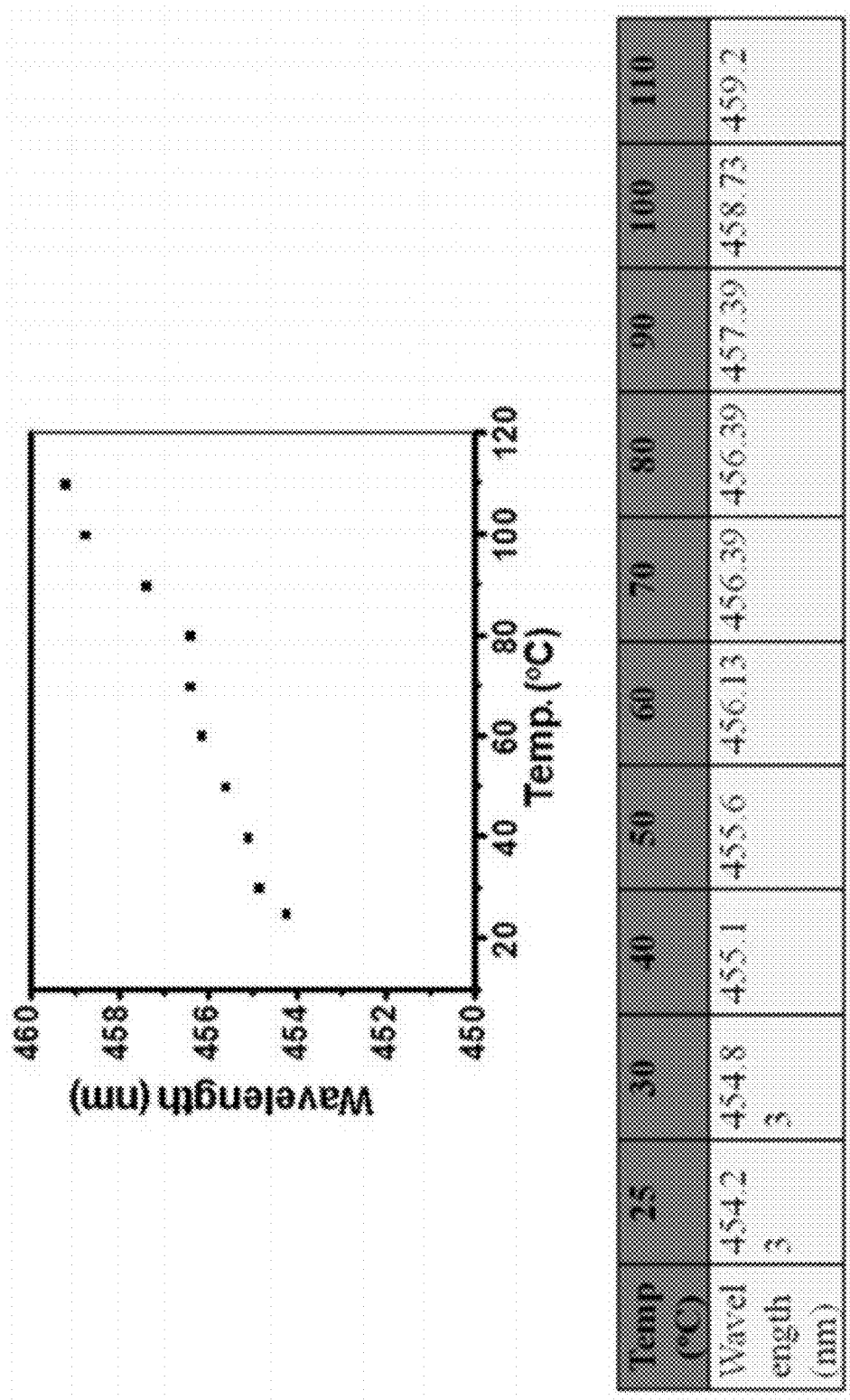

FIG. 30. Wavelength redshift by external heating (on hot plate) with low input current (power), 0.05 mA (0.14 mW).

Figure 31:
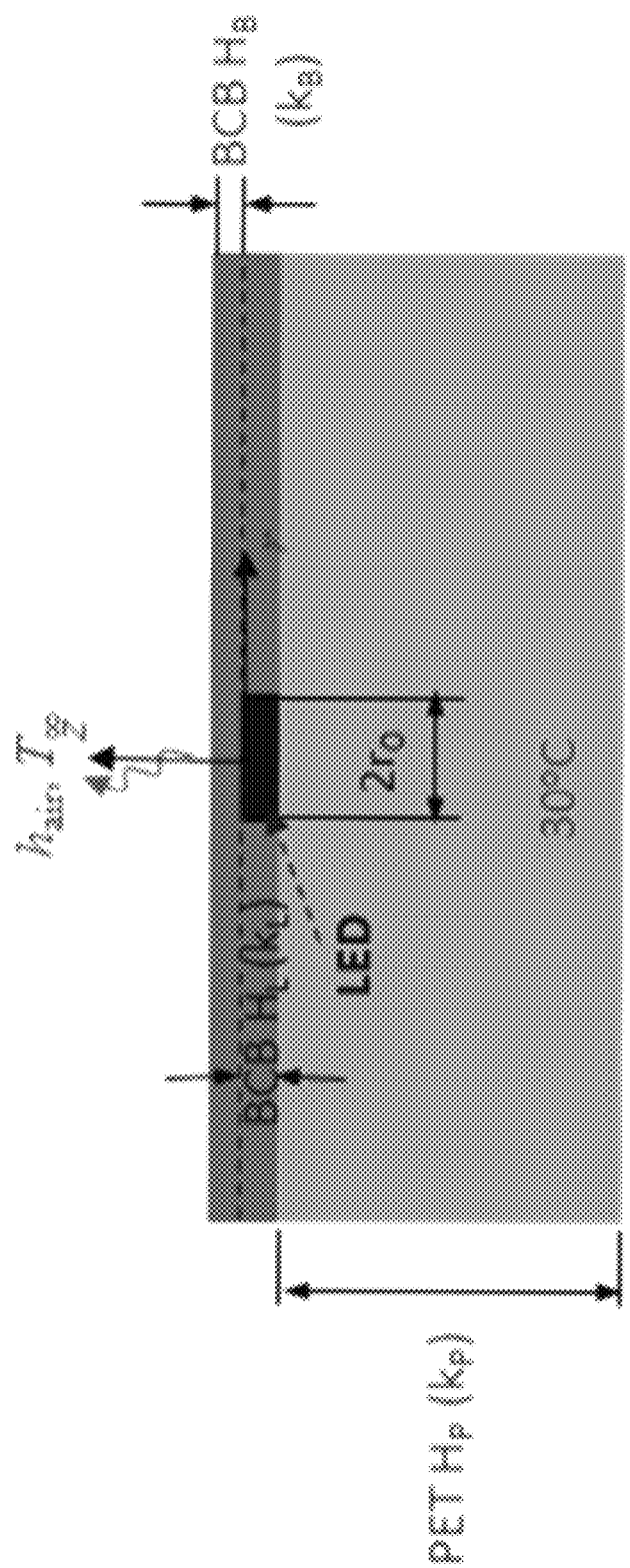

FIG. 31. Schematic illustration of the device geometry and parameters used in analytical model for heat.

Figure 32:
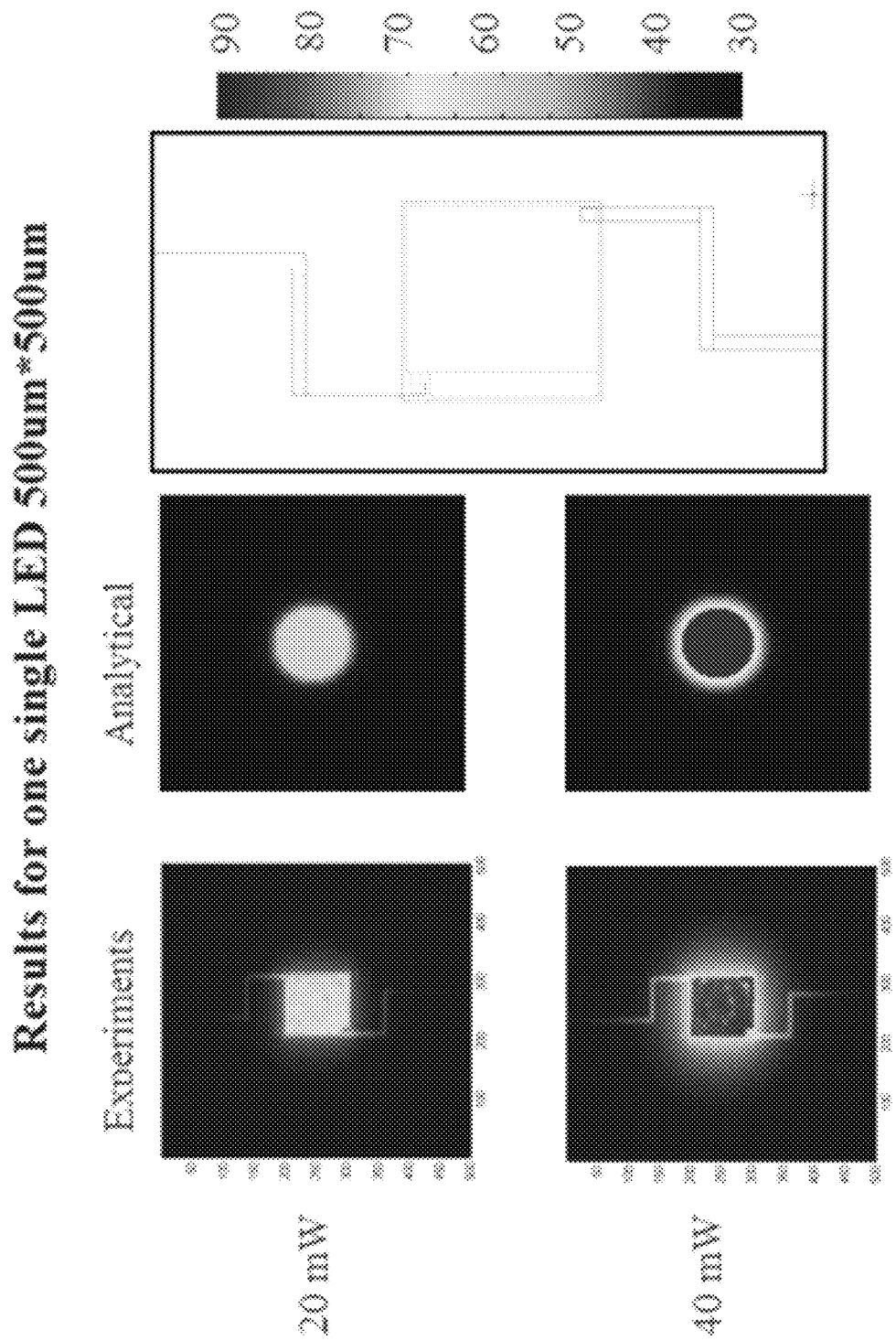

FIG. 32. Surface temperature of a 500×500 μm$^2$ LED. (20, 40 mW input power).

Figure 33:
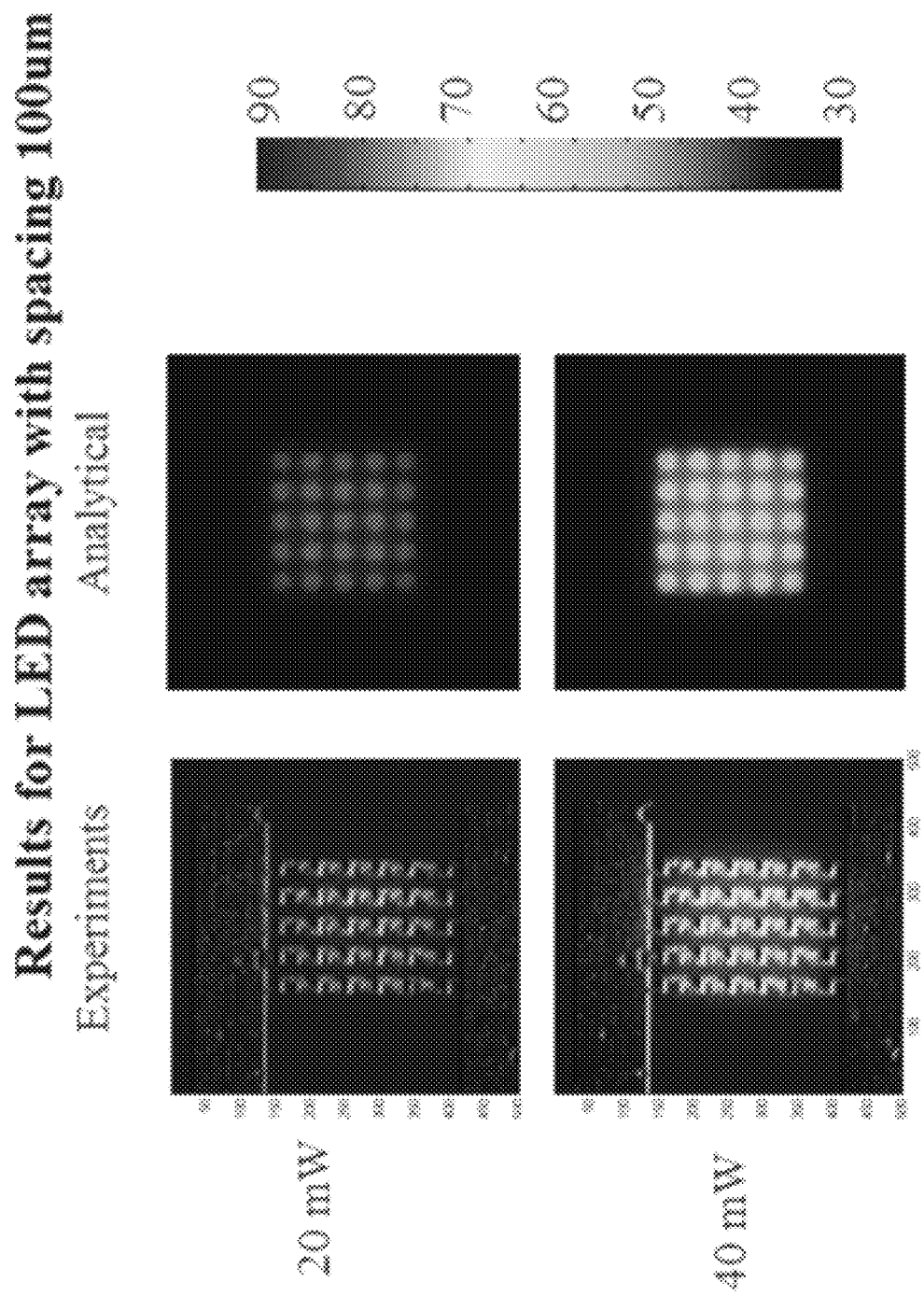

FIG. 33. Surface temperature of an array of LEDs with 100 μm spacing, in a 5×5 square arrangement with individual device dimensions of 100×100 μm$^2$. 20, 40 mW applied power.

Figure 34:
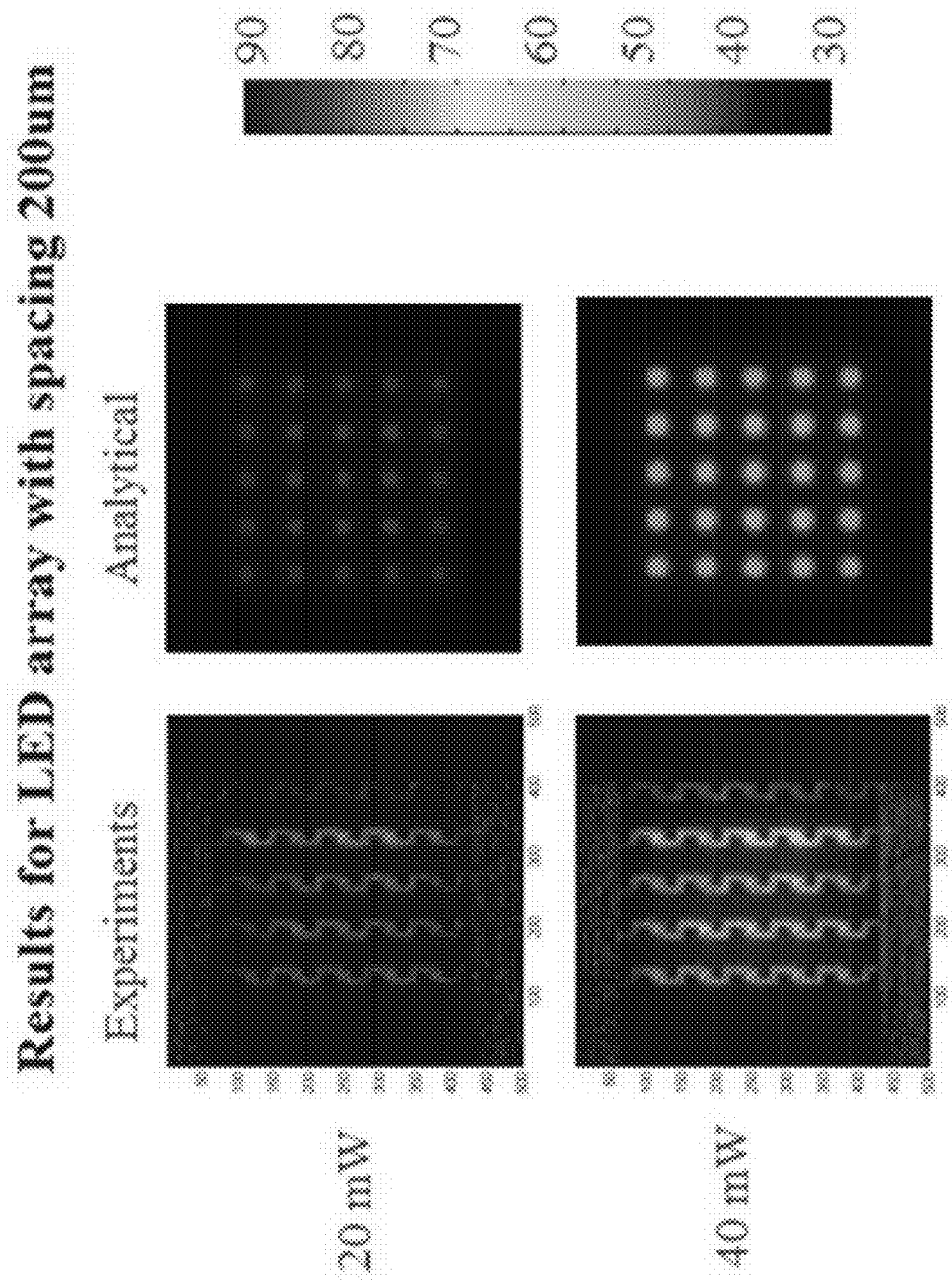

FIG. 34. Surface temperature of an array of LEDs with 200 μm spacing, in a 5×5 square arrangement with individual device dimensions of 100×100 μm$^2$. 20, 40 mW applied power.

Figure 35:
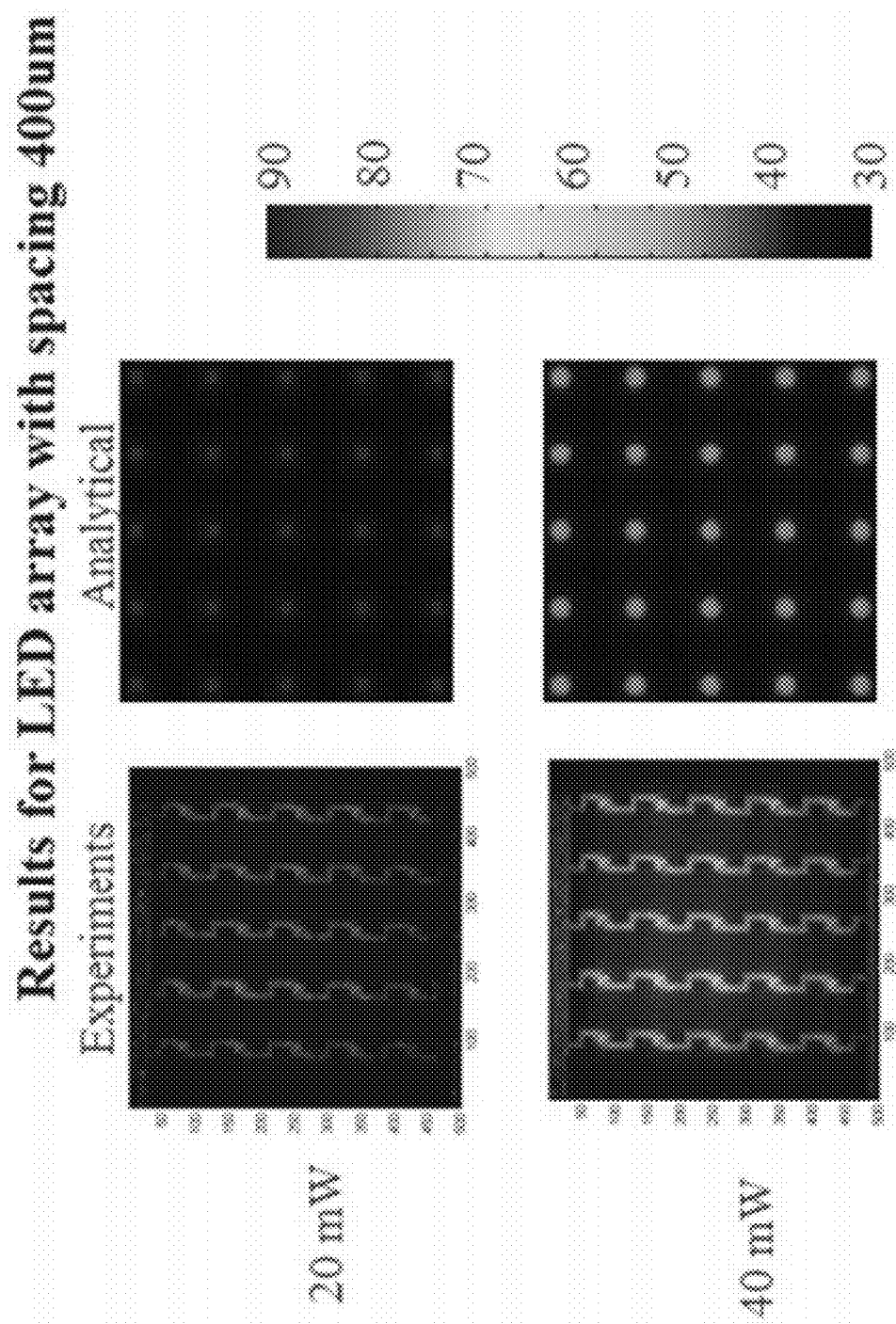

FIG. 35. Surface temperature of an array of LEDs with 400 μm spacing, in a 5×5 square arrangement with individual device dimensions of 100×100 μm$^2$. 20, 40 mW applied power.

Figure 36:
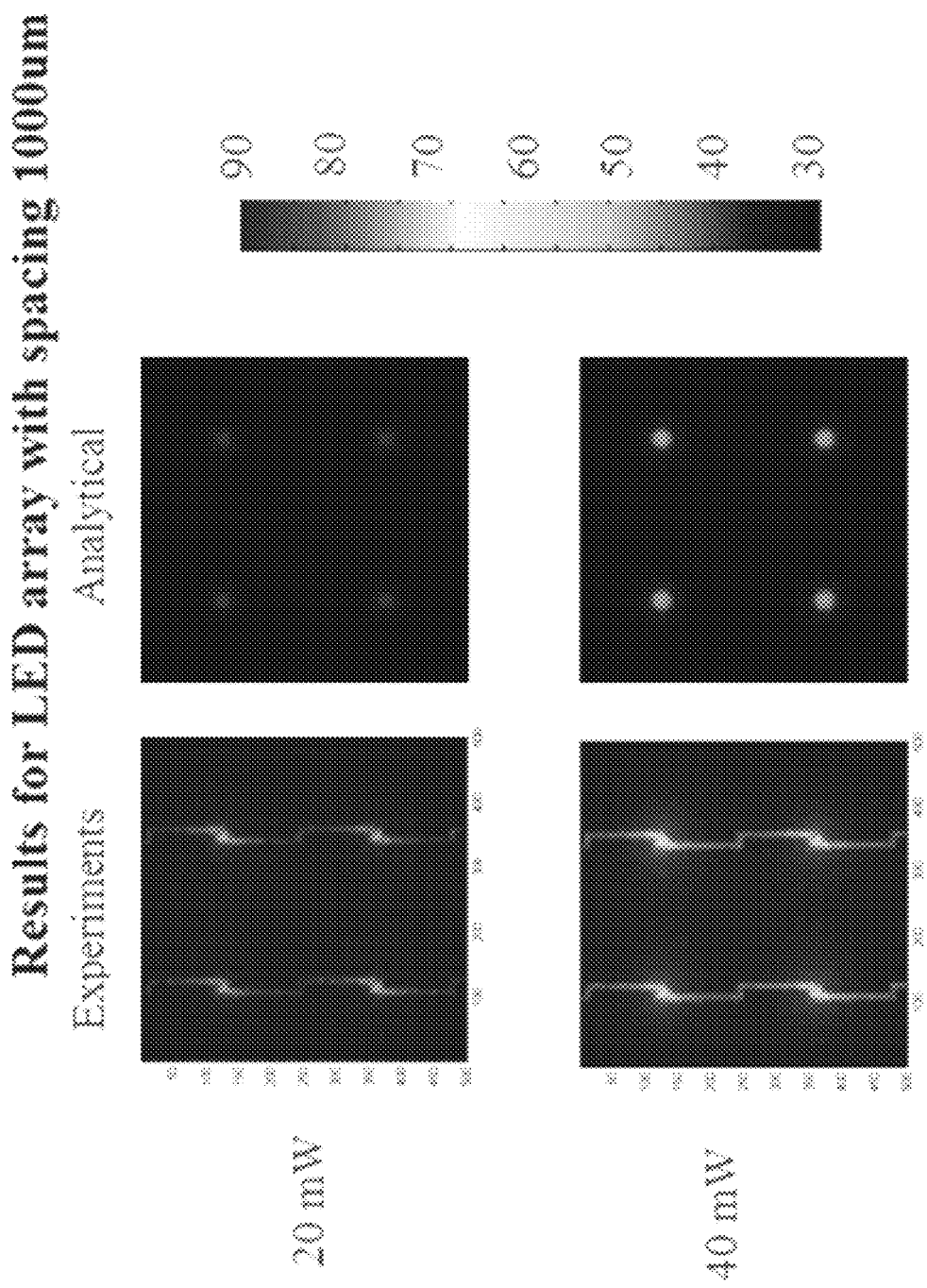

FIG. 36. Surface temperature of an array of LEDs with 1000 μm spacing, in a 5×5 square arrangement with individual device dimensions of 100×100 μm$^2$. 20, 40 mW applied power.

Figure 37:
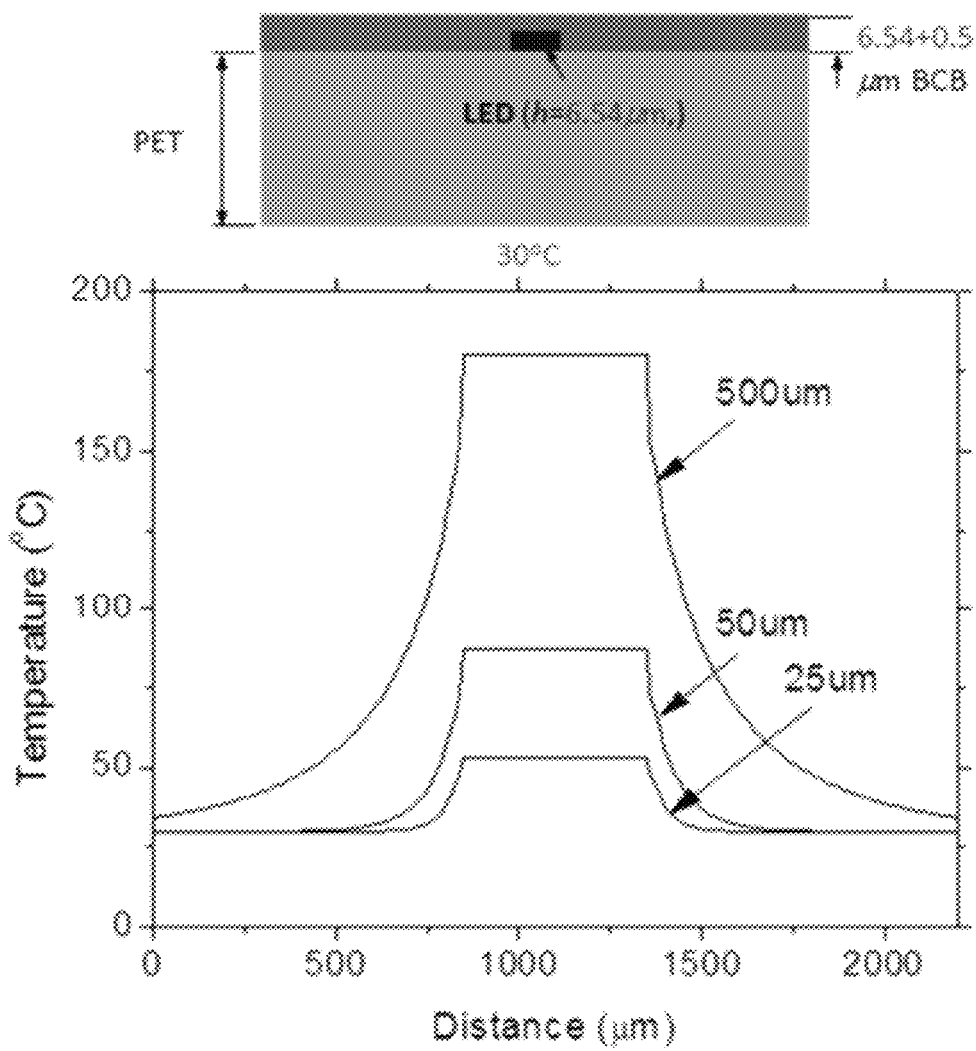

FIG. 37. Thermal decay length at various PET thicknesses.

Figure 38:
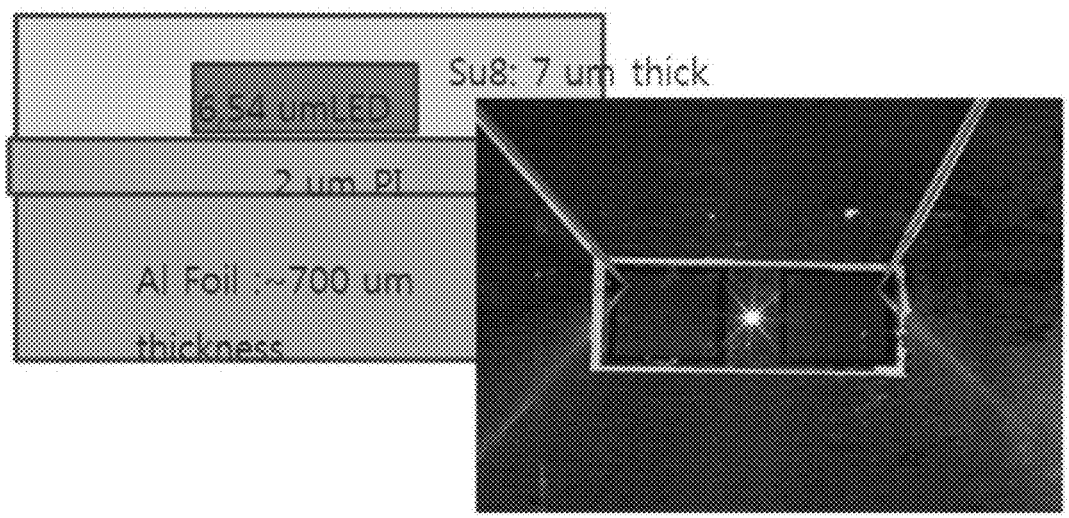

FIG. 38. Schematic illustration of a μ-ILED on 700 μm thick Al foil and optical image.

Figure 39:
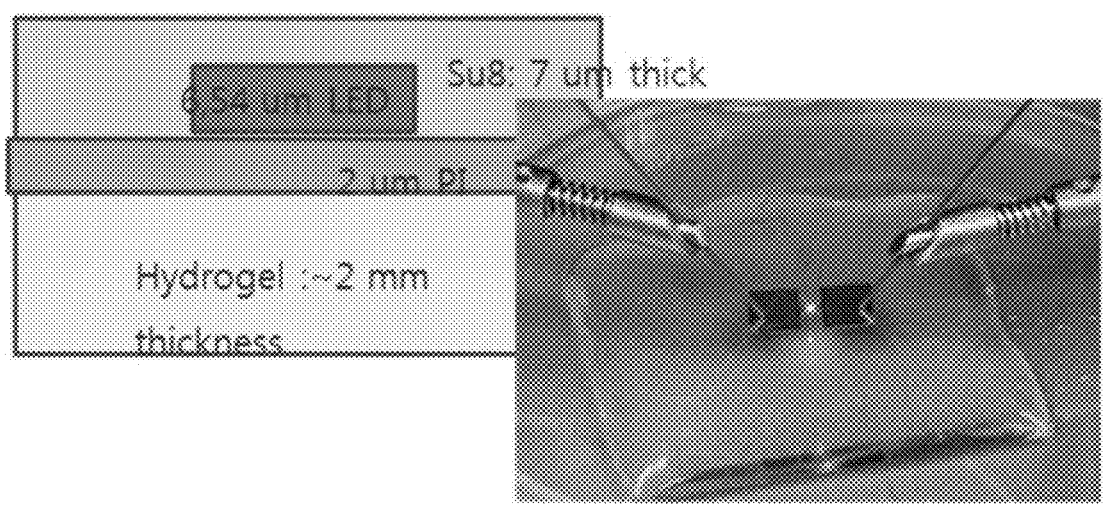

FIG. 39. Schematic illustration of a μ-ILED on 2 mm thick hydrogel and optical image.

Figure 40:
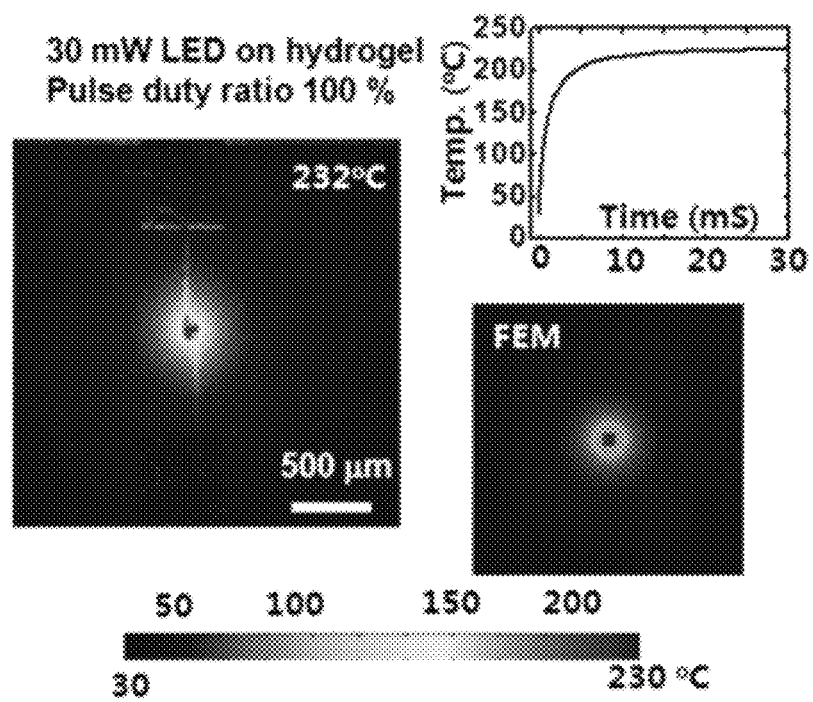

FIG. 40. LED on hydrogel at non-pulsed (100% duty cycle) 30 mW input power.

Figure 41:
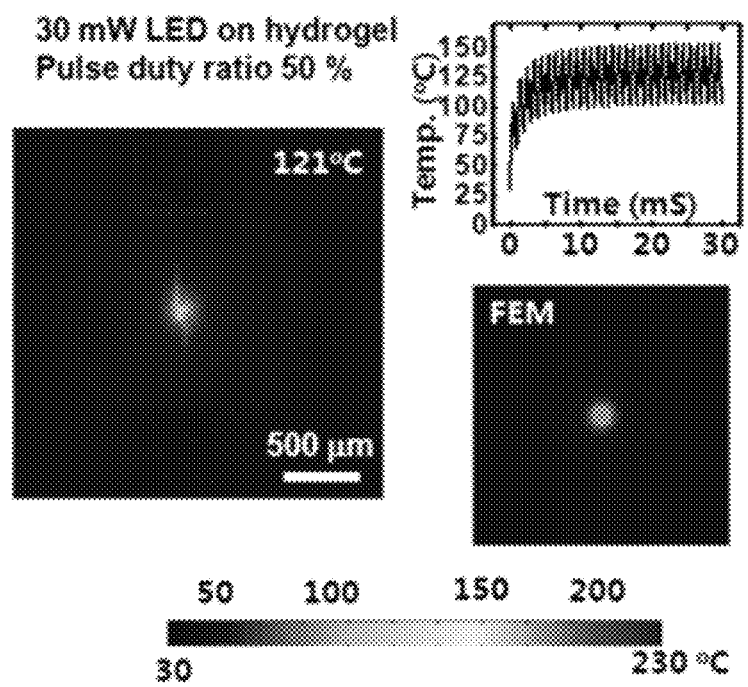

FIG. 41. LED on hydrogel at pulsed (50% duty cycle) 30 mW input power (1 ms period).

Figure 42:
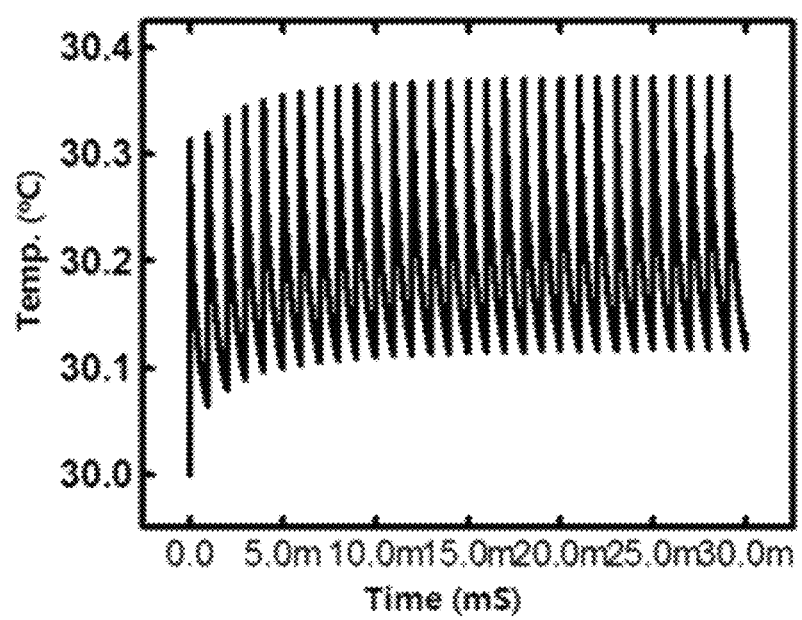

FIG. 42. Temperature change of LED on hydrogel at pulsed (1% duty cycle) 30 mW input power (1 ms period).

Figure 43:
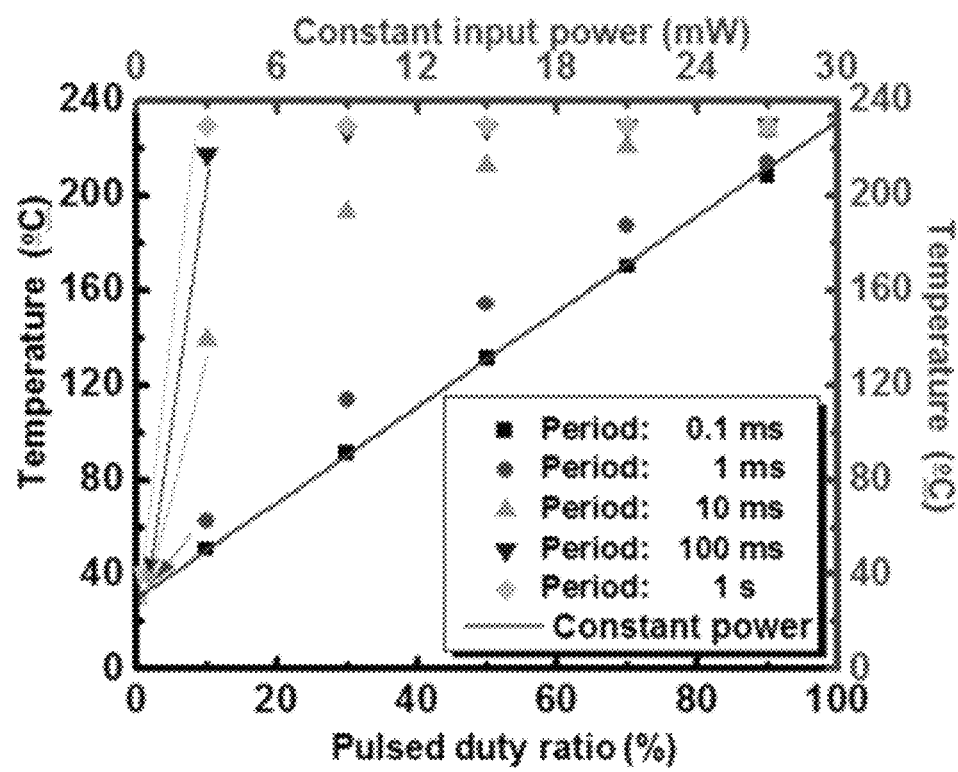

FIG. 43. Temperature comparison between averaged pulsed input power and constant input power.

DETAILED DESCRIPTION

In general the terms and phrases used herein have their art-recognized meaning, which can be found by reference to standard texts, journal references and contexts known to those skilled in the art. The following definitions are provided to clarify their specific use in the context of the invention.

"Transferable" or "printable" are used interchangeably and relate to materials, structures, device components and/or integrated functional devices that are capable of transfer, assembly, patterning, organizing and/or integrating onto or into substrates. In an embodiment, transferring or printing refers to the direct transfer of a structure or element from one substrate to another substrate, such as from a host substrate (e.g. epitaxial growth substrate) to a device substrate or a device or component supported by a device substrate. Alternatively, printable refers to a structure or element that is printed via an intermediate substrate, such as an elastomeric stamp that lifts-off the structure or element and then subsequently transfers the structure or element to a device substrate or a component that is on a device substrate. In an embodiment, printable refers to a structure that is transferrable via transfer printing, such as dry contact transfer printing using an elastomeric stamp, such as a stamp comprising a high Young's modulus polymer layer or a stamp comprising a low Young's modulus polymer layer or a stamp comprising a combination of a high Young's modulus polymer layer and a low Young's modulus polymer layer. In an embodiment, the printing occurs without exposure of the substrate to high temperatures (i.e. at temperatures less than or equal to about 400 degrees Celsius). In one embodiment, printable or transferable materials, elements, device components and devices are capable of transfer, assembly, patterning, organizing and/or integrating onto or into substrates via solution printing or dry transfer contact printing. Similarly, "printing" is used broadly to refer to the transfer, assembly, patterning, organizing and/or integrating onto or into substrates, such as a substrate that functions as a stamp or a substrate that is itself a target (e.g., device) substrate.

"Substrate" refers to a material having a surface that is capable of supporting a component, including a device, or an interconnect. An interconnect that is "bonded" to the substrate refers to a portion of the interconnect in physical contact with the substrate and unable to substantially move relative to the substrate surface to which it is bonded. Unbonded portions, in contrast, are capable of substantial movement relative to the substrate. The unbonded portion of an interconnect generally corresponds to that portion having a "bent configuration," such as by strain-induced interconnect bending.

"Host substrate" and "handle substrate" interchangeably refer to a substrate on which an electronic device is assembled, processed or otherwise manipulated. In certain embodiments, a handle substrate is a substrate useful as a transitory substrate, for example for holding structures for subsequent transfer to another substrate, such as by transfer printing. In some embodiments, a handle substrate is useful as a processing substrate, where structures present on the handle substrate undergo additional processing steps. In an embodiment, the host substrate is a "growth substrate", which refers to a substrate useful for growing material, for example via epitaxial growth. In some embodiments, a growth substrate comprises the same material as is being grown. In some embodiments a growth substrate comprises material different from that being grown, optionally having one or more external layers to promote growth, such as epitaxial growth. Useful growth substrates include substrates which are lattice matched, or effectively lattice matched, to the material being grown. In some embodiments a growth substrate is a host substrate. "Device substrate" refers to a substrate useful for assembling device components. In some embodiments, a device substrate comprises functional device components. In some embodiments, a device substrate is a flexible substrate, a large area substrate, a pre-metalized substrate, a substrate pre-patterned with one or more device components, or any combination of these. In some embodiments a device substrate is a host substrate.

The term "surface" as used herein is intended to be consistent with its plain meaning which refers to an outer boundary of an object. In embodiments, surfaces may be given specific names, such as "receiving surface", "contact surface", "external surface". In some embodiments, named surfaces can refer to their target use and/or identify subregions of a surface. In some embodiments, named surfaces can refer to their orientation, for example relative to other nearby or adjacent components.

"Functional layer" or "device layer" refers to a layer capable of incorporation into a device or device component and that provides at least partial functionality to that device or device component. Depending on the particular device or device component, a functional layer can include a broad range of compositions. For example, a device that is an LED can be made from a starting functional layer of semiconductor material, including a functional layer that is itself made up of a plurality of distinct layers as provided herein. In certain embodiments, release and subsequent printing of such layers provides the basis for constructing an LED device or device component. In contrast, a functional layer for incorporation into electronics (MESFETs), solar cells, or optical systems may have a different layering configuration and/or compositions. Accordingly, the specific functional layer incorporated into the multilayer structure depends on the final device or device component in which the functional layer will be incorporated.

"Release layer" (sometimes referred to as "sacrificial layer") refers to a layer that at least partially separates one or more layers. A release layer is capable of being removed or providing other means for facilitating separation of the functional layer from other layers of a multi-layer structure, such as by a release layer that physically separates in response to a physical, thermal, chemical and/or electromagnetic stimulation, for example. Accordingly, the actual release layer composition is selected to best match the means by which separation will be provided. Separation is by any one or more separating means known in the art, such as by interface failure or by release layer sacrifice. A release layer may itself remain connected to a functional layer, such as a functional layer that remains attached to the remaining portion of the multilayer structure, or a functional layer that is separated from the remaining portion of the multilayer structure. The release layer is optionally subsequently separated and/or removed from the functional layer.

"Structural layer" refers to a layer that imparts structural functionality, for example by supporting and/or encapsulating device components. Specific examples of structural layers include spacing layers and encapsulating layers.

"Buffer layer" refers to a layer of a device or device component which is useful for protecting other layers of the device component. In one embodiment, a buffer layer protects another device layer from etching. In an embodiment, a buffer layer does not impact or has a minimal impact on the function of the device. In one embodiment, an etch block layer is a buffer layer.

"Release" and "releasing" refer to at least partially separating two layers, devices or device components from one another, for example by mechanical or physical separation, or by removal of at least a portion of one layer, device or device component. In some embodiments, removal of a sacrificial layer results in the release of a layer, device or device component. In some embodiments, layers, devices or device components are released by etching away a portion of the layer, device or device component and/or by etching away a portion of an underlying layer or substrate. In some embodiments, layers, devices or device components are released by exposure to electromagnetic radiation. In certain embodiments, released components remain attached to the object which they are released from by one or more anchors. In some embodiments, released components are subsequently attached to the object they are released from by one or more anchors.

"Etch" and "etching" refer to a process by which a portion of a layer, device or device component is reacted away, dissolved or otherwise removed. In embodiments, an anisotropic etch or a directional etch refers to an etching process which preferentially removes material along a specific direction. In embodiments, a wet etch refers to removal of material by exposure to a solution, such as a hot (e.g., T>298 K) KOH solution. In embodiments, a selective etch refers to removal of a specific material or class of materials. In embodiments, a reactive ion etch or an inductively coupled plasma reactive ion etch refers to an etching method which utilizes a plasma to etch away material, for example by reaction with ions in the plasma. The term "etchant" is used in the present description to broadly refer to a substance which is useful for removal of material by etching. The term "electrochemical etching" refers to an etching process which utilizes an applied electric potential, electric field or electric current. The term "photoelectrochemical etching" refers to an etching process which utilizes an applied electric potential, electric field or electric current and exposure to electromagnetic radiation.

An "etch mask" refers to material useful for preventing underlying material from being etched. In some embodiments, a thick etch mask refers to an etch mask of a sufficient thickness that the majority of the mask remains after an etching process. In embodiments a thick etch mask has a thickness selected over the range of 100 nm to 5 µm. In some embodiments a metal etch mask refers to an etch block layer.

The term "mask" refers to a material which covers or otherwise blocks portions of an underlying material. Use of the term "mask" is intended to be consistent with use of the term in the art of microfabrication. In embodiments, the term "mask" refers to an etch mask, an optical mask, a deposition mask or any combination of these.

The terms "masked region" and "exposed region" respectively refer to portions of an underlying material which are blocked and unblocked by a mask. The term "exposed region" may also refer to a portion of a substrate, device or device component which is not encapsulated by an encapsulant.

"Epitaxial regrowth" and "epitaxial growth" refer to methods of growing a crystalline layer by deposition of material, for example gas or liquid phase deposition. The term "epilayer" refers to a layer grown via epitaxial growth.

The term "patterning" is used herein as in the art of microfabrication to broadly refer to a process by which portions of a layer, device or device component are selectively removed or deposited to create a specified structure.

"Supported by a substrate" refers to a structure that is present at least partially on a substrate surface or present at least partially on one or more intermediate structures positioned between the structure and the substrate surface. The term "supported by a substrate" may also refer to structures partially or fully embedded in a substrate.

"Printable electronic device" or "printable electronic device component" refer to devices and structures that are configured for assembly and/or integration onto substrate surfaces, for example by using dry transfer contact printing and/or solution printing methods. In embodiments, a printable electronic device component is a printable semiconductor element. In embodiments, printable semiconductor elements are unitary single crystalline, polycrystalline or microcrystalline inorganic semiconductor structures. In preferred embodiments, printable semiconductor elements are printable single crystalline LED structures, for example, generated via epitaxial growth and/or doping techniques. In various embodiments, printable semiconductor elements are connected to a substrate, such as a mother wafer, via one or more bridge or anchor elements. In this context of this description, a unitary structure is a monolithic element having features that are mechanically connected. Semiconductor elements of various embodiments may be undoped or doped, may have a selected spatial distribution of dopants and may be doped with a plurality of different dopant materials, including p- and n-type dopants. Certain microstructured printable semiconductor elements include those having at least one cross sectional dimension greater than or equal to about 1 micron and certain nanostructured printable semiconductor elements include those having at least one cross sectional dimension less than or equal to about 1 micron.

Printable semiconductor elements useful for a variety of applications comprise elements derived from "top down" processing of high purity bulk materials, such as high purity crystalline semiconductor wafers generated using conventional high temperature processing techniques, including epitaxial growth. In an embodiment, a printable semiconductor element comprises a composite heterogeneous structure having a semiconductor operationally connected to or otherwise integrated with at least one additional device component or structure, such as a conducting layer, dielectric layer, electrode, additional semiconductor structure or any combination of these. In some methods and systems, the printable semiconductor element(s) comprises a semiconductor structure integrated with at least one additional structure selected from the group consisting of: another semiconductor structure; a dielectric structure; a conductive structure, and an optical structure (e.g., optical coatings, reflectors, windows, optical filters, collecting, diffusing or concentration optics, etc.). In some embodiments a printable semiconductor element comprises a semiconductor structure integrated with at least one electronic device component selected from the group consisting of: an electrode, a dielectric layer, an optical coating, a metal contact pad, and a semiconductor channel. In some embodiments, printable semiconductor elements comprise stretchable semiconductor elements, bendable semiconductor elements and/or heterogeneous semiconductor elements (e.g., semiconductor structures integrated with one or more additional materials such as dielectrics, other semiconductors, conductors, ceramics, etc.). Printable semiconductor elements include printable semiconductor devices and components thereof, including but not limited to printable LEDs, lasers, solar cells, p-n junctions, photovoltaics, photodiodes, diodes, transistors, integrated circuits, and sensors.

A "component" is used broadly to refer to a material or individual component used in a device. An "interconnect" is one example of a component and refers to an electrically conducting material capable of establishing an electrical connection with a component or between components. In particular, an interconnect may establish electrical contact between components that are separate and/or moveable with respect to each other. Depending on the desired device specifications, operation, and application, an interconnect is made from a suitable material. For applications where a high conductivity is required, typical interconnect metals may be used, including but not limited to copper, silver, gold, aluminum and the like, and alloys. Suitable conductive materials further include semiconductors, such as silicon and GaAs and other conducting materials such as indium tin oxide.

Other components include, but are not limited to, thin film transistors (TFTs), transistors, electrodes, integrated circuits, circuit elements, control elements, microprocessors, transducers, islands, bridges and combinations thereof. Components may be connected to one or more contact pads as known in the art, such as by metal evaporation, wire bonding, and application of solids or conductive pastes, for example.

An interconnect that is "stretchable" or "flexible" is used herein to broadly refer to an interconnect capable of undergoing a variety of forces and strains such as stretching, bending and/or compression in one or more directions without substantially adversely impacting electrical connection to, or electrical conduction from, a device component. Accordingly, a stretchable interconnect may be formed of a relatively brittle material, such as GaAs, yet remain capable of continued function even when exposed to a significant deformatory force (e.g., stretching, bending, compression) due to the interconnect's geometrical configuration. In an exemplary embodiment, a stretchable interconnect may undergo strain larger than about 1%, 10% or 30% or up to about 100% without fracturing. In an example, the strain is generated by stretching an underlying elastomeric substrate to which at least a portion of the interconnect is bonded. For certain embodiments, flexible or stretchable interconnects include interconnects having wavy, meandering or serpentine shapes.

A "device component" is used to broadly refer to an individual component within an electrical, optical, mechanical or thermal device. Components include, but are not limited to, a photodiode, LED, TFT, electrode, semiconductor, other light-collecting/detecting component, transistor, integrated circuit, contact pad capable of receiving a device component, thin film device, circuit element, control element, microprocessor, transducer and combinations thereof. A device component can be connected to one or more contact pads as known in the art, such as by metal evaporation, wire bonding, application of solids or conductive pastes, for example.

"Electrical device" generally refers to a device incorporating a plurality of device components, and includes large area electronics, printed wire boards, integrated circuits, device components, arrays, biological and/or chemical sensors, physical sensors (e.g., temperature, light, radiation, etc.), solar cell or photovoltaic arrays, display arrays, optical collectors, systems and displays.

"Electronic device component" refers to a printable semiconductor or part of an electrical device. Exemplary electronic device component embodiments are configured for performing a function, for example emitting electromagnetic radiation or converting electromagnetic radiation into electrical energy. In specific embodiments, multiple electronic device components are electrically interconnected and perform a more complex task or function than the individual device components perform alone. Useful electronic device components include, but are not limited to P-N junctions, thin film transistors, single junction solar cells, multi-junction solar cells, photodiodes, light emitting diodes, lasers, CMOS devices, MOSFET devices, MESFET devices, photovoltaic cells, microelectromechanical devices, nanoelectromechanical devices and HEMT devices.

"Active circuit" and "active circuitry" refer to one or more device components configured for performing a specific function. Useful active circuits include, but are not limited to, amplifier circuits, multiplexing circuits, integrated circuits and current limiting circuits. Useful active circuit elements include, but are not limited to, transistor elements and diode elements.

"Sensing element" and "sensor" are used synonymously and refer to a device component useful as a sensor and/or useful for detecting the presence, absence, amount, magnitude or intensity of a physical property, object, radiation and/or chemical.

"Sensing" refers to detecting the presence, absence, amount, magnitude or intensity of a physical and/or chemical property. Useful electronic device components for sensing include, but are not limited to electrode elements, chemical or biological sensor elements, pH sensors, optical sensors, temperature sensors, photodiodes, photovoltaic elements, strain sensors, acceleration sensors, movement sensors, displacement sensors, pressure sensors, acoustic sensors and capacitive sensors.

"Actuating element" and "actuator" are used synonymously and refer to a device component useful for interacting with, stimulating, controlling, or otherwise affecting another structure, material or fluid. In some embodiments, actuating elements are used for interacting with, modifying a property of or otherwise affecting a device component, for example a component adjacent to a heating or actuating element.

"Actuating" refers to stimulating, controlling, or otherwise affecting an external structure, material or fluid. Useful electronic device components for actuating include, but are not limited to, electrode elements, electromagnetic radiation emitting elements, light emitting diodes, lasers, and heating elements.

"Visualizing" refers to a method of observing or otherwise detecting electromagnetic radiation, for example with an eye or a photodetector.

"Device island" refers to a relatively rigid device element or component of an electronic device comprising one or more semiconductor elements or active semiconductor structures. "Bridge" or "bridge structure" refers to stretchable or flexible structures interconnecting two or more device islands or one device island to another device component. Specific bridge structures include flexible semiconductor interconnects.

"Vertical type LED" refers to a light emitting diode device in which the functional components or layers of the device are arranged in a stacked configuration and the electrical contacts are made at the top and bottom of the stack.

"ON/OFF state" refers to a configuration of a device component capable of and/or configured for generation of electromagnetic radiation, such as a light emitting diode or a laser. In one embodiment, an ON/OFF state distinguishes between moments when a device component is generating electromagnetic radiation and when a device component is not generating electromagnetic radiation. In an embodiment, an ON/OFF state distinguishes between moments when a device component is generating electromagnetic radiation having an intensity above a threshold value and when a device component is generating electromagnetic radiation having an intensity below a threshold value.

"Solution printing" is intended to refer to processes whereby one or more structures, such as transferable or printable elements, are dispersed into a carrier medium and delivered in a concerted manner to selected regions of a substrate surface. In an exemplary solution printing method, delivery of structures to selected regions of a substrate surface is achieved by methods that are independent of the morphology and/or physical characteristics of the substrate surface undergoing patterning. Solution printing methods include, but are not limited to, ink jet printing, thermal transfer printing, and capillary action printing.

"Contact printing" refers broadly to a dry transfer contact printing method such as with a stamp that facilitates transfer of structures, such as printable LEDs, from a stamp surface to a substrate surface. Alternatively, the transfer can be directly to a target (e.g., device) substrate or host substrate. In an embodiment, the stamp is an elastomeric stamp, such as a stamp comprising a high Young's modulus polymer layer or a stamp comprising a low Young's modulus polymer layer or a stamp comprising a combination of a high Young's modulus polymer layer and a low Young's modulus polymer layer. The following references relate to self-assembly techniques which may be used in methods described herein to transfer, assemble and interconnect transferable semiconductor elements via contact printing and/or solution printing techniques and are incorporated by reference in their entireties herein: (1) "Guided molecular self-assembly: a review of recent efforts", Jiyun C Huie Smart Mater. Struct. (2003) 12, 264-271; (2) "Large-Scale Hierarchical Organization of Nanowire Arrays for Integrated Nanosystems", Whang, D.; Jin, S.; Wu, Y.; Lieber, C. M. Nano Lett. (2003) 3(9), 1255-1259; (3) "Directed Assembly of One-Dimensional Nanostructures into Functional Networks", Yu Huang, Xiangfeng Duan, Qingqiao Wei, and Charles M. Lieber, Science (2001) 291, 630-633; and (4) "Electric-field assisted assembly and alignment of metallic nanowires", Peter A. Smith et al., Appl. Phys. Lett. (2000) 77(9), 1399-1401.

Useful contact printing methods for assembling, organizing and/or integrating transferable elements include dry transfer contact printing, microcontact or nanocontact printing, microtransfer or nanotransfer printing and self assembly assisted printing. Use of contact printing is beneficial because it allows assembly and integration of a plurality of transferable semiconductors in selected orientations and positions relative to each other. Contact printing also enables effective transfer, assembly and integration of diverse classes of materials and structures, including semiconductors (e.g., inorganic semiconductors, single crystalline semiconductors, organic semiconductors, carbon nanomaterials etc.), dielectrics, and conductors. Contact printing methods optionally provide high precision registered transfer and assembly of transferable semiconductor elements in preselected positions and spatial orientations relative to one or more device components prepatterned on a device substrate. Contact printing is also compatible with a wide range of substrate types, including conventional rigid or semi-rigid substrates such as glasses, ceramics and metals, and substrates having physical and mechanical properties attractive for specific applications, such as flexible substrates, bendable substrates, shapeable substrates, conformable substrates and/or stretchable substrates. Contact printing assembly of transferable structures is compatible, for example, with low temperature processing (e.g., less than or equal to 298K). This attribute allows the present optical systems to be implemented using a range of substrate materials including those that decompose or degrade at high temperatures, such as polymer and plastic substrates. Contact printing transfer, assembly and integration of device elements is also beneficial because it can be implemented via low cost and high-throughput printing techniques and systems, such as roll-to-roll printing and flexographic printing methods and systems.

"Stretchable" refers to the ability of a material, structure, device or device component to be strained without undergoing fracture. In an exemplary embodiment, a stretchable material, structure, device or device component may undergo strain larger than about 0.5% without fracturing, preferably for some applications strain larger than about 1% without fracturing and more preferably for some applications strain larger than about 3% without fracturing.

The terms "foldable," "flexible" and "bendable" are used synonymously in the present description and refer to the ability of a material, structure, device or device component to be deformed into a curved shape without undergoing a transformation that introduces significant strain, such as strain characterizing the failure point of a material, structure, device or device component. In an exemplary embodiment, a flexible material, structure, device or device component may be deformed into a curved shape without introducing strain larger than or equal to about 5%, preferably for some applications without introducing strain larger than or equal to about 1%, and more preferably for some applications without introducing strain larger than or equal to about 0.5%. As used herein, some, but not necessarily all, flexible structures are also stretchable. A variety of properties provide flexible structures (e.g., device components), including materials properties such as a low modulus, bending stiffness and flexural rigidity; physical dimensions such as small average thickness (e.g., less than 100 µm, optionally less than 10 µm and optionally less than 1 µm) and device geometries such as thin film and mesh geometries.

"Semiconductor" refers to any material that is an insulator at very low temperatures, but which has an appreciable electrical conductivity at temperatures of about 300 Kelvin. In the present description, use of the term semiconductor is intended to be consistent with use of this term in the art of microelectronics and electrical devices. Useful semiconductors include element semiconductors, such as silicon, germanium and diamond, and compound semiconductors, such as group IV compound semiconductors such as SiC and SiGe, group III-V semiconductors such as AlSb, AlAs, Aln, AlP, BN, GaSb, GaAs, GaN, GaP, InSb, InAs, InN, and InP, group III-V ternary semiconductor alloys such as $Al_xGa_{1-x}As$, group II-VI semiconductors such as CsSe, CdS, CdTe, ZnO, ZnSe, ZnS, and ZnTe, group I-VII semiconductors such as CuCl, group IV-VI semiconductors such as PbS, PbTe and SnS, layer semiconductors such as $PbI_2$, $MoS_2$ and GaSe, and oxide semiconductors such as CuO and $Cu_2O$.

The term semiconductor includes intrinsic semiconductors and extrinsic semiconductors that are doped with one or more selected materials, including semiconductors having p-type doping materials (also known as P-type or p-doped semiconductors) and n-type doping materials (also known as N-type or n-doped semiconductors), to provide beneficial electrical properties useful for a given application or device. The term semiconductor includes composite materials comprising a mixture of semiconductors and/or dopants. Specific semiconductor materials useful for some embodiments include, but are not limited to, Si, Ge, Se, diamond, fullerenes, SiC, SiGe, SiO, $SiO_2$, SiN, AlSb, AlAs, AlIn, AlN, AlP, AlS, BN, BP, BAs, $As_2S_3$, GaSb, GaAs, GaN, GaP, GaSe, InSb, InAs, InN, InP, CsSe, CdS, CdSe, CdTe, $Cd_3P_2$, $Cd_3As_2$, $Cd_3Sb_2$, ZnO, ZnSe, ZnS, ZnTe, $Zn_3P_2$, $Zn_3As_2$, $Zn_3Sb_2$, $ZnSiP_2$, CuCl, PbS, PbSe, PbTe, FeO, $FeS_2$, NiO, EuO, EuS, PtSi, TlBr, $CrBr_3$, SnS, SnTe, $PbI_2$, $MoS_2$, GaSe, CuO, $Cu_2O$, HgS, HgSe, HgTe, $HgI_2$, MgS, MgSe, MgTe, CaS, CaSe, SrS, SrTe, BaS, BaSe, BaTe, $SnO_2$, TiO, $TiO_2$, $Bi_2S_3$, $Bi_2O_3$, $Bi_2Te_3$, $BiI_3$, $UO_2$, $UO_3$, $AgGaS_2$, PbMnTe, $BaTiO_3$, $SrTiO_3$, $LiNbO_3$, $La_2CuO_4$, $La_{0.7}Ca_{0.3}MnO_3$, CdZnTe, CdMnTe, $CuInSe_2$, copper indium gallium selenide (CIGS), HgCdTe, HgZnTe, HgZnSe, PbSnTe, $Tl_2SnTe_5$, $Tl_2GeTe_5$, AlGaAs, AlGaN, AlGaP, AlInAs, AlInSb, AlInP, AlInAsP, AlGaAsN, GaAsP, GaAsN, GaMnAs, GaAsSbN, GaInAs, GaInP, AlGaAsSb, AlGaAsP, AlGaInP, GaInAsP, InGaAs, InGaP, InGaN, InAsSb, InGaSb, InMnAs, InGaAsP, InGaAsN, InAlAsN, GaInNAsSb, GaInAsSbP, and any combination of these. Porous silicon semiconductor materials are useful in the field of sensors and light emitting materials, such as light emitting diodes (LEDs) and solid state lasers. Impurities of semiconductor materials are atoms, elements, ions and/or molecules other than the semiconductor material(s) themselves or any dopants provided to the semiconductor material. Impurities are undesirable materials present in semiconductor materials which may negatively impact the electrical properties of semiconductor materials, and include but are not limited to oxygen, carbon, and metals including heavy metals. Heavy metal impurities include, but are not limited to, the group of elements between copper and lead on the periodic table, calcium, sodium, and all ions, compounds and/or complexes thereof.

"Semiconductor element", "semiconductor structure" and "semiconductor circuit element" are used synonymously in the present description and broadly refer to any semiconductor material, composition, structure, device or device component, and expressly include high quality, single crystalline and polycrystalline semiconductors, semiconductor materials fabricated via high temperature processing, doped semiconductor materials, inorganic semiconductors and composite semiconductor materials and structures having one or more additional semiconductor components and/or non-semiconductor components, such as dielectric layers or materials and/or conducting layers or materials. In some embodiments, for example, semiconductor element refers to semiconductor-containing devices or components thereof, such as LEDs, lasers, solar cells, semiconductor junctions, p-n junctions, photovoltaics, photodiodes, diodes, transistors, integrated circuits, logic circuits, sensors, heaters, temperature sensors, thermistors and resistive heating elements. Semiconductor elements expressly include structures having an average thickness selected over the range of 50 nm to 100 µm, one or more lateral dimensions selected over the range of 250 nm to 100000 µm, and any combinations of these. Optionally, semiconductor elements are provided in physical contact with other dielectric or insulating materials and structures. Optionally, semiconductor elements are provided in physical contact or electrical communication with other metallic, doped or conducting materials and structures. Optionally, semiconductor structures are provided in physical contact or electrical communication with other semiconductor devices, including, but not limited to LEDs, lasers, transistors, integrated circuits, logic circuits, photodiodes, multiplexer circuitry and amplifier circuitry. Optionally, a plurality of semiconductor structures is provided in array configurations, including arrays with a fixed element pitch or a variable element pitch. Semiconductor structures may optionally be provided in a plurality of individually encapsulated stacked layers, including stacked layers of array structures. Semiconductor elements utilized in the devices and methods described herein include high purity semiconductor elements having oxygen impurities less than about 5 to 25 parts per million atoms, carbon impurities less than about 1 to 5 parts per million atoms, and heavy metal impurities less than or equal to about 1 part per million atoms (ppma), preferably less than or equal to about 100 parts per billion atoms (ppba) for some applications, and more preferably less than or equal to about 1 part per billion atoms (ppba) for some applications. Semiconductor elements having low levels of heavy metal impurities (e.g. less than about 1 part per million atoms) are beneficial for applications and devices requiring good electronic performance, as the presence of heavy metals in semiconductor materials can severely degrade their electrical properties.

In certain embodiments, the term "orientation" refers to a specific plane of a crystal structure, for example a semiconductor crystal. In certain embodiments, the term "direction" refers to a specific axis, or equivalent axes, of a crystal structure. In embodiments, use of the terms orientation and direction with a specific numeric indicator is intended to be consistent with use in the fields of crystallography and microfabrication.

"Quantum well" refers to an active layer of a light emitting diode device. In one embodiment, a quantum well is a layer of an LED device having a relatively narrow bandgap, surrounded on two sides by layers each having a relatively wider bandgap. "Barrier layer" refers to a layer of a light emitting diode device which is positioned adjacent to a quantum well layer and has a larger bandgap than the quantum well material. In one embodiment, a quantum well layer is sandwiched between two barrier layers. In another embodiment, multiple quantum well layers are sandwiched between multiple barrier layers.

"Contact layer" refers to a layer of a light emitting diode device, for example used to make electrical contact with external circuit components, such as electrical interconnects. "Spreader layer" refers to a layer of a light emitting diode device, for example useful for providing voltage or current from a contact layer across the area of a light emitting diode device. "Cladding layer" refers to a layer of a light emitting diode device, for example a layer surrounding the barrier layer and quantum well layer.

"Good electronic performance" and "high performance" are used synonymously in the present description and refer to devices and device components having electronic characteristics, such as field effect mobilities, threshold voltages and on-off ratios, providing a desired functionality, such as electronic signal switching and/or amplification. Exemplary printable elements exhibiting good electronic performance may have intrinsic field effect mobilities greater than or equal about 100 $cm^2$ $V^{-1}$ $s^{-1}$, and for some applications, greater than or equal to about 300 $cm^2$ $V^{-1}$ $s^{-1}$. Exemplary transistors exhibiting good electronic performance may have device field effect mobilities great than or equal to about 100 $cm^2$ $V^{-1}$ $s^{-1}$, for some applications, greater than or equal to about 300 $cm^2$ $V^{-1}$ $s^{-1}$, and for other applications, greater than or equal to about 800 $cm^2$ $V^{-1}$ $s^{-1}$. Exemplary transistors exhibiting good electronic performance may have threshold voltages less than about 5 volts and/or on-off ratios greater than about $1\times10^4$.

"Plastic" refers to any synthetic or naturally occurring material or combination of materials that can be molded or shaped, generally when heated, and hardened into a desired shape. Useful plastics include, but are not limited to, polymers, resins and cellulose derivatives. In the present description, the term plastic is intended to include composite plastic materials comprising one or more plastics with one or more additives, such as structural enhancers, fillers, fibers, plasticizers, stabilizers or additives which may provide desired chemical or physical properties.

"Prepolymer" refers to a material which is a polymer precursor and/or a material which, when cured, is a polymer. A "liquid prepolymer" refers to a prepolymer which exhibits one or more properties of a liquid, for example flow properties. Specific prepolymers include, but are not limited to, photocurable polymers, thermally curable polymers and photocurable polyurethanes. Use of the term "developed" in reference to a prepolymer material refers to prepolymer materials that have been cured or partially cured. For example, in one embodiment, a developed prepolymer refers to a prepolymer that has been exposed to electromagnetic radiation, initiating the curing process. Use of the term "undeveloped" in reference to a prepolymer material refers to prepolymer materials that have not undergone curing. For example, in one embodiment, an undeveloped prepolymer refers to a prepolymer that has not been exposed to electromagnetic radiation and, thus, has not begun the curing process. In one embodiment, the term undeveloped is used to specifically distinguish an uncured portion of a single prepolymer region that is adjacent to other portions of the same prepolymer region that are cured or have begun the curing process.

"Curing" refers to a process by which a material is transformed such that the transformed material exhibits one or more properties different from the original, non-transformed material. In some embodiments, a curing process allows a liquid material to become solid or rigid. In an embodiment, curing transforms a prepolymer material into a polymer material. Useful curing processes include, but are not limited to, exposure to electromagnetic radiation (photocuring processes), for example exposure to electromagnetic radiation of a specific wavelength or wavelength range (e.g., ultraviolet or infrared electromagnetic radiation); thermal curing processes, for example heating to a specific temperature or within a specific temperature range (e.g., 150° C. or between 125 and 175° C.); temporal curing processes, for example waiting for a specified time or time duration (e.g., 5 minutes or between 10 and 20 hours); drying processes, for example removal of all or a percentage of water or other solvent molecules; and any combination of these.

"Polymer" refers to a molecule comprising a plurality of repeating chemical groups, typically referred to as monomers. Polymers are often characterized by high molecular masses. Polymers are typically composed of repeating structural units connected by covalent chemical bonds or the polymerization product of one or more monomers. The term polymer includes homopolymers, or polymers consisting essentially of a single repeating monomer subunit. The term polymer also includes copolymers, or polymers consisting essentially of two or more monomer subunits, such as random, block, alternating, segmented, graft, tapered and other copolymers. Useful polymers include organic polymers and inorganic polymers, both of which may be in amorphous, semi-amorphous, crystalline or partially crystalline states. Polymers may comprise monomers having the same chemical composition or may comprise a plurality of monomers having different chemical compositions, such as a copolymer. Cross linked polymers having linked monomer chains are also useful for some embodiments. Useful polymers include, but are not limited to, plastics, elastomers, thermoplastic elastomers, elastoplastics, thermoplastics and acrylates. Exemplary polymers include, but are not limited to, acetal polymers, biodegradable polymers, cellulosic polymers, fluoropolymers, nylons, polyacrylonitrile polymers, polyamide-imide polymers, polyimides, polyarylates, polybenzimidazole, polybutylene, polycarbonate, polyesters, polyetherimide, polyethylene, polyethylene copolymers and modified polyethylenes, polyketones, poly(methyl methacrylate), polymethylpentene, polyphenylene oxides and polyphenylene sulfides, polyphthalamide, polypropylene, polyurethanes, styrenic resins, sulfone based resins, vinyl-based resins, rubber (including natural rubber, styrene-butadiene, polybutadiene, neoprene, ethylene-propylene, butyl, nitrile, silicones), acrylic, polystyrene, polyvinyl chloride, polyolefin or any combinations of these.

"Elastomer" refers to a polymeric material which can be stretched or deformed and return to its original shape without substantial permanent deformation. Elastomers commonly undergo substantially elastic deformations. Useful elastomers may comprise polymers, copolymers, composite materials or mixtures of polymers and copolymers. An elastomeric layer refers to a layer comprising at least one elastomer. Elastomeric layers may also include dopants and other non-elastomeric materials. Useful elastomer embodiments include, but are not limited to, thermoplastic elastomers, styrenic materials, olefenic materials, polyolefin, polyurethane thermoplastic elastomers, polyamides, synthetic rubbers, PDMS, polybutadiene, polyisobutylene, poly(styrene-butadiene-styrene), polyurethanes, polychloroprene and silicones. In some embodiments, an elastomeric stamp comprises an elastomer. Exemplary elastomers include, but are not limited to silicon containing polymers such as polysiloxanes including poly(dimethyl siloxane) (i.e. PDMS and h-PDMS), poly(methyl siloxane), partially alkylated poly(methyl siloxane), poly(alkyl methyl siloxane) and poly(phenyl methyl siloxane), silicon modified elastomers, thermoplastic elastomers, styrenic materials, olefenic materials, polyolefin, polyurethane thermoplastic elastomers, polyamides, synthetic rubbers, polyisobutylene, poly(styrene-butadiene-styrene), polyurethanes, polychloroprene and silicones. In an embodiment, a flexible polymer is a flexible elastomer.

"Transfer device" or "transfer substrate" refers to a substrate, device or device component capable of and/or configured for receiving and/or relocating an element or array of elements, such as printable elements. Useful transfer devices include conformal transfer devices, such as devices having one or more contact surfaces capable of establishing conformal contact with elements undergoing transfer. An elastomeric stamp and/or transfer device is useful with a variety of the methods and devices described herein. Useful elastomeric transfer devices include, but are not limited to, elastomeric stamps, composite elastomeric stamps, an elastomeric layer, a plurality of elastomeric layers and an elastomeric layer coupled to a substrate such as a glass, ceramic, metal or polymer substrate.

"Elastomeric stamp" and "elastomeric transfer device" are used interchangeably and refer to an elastomeric material having a surface that can receive as well as transfer a feature. Exemplary elastomeric transfer devices include stamps, molds and masks. The transfer device affects and/or facilitates feature transfer from a donor material to a receiver material. Stamps and transfer devices may be used for assembling components via transfer printing, such as dry contact transfer printing.

"Target substrate" is used broadly to refer to the desired final substrate that will support the transferred structure(s). In an embodiment, the target substrate is a device substrate. In an embodiment, the target substrate is a device component or element that is itself supported by a substrate.

"Large area" refers to an area, such as the area of a receiving surface of a substrate used for device fabrication, greater than or equal to about 36 square inches.

"Pre-metalized" refers to a structure which includes metallic layers, components or features.

"Pre-patterned" refers to a structure which includes one or more devices, components or relief features.

"Optical communication" refers to a configuration of two or more elements wherein one or more beams of electromagnetic radiation are capable of propagating from one element to the other element. Elements in optical communication may be in direct optical communication or indirect optical communication. "Direct optical communication" refers to a configuration of two or more elements wherein one or more beams of electromagnetic radiation propagate directly from a first device element to another without use of optical components for steering and/or combining the beams. "Indirect optical communication" refers to a configuration of two or more elements wherein one or more beams of electromagnetic radiation propagate between two elements via one or more device components including, but not limited to, wave guides, fiber optic elements, reflectors, filters, prisms, lenses, gratings and any combination of these device components.

"Luminous efficacy" and "luminous efficiency" refer to a relative measure of an amount of luminous flux generated by a device or device element that consumes a specific power.

The term "phosphor" as used herein refers to a luminescent material, for example a material that emits electromagnetic radiation by a non-incandescent mechanism. In one embodiment, a phosphor emits electromagnetic radiation of one wavelength or wavelength distribution when exposed to electromagnetic radiation of a second wavelength or wavelength distribution. The term phosphor expressly includes phosphorescent materials and fluorescent materials.

An "optical diffuser" refers to a device component used for scattering, spreading or otherwise redirecting electromagnetic radiation. In one embodiment, an optical diffuser is used to enlarge the apparent size of a source of electromagnetic radiation. In one embodiment, a diffuser is used to make multiple discrete sources of light appear as a single, continuous, larger area source of light.

The term "chromaticity" as used herein refers to an apparent color of electromagnetic radiation or a distribution of electromagnetic radiation. In some embodiments, chromaticity is defined according to a defined color space. In a specific embodiment, chromaticity is referred to according to coordinates of the CIE 1931 color space, for example x and y coordinates.

"Electrical contact" and "electrical communication" refer to the arrangement of one or more objects such that an electric current efficiently flows from one object to another. For example, in some embodiments, two objects having an electrical resistance between them less than $100\Omega$ are considered in electrical communication with one another. An electrical contact can also refer to a component of a device or object used for establishing electrical communication with external devices or circuits, for example an electrical interconnection. "Electrical contact" also refers to the ability of two or more materials and/or structures to transfer charge between them, such as in the form of the transfer of electrons or ions. "Electrical communication" also refers to a configuration of two or more components such that an electronic signal or charge carrier can be directly or indirectly transferred from one component to another. As used herein, electrical communication includes one-way and two-way electrical communication. In some embodiments, components in electrical communication are in direct electrical communication wherein an electronic signal or charge carrier is directly transferred from one component to another. In some embodiments, components in electrical communication are in indirect electrical communication wherein an electronic signal or charge carrier is indirectly transferred from one component to another via one or more intermediate structures, such as circuit elements, separating the components.

"Electrical resistivity" refers to a property of a material characteristic of the resistance to flow of electrons through the material. In certain embodiments, the resistivity of a material ($\rho$) is related to the resistance (R) of a length of material (L) having a specific cross sectional area (A), e.g., $\rho = R \times A/L$.

"Electrical interconnection" and "electrical interconnect" refer to a component of an electrical device used for providing electrical communication between two or more device components. In some embodiments, an electrical interconnect is used to provide electrical communication between two device components spatially separated from one another, for example spatially separated by a distance greater than 50 nm, for some applications greater than 100 nm, for other applications greater than 1 µm, and for yet other applications greater than 50 µm. "Electrode contact" refers to a component of an electronic device or device component to which an electrical interconnect attaches or provides electrical communication to or from.

"Independently electrically addressable" refers to an electrical circuit wiring scheme where currents or potentials are provided to individual device components irrespective of currents or potentials provided to other device components. "Series configuration" refers to an electrical circuit wiring scheme where multiple device components carry the same current due to a single conduction path through all the device components. "Parallel configuration" refers to an electrical circuit wiring scheme where a single potential difference is applied across multiple device components.

"Embed" refers to a process by which one object or device is buried, conformally surrounded or otherwise placed or positioned within or below the surface of another object, layer or material.

"Encapsulate" refers to the orientation of one structure such that it is entirely surrounded by one or more other structures. "Partially encapsulated" refers to the orientation of one structure such that it is partially surrounded by one or more other structures or has one or more exposed regions, such as regions exposed to the surrounding environment. "Completely encapsulated" refers to the orientation of one structure such that it is completely surrounded by one or more other structures. Some embodiments contemplate devices having partially or completely encapsulated electronic devices, device components and/or inorganic semiconductor components and/or electrodes.

"Laminate" refers to a process by which two or more layers are joined together to form a single multilayer structure. In one embodiment, two or more layers are laminated by positioning an adhesive layer between each layer. In one embodiment, two or more layers are laminated by positioning the layers adjacent to one another and then encapsulating all layers into a single encapsulated structure.

"Replicate" refers to a process by which one or more relief features are transferred and/or recreated during casting, molding, embedding, or embossing processes. Replicated features generally resemble the features they originate from except that the replicated features represent the negative of the original features; that is where the original features are raised features, the replicated features are recessed features and where the original features are recessed features, the replicated features are raised features. "Replica molding" and "nano imprint lithography" refer to specific replicating methods known in the art of microfabrication.

"Relief feature" refers to portions of an object or layer exhibiting differences in elevation and slope between the higher and lower parts of the surface of a given area or portion of the object or layer. "Raised features" refer to relief features which extend above the surface or average surface level of an object or layer or relief features which have elevations higher than other portions of the surface of an object or layer. "Recessed features" refer to relief features which extend below the surface or average surface level of an object or layer or relief features which have elevations lower than other portions of the surface of an object or layer.

"Unitary structure" refers to a structure having one or more components within a single continuous or monolithic body, and includes structures having a uniform or non-uniform composition.

"Contiguous" refers to materials or layers that are touching or connected throughout in an unbroken sequence. In one embodiment, a contiguous layer of a device has not been etched to remove a substantial portion (e.g., 10% or more) of the originally provided material or layer.

"Accommodate" and "accommodation" refer to the configuration of one surface or device to match the contours or relief features of another surface or device such that the two surfaces/devices are in intimate contact. In one embodiment, a surface which accommodates a device or device component is a microstructured or nanostructured surface having relief features which match the shape, contours and or dimensions of the device or device component.

"Conformal contact" refers to contact established between surfaces, coated surfaces, and/or surfaces having materials deposited thereon which may be useful for transferring, assembling, organizing and integrating structures (such as printable elements) on a substrate surface. In one aspect, conformal contact involves a macroscopic adaptation of one or more contact surfaces of a conformal transfer device to the overall shape of a substrate surface or the surface of an object such as a printable element. In another aspect, conformal contact involves a microscopic adaptation of one or more contact surfaces of a conformal transfer device to a substrate surface leading to an intimate contact without voids. The term conformal contact is intended to be consistent with use of this term in the art of soft lithography. Conformal contact may be established between one or more bare contact surfaces of a conformal transfer device and a substrate surface. Alternatively, conformal contact may be established between one or more coated contact surfaces, for example contact surfaces having a transfer material, printable element, device component, and/or device deposited thereon, of a conformal transfer device and a substrate surface. Alternatively, conformal contact may be established between one or more bare or coated contact surfaces of a conformal transfer device and a substrate surface coated with a material such as a transfer material, solid photoresist layer, prepolymer layer, liquid, thin film or fluid.

"Conformable" refers to a device, material or substrate which has a bending stiffness sufficiently low to allow the device, material or substrate to adopt any desired contour profile, for example a contour profile allowing for conformal contact with a surface having a pattern of relief features.

"Bind" and "bond" refer to the physical attachment of one object to another. Bind and bond can also refer the retention of one object on another. In one embodiment an object can bind to another by establishing a force between the objects. In some embodiments, objects are bound to one another through use of an adhesion layer. In one embodiment, an adhesion layer refers to a layer used for establishing a bonding force between two objects.

"Placement accuracy" refers to the ability of a transfer method or device to transfer a printable element, to a selected position, either relative to the position of other device components, such as electrodes, or relative to a selected region of a receiving surface. "Good placement accuracy" refers to methods and devices capable of transferring a printable element to a selected position relative to another device or device component or relative to a selected region of a receiving surface with spatial deviations from the absolutely correct position less than or equal to 50 microns, more preferably less than or equal to 20 microns for some applications and even more preferably less than or equal to 5 microns for some applications. Methods and devices described herein include those comprising at least one printable element transferred with good placement accuracy.

"Fidelity" refers to a measure of how well a selected pattern of elements, such as a pattern of printable elements, is transferred to a receiving surface of a substrate. Good fidelity refers to transfer of a selected pattern of elements wherein the relative positions and orientations of individual elements are preserved during transfer, for example wherein spatial deviations of individual elements from their positions in the selected pattern are less than or equal to 500 nanometers, more preferably less than or equal to 100 nanometers.

"Undercut" refers to a structural configuration wherein the bottom surfaces of an element, such as a printable element, bridge element and/or anchor element, are at least partially detached from or not fixed to another structure, such as a mother wafer or bulk material. Entirely undercut refers to a structural configuration wherein the bottom surface of an element, such as printable element, bridge element and/or anchor element, is completely detached from another structure, such as a host substrate or bulk material. Undercut structures may be partially or entirely free standing structures. Undercut structures may be partially or fully supported by another structure, such as a host substrate, mother wafer or bulk material, that they are detached from. Undercut structures may be attached, affixed and/or connected to another structure, such as a wafer or other bulk material, at surfaces other than the bottom surfaces.

"Anchor" refers to a structure useful for connecting or tethering one device or device component to another. "Anchoring" refers to a process resulting in the connection or tethering of one device or device component to another. Printable LED elements of the invention, such as printable InGaN structures, may be connected or otherwise attached to a host substrate via homogeneous anchoring or heterogeneous anchoring. Anchor structures useful in some embodiments include partially or fully undercut structures.

"Homogeneous anchoring" refers to an anchor that is an integral part of the functional layer. In general, methods of making transferable elements by homogenous anchoring systems is optionally by providing a wafer, depositing a sacrificial layer on at least a portion of a wafer surface, defining semiconductor elements by any means known in the art, and defining anchor regions. The anchor regions correspond to specific regions of the semiconductor element. The anchor regions can correspond to a geometrical configuration of a semiconductor layer, e.g., anchors defined by relatively large surface areas and connected to transferable elements by bridge or tether elements. Such geometry provides a means for facilitating lift-off of specific non-anchored regions for either single-layer or multi-layer embodiments. Alternatively, anchors correspond to semiconductor regions that are attached or connected to the underlying wafer. Removing the sacrificial layer provides a means for removing or transferring semiconductor elements while the portion of semiconductor physically connected to the underlying wafer remains.

"Heterogeneous anchoring" refers to an anchor that is not an integral part of the functional layer, such as an anchor that is made of a different material than the semiconductor layer or is made of the same material, but that is defined after the transferable semiconductor elements are placed in the system. One advantage of heterogeneous anchoring compared to homogeneous anchoring relates to better transfer defining strategies and further improvement to the effective useable wafer footprint. In the heterogeneous strategy embodiment, a wafer is provided, the wafer is coated with a sacrificial layer, semiconductor elements are defined, and heterogeneous anchor elements are deposited that anchor semiconductor regions. In an aspect, the anchor is a resist material, such as a photoresist or SiN (silicon nitride), or other material that has a degree of rigidity capable of anchoring and resisting a lift-off force that is not similarly resisted by non-anchored regions. The anchor may span from the topmost semiconductor layer through underlying layers to the underlying wafer substrate. Removal of the sacrificial layer provides a means for removing unanchored regions while the anchored regions remain connected to the wafer, such as by contact transfer, for example. In another embodiment, for a multi-layer system, the anchor provides anchoring of a top layer to an underlying semiconductor layer. Alternatively, the anchoring system is for single-layer semiconductor layer systems.

"Carrier film" refers to a material that facilitates separation of layers. The carrier film may be a layer of material, such as a metal or metal-containing material positioned adjacent to a layer that is desired to be removed. The carrier film may be a composite of materials, including incorporated or attached to a polymeric material or photoresist material, wherein a lift-off force applied to the material provides release of the composite of materials from the underlying layer (such as a functional layer, for example).

In the context of this description, a "bent configuration" refers to a structure having a curved conformation resulting from the application of a force. Bent structures may have one or more folded regions, convex regions, concave regions, and any combinations thereof. Useful bent structures, for example, may be provided in a coiled conformation, a wrinkled conformation, a buckled conformation and/or a wavy (i.e., wave-shaped) conformation.

Bent structures, such as stretchable bent interconnects, may be bonded to a flexible substrate, such as a polymer and/or elastic substrate, in a conformation wherein the bent structure is under strain. In some embodiments, the bent structure, such as a bent ribbon structure, is under a strain equal to or less than about 30%, a strain equal to or less than about 10%, a strain equal to or less than about 5% or a strain equal to or less than about 1% in embodiments preferred for some applications. In some embodiments, the bent structure, such as a bent ribbon structure, is under a strain selected from the range of about 0.5% to about 30%, a strain selected from the range of about 0.5% to about 10%, or a strain selected from the range of about 0.5% to about 5%. Alternatively, the stretchable bent interconnects may be bonded to a substrate that is a substrate of a device component, including a substrate that is itself not flexible. The substrate itself may be planar, substantially planar, curved, have sharp edges, or any combination thereof. Stretchable bent interconnects are available for transferring to any one or more of these complex substrate surface shapes.

"Thermal contact" or "thermal communication" refers to the arrangement of two materials or structures such that they are capable of substantial heat transfer from the higher temperature material to the lower temperature material, such as by conduction. In embodiments, electrical interconnects positioned in electrical contact with printable LED elements are also provided in thermal communication with the printable LED elements and/or are also provided in physical contact with the printable LED elements. In embodiments, electrical interconnects positioned in thermal communication with printable LED elements are also provided in physical contact with the printable LED elements.

"Heat dissipation" refers to a process of transferring heat from one object to another object or fluid. In embodiments, dissipation of heat is achieved by providing two objects in thermal communication, for example an electrical interconnect and a device element. In embodiments, heat dissipation is referred to in units of a rate of energy transferred, for example J/s or W.

"Heat capacity" refers to a property of a material corresponding to the amount of heat required to increase the temperature of the material by a specific amount, for example the amount of heat required to increase the temperature by 1 K. "Specific heat capacity" refers to a property of a material corresponding to the amount of heat required to increase the temperature of a specified mass of material by a specific amount, for example the amount of heat required to increase the temperature of 1 g of a material by 1 K.

"Thermal conductivity" refers to a property of a material describing the relative ability of the material to transfer heat. For example, a material with a higher thermal conductivity transfers heat more quickly than a material with a lower thermal conductivity. In specific embodiments, materials having relatively high thermal conductivities are useful for managing the temperature of objects that generate heat by transferring heat away from the objects more efficiently than would materials having relatively lower thermal conductivity.

"Ultrathin" refers to devices of thin geometries that exhibit extreme levels of bendability. In an embodiment, ultrathin refers to circuits having a thickness less than 1 µm, less than 600 nm or less than 500 nm. In an embodiment, a multilayer device that is ultrathin has a thickness less than 200 µm, less than 50 µm, or less than 10 µm.

"Thin layer" refers to a material that at least partially covers an underlying substrate, wherein the thickness is less than or equal to 300 µm, less than or equal to 200 µm, or less than or equal to 50 µm. Alternatively, a thin layer may be described in terms of a functional parameter, such as a thickness that is sufficient to isolate or substantially reduce the strain on the electronic device. A thin layer may be a functional layer (e.g. a layer that is sensitive to strain) in the electronic device.

"Isolate" refers to the presence of an elastomer layer that substantially reduces the strain or stress exerted on a functional layer when the device undergoes a stretching or folding deformation. In an embodiment, strain is said to be "substantially" reduced if the strain is at least a factor of 20, at least a factor of 50, or at least a factor of 100 times reduced compared to the strain of the same system without the elastomer layer.

"Dielectric" and "dielectric material" are used synonymously in the present description and refer to a substance that is highly resistant to flow of electric current. Useful dielectric materials include, but are not limited to, $SiO_2$, $Ta_2O_5$, $TiO_2$, $ZrO_2$, $Y_2O_3$, $Si_3N_4$, STO, BST, PLZT, PMN, and PZT. In an embodiment, an inorganic dielectric comprises a dielectric material substantially free of carbon. Specific examples of inorganic dielectric materials include, but are not limited to, silicon nitride and silicon dioxide.

"Device field effect mobility" refers to the field effect mobility of an electronic device, such as a transistor, as computed using output current data corresponding to the electronic device.

"Fill factor" refers to the percentage of the two-dimensional or three-dimensional area between two elements, such as between two electrodes, that is occupied by a material, element and/or device component. In one embodiment, two electrodes are provided in electrical contact with one or more printable semiconductor elements that provide a fill factor between first and second electrodes greater than or equal to 20%, preferably greater than or equal to 50% for some applications, and more preferably greater than or equal to 80% for some applications. In some embodiments, the term "density" refers to a specific number of elements found in a specified area.

"Multilayer stacked geometry" refers to a device comprising a plurality of functional layers in a stacked configuration. In some embodiments, stacked multilayers are provided in an offset configuration such that one or more device components in a first functional layer are not provided directly adjacent to one or more device components in a second functional layer, such as a first functional layer positioned adjacent to, above or below a second functional layer.

"Collecting" and "concentrating", as applied to optics and optical components, refers to the characteristic of optical components and device components that collect light from a first area, in some cases a large area, and optionally direct that light to another area, in some cases a relatively smaller area. In the context of some embodiments, collecting and concentrating optical components are useful for light detection or power harvesting by printed solar cells or photodiodes.

"Conductive material" refers to a substance or compound possessing an electrical resistivity which is typical of or equivalent to that of a metal, for example copper, silver or aluminum. In embodiments, the electrical resistivity of a conductive material is selected over the range of $1 \times 10^{-10}$ Ω·cm to $1 \times 10^{-2}$ Ω·cm. In the present description, use of the term conductive material is intended to be consistent with use of this term in the art of electronic devices and electric circuits. In embodiments, conductive materials are useful as electrical interconnections and/or for providing electrical communication between two devices. A "conductive paste" refers to a conductive material comprising a mixture which is generally soft and malleable. In some embodiments, cured conductive pastes lose their soft and malleable nature and generally exhibit properties of a solid or a monolithic body. Exemplary conductive pastes comprise metal micro- and/or nano-particles. Silver epoxy refers to a conductive paste comprising micro- and/or nano particles including metallic silver (Ag) and which, when cured, exhibits a low electrical resistivity, for example an electrical resistivity lower than $1\times10^{-5}$ Ω·cm or selected over the range of $1\times10^{-10}$ Ω·cm to $1\times10^{-5}$ Ω·cm.

"Fill" and "filling" refer to a process of depositing a material into a recessed feature. In one embodiment, a recessed region is filled by scraping material across and into the recessed feature. A filling tool generally refers to a device for moving material into a recessed feature. In an embodiment, a filling tool refers to a device for scraping material across and/or into a recessed region. In a specific embodiment, a filling tool comprises a layer or solid body of PDMS. For certain embodiments, a filling process is conceptually similar to a screen printing process where a material is scraped across a recessed feature by a tool or device having dimensions larger than the recessed feature, thereby at least partially filling the recessed feature with the material.

"Align" refers to a process by which two objects are arranged with respect to one another. "Aligned off center" refers to a process by which the centers of two objects or two areas are arranged such that the two centers are not coincident with respect to one or more spatial dimensions. For certain embodiments, the term aligned off center refers to alignment of the center of two objects such that the centers of the objects are spatially separated by a distance greater than 50 nm, for some applications greater than 100 nm, for other applications greater than 1 μm, and for yet other applications greater than 50 μm.

"Neutral mechanical surface," "NMS," "neutral mechanical plane," and "NMP" interchangeably refer to a position within a device or component under strain that experiences an absence of strain. In some embodiments a NMS or NMP is a plane positioned between two regions or layers of a device or component under strain, such as a plane between regions under compressive strain and regions under expansive strain. The NMP is less susceptible to bending stress than other planes of the device that lie at more extreme positions along a vertical axis of the device and/or within more bendable layers of the device. Thus, the position of the NMP is determined by both the thickness of the device and the materials forming the layer(s) of the device.

A "NMS adjusting layer" refers to a layer whose primary function is adjusting the position of the NMS in the device. For example, the NMS adjusting layer may be an encapsulating layer or an add layer such as an elastomeric material.

"Coincident" refers to the relative position of two or more objects, planes or surfaces, for example a surface such as a NMS or NMP that is positioned within or is adjacent to a layer, such as a functional layer, substrate layer, or other layer. In an embodiment, a NMS or NMP is positioned to correspond to the most strain-sensitive layer or material within the layer.

"Proximate" refers to the relative position of two or more objects, planes or surfaces. For example, a NMS or NMP is proximate to or closely follows the position of a layer, such as a functional layer, substrate layer, or other layer while still providing desired foldability or bendability without an adverse impact on the strain-sensitive material physical properties. "Strain-sensitive" refers to a material that fractures or is otherwise impaired in response to a relatively low level of strain. In general, a layer having a high strain sensitivity, and consequently being prone to being the first layer to fracture, is located in the functional layer, such as a functional layer containing a relatively brittle semiconductor or other strain-sensitive device element. A NMS or NMP that is proximate to a layer need not be constrained within that layer, but may be positioned proximate or sufficiently near to provide a functional benefit of reducing the strain on the strain-sensitive device element when the device is folded.

"Adjacent" refers to the position of two or more structures, such as device components, that are located next to each other. In an embodiment, for example, proximate LED elements are positioned such that they are located next to each other in an LED array geometry. Adjacent structures, such as adjacent LED elements, are not necessarily provided in physical contact, and in some embodiments, for example, adjacent structures, such as adjacent LED elements, are separated by a distance greater than or equal to 2 μm, optionally for some applications are separated by a distance greater than or equal to 10 μm, optionally for some applications are separated by a distance greater than or equal to 100 μm, optionally for some applications are separated by a distance greater than or equal to 1000 μm, and optionally for some applications are separated by a distance greater than or equal to 10000 μm.

"Young's modulus" refers to a mechanical property of a material, device or layer which refers to the ratio of stress to strain for a given substance. Young's modulus may be provided by the expression;

$$E = \frac{(\text{stress})}{(\text{strain})} = \left(\frac{L_0}{\Delta L} \times \frac{F}{A}\right)$$

where E is Young's modulus, $L_0$ is the equilibrium length, $\Delta L$ is the length change under the applied stress, F is the force applied and A is the area over which the force is applied. Young's modulus may also be expressed in terms of Lame constants via the equation:

$$E = \frac{\mu(3\lambda + 2\mu)}{\lambda + \mu}$$

where μ and λ are Lame constants. High Young's modulus (or "high modulus") and low Young's modulus (or "low modulus") are relative descriptors of the magnitude of Young's modulus in a given material, layer or device. In the present description, a high Young's modulus is larger than a low Young's modulus, about 10 times larger for some applications, more preferably about 100 times larger for other applications and even more preferably about 1000 times larger for yet other applications. In an embodiment of the present invention, a polymer layer having a high Young's modulus comprises a polymer having a Young's modulus selected over the range of about 1 GPa to about 10 GPa. Exemplary high Young's modulus polymer layers may comprise polyimide, polyester, polyetheretherketone, polyethersulphone, polyetherimide, polyethyleneapthalate, polyketones, poly(phenylene sulfide), any combinations of these materials or other polymeric materials having similar mechanical properties. In an embodiment of the present invention, a polymer layer having a low Young's modulus comprises a polymer having a Young's modulus selected over the range of about 1 MPa to about 10 MPa. Exemplary low Young's modulus polymer layers may comprise elastomers such as, PDMS, h-PDMS, polybutadiene, polyisobutylene, poly(styrene-butadiene-styrene), polyurethanes, polychloroprene and silicones.

Figure 1A:
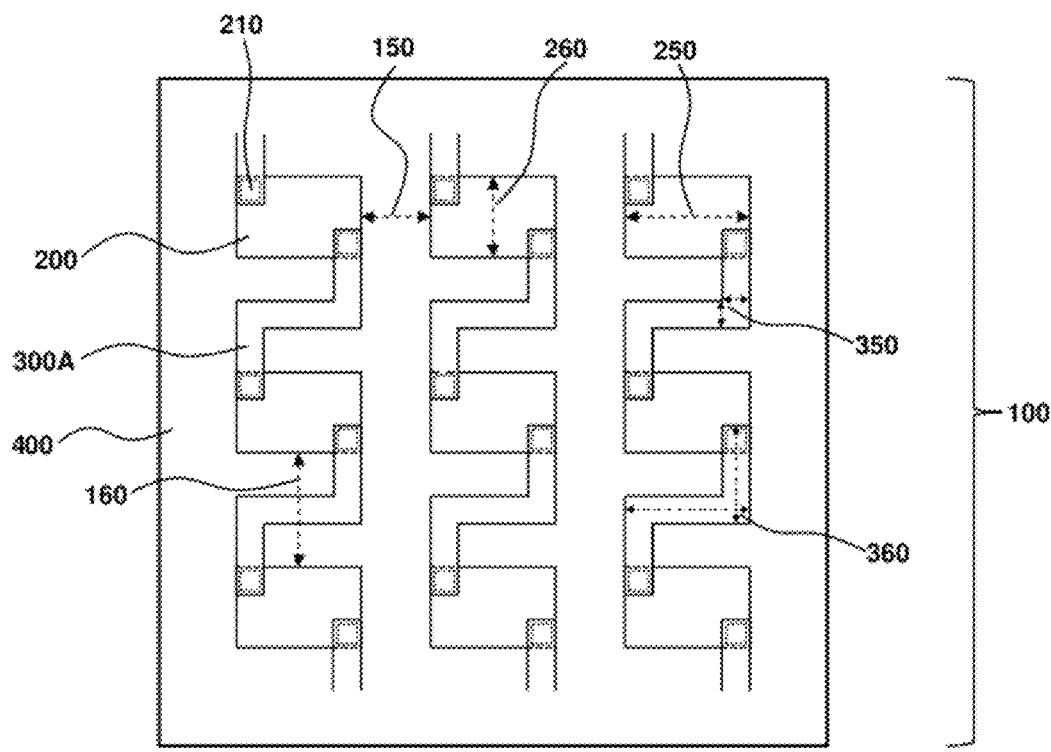
FIG. 1A provides a top plan view of an electronic device and FIG. 1B provides a side view of an electronic device.
Figure 1B:
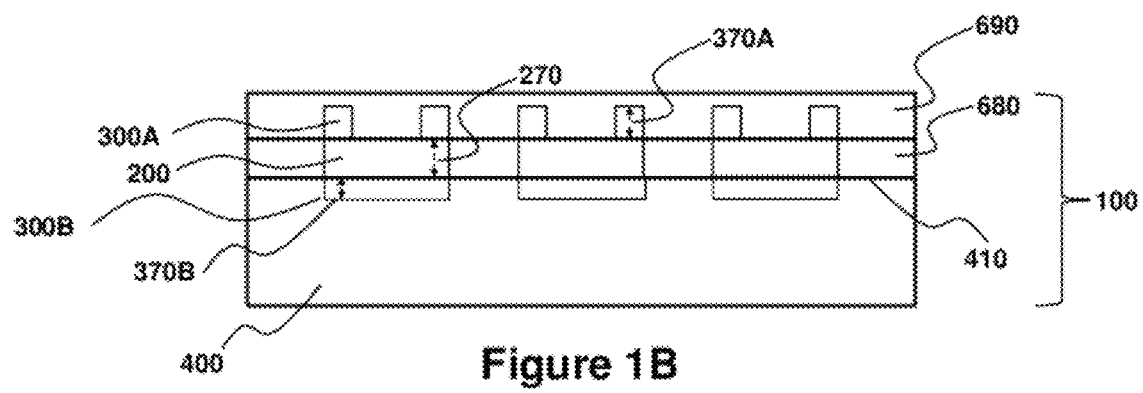
FIG. 1.

FIG. 1A provides a top plan view of an electronic device 100 and FIG. 1B provides a side view of electronic device 100. As show in FIGS. 1A and 1B, electronic device 100 comprises a LED array comprising LED elements 200 and electrical interconnects 300A (top side) and 300B (bottom side) supported by a receiving surface 410 of a substrate 400. LED elements 200 are provided in a sparse array geometry wherein adjacent LED elements are spaced apart from each other by distances 150 and 160. LED elements 200 are characterized by lateral dimensions, such as width 250 and length 260, and a thickness dimension 270. Each LED element 200 includes two electrical contacts 210. Electrical interconnects are also characterized by lateral dimensions, such as widths 350 and lengths 360, and a thickness dimension 370A and 370B. In some embodiments, lateral and thickness dimensions of LED elements 200 are small enough so as to provide useful thermal properties, such as the ability to efficiently passively cool LED elements 200 via heat transfer and dissipation by electrical interconnects 300A and 300B. In some embodiments, lateral and thickness dimensions of electrical interconnects 300A and 300B are large enough such that electrical interconnects 300A and 300B function as efficient heat sinks for dissipating heat generated by LED elements 200 during operation. Optionally, device 100 further comprises planarizing layer 680 and/or encapsulating layer 690.

EXAMPLE 1

Unusual Strategies for Using InGaN Grown on Silicon (111) for Solid State Lighting Properties that can now be achieved with advanced, blue InGaN light emitting diodes (LEDs) lead to their potential as replacements for existing infrastructure in general illumination, with enormous positive implications on power efficiency. Further advances in this technology will benefit from re-examination of the modes for incorporating this materials technology into lighting modules that manage light conversion, extraction and distribution in ways that most critically minimize adverse thermal effects associated with operation, with packages that fully exploit the unique aspects of these light sources. This example describes techniques including anisotropic etching, microscale device assembly/integration, and module configuration that address these challenges in unconventional ways. Various device demonstrations provide examples of the capabilities, including thin, flexible lighting 'tapes' based on patterned phosphors and large collections of small, light emitters on plastic substrates. Quantitative modeling and experimental evaluation of heat flow in such structures illustrates one particular, important aspect of their operation: small, distributed LEDs can be passively cooled simply by direct thermal transport through thin film metallization used for electrical interconnect, providing an enhanced and scalable means to integrate these devices in modules for white light generation.

InGaN-based blue LEDs hold a dominant position in the rapidly growing solid-state lighting industry. The materials and designs for the active components of these devices are increasingly well developed, due to widespread research focus on these aspects over the last one and a half decades. Internal and external quantum efficiencies of greater than 70% and 60%, respectively, with luminous efficacies larger than 200 μm/W and lifetimes of >50,000 hours are now possible. High luminous efficacy of these LEDs (i.e. 249 lm/W) compared to that of a tri-phosphor fluorescent lamp (i.e. 90 lm/W) represents an appealing solution to more energy-efficient lighting systems. In particular, electricity consumption for lighting could potentially be cut in half using solid-state lighting. Although there remain opportunities for further improvements in these parameters, the emergence of LEDs into a ubiquitous technology for general illumination will rely critically on cost effective techniques for integrating the active materials into device packages, interconnecting them into modules, managing the accumulation of heat during their operation, and spatially homogenizing their light output at desired levels of chromaticity. Existing commercial methods use sophisticated, high-speed tools, but which are based on conceptually old procedures that exploit robotic systems to assemble material mechanically diced from a source wafer, with collections of bulk wires, lenses and heat sinks in millimeter-scale packages, on a device-by-device basis, followed by separate steps to form integrated lighting modules. The intrinsic features of such processes prohibit cost competitive realization of some of the most appealing configurations of LEDs for lighting, such as those that involve large collections of ultra-small, thin devices distributed uniformly, but sparsely, over emissive areas of large modules that could serve as direct replacements for troffers currently used in fluorescent building lights. Alternative techniques, such as those that use directed assembly of solution suspensions of LEDs, first reported nearly twenty years ago, appear interesting but efforts to design commercially relevant manufacturing schemes have been unsuccessful. This example describes a set of procedures that address the limitations of existing approaches in a different way, using ideas that extend beyond previous flexible electronics, information displays and photo-voltaics systems, to the area of solid-state lighting by introducing new materials, etching strategies, interconnection methods, thermal management techniques and schemes for wavelength conversion and light distribution. The process begins with removal of InGaN epitaxial material grown on silicon wafers with (111) orientation, using lithographically defined structures and anisotropic wet chemical etching, in ways that bypass conventional laser liftoff techniques and wafer dicing. When implemented with fully formed LEDs, these ideas can be combined with precision assembly via transfer printing, to allow high-throughput manipulation of devices with geometries that are orders of magnitude smaller than those compatible with robotic pick-and-place procedures. Self-aligned techniques for thin film metallization that exploit the large band-gap of GaN provide remarkably simple routes to interconnect large collections of devices. The outcome consists of finely distributed sources of illumination that naturally manage the thermal aspects of operation through dramatically accelerated rates for passive heat spreading, consistent with analytical models for heat flow. Laminating such systems with patterned layers of phosphors and film type optical diffusers yields thin, flexible lighting modules whose formats make them attractive for wide ranging applications in general illumination, both conventional and unconventional.

The work described in this example focuses on model multilayer InGaN epitaxial stacks grown on Si wafers with (111) orientation, due to the cost and throughput advantages that are expected to result from this materials technology when optimized to offer levels of quality (e.g. threading dislocation densities <$10^9$ $cm^{-2}$) currently available from material grown on conventional substrates such as sapphire or SiC. The layer configurations appear in FIG. 8. As illustrated in FIG. 9, lithographically patterned n-type ohmic contacts (Ti:15 nm/Al:60 nm/Mo:20 nm/Au:100 nm) result from electron beam (e-beam) evaporation and rapid thermal annealing (RTA, in $N_2$ ambient) of metal deposited on regions of n-GaN exposed by inductively coupled plasma reactive ion etching (ICP-RIE). Similar procedures yield partially transparent p-type ohmic contacts (Ni:10 nm/Au:10 nm) to the top p-GaN layer, as shown in FIG. 10. Opaque pads (Ti:10 nm/Au:120 nm) e-beam evaporated on top of the p- and n-contacts enable single-step planarization and self-aligned passivation, using procedures outlined subsequently. Etching by ICP-RIE (i.e. mesa etch) defines the lateral dimensions of individual devices, in densely packed, arrayed layouts. Etching proceeds through the entire thickness of the InGaN material, and to a controlled depth (~1 µm) into the silicon, for purposes of release described next. A representative array of such devices appears in graphic illustration in FIG. 2A, and in a corresponding scanning electron microscope (SEM) image in shown in FIG. 2C.

Figure 2:
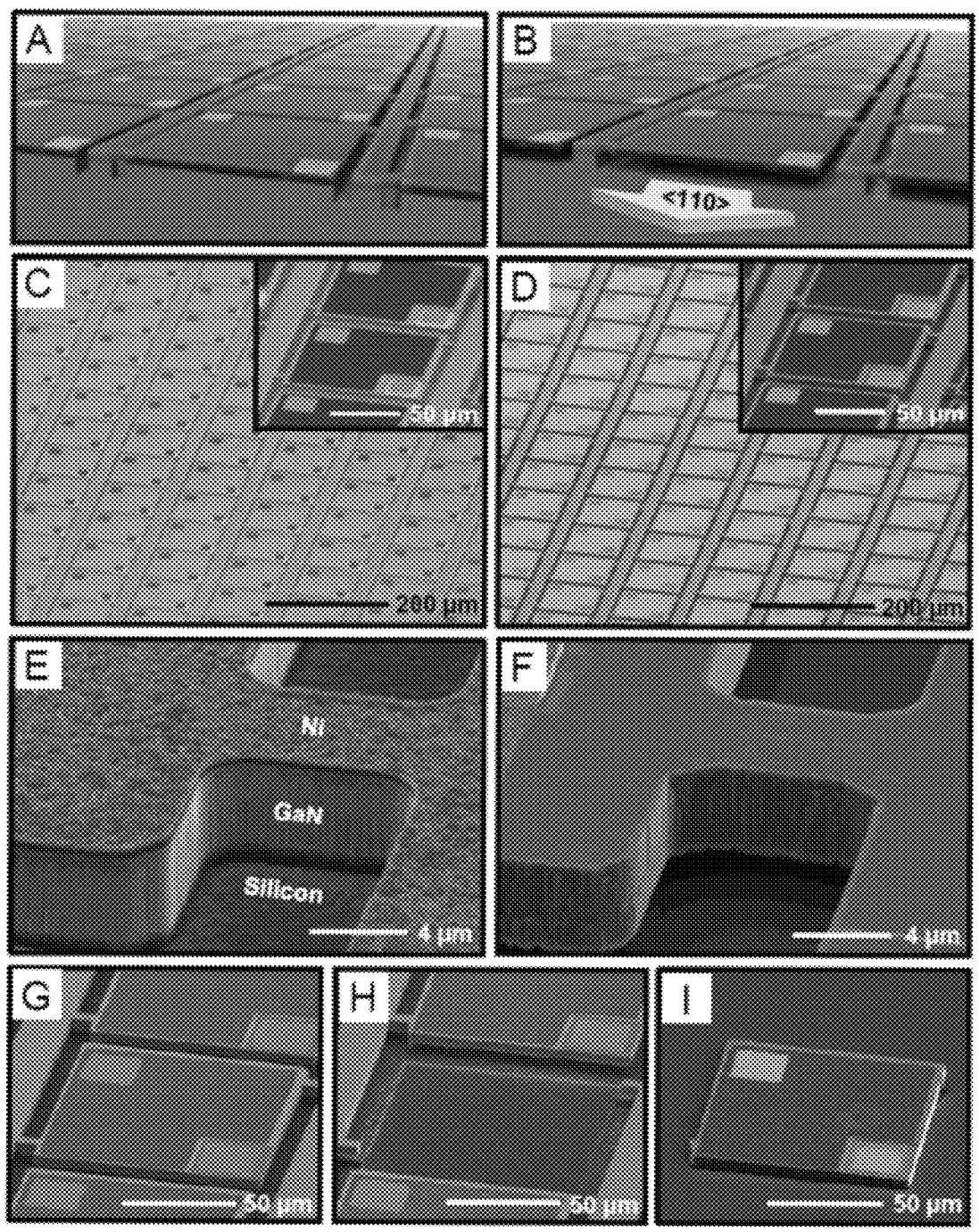
FIG. 2. Schematic illustration of arrays of InGaN µ-ILED arrays (A) before and (B) after anisotropic etching of the near-interfacial region of a supporting Si (111) wafer. The colors correspond to the InGaN (light blue), the contact pads (gold) and a thin current spreading layer (red). SEM images of a dense array of µ-ILEDs on a Si (111) wafer (C) before and (D) after this type of anisotropic etching process. The insets provide magnified views (colorized using a scheme similar to that in A). SEM images of the region of the µ-ILED structure that connects to the underlying silicon wafer (E) before and (F) after etching. Break-away anchors serve as fracture points during retrieval of µ-ILEDs from the Si (111) wafer. SEM images of a representative µ-ILED, shown in sequence, (G) after undercut, (H) after removal from the Si wafer, and (I) after assembly onto a receiving substrate (colorized for ease of viewing).

The procedure for releasing these devices from the underlying substrate exploits the large differences in rates (>100×) for removing planes of Si(110) compared to Si(111) with wet chemical etching baths of potassium hydroxide (KOH) or tetramethylammonium hydroxide (TMAH). To take advantage of this effect, the arrays are configured such that two sides of each device lie perpendicular to <110>. The devices are tightly packed in this direction (i.e. spacing of 10 µm for this example, but with values that can be as small as 2 µm), and somewhat less so in the orthogonal direction (i.e. 40 µm shown here). Immersion in a hot, aqueous solution of KOH rapidly removes silicon along the Si(110) planes exposed by the mesa etch, thereby undercutting the devices without etching into the depth of the silicon wafer. Because the etching proceeds only along <110>, relief structures of silicon remain in the orthogonal (<111>) direction between devices. A pair of small supporting structures (i.e. anchors) of GaN, also defined during the mesa etch, connects each of the devices to the silicon in these regions (i.e. anchor bars), to yield freely suspended configurations after the KOH etching self-terminates on the (111) planes. A graphical illustration and corresponding SEM image appear in FIG. 2B and FIG. 2D, respectively. FIGS. 2E and 2F show magnified views of the anchor regions before and after anisotropic silicon etching. At this stage, the devices can be removed, in a non-destructive, high-speed and parallel operation, using soft stamps and the techniques of transfer printing. In this way, assembly into arrayed layouts on glass, plastic or other classes of substrate can be achieved at room temperature, with throughputs of millions of devices per hour and micron-scale positioning accuracy, in deterministic and adjustable ranges of pitch (FIG. 11) over areas that can be much larger than those defined by the devices on the source wafer. The SEM images of FIGS. 2G-2I show a progression of a representative device from delineation on a donor substrate, to removal and delivery onto a receiving substrate, respectively. The LEDs formed in this manner have emission areas and thicknesses that can be up to 1600× and 100× smaller, respectively than conventional devices (i.e. 1×1 $mm^2$). For these reasons, the devices are referred to herein as microscale inorganic light emitting diodes (µ-ILEDs).

Figure 3:
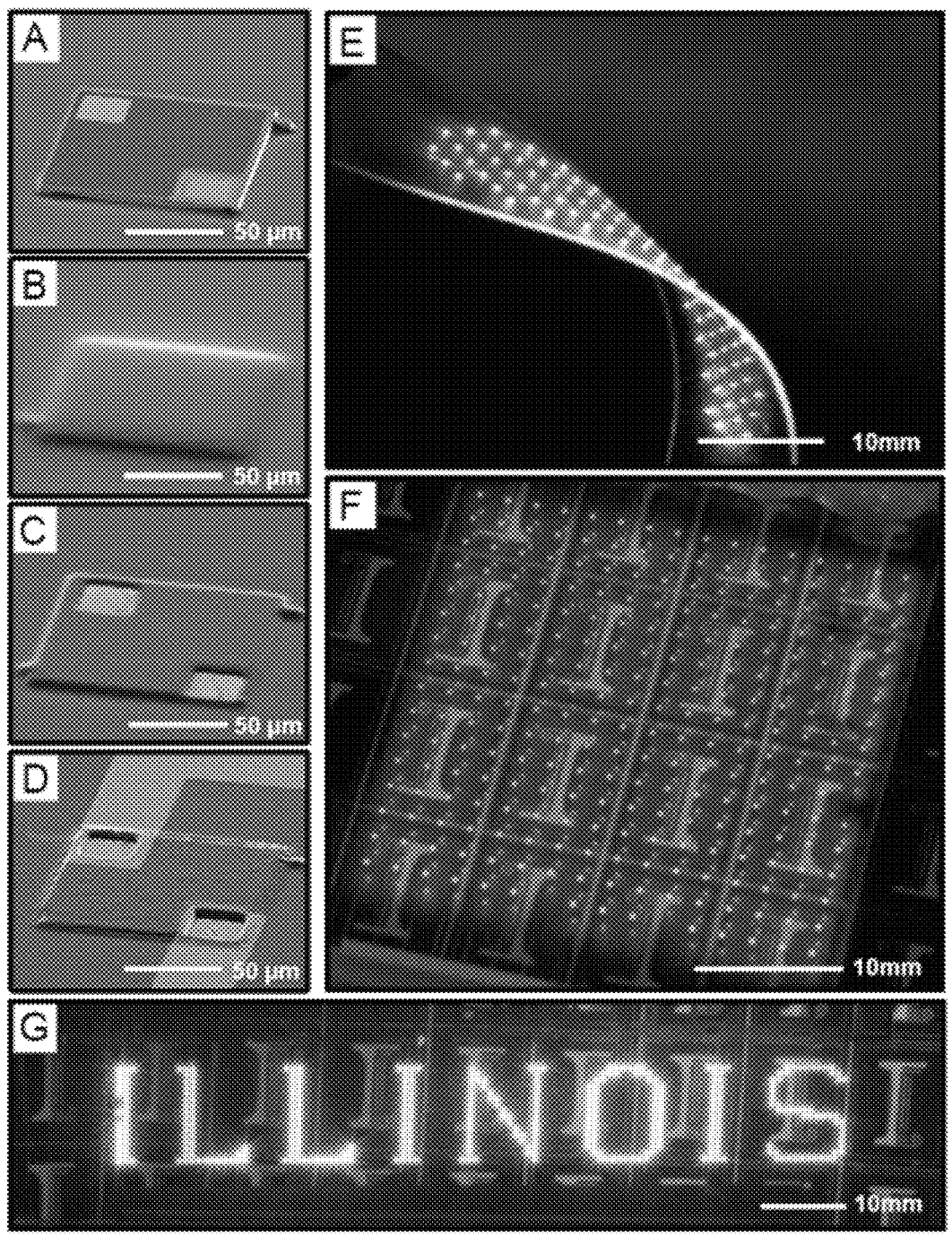
FIG. 3. SEM images of the interconnection process for a representative InGaN µ-ILED, shown in sequence, (A) after assembly onto an optically transparent substrate (e.g. glass or plastic), (B) after spin-coating a photo-sensitive polymer, (C) after self-aligned via formation using a back-side exposure process, and (D) after deposition and patterning of a metallic interconnect layer. The colorized regions correspond to the contact pads (gold), a thin current spreading layer (red) and Al interconnects (green). Optical images of various lighting modules based on arrays of µ-ILEDs (E) plastic and (F,G) glass substrates.
Figure 4:
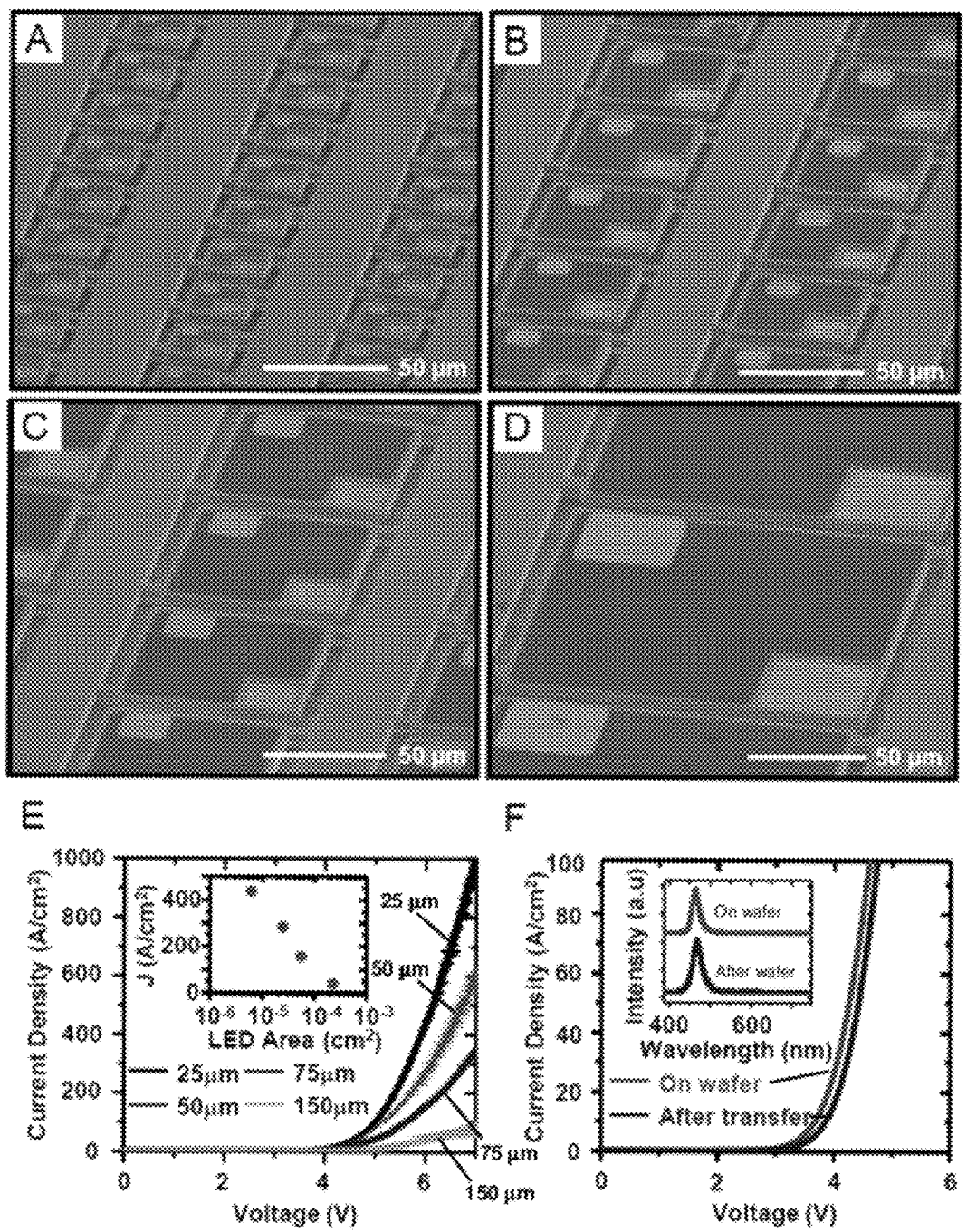
FIG. 4. SEM images of arrays of released InGaN µ-ILEDs with dimensions from (A) 25×25 µm$^2$, (B) 50×50 µm$^2$, (C) 75×75 µm$^2$ to (D) 150×150 µm$^2$. The colorized regions correspond to the contact pads (gold), and thin current spreading layers (red). (E) Corresponding current density-voltage (J-V) characteristics for µ-ILEDs with the dimensions shown in (A). The inset provides a plot of current density as a function of µ-ILED area, measured at 6V. (F) Current density-voltage (J-V) characteristics and emission spectrum (inset) of a representative device before undercut etching on the Si wafer, and after assembly onto a glass substrate.

The small thicknesses of µ-ILEDs make them amenable to interconnect based on thin film metallization, to provide a high-speed, parallel alternative to traditional wire bonds. Practical challenges exist for applications in lighting, however, due to requirements on overlay and registration, especially for large area modules (i.e. troffer-scale). Fortunately, the properties of GaN devices allow a remarkably simple method for accomplishing precise registration, without the need for lithographic alignment or photo-resist processing. In this "back-side exposure" (BSE) technique, both planarization and via formation occur simultaneously in a single-step, self-aligned process. Here, the device structures themselves serve as a mask for photo-induced cross-linking of a polymer overcoat (FIG. 12). FIG. 3A shows an SEM image of a single 100×100 $µm^2$ µ-ILED printed on a glass substrate. Spin-coating a photosensitive polymer (Dow Chemical, Benzocyclobutene (BCB), Cyclotene 4024-40 Resin) fully encapsulates the device (FIG. 3B). H-line radiation incident on the backside of the structure passes through the transparent substrate (e.g. glass or plastic) and the GaN (band gap≈3.4 eV), to flood expose the polymer in all regions except those shadowed by the opaque contact pads, shown in colorized gold in FIG. 3C. Washing away the unexposed regions leaves a pattern of polymer with openings at the contacts, and with positively sloped sidewalls for conformal deposition of interconnect metal (FIG. 3D). Due to the encapsulating nature of the polymer coating, requirements on registration for the interconnects are greatly relaxed compared to those for the contact pads themselves. In particular, the relevant length scale for registration decreases from roughly the size of a contact pad to the size of an entire device. This improvement corresponds to a factor of four for the case considered here with 25×25 $µm^2$ contact pads, but could be as large as a factor of 20 with 5×5 $µm^2$ contact pads. As shown in FIG. 3D, arrays were interconnected with overly wide leads (which easily accommodates small misalignments in the printed location of devices) by edge-over metallization, photolithographic patterning, and subsequent metal etching. This method is amenable to interconnecting large numbers of µ-ILEDs over large area arrays (e.g. 396 µ-ILEDs over ~12 $cm^2$ in FIG. 3G), shown here for arrays integrated on PET (FIG. 3E) and on glass (FIGS. 3F and 3G) substrates, and for exceptionally small devices. As an example of the latter capability, vias of ~4×4 $µm^2$ were easily formed on devices with lateral dimensions as small as 25×25 $µm^2$ (FIG. 12D).

To illustrate the versatility, FIGS. 4A-4D show SEM images of exemplary p-ILEDs with various sizes from (FIG. 4A) 25×25 $µm^2$, (FIG. 4B) 50×50 $µm^2$, (FIG. 4C) 75×75 $µm^2$, and (FIG. 4D) 150×150 $µm^2$. The sizes of the smallest and largest devices are limited by the resolution in device processing (i.e. lithography and mesa etching) and by degradation of etch-resist layers during silicon etching, respectively. The current density-voltage (J-V) characteristics of these µ-ILEDs show a noticeable increase in J as the size of µ-ILEDs decreases (FIG. 4E). This behavior might be attributed to superior current spreading in small devices. The properties are unaltered by the processing, as shown in FIG. 4F. The small, thin geometries also provide enhanced mechanical bendability (FIG. 13) and dramatically improved rates for passive thermal spreading. Both of these qualities facilitate integration with flexible sheets of plastic, as shown in FIG. 3E. Details related to the bending mechanics appear below; the thermal properties represent a focus discussed shortly below.

Figure 5:
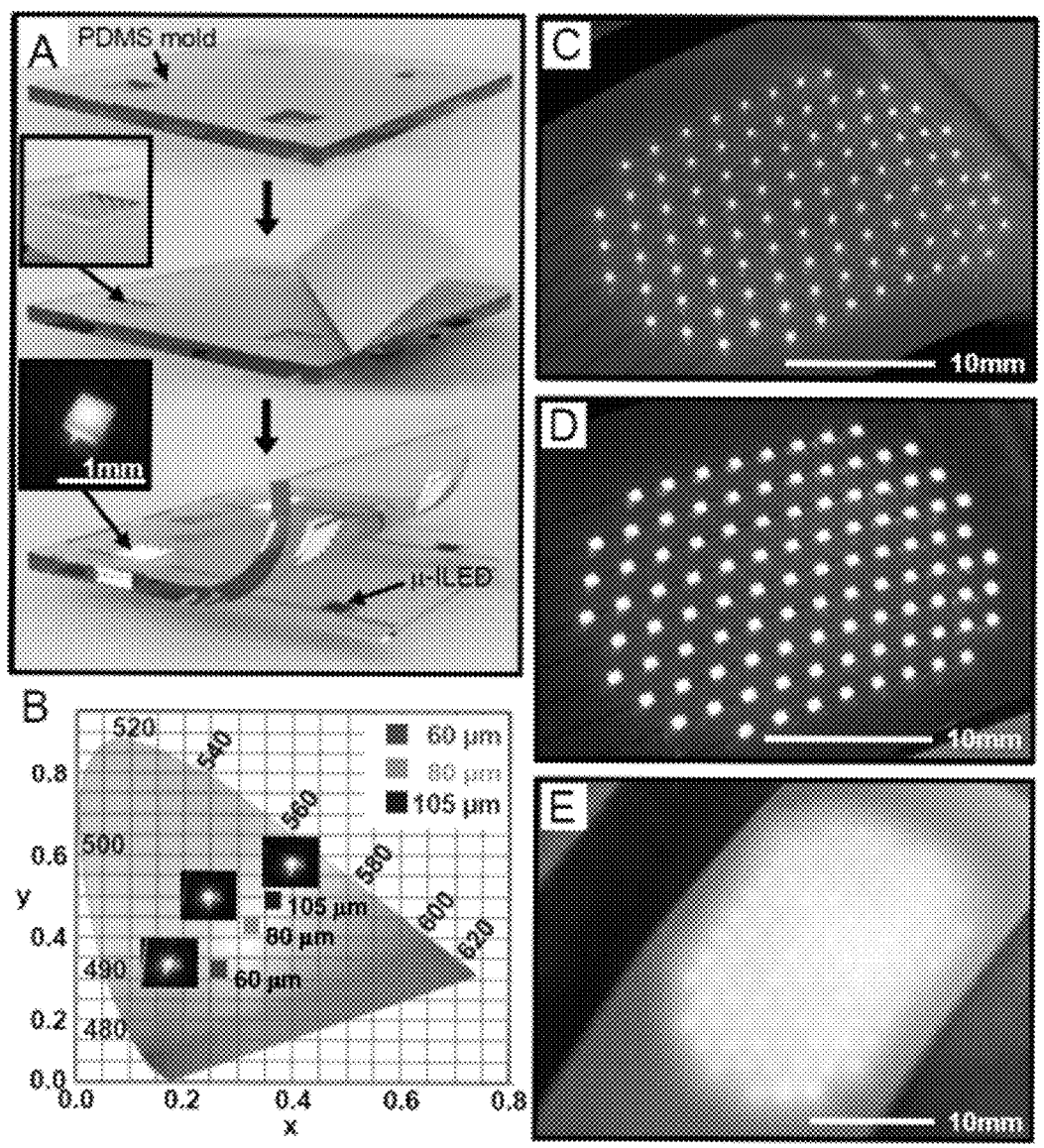
FIG. 5. (A) Schematic illustration of the process for fabricating flexible, white lighting modules, achieved by integrating patterned, encapsulated tiles of YAG:Ce phosphor-containing islands with arrays of InGaN µ-ILEDs. (B)

To demonstrate integrated sources of white light that exploit these unique capabilities, schemes were developed for integrating phosphors, patterned into small tiles, with arrays of µ-ILEDs and thin film optical diffusers. As an example, a flexible lighting device that incorporates an amount of active material equal to that of a single, conventional 1×1 $mm^2$ LED, but spread sparsely across an area of ~300 $mm^2$ at an areal coverage corresponding to ~0.3%, was built to optimize the thermal and optical properties (FIG. 5 and FIG. 14). The process for constructing these systems follows two parallel routes: (i), μ-ILED fabrication, array assembly and interconnection as shown in FIG. 8 using a thin, PET substrate similar to the one in FIG. 3, but with interconnects patterned such that 90% of each device is covered by reflective metal (Ti:3 nm/Al:500 nm), and the remaining 10% comprises the separation of leads to the p- and n-contacts; and, (ii), generation of a separate, patterned array of phosphor tiles matching the spatial geometry of the printed devices, on a soft, flexible sheet of the elastomer poly(dimethylsiloxane) (PDMS). The design of this second sub-module allows the use of phosphor only where required, i.e. directly above each of the μ-ILEDs in the array. A schematic representation of the processing steps appears in FIG. 5A. The substrate consists of a thin sheet of PDMS embossed with an array of square wells of relief. A slurry incorporating a cerium-doped yttrium aluminum garnet phosphor (Internatix, NYAG-1) in an uncured PDMS matrix uniformly disperses the phosphor particles (FIG. 15), in a manner that allows their delivery to the wells using a doctor blade. Thermally curing the slurry completes this part of the fabrication process. Soft contact lamination against a patterned, interconnected array of μ-ILEDs yields white light output, with chromaticity that can be tuned by controlling the well depth using slurries at a constant phosphor-in-PDMS weight loading (37.35 wt %). Chromaticity data at different phosphor thicknesses appear in a CIE 1931 color space diagram in FIG. 5B. As expected, the chromaticity follows an approximately linear path between the limits of the blue emission of the μ-ILED and yellow emission of the phosphor, with increasing thickness. For this PDMS-phosphor composition CIE coordinates of x=0.321 and y=0.376 with a phosphor thickness of 80 μm were obtained.

The LED component of the system consists of 100 μ-ILEDs, each 100×100 μm², in a hexagonal array, printed with an inter-device spacing of 2 mm, set to exceed the characteristic thermal diffusion length in this system. FIGS. 5C and 5D show images of the array before and after lamination against a sheet of patterned phosphor, respectively. (In this layout, the PET substrate provides a spacer between the μ-ILEDs and the phosphor tiles.) To complete the fabrication, a thin plastic diffuser film laminates onto the array to achieve diffuse, larger area emission, as in FIG. 5E. This sparse array of printed μ-ILEDs provides an effective illuminated area >100 times larger than the area of a traditional LED die, in a way that uses the same amount of InGaN in a configuration that has strong optical and thermal benefits.

The thermal benefits of the type of layout in FIG. 5 are critically important, due to the adverse effects of excessive heating that can occur in devices with conventional sizes (e.g. 1×1 mm²), in the absence of bulk, or miniature, heat sinking structures. Quantitative study shows that for the sparse, μ-ILED designs, the electrical interconnects serve simultaneously as effective heat sinks. This example examines the system using both analytical treatments and rigorous finite element methods (FEM) simulations. For the former, the approximately axi-symmetric nature of the system allows a precise analytical study of the thermal transport properties. FIG. 6A shows the thicknesses H, thermal conductivity k, (the subscripts denote metal interconnect, BCB, μ-ILED, and glass, respectively), and surrounding temperature T. The heat source is modeled as a disk with a radius $r_0$, and total heat generation Q, which is approximately equal to the input power to μ-ILED that does not result in light emission. The temperature distribution is obtained from the steady-state heat transfer governing equation $$\frac{\partial^2 T}{\partial r^2} + \frac{1}{r}\frac{\partial T}{\partial r} + \frac{\partial^2 T}{\partial z^2} = 0$$

in cylindrical coordinates (r, z) (FIG. 6A). The boundary conditions include the free convection $$-k_m \frac{dT}{dz} = h(T - T_\infty)$$

at the top (air-interconnect) surface, and constant temperature $T=T_\infty$ at the bottom (glass) surface, where h is the coefficient of natural convection. The continuity of temperature and heat flux across interconnect-BCB interface requires [T]=0 and $$\left[k\frac{\partial T}{\partial z}\right] = 0,$$

where [ ] stands for the discontinuity between two adjacent layers. The above continuity conditions also hold at other interfaces. Heat generation requires $$\left[k\frac{\partial T}{\partial z}\right] = \frac{Q}{\pi r_0^2}(r \le r_0)$$

across the top and bottom surfaces of a μ-ILED. The interconnect surface temperature is obtained as $$T_{surface}(r) = T_\infty + \frac{Q}{2\pi r_0 k_b} \quad (1)$$

$$\int_0^\infty [C_1(\xi) + C_2(\xi)e^{2\xi H_b}]e^{-\xi(H_b+H_m)}\frac{k_m}{k_m\xi + h}J_1(\xi r_0)J_0(\xi r)d\xi,$$

where $C_1(\xi) = (1 + k_b/k_m)\{[(1 + k_g/k_b) - (1 - k_g/k_b)e^{2\xi(H_L+H_g)}]\beta(\xi) + 1\},$ $C_2(\xi) = (1 - k_b/k_m)\{[(1 - k_g/k_b) - (1 + k_g/k_b)e^{2\xi(H_L+H_g)}]\beta(\xi) - 1\},$ $$\beta(\xi) = \frac{\kappa + 1}{[(1 - k_g/k_b) - (1 + k_g/k_b)\kappa] - },$$

$$[(1 + k_g/k_b) - (1 - k_g/k_b)\kappa]e^{2\xi(H_L+H_g)}$$

$$\kappa = \frac{\left[\left(1 - \frac{k_b}{k_m}\right) - \frac{k_m\xi - h}{k_m\xi + h}\left(1 + \frac{k_b}{k_m}\right)e^{-2\xi H_m}\right]e^{-2\xi H_b}}{\left[\frac{k_m\xi - h}{k_m\xi + h}\left(1 - \frac{k_b}{k_m}\right)e^{-2\xi H_m} - \left(1 + \frac{k_b}{k_m}\right)\right]},$$

with $J_0$ and $J_1$ being the Bessel functions of order 0 and 1, respectively. The operating μ-ILED temperature is given by $$T_{LED} = T_\infty + \frac{2Q}{k_b\pi r_0^2}\int_0^\infty (1 - e^{2\xi(H_L+H_g)})\frac{\beta(\xi)}{\xi^2}J_1^2(\xi r_0)d\xi. \quad (2)$$

This analytical treatment agrees well with full three-dimensional FEM simulations as shown in FIG. 17. The differences between temperatures in Equations (1) and (2) and FEM simulations are less than 3% for μ-ILED sizes from 10 μm to 100 μm with 1000 nm-thick interconnects at a power density 400 W/cm². The coefficient of natural convection is h=25 W/m²/° C. Other conditions in experiments include the surrounding temperature $T_\infty=50°$ C., thickness and thermal conductivity $H_b=1$ μM, $k_b=0.3$ W/m/° C. for BCB; $H_g=800$ μm, $k_g=1.1$ W/m/° C. for glass; $H_L=5$ μm for μ-ILED. The thermal conductivity for Al interconnects is thickness dependent, and is taken as 70 W/m/° C. and 160 W/m/° C. for 300 nm-thick and 1000 nm-thick interconnects, respectively. The radius of disk heat source is $r_0=56$ μm to yield the same area as the square μ-ILED with dimensions of 100×100 μm².

The left and right frames of FIGS. 6B-6G show a set of experiments involving infrared thermal imaging of temperature distributions (QFI Infra-Scope Micro-Thermal Imager) and analytical predictions, respectively. These experiments compare surface temperatures for cases of Al interconnect with thicknesses of 300 nm and 1000 nm (FIGS. 6B-6D for 300 nm and FIGS. 6E-6G for 1000 nm), for input power ranging from 7.8 mW to 43.2 mW (i.e. power density ranging from 78 W/cm² to 432 W/cm²). FIG. 6H presents surface temperatures as a function of power, where analytical model results (lines) agree very well the experimental measurements (symbols) for devices with these two interconnect thicknesses.

The results of FIGS. 6B-6H clearly show pronounced decreases in the temperatures with thicker Al interconnects, thereby demonstrating that the interconnects themselves serve a dual role as efficient heat sinks by accelerating the rates of lateral thermal diffusion. These effects can be attributed predominantly to the significant thermal mass of the interconnects compared to the μ-ILEDs, and to their higher thermal conductivities. By consequence, both the thickness of the interconnects and the size of the devices are important. A theoretical parametric study, summarized in FIG. 6I, shows the surface temperatures at a constant heat flux density of 400 W/cm², as a function of these two variables. Clearly, the temperature can be greatly reduced by decreasing the sizes of the LEDs and by increasing the thicknesses of the interconnects. As a particular example, consider a conventional, macro-size LED (i.e. 1×1 mm²) and an array of 100 μ-ILEDs (i.e. 100×100 μm²) at a spacing of 2 mm on otherwise identical platforms, both at total input power densities of 400 W/cm². The method of superposition is used to determine the temperature of μ-ILED arrays based on the solution for a single LED, i.e., $$T_{array}(r, z) = T_\infty + \sum_i [T_i(r, z) - T_\infty],$$

where $T_i(r,z)$ is the temperature distribution due to ith μ-ILED. The surface temperature distributions for a macro-size LED and μ-ILED array with spacing 2 mm are shown in FIGS. 7A-7B, respectively. The maximum temperature occurs at the center of the array and it decreases as the spacing increases (FIG. 7C). The conventional LED would reach a temperature of over 1000° C., whereas the array of μ-ILEDs would operate at ~100° C. (FIG. 17). In real devices, the conventional LED would be completely destroyed under these conditions, thereby motivating the requirement for advanced heat sinking structures of the type that are presently in use commercially. By contrast, the μ-ILEDs experience temperatures that enable stable operation, without any additional components.

The strategies described in this example incorporate advanced ideas in etching to release thin devices, self-aligned photo-exposures to form metal features that serve simultaneously as electrical interconnect and thermal heat spreaders, and module designs that include thin, patterned phosphors with film diffusers. This collection of procedures, combined with analytical models of heat flow, create new design opportunities in solid state lighting. Although all of these processes were combined to yield integrated systems, each can be implemented separately and matched to existing techniques for certain steps, to add new capabilities to otherwise conventional module designs. For example, the same concepts can be applied to active materials derived from epitaxial growth on sapphire substrates.

Materials and Methods. Fabrication of GaN μ-ILEDs. A GaN/Si(111) wafer (Azzurro Semiconductor) with layers of GaN:Mg (110 nm), five repeats of InGaN/GaN:Si (3 nm:10 nm), GaN:Si (1700 nm), AlN:Si/GaN:Si (1900 nm), GaN (750 nm), and AlN/AlGaN (300 nm) served as the starting material. Spin casting, exposing, and developing a layer of photoresist (AZ5214-E, Clariant; developer, AZ327, Clariant) formed a square array of holes that provided an etch mask for ICP-RIE etching to expose the GaN:Si layer. After removing the resist with acetone, image-reversal photolithography defined another square array of holes, aligned to the first. Immersing the sample in a buffered oxide etchant (BOE) for 2 min, rinsing in deionized (DI) water and immediately loading into an e-beam evaporator enabled deposition of n-type ohmic contact metal (Ti:15 nm/Al:60 nm/Mo:20 nm/Au:100 nm). Rinsing the resist away with acetone and then annealing at 860° C. for 30 sec in $N_2$ ambient completed the formation of the n contacts. Image-reversal photolithography defined another array of holes. Immersing the sample is a solution of hydrochloric acid ($HCl:H_2O=3:1$) for 5 min and immediately loading into an e-beam evaporator enabled deposition of p-type ohmic contact metal (Ni:10 nm/Au:10 nm). Rinsing the resist away with acetone and subsequently annealing at 500° C. for 10 min $N_2:O_2$ (80:20) ambient completed the formation of p contacts. Next, image-reversal photolithography defined another array of holes for deposition of opaque contact pads by e-beam evaporation (Ti:10 nm/Au:120 nm), patterned by lift-off, as with the contact metal. As a resist for KOH attack on ohmic contacts, a 300 nm layer of silicon nitride was deposited by plasma enhanced chemical vapor deposition (PECVD). The geometry of the device array was photo-lithographically defined by patterning a metal etch mask of metal (Ti:50 nm/Ni:450 nm) by lift-off, and then removing the exposed silicon nitride by RIE with $SF_6$. An ICP-RIE step provided the mesa etch, to generate an isolated array of devices. A commercial etchant (Ni Etchant Type TFB, Transene) removed the Ni mask. Anisotropic undercut etching of the silicon was performed by complete immersion in a solution of KOH (PSE-200, Transene) at 100° C. (hot plate temperature). Removing the silicon nitride by RIE completed the fabrication.

Fabrication of Arrays of InGaN μ-ILEDs. Devices were transfer printed from the source wafer to a target substrate. BSE was performed by spin-casting and baking an adhesion layer (AP3000, Dow Chemical, 2000 rpm for 30 sec, 80° C. for 30 sec) and then spin-casting and pre-baking a layer of benzocyclobutene (Cyclotene 4024-40 Resin, 2000 rpm for 60 sec, 80° C. for 2 min). Samples were inverted, placed on a Cr-coated glass slide, exposed under a MJB3 Mask Aligner (Karl Suss), and then developed (DS2100). After curing (210° C. for 60 min $O_2$-free glove box), the sample was exposed to RIE ($O_2:CF_4$ 4:1 mixture) to remove any residual cyclotene. Interconnect metal (Ti/Al in desired thickness)

was sputter deposited and patterned by photolithography and metal etching (Ti-6:1 BOE, Al—Al Etchant Type A (Transene)).

Fabrication of Thin, Flexible White Light Modules. Fabricating supports for the phosphor involved casting and curing PDMS (10:1 mixture of base to curing agent) against a functionalized silicon wafer (trichlorosilane, United Chemical Technologies) with a photodefined set of structures of epoxy (SU-8 50, MicroChem. Corp.) with desired thicknesses. Peeling away the cured PDMS yielded an array of relief features (500×500 µm$^2$) matching the spatial geometry of interconnected µ-ILEDs. Phosphor-containing islands were created by scraping a PDMS-based slurry of phosphor (NYAG-1, Internatix, created by mixing with uncured PDMS) across the PDMS substrate using a doctor-blade type implement consisting of a PDMS-coated razor blade. Thermal curing (70° C. for >3 hr) completed the process. The phosphor mold was manually aligned and laminated to a matching array of µ-ILEDs. The module was completed by bonding an optical diffuser film (AX27425, Anchor Optics) to the phosphor mold.

Characterization of Electrical, Optical, Mechanical, and Thermal Properties. Electrical measurements were performed with a semiconductor parameter analyzer (4155C, Agilent or 2400 Sourcemeter, Keithley). Optical measurements of the emission spectra were performed with a high resolution spectrometer (HR4000, Ocean Optics). Color chromaticity was determined using SpectraSuite (Ocean Optics) with a radiometric calibration source (HL-2000, Mikropack) and an Ocean Optics spectrometer optical fiber in a fixed location ~1 mm above the sample. Bending measurements involved determining the forward voltage needed to produce 10 mA current with the sample mounted on cylindrical tubes with various radii, ranging from 5.9 mm to 65.3 mm. Fatigue measurements were performed by repeatedly bending the specimen from a flat state to the bent state with a bending radius of 5.9 mm. Thermal measurements of the surface temperature of µ-ILEDs were performed using MWIR-based InSb thermal imager (InfraScope, QFI) with the base temperature of 50° C.

Stack Design of InGaN/GaN Multiple Quantum Well (MQW) LED on Si(111) Substrate. FIG. 8 shows a schematic illustration of the epitaxial semiconductor multilayer stack of InGaN MQW LED on a Si(111) wafer. Active layers consist of a Si-doped n-GaN layer with a thickness of 1700 nm, 5 layers of multi-quantum well (MQW) of 3 nm InGaN and 10 nm of Si-doped GaN capped with Mg-doped p-GaN layer with a thickness of 110 nm. This wafer was purchased from Azzurro Semiconductor in Germany.

Fabrication Process of InGaN/GaN MQW µ-ILEDs on Flexible Substrates. FIG. 9 shows a schematic overview of the fabrication process. The process starts with InGaN epitaxial layers grown on a Si (111) wafer, as illustrated in FIG. 8. For photolithography, photo-resist AZ5214 was used as both a positive tone and negative tone resist. The steps for photolithography with this material appear below.

Photolithography Using AZ5214 as a Positive Tone Resist. a. Spin-coat at 4000 rpm for 30 seconds. b. Pre-bake at 110° C. for 60 seconds. c. Exposure dose of 78.5 mJ/cm$^2$ at 365 nm. d. Develop in MIF 327 for 35 seconds. e. Hard bake at 130° C. for 180 seconds. f. O$_2$ descuum for 45 seconds in 250 mTorr, 20 sccm of O$_2$ under 50 W.

Photolithography Using AZ5214 as a Negative Tone Resist (Image Reversal). a. Spin-coat at 5000 rpm for 30 seconds. b. Pre-bake at 110° C. for 60 seconds. c. Exposure dose of 110 mJ/cm$^2$ at 320 nm. d. Post-exposure bake (PEB) at 110° C. for 65 seconds. e. Flood UV exposure of 400 mJ/cm$^2$. f. Develop in MIF 327 for 35 seconds. More negatively sloped sidewalls can be achieved for easy lift-off if developed in MIF327 for longer time (i.e. additional 10~15 seconds). g. O$_2$ descuum for 45 seconds in 250 mTorr, 20 sccm of O$_2$ under 50 W.

N-Ohmic Contact Recession. P-GaN and MQW layers must be etched in the region where n-ohmic contacts are to be formed. First, n-ohmic contact regions are photo-lithographically defined using AZ positive-tone process (see above). Etching the GaN can be achieved using ICP-RIE with BCl$_3$ and Cl$_2$ gases, with pressures of 3 mTorr and temperatures of 25° C. A two-step etching process was employed. The first step consisted of 15 sccm of BCl$_3$ with RF power of 300 W and parallel plate DC voltage of 100 V for 90 seconds. The second step consisted of 15 sccm of Cl$_2$ gas with RF power of 300 W and parallel plate DC voltage of 100 V for an additional 120 seconds. An etch depth of 350 nm to 400 nm can be achieved with this recipe. After the ICP-RIE etching of GaN, the photo-resist (PR) was removed using acetone in an ultrasonic bath for about 120 seconds. The total etching depth was about 350 nm to 400 nm, as measured using profilometry.

N-Ohmic Contact Deposition and Annealing. Image Reversal of AZ5214-E (see above) and lift-off process were used to define n-ohmic contact metal. The native oxide on the surface n-GaN was removed using Buffered Oxide Etchant (BOE) at a 10:1 mixing ratio for 120 seconds prior to metal deposition. (Ti:15 nm)/(Al:60 nm)/(Mo:20 nm)/(Au:100 nm) were evaporated at base pressures of $8 \times 10^{-7}$ Torr as ohmic contacts to the n-GaN. An AG Assoc. Heat-pulse 610 RTP was used for rapid thermal annealing at 860° C. for 30 seconds under N$_2$ environment.

P-Ohmic Contact Deposition and Annealing. Image reversal with AZ5214-E (see above) was used to define the p-ohmic contact regions. Immersion of p-GaN in HCl:DI=3:1 for 5 mins removed the native oxide. Ni (10 nm)/Au (10 nm) layers were deposited in an e-beam evaporator at a base pressure of $<5 \times 10^{-7}$ Torr at a relatively slow rate (approx. 0.5 A/s). After deposition, PR was removed using acetone in an ultrasonic bath for 120 seconds, and then Ni/Au layers were annealed in a furnace at 500° C. for 10 minutes in air (80% N$_2$+20% O$_2$) to improve the ohmic properties. Ohmic contact characteristics are depicted in FIG. 10.

Opaque Contact Pad. Image reversal with AZ5214-E (see above) was used to define the opaque contact pad regions on both p-ohmic contact region and n-ohmic contact region. Opaque contact pads served not only as contact electrodes, but also as mask patterns for the self-aligned passivation process, as illustrated in FIG. 12. As an opaque contact pad, Ti(10 nm)/Au(120 nm) was deposited using an e-beam evaporator. After deposition, PR was removed using acetone in an ultrasonic bath for 120 seconds.

SiN Passivation Layer Deposition Condition. SiN, which served as an etch barrier during the KOH undercut process, was deposited using an STS Multiplex PECVD system. 300 nm of SiN film was deposited at a pressure of 650 mTorr, temperature of 300° C., and gas flow rates of 1960 sccm (N$_2$)+40 sccm (SiH$_4$)+35 sccm (NH$_3$). Mixed frequency RF power of 20 W, with frequencies of 13.56 MHz for 6 seconds and 380 KHz for 2 seconds was used.

Ni Etch Mask Deposition. On top of SiN film, AZ5214-E was used in an image reversal mode (see above) to define the lateral dimensions of the µ-ILEDs and the geometries of the anchors. Ti (50 nm)/Ni (450 nm) was deposited using an e-beam evaporator at relatively high deposition rate of approx. 6 A/sec to minimize the thermal stress caused by the heating inside the chamber. After the deposition, PR was removed using acetone in an ultrasonic bath for 60 seconds.

SiN+GaN Dry Etching. SiN was dry-etched using a parallel plate RIE (Unaxis/Plasma Therm) with 40 sccm of $SF_6$, 35 mTorr pressure, and 100 W RF power, for an etch rate of SiN of ~100 nm/min. Upon the removal of SiN, GaN/InGaN/AlN/AlGaN epi-layers were all etched with a gas combination of $BCl_3/Cl_2/Ar$ in inductively coupled plasma reactive ion etching (ICP-RIE, Plasma Therm SLR770). Two etching steps were incorporated in etching GaN/AlN based epitaxial layers, as in the following.

GaN Etching Step 1 in ICP-RIE. A. Pressure: 5 mTorr. B. Temperature: 25° C. C. Gas: 10 sccm of $BCl_3$+16 sccm of $Cl_2$+4 sccm of Ar. D. ICP coil power of 500 W and parallel plate voltage of 300 V. E. Etching time: 1 minute.

GaN Etching Step 2 in ICP-RIE. A. Pressure: 5 mTorr. B. Temperature of 25° C. C. Gas: 20 sccm of $Cl_2$+4 sccm of Ar. D. ICP coil RF power of 500 W and parallel plate voltage of 260 V. E. Etching time: 8 additional minutes.

Anisotropic Etching of Silicon Using KOH (Transene PSE-200). A. Hot plate temperature: 100° C. B. Etching time: 45 minutes for a 100×100 μm² device.

Ti/Ni, SiN removal. A. Ni etchant: (Transene TFB). B. Etch rate: 3 nm/sec at 25° C. C. SiN is dry etched using conditions described above.

Transfer-Printing. Transfer-printing of μ-ILEDs was carried out onto either glass or PET substrates. Glass substrates were prepared by cleaving a slide into appropriate dimensions. PET substrates were prepared by spinning uncured PDMS (10:1 mixture of base to curing agent) on a glass slide cleaved to appropriate dimensions at 2000 rpm for 30 seconds. The PET film (Dura-Lar, Grafix) was laminated to the uncured PDMS and the entire substrate was cured at 70° C. for 3 hours. A thin-film adhesive was spin-coated onto the secondary substrate after $O_2$ plasma (see above) at 3000 rpm for 30 seconds and soft-baked at 110° C. for 10 min. Transfer printing of μ-ILEDs was carried out in an automated printer system using PDMS as a stamp. Step and repeat printing allowed formation of arrays with arbitrary configurations. The thin-film adhesive was cured under UV light for 10 minutes.

Self-Aligned Passivation by Back-Side Exposure (BSE). A. Adhesion promoter (AP3000) is spin-coated at 2000 rpm for 30 seconds. B. Soft-baking at 80° C. for 30 seconds. C. BCB (Cyclotene 4024-40, Dow) is spin-coated at 2000 rpm for 60 seconds. D. Pre-baking at 80° C. for 120 seconds. E. Flood exposure dose from the back side of 123 mJ/cm² at 405 nm. F. Post-exposure baking (PEB) at 70° C. for 30 seconds. G. Develop in DS2100 for 70 seconds. H. Curing of BCB is carried out in oxygen-free environment at 210° C. for 60 minutes. I. Descuum process using RIE at the pressure of 200 mTorr with 18 sccm of $O_2$ with 2 sccm of $CF_4$ with 150 W RF power for 30 seconds.

Metallization. Sputtered or e-beam evaporated Al was used for reflective interconnection. Aluminum was deposited and patterned photo-lithographically using AZ5214 and an etch-back process (Type A, Transene). Fully interconnected arrays of p-ILED resulted from this metallization process.

Ohmic Contact Characterization of Ni/Au Layers to p-GaN. FIG. 10 illustrates the ohmic contact characteristics of Ni (10 nm)/Au (10 nm) to p-GaN. FIG. 10A shows the current-voltage characteristics of Ni/Au contact to p-GaN with TLM pad spacings of 21 μm in three different annealing conditions (i.e. as deposited, 5 minutes annealing, 10 minutes annealing, and 15 minutes annealing). FIG. 10B shows a plot of total resistance at four different pad spacings ranging from 2.5 μm to 17 μm. The specific contact resistance could not be extracted due to the large sheet resistance associated with the highly resistive p-GaN. It is, however, qualitatively shown that 10 minutes annealing at 500° C. exhibits better ohmic characteristics than 15 minutes or 5 minutes annealing at the same temperature.

Versatility of Transfer-Printing Process. The versatility of the transfer printing process is shown in FIG. 11 via corresponding SEM images of (a) after KOH undercut and (b) after transfer printing. In FIG. 11C, μ-ILEDs are transfer printed onto a glass substrate with varying pitches ranging from 25 μm to 500 μm.

Schematic for Passivation and Via Formation Using Back-side Exposure (BSE) Process. In FIG. 12A, a schematic illustration of an unusual passivation scheme using a Back-Side Exposure (BSE) process is shown. The self-aligned passivation starts with a transparent substrate such as a glass or a plastic. A transfer-printed μ-ILED exhibits transparency in wavelengths above its band-gap. First, a photosensitive polymer with a significant sensitivity (absorption) in the wavelength regime higher than the corresponding wavelength of the band-gap of GaN (~365 nm) is applied (e.g. by spin-coating) on the surface of printed μ-ILEDs. The polymer can effectively be cross-linked by the irradiation through the GaN and the substrate. The opaque contact pads serve as a masking layer. Corresponding SEM images of μ-ILEDs are shown in FIGS. 12B and 12C with a 100×100 μm² device and in FIG. 12D with a 25×25 μm² device after the BSE process. Cross-sectional profiles of a passivated μ-ILED (acquired using profilometry) are shown in FIG. 12E. This process naturally generates vias with positive sidewalls.

Uniformity in Electrical Properties of μ-ILED on Mechanical Deformation. FIGS. 13A and 13B show electrical properties (I-V characteristics and forward voltage at 10 mA of current) for representative μ-ILEDs printed on a PET substrate measured for varying bending radii and repetitive cycles. These I-V data demonstrate that the μ-ILEDs do not change in an appreciable way to bending radii down to ~5.9 mm and up to 1000 bending cycles. For this specific substrate configuration, these results indicate robust operation of the devices to strains up to 0.18%.

Uniformity in Electrical Properties of μ-LED in an Array. Current-voltage characteristics of 100 μ-ILEDs from an array, shown in FIG. 14A, exhibit excellent uniformity. For example, less than 100 mV difference in the forward voltage is shown at 3 mA current. An array consists of 100 μ-ILEDs in a hexagonal arrangement (e.g. equal spacing between all μ-ILEDs) are shown in FIG. 14B.

Integration YAG:Ce Phosphors with μ-ILED in an Array. Phosphors must be dispersed uniformly to generate uniform white light. FIG. 15A shows optical microscope images of relief features filled with a PDMS/phosphor slurry (left column) and filled with the phosphor powder only (right column). Compared to the "dry filling" method, the PDMS/phosphor slurry provides excellent dispersion and uniformity of phosphor in the PDMS matrix. Emission spectra of white μ-ILEDs are shown in FIG. 15B with phosphor layer thicknesses of 60 μm, 80 μm, and 105 μm.

Fabricating SU-8 Mold for Phosphor-Containing Island Mold. A. Spin coat SU-8 5 on Si(100) wafer 1800 rpm for 30 sec. B. Bake at 95° C. for 5 min. C. Flood exposure dose of 216 mJ/cm² at 365 nm. D. Spin SU-8 50 and expose: a. For 60 μm film: Spin 1800 rpm for 30 sec, Exposure dose of 432 mJ/cm² at 365 nm; b. For 80 μm film: 1600 rpm for 30 sec, Exposure dose of 513 mJ/cm² at 365 nm; c. For 105 μm film: 1250 rpm for 30 sec, Exposure dose of 583 mJ/cm² at 365 nm. E. Bake at 65° C. for 1 min then ramp to 95° C., total bake time 11 min. F. Develop in SU-8 Developer 12 min. G. Bake 180° C. for 10 min. H. UVO treatment for 2 min. I. Treat with tridecafluoro-1,1,2,2-tetrahydrooctyl trichlorosilane for 2 hr in air-tight container.

Creating White Light, μ-ILED. A. Cast 10:1 mixture (base to curing agent) of uncured PDMS over SU-8 master. B. Cure at 70° C. for 3 hrs. C. Create phosphor/PDMS slurry: Mix 37.35 wt % phosphor in 10:1 PDMS with glass stir rod. D. Drip small amount of slurry on PDMS mold. E. With PDMS-coated razor blade, squeegee slurry into relief features of PDMS mold. F. Repeat in orthogonal direction. G. Cure at 70° C. for 3 hrs. H. Phosphor-containing island mold is manually aligned to the back side of a functioning μ-ILED array.

Analytical Model of Printed μ-ILED on a Glass Substrate. Basic Equations. A half space with built-in disk heat source is used to model the present problem. The cylindrical coordinate system is set such that the origin is coincident with the center of the heat source. The steady-state axisymmetric heat conduction in cylindrical coordinates is $$\frac{\partial^2 T}{\partial r^2} + \frac{1}{r}\frac{\partial T}{\partial r} + \frac{\partial^2 T}{\partial z^2} = 0, \quad (3)$$

Setting $\theta = T - T_\infty$, where $T_\infty$ is the remote temperature, the above equation is equivalent to $$\frac{\partial^2 \theta}{\partial r^2} + \frac{1}{r}\frac{\partial \theta}{\partial r} + \frac{\partial^2 \theta}{\partial z^2} = 0, \quad (4)$$

Boundary and continuity conditions are as follows:
(Boundary Condition 1) $z=-H_g-H_L=h_1$ (Glass bottom surface):

$$\theta_g|_{z=h_1} = 0 \quad (BC1)$$

(Boundary Condition 2) $z=0$ (BCB-glass interface):
Downward heat flux $$-k_b \frac{\partial \theta_b}{\partial z}\bigg|_{z=0} = G_1(r) = \begin{cases} -q_1, & 0 \leq r \leq r_0 \\ q_{0,int}, & r > r_0 \end{cases} \quad (a)$$

Upward heat flux $$-k_g \frac{\partial \theta_g}{\partial z}\bigg|_{z=0} = G_2(r) = \begin{cases} q_2, & 0 \leq r \leq r_0 \\ q_{b,int}, & r > r_0 \end{cases} \quad (b)$$

Here the heat flux satisfy the following conditions:

$$q_1 \pi r_0^2 + q_2 \pi r_0^2 = Q, \quad (c)$$

$$\theta_g|_{z=0} = \theta_b|_{z=0}, \left[-k_b \frac{\partial \theta_b}{\partial z}\right]_{z=0, r \geq r_0} = \left[-k_g \frac{\partial \theta_g}{\partial z}\right]_{z=0, r \geq r_0} \quad (BC2)$$

where $k_g$ and $k_b$ are the thermal conductivities of glass and BCB, $r_0$ is the equivalent radius of LED and Q is the total heat generated in the LED.

(Boundary Condition 3) $z=H_b=h_2$ (BCB-interconnect interface):

$$\theta_b|_{z=h_2} = \theta_m|_{z=h_2}, -k_b \frac{\partial \theta_b}{\partial z}\bigg|_{z=h_2} = -k_m \frac{\partial \theta_m}{\partial z}\bigg|_{z=h_2} \quad (BC3)$$

where $k_m$ is the thermal conductivity of metal interconnect.
(Boundary Condition 4) $z=H_b+H_m=h_3$ (Interconnect-air interface):

$$-k_m \frac{d\theta_m}{dz}\bigg|_{z=h_3} = h\theta_m\bigg|_{z=h_3} \quad (BC4)$$

where h is the coefficient of convection at the lower surface of a plate.

Solution. Equation (3) is solved via the Hankel transform, for which the following transform pair of the first kind is used, $$\phi(r,z) = \int_0^\infty \bar{\phi}(\xi,z) J_0(\xi r) \xi d\xi$$

$$\bar{\phi}(\xi,z) = \int_0^\infty \phi(r,z) J_0(\xi r) r dr \quad (5a,b)$$

where $\phi(r, z)$ is the original function and $\bar{\phi}(\xi, z)$ is the transform.

The Hankel transform of (4) is $$\frac{d^2 \bar{\theta}}{dz^2} - \xi^2 \bar{\theta} = 0 \quad (6)$$

for which the solution is obtained as $$\bar{\theta} = Ae^{-\xi z} + Be^{\xi z}, \quad (7)$$

and the heat flux is $$-k\frac{\partial \bar{\theta}}{\partial z} = k\xi(Ae^{-\xi z} - Be^{\xi z}) \quad (8)$$

where A and B are two unknown functions to be determined according to boundary and continuity conditions. The temperature and heat flux are obtained as $$\theta = \int_0^\infty (Ae^{-\xi z} + Be^{\xi z}) J_0(\xi r) \xi d\xi \quad (9)$$

$$q_z = -k\frac{\partial \theta}{\partial z} = \int_0^\infty k\xi(Ae^{-\xi z} - Be^{\xi z}) J_0(\xi r) \xi d\xi \quad (10)$$

The boundary and continuity conditions can also be expressed in Hankel transform. Using (5-8), the two unknowns A and B for each layer can be solved. For glass, $$A_g = \frac{1}{\beta_1 - \beta_2 e^{-2\xi h_1}} \frac{(\kappa_C + 1)}{k_b \xi} \frac{Q}{\pi r_0} \frac{J_1(\xi r_0)}{\xi} \quad (11)$$

$$B_g = -A_g e^{-2\xi h_1}.$$

For BCB, $$A_b = \frac{1}{2}\left(1 + \frac{k_g}{k_b}\right)A_g + \frac{1}{2}\left(1 - \frac{k_g}{k_b}\right)B_g + \frac{1}{2k_b\xi}\frac{Q}{\pi r_0}\frac{J_1(\xi r_0)}{\xi} \quad (12)$$

$$B_b = \frac{1}{2}\left(1 - \frac{k_g}{k_b}\right)A_g + \frac{1}{2}\left(1 + \frac{k_g}{k_b}\right)B_g - \frac{1}{2k_b\xi}\frac{Q}{\pi r_0}\frac{J_1(\xi r_0)}{\xi}.$$

For interconnect, $$A_m = \frac{1}{2}\left[\left(1 + \frac{k_b}{k_m}\right)A_b e^{-2\xi h_2} + \left(1 - \frac{k_b}{k_m}\right)B_b e^{2\xi h_2}\right] \quad (13)$$

$$B_m = \frac{1}{2}\left[\left(1 - \frac{k_b}{k_m}\right)A_b e^{-2\xi h_2} + \left(1 + \frac{k_b}{k_m}\right)B_b\right].$$

where $$\beta_1 = \left(1 - \frac{k_g}{k_b}\right) - \left(1 + \frac{k_g}{k_b}\right)\kappa_C, \beta_2 = \left(1 + \frac{k_g}{k_b}\right) - \left(1 - \frac{k_g}{k_b}\right)\kappa_C$$

$$\kappa_C = \frac{\left(1 - \frac{k_b}{k_m}\right)e^{-2\xi h_3} - \frac{k_m\xi - h}{k_m\xi + h}e^{-2\xi h_3}\left(1 + \frac{k_b}{k_m}\right)}{\frac{k_m\xi - h}{k_m\xi + h}e^{-2\xi h_3}\left(1 - \frac{k_b}{k_m}\right)e^{2\xi h_3} - \left(1 + \frac{k_b}{k_m}\right)}.$$

The temperature in each layer can be obtained by Eq. (9). For example, the temperature in interconnect is given by $$T_m(r,z) = T^\infty + \int_0^\infty (A_m e^{-\xi z} + B_m e^{\xi z})J_0(\xi r)\xi d\xi \quad (14)$$

The interconnect surface temperature is then obtained by setting $z = h_3$. The LED temperature can be approximated by its average value over the entire active region as $$T_{LED} = T_\infty + \frac{2}{r_0}\int_0^\infty (1 - e^{-2\xi h_1})A_g J_1(\xi r_0)\,d\xi. \quad (15)$$

The thermal conductivity of Al decreases as the film thickness decreases as shown in FIG. 16. For the model described here, the thermal conductivity of Al is used as a fitting parameter, but with constraints to approximate literature values. In the case of 300 nm and 1000 nm Al interconnects, the thermal conductivities of 70 W/m/k and 160 W/m/k, respectively, are used in the model. These values were compared with reported values to make sure they are within the reasonable range as depicted in FIG. 16.

Finite Element Model to Determine the Temperature Distribution. A 3D finite element model is established to study the temperature distribution in the LED system and validate the analytical model. Eight-node, hexahedral brick elements in the finite element software ABAQUS are used to discretize the geometry. A volume heat source is applied on the LED. The thermal convection boundary is applied at the air-interconnect interface and a constant temperature is applied at the bottom of the glass substrate. For LED arrays, a ¼ unit cell is used to take advantage of symmetry and periodic boundaries are applied. The finite element simulations agree well with analytical modeling as shown in FIG. 17.

Experimental Setup for Measuring the LED Temperature. The printed μ-ILED is placed on a heated chuck with a base temperature of 50° C., and pixel-by-pixel calibration is performed to yield a reference irradiance image of an unpowered sample in order to account for the emissivity differences on the sample surface. In some cases, however, when the material has emissivity <0.1, such as Al, temperature measurement could be inaccurate due to very low thermal emission. A surface ink or polymer that emits as a blackbody can be placed on top of the sample and to eliminate variation in emissivity. This procedure was not used because of the destructive nature of this material to electrical devices. As a result, quantitative values were extracted for the temperature only at the open areas between Al interconnects.

References

Tsao J Y, Coltrin M E, Crawford M H, & Simmons J A (2010) Solid-state lighting: An integrated human factors, technology, and economic perspective. P IEEE 98:1162-1179.

Schubert E F & Kim J K (2005) Solid-state light sources getting smart. Science 308:1274-1278.

Chen G, et al. (2008) Performance of high-power III-nitride light emitting diodes. phys. stat. sol. (a) 205:1086-1092.

Narukawa Y, Ichikawa M, Sanga D, Sano M, & Mukai T (2010) White light emitting diodes with super-high luminous efficacy. J Phys D: Appl Phys 43:354002.

Solid-state lighting research and development: Multi-year program plan, (Energy USDo). available from http://www1.eere.energy.gov/buildings/ssl/techroadmaps.html (2010)

Karlicek Jr. R F (2005) High power LED packaging. CLEO.

Yeh H-J J & Smith J S (1994) Fluidic self-assembly for the integration of GaAs light-emitting diodes on Si substrates. IEEE Photonic Tech L 6:706-708.

Kim D-H, et al. (2008) Materials and noncoplanar mesh designs for integrated circuits with linear elastic responses to extreme mechanical deformations. Proc Natl Acad Sci USA 105:18675-18680.

Park S-I, et al. (2009) Printed assemblies of inorganic light-emitting diodes for deformable and semitransparent displays. Science 325:977-981.

Yoon J, et al. (2008) Ultrathin silicon solar microcells for semitransparent, mechanically flexible and microconcentrator module designs. Nat Mater 7:907-915.

Yoon J, et al. (2010) GaAs photovoltaics and optoelectronics using releasable multilayer epitaxial assemblies. Nature 465:329-334.

Meitl M A, et al. (2006) Transfer printing by kinetic control of adhesion to an elastomeric stamp. Nat Mater 5:33-38.

Lee J, et al. (2011) Growth of high-quality InGaN/GaN LED structures on (111) Si substrates with internal quantum efficiency exceeding 50%. J Cryst Growth 315:263-266.

Kumar V, Zhou L, Selvanathan D, & Adesida I (2002) Thermally-stable low-resistance Ti/Al/Mo/Au multilayer ohmic contacts on n-GaN. J Appl Phys 92:1712-1714.

Baca A J, et al. (2007) Printable single-crystal silicon micro/nanoscale ribbons, platelets and bars generated from bulk wafers. Adv Funct Mater 17:3051-3062.

Bean K E (1978) Anisotropic etching of silicon. IEEE T Electron Dev ED-25:1185-1193.

Kim R-H, et al. (2010) Waterproof AlInGaP optoelectronics on stretchable substrates with applications in biomedicine and robotics. Nat Mater 9:929-937.

Gong Z, et al. (2010) Size-dependent light output, spectral shift, and self-heating of 400 nm InGaN light-emitting diodes. J Appl Phys 107:013103.

Sou Z, Ma E Y, Gleskova H, & Wagner S (1999) Mechanics of rollable and foldable film-on-foil electronics. Appl Phys Lett 74:1177-1179.

Moon S-M & Kwak J S (2009) High-current electro-optical degradation of InGaN/GaN light-emitting diodes fabricated with Ag-based reflectors. J Korean Phys Soc 55:1128-1131.

Arik M & Weaver S (2004) Chip scale thermal management of high brightness LED packages. Proc. of SPIE 5530: 214-223

Senawiratne J, et al. (2008) Junction temperature measurements and thermal modeling of GaInN/GaN quantum well light-emitting diodes. J Electron Mater 37:607-610.

Incropera F P, DeWitt D P, Bergman T L, & Layine A S. (2006) Introduction to heat transfer (Wiley).

Christiaens I, Roelkens G, Mesel K D, Thourhout D V, & Baets R. (2005) Thin-film devices fabricated with benzocyclobutene adhesive wafer bonding. J. Lightwave Technol. 23:517-523.

Lee SM, & Cahill G. (1997) Heat transport in thin dielectric films. J. Appl. Phys. 81:2590-2595.

Bourgoin J-P, Allogho G-G, & Hache A (2010) Thermal conduction in thin films measured by optical surface thermal lensing. J Appl Phys 108:073520.

Schmidt A J, Cheaito R, & Chiesa M (2010) Characterization of thin metal films via frequency-domain thermoreflectance. J Appl Phys 107:024908.

Spina L L, et al. (2006) MEMS test structure for measuring thermal conductivity of thin films. Proc IEEE International Conference on Microelectronic Test Structures Austin, USA:137-142.

Stojanovic N, et al. (2007) Thin-film thermal conductivity measurement using microelectrothermal test structures and finite-element-model-based data analysis. J Microelectromech S 16:1269-1275.

Webb P W. (1991) Thermal imaging of electronic devices with low surface emissivity. Proc. Inst. Electr. Eng. 138: 390-400

Sarua A, et al. (2006) Combined Infrared and Raman temperature measurements on device structures. CS Mantech Conf: 179-182.

EXAMPLE 2

High Efficiency, Microscale GaN Light Emitting Diodes and Their Thermal Properties on Unusual Substrates This Example presents materials and assembly methods that enable efficient, ultrathin (slightly larger than 6 μm) LEDs based on GaN, with lateral dimensions ranging from ~1×1 mm$^2$ to ~25×25 μm$^2$, and their integration onto substrates of unconventional materials, including hydrogels. Quantitative experimental and theoretical studies shows the benefits of thermal management that results from these geometries, for both continuous and pulsed mode operation, the latter of which demonstrates potential for use of these technologies in bio-integrated contexts.

Materials and processing schemes for inorganic light emitting diodes (LEDs) are increasingly important for applications in areas ranging from consumer electronics to energy efficient lighting. Conventional routes to devices involve epitaxial growth of active materials followed by wafer dicing and pick-and-place robotic manipulation into individually packaged components, for interconnection by bulk wire bonding. Recently reported schemes based on advanced methods in epitaxial liftoff and deterministic assembly allow devices with extremely thin geometries, in layouts that can be interconnected by planar metallization and photolithography.[1-6] Alternative, related strategies involve LEDs comprised of vertically aligned arrays of micro or nanowires to offer similar advantages, including the ability to form devices on thin, plastic substratesr[7-8], but also with relaxed constraints on growth conditions. These and other recent advances have the potential to create new engineering opportunities and application possibilities for LED technologies. Even if flexible LEDs are in high demand and have a lot of applications, high efficiency and robust, flexible LEDs and their thermal analysis have not been addressed or only theoretical analysis[1] is reported. Importantly, these LEDs should be utilized in commercial/biomedical applications in the near future.

This Example presents materials and fabrication strategies that enable efficient, ultrathin (slightly larger than 6 μm) LEDs based on GaN, with lateral dimensions ranging from ~1×1 mm$^2$ to ~25×25 μm$^2$, and their integration onto unconventional substrates. The process begins with high quality epitaxial material grown using state-of-the-art techniques on sapphire substrates, but with unusual methods for releasing this material in the form of completed devices suitable for assembly using the techniques of transfer printing. This strategy represents a significant improvement over recently reported[1] routes to similar classes of devices, which rely critically on comparatively low performance active materials grown on silicon. Particular additional points of emphasis in the following are theoretical and experimental aspects of heat dissipation with devices mounted on hydrogels and other 'soft' substrate materials, as models for their integration with organs of the body.

FIG. 18 outlines the growth and processing steps, in a sequence of schematic illustrations, micrographs and images. FIG. 18A shows commercially obtained epitaxial material on sapphire, etched into square islands (100×100 μm$^2$) with L-shaped current spreading layers (Ni: 15 nm/Au 15 nm) and pads in the corners for top p-contacts (upper right; 25×25 μm$^2$; Cr: 15 nm/Au: 300 nm), and recessed n-contacts (lower left; 25×25 μm$^2$; Cr: 15 nm/Au: 300 nm). Details appear in the Methods section and in FIG. 23. Uniform deposition of a thin layer (200 nm) of SiN$_x$ passivates and protects the top surfaces and sidewalls of these structures, as preparation for coating with a bilayer of Cr (adhesion layer: 15 nm)/Pd (150 nm) that facilitates bonding to another substrate (silicon or glass) which supports metallization of Cr (adhesion layer: 15 nm)/Pd (150 nm)/In (900 nm). Bonding at pressures and temperatures of 400 bar and 220° C., respectively, causes the In (melting point ~156° C.; Brinell hardness 8.83 MPa (cf. lead (Pb): 38.3 MPa))[9] to flow and partially fill the recessed n-contacts and the trenches between the devices. A fraction of the In forms an alloy with the Pd,[10-11] to form a solid layer (InPd$_x$) that prevents cracking in the LEDs during subsequent processing, including laser lift off (LLO) as described next.

Passing light from a krypton fluoride (KrF) (0.9 J/cm$^2$, 248 nm wavelength) or yttrium aluminum garnet (YAG): Nd laser (0.3 J/cm$^2$, 266 nm, single pulse with 5 ns exposure time) through the sapphire leads to strong absorption at the interface with the GaN, where thermal decomposition forms Ga metal and nitrogen gas. Pressure associated with this process releases the GaN from the sapphire, in the form of individual microscale inorganic LEDs (μ-ILEDs). Heating to 70° C. (melting point of Ga is 29.7° C.[9]) and applying mild mechanical force enables complete removal of the sapphire, as in FIG. 18B and FIG. 24. Immersing the exposed μ-ILEDs in dilute HCl (5 wt %) etches away the residual Ga, to yield clean surfaces on top. This same etchant removes unalloyed In, leaving only agglomerates of InPd$_x$. This remaining metal is important because it tethers the μ-ILEDs to the underlying substrate, in their transferred locations. The micrograph in FIG. 18C shows a sample after these process steps. The tilted scanning electron microscope (SEM) image in the inset reveals voids and InPd$_x$ agglomerates between a representative μ-ILED and the substrate.

Contacting a bulk slab of poly(dimethylsiloxane) (PDMS) that has an array of vertical pillars (3 μm in diameter, 1.2 μm in height, and 5 μm spacings) embossed on its surface, and then peeling it away retrieves, in a single step, all of the μ-ILEDs from their substrate via separation at the contact points defined by the InPd$_x$, leaving the devices bound by van der Waals forces to the structured surface of the PDMS. Etching the exposed Pd and Cr layers removes all residual metal particles (FIG. 25 shows a Si wafer after removal of all μ-ILEDs) including, by liftoff, any remaining particulates of InPd$_x$. FIG. 18D presents optical micrographs of the results; the inset shows an individual μ-ILED on a structured PDMS slab. (As shown in this image, a fraction of the devices, typically ~10%, undergo some translational and rotational misalignment during the transfer. This aspect of the process can be further minimized through optimized processing, or it can be accommodated in the steps described next.) Techniques of transfer printing are used to remove individual μ-ILEDs, or selected collections of them, from this PDMS slab and then to deliver them to nearly any substrate of interest, where they can be electrically interconnected to yield functional lighting systems using procedures described elsewhere[1]. (see FIG. 26-28) The printed μ-ILEDs on PET or any other transparent substrates were electrically interconnected after passivation by a "back side exposure" method[1] using light sensitive tone resist. In case of a non-transparent, high heat dissipation substrate, like Al foil, the whole device layer including the printed μ-ILED and interconnects is transferred onto a non-transparent substrate (i.e. Al foil) by additional transfer printing. The main focus of work presented here corresponds to systems in which the densely arrayed μ-ILEDs on the structured PDMS are distributed over large areas, in sparse coverages on soft substrates. FIG. 18E (left) shows an interconnected string of 12 μ-ILEDs on a strip (5×40 mm$^2$) of poly(ethylene terephthalate) (PET, 50 μm thick; Grafix® Dura-Lar™ film roll) and a square array of 100 μ-ILEDs on glass (right). Comparisons of performance in μ-ILEDs on sapphire and on PET (50 μm thick) (FIG. 19 A-D) reveal nearly identical behaviors at low power. At high power, the μ-ILEDs on sapphire show a slight blue-shift in emission wavelength (from 447 nm at 1 mA to 445.2 nm at 10 mA), consistent with charge accumulation that results from band filling effects described previously[12-13] By contrast, μ-ILEDs on PET exhibit red-shift (from 447.3 nm at 1 mA to 451.7 nm at 10 mA) due to heating associated with the low thermal conductivity of the PET (compared to the sapphire).[13] (See FIGS. 29 and 30.) FIG. 19 shows a comparison of the μ-ILED properties to a commercialized LED. These properties can be enhanced through optimized processing and use of a high quality wafer stack.

As suggested by previous thermal modeling results, an advantage of μ-ILEDs on plastic substrates is their accelerated rates of passive heat spreading due to favorable size scaling effects in thermal transport.[1] The strategy of FIG. 18 is compatible with a wide range of μ-ILED sizes (much wider than previously possible), in a manner that allows the first quantitative experimental investigations of these effects. FIG. 20A shows examples, from 1×1 mm$^2$, 500×500 μm$^2$, 300×300 μm$^2$, 150×150 μm$^2$, 100×100 μm$^2$, 75×75 μm$^2$, 50×50 μm$^2$ to 25×25 μm$^2$. This size range spans the commercial regime to dimensions limited only by resolution and alignment accuracy set by tools for photolithography used in this work. Even the largest devices show spatially uniform emission across the active regions (FIG. 20B). Studies of size dependent operational characteristics over this available range illustrate clearly the relevant behaviors. FIG. 20C, for example, shows a sharp decrease in operating temperatures of μ-ILEDs on a 50 μm thick PET substrate, at the same power per unit area, with decreasing μ-ILED size. The results are significant reductions in the operating temperatures, and corresponding enhancements in efficiency (FIG. 20C). These improvements can be illustrated in plots of the input and output power densities, shown in FIG. 20D. The overlap of these data at low power densities demonstrates that the beneficial aspects of small device geometries (in the regime studied) are due mostly to thermal effects and not, for example, to increases in optical output coupling efficiency which might also occur. These output power and junction temperature results from LEDs on PET show quite similar trends compared to LEDs on sapphire.[12-13]

This improvement in thermal behavior with decreasing size can be exploited by structuring an LED with conventional dimensions into an array of interconnected μ-ILEDs with sufficient spacing, as suggested theoretically in our recent report[1] FIG. 21 provides detailed experimental evidence of the effects. Here, two device designs are compared (FIG. 21A). The first involves a single, 500×500 μm$^2$HLED; the second is a 5 by 5 array of 100×100 μm$^2$ μ-ILEDs, separated by 200 μm. FIG. 21B and FIG. 32 show heat dissipation results for the first case (red symbols o experimental; black lines—analytical models; black symbols ■ finite element models) at 40 mW of applied power at room temperature. The peak device temperature is ~86° C., with a characteristic lateral decay length of ~200 μm along the PET substrate (~50 μm thick). Separating adjacent μ-ILEDs in the 5×5 array by slightly more than 200 μm can yield significant reductions in peak temperatures. Measurements on arrays with various separations were performed; the results for the peak temperatures appear in FIG. 21C and FIG. 33-36, at applied powers of 20 mW and 40 mW. (The characteristic lateral decay length will be sensitive to many parameters, including the PET thickness, i.e. increasing the thickness increases this length. Some modeling results appear in FIGS. 30-37.)

As with the thickness, the intrinsic thermal properties of the substrate materials have a large effect on heat dissipation, consistent with expectation. FIG. 22 shows results from two dramatically different cases: 700 μm thick Al foil and 2 mm thick hydrogel. The μ-ILED on Al foil reaches only 48° C. at 40 mW of applied power (FIG. 22A and FIG. 38) and it cannot be degraded even after 5 min operation while an identical one on hydrogel reaches 65° C. even at only 5 mW (FIG. 22B and FIG. 39). At 40 mW, this latter case leads to strong degradation of both the device and the substrate even at 5 sec operation, due to the high temperatures that are reached (cf. 232° C. at 30 mW). Nevertheless, as discussed above, small device geometries create opportunities for reliable operation even on such substrates, thereby demonstrating their potential use on or under the skin or integrated with internal tissues of the body. Here, pulsed mode can provide additional benefits, especially in applications of optogenetics, where the biological response can be suppressed with continuous mode operation.[14] The thermal behaviors under pulsed operation are shown in FIG. 22C for an μ-ILED on hydrogel, to simulate biological tissue, for various duty cycles (1, 10, 30, 50, 70, 90 and 100%) at 30 mW peak power. The various duty cycles of 1, 10, 30, 50, 70, 90 and 100% correspond to on and (off) times of 10 μs (990 μs), 100 μs (900 μs), 300 μs (700 μs), 500 μs (500 μs), 700 μs (300 μs), 900 μs (100 μs). As can be seen in simulation results in FIG. 22C (black symbols, ○(minimum)

and ●(maximum temperature)) and right images of FIGS. 22D, 40 and 41, the time dependent behavior of the temperature reflects the pulsed operational mode, with decreases in temperature between pulses, due to thermal diffusion. As the duty cycle decreases, so does the temperature, from 232° C. at 100 (FIG. 40) to 30.3° C. at 1% (FIG. 22D and FIG. 42). For the regimes of operation explored here, reducing the duty cycle of the pulsed mode at short period (less than 1 ms) has similar effects to reducing the average power in a continuous (i.e. non-pulsed) mode (FIG. 43). For example, the temperature of a μ-ILED with 50% duty cycle and 1 ms period at 30 mW is about 128° C. (maximum and minimum of 154° C. and 102° C., respectively), similar to the temperature (125° C.) at 15 mW continuous power. The characteristic times for passive cooling in this case are ~20 ms. (FIG. 22E) The pulsed mode shows promise for achieving challenging requirements in optogenetics, where peak powers must be ~10 mW/mm$^2$ with sustained changes in temperature of less than 1-2° C.[14]

The results reported here demonstrate that state-of-the-art GaN epitaxial materials grown on sapphire substrates can be manipulated in the form of μ-ILEDs, for use in applications that would be difficult or impossible to address with conventional LED technologies.

EXPERIMENTAL SECTION

Delineating μ-ILEDs and Forming Ohmic Contacts on Them. The fabrication began with GaN epitaxially grown on a double-sided polished sapphire wafer (2 inch diameter; Cermet Inc.). The epitaxial layers consisted of undoped GaN (3.8 μm), n-type doped GaN (2 μm), multiple quantum wells (0.14 μm), and p-type doped GaN (0.2 μm). Rinsing with diluted HCl(HCl:DI=1:3) for 5 min removed residual metal ions and oxidized GaN. Sputter deposition (AJA, ATC 2000) formed a bilayer of Ni (15 nm) and Au (15 nm) as a thin p-contact. Wet etching the Au (for 3 s) and Ni (for 2 min) with commercial etchants (Transene) patterned this bilayer into a L-shape for effective current spreading. The sample was annealed in an oxygen and nitrogen atmosphere at 500° C. for 5 min to enhance the contact properties. Next, patterning photoresist near the inner edges of the L-shaped pad and then removing the exposed epitaxial material by chlorine based inductively coupled reactive ion etching (ICP-RIE; PlasmaTherm, SLR-770) formed square (40×40 μm$^2$) recessed regions to open access to the n-type layers at the base. In a single step, contact pads to the n- and p-regions, each 25×25 μm$^2$, were formed by electron beam evaporation (Temescal, FC-1800) of 15 nm of Cr and then 300 nm of Au. A low-stress silicon nitride (200 nm; SiN$_X$) was then formed uniformly over the entire substrate, using plasma enhanced chemical vapor deposition (PECVD; STS, Mesc Multiple). Next, a negative tone photoresist (PR, 7 μm thick; MicroChemicals Inc., AZ nLOF 2070) was patterned by photolithography, to serve as a mask for etching the SiN$_X$ as well as the GaN to define the lateral dimensions of arrays of μ-ILEDs. As a final step, residual PR was removed by immersion in piranha solution (3:1 mixture of surfuric acid with hydrogen peroxide at 90° C.) for 5 min.

Bonding and Laser Lift Off (LLO). After delineating and forming contacts for the μ-ILEDs, another layer of SiN$_X$ (200 nm) was deposited for passivation, as preparation for wafer bonding and transfer. The process used Cr (15 nm)/Pd (150 nm) on the SiN$_X$-coated μ-ILED substrate and Cr (15 nm)/Pd (150 nm)/In (900 nm) on a target silicon wafer. The bonding occurred upon contact with a pressure of 400 bar and heating to 220° C. The LLO used 0.9 J/cm$^2$ from a krypton fluoride (KrF) laser (JSPA, excimer laser with 248 nm wavelength) or 0.3 J/cm$^2$ from yttrium aluminum garnet (YAG) laser (Sandia Nat. Lab, third harmonic of a Q-switched YAG:Nd laser, 266 nm wavelength, single pulse with 5 ns exposure time), directed through the polished bottom surface of the sapphire. Absorption occurred at the GaN-sapphire interface, to cause decomposition of the undoped GaN into nitrogen (N$_2$) and gallium (Ga) metal according to: 2GaN→2Ga (m)+N$_2$ (g). The sample was then heated to 70° C., to melt the Ga. Afterward, the sapphire substrate could be removed easily, to complete the transfer of GaN.

Transfer Printing Individual μ-ILEDs. Immersion in dilute HCl (5% volume ratio) removed the unalloyed In in the vicinity of the bonding layer. The In—Pd alloy was not removed in this etchant, thereby leaving it to serve as distributed tethers (i.e. anchors) to hold the μ-ILEDs to the underlying silicon. Next, the residual Pd and Cr material on the passivated μ-ILEDs was eliminated by Pd and Cr etchant (Transene Inc.), respectively. Contacting a bulk slab of PDMS with an array of vertical pillars (3 μm in diameter, 1.2 μm in height, and 5 μm in space) against the processed substrate and then quickly peeling it back transferred all of the μ-ILEDs to the structured surface of the PDMS. Etching the exposed Pd and Cr layers removed substantially all residual metal. A PDMS stamp with posts (100×100 μm and heights of 100 μm) was positioned above the μ-ILEDs to allow their retrieval and printing to a substrate of interest. The printing was performed using a slightly modified mask aligner (Karl Suss, MJB) or an automated printing machine. The structured PDMS slab is important because it allows the μ-ILEDs to be flipped over for further processing, in a way that provides sufficiently weak adhesion (defined by van der Waals interactions, and contact area) for efficient retrieval by transfer printing.

Interconnect. To form interconnected arrays of μ-ILEDs, or for electrically probing individual devices, the SiN$_X$ layer was first etched away by reactive ion etching (RIE; a mixture of CF$_4$ (40 sccm) and O$_2$ (1.2 sccm); Plasmatherm 790). Coating with an adhesion promoter (Dow, AP3000) and then a layer of photosensitive benzocyclobutene (6 μm thick; BCB) prepared the devices for backside exposure to ultraviolet light, through a transparent substrate. This light exposes the BCB in all regions except those above the opaque n-, and p-contact pads. Developing away the unexposed BCB (Advanced Developer, DS2100) and blowing with a stream of N$_2$ removed the residual developer, to complete the patterning process. After fully curing the BCB in an Ar atmosphere glove box, remaining BCB residue was removed by oxygen RIE. To form metallization lines to the contacts, 15 nm of Cr and 300 nm of Au were sputtered, and then etched using a mask of patterned PR.

Characterization of Electrical, Optical and Thermal Properties. A semiconductor parameter analyzer (4155C, Agilent) was used to measure the electrical properties. Optical measurements of the emission spectra and light output were performed with a spectrometer (HR4000 and FOIS-1 fiber optics integrating sphere, Ocean Optics). Radiant efficiency was simply calculated by $P_{out}/P_{in}$. Thermal measurements were performed using a MWIR-based InDb thermal imager (InfraScope, GFI) with a base temperature of 30° C.

REFERENCES

[1] H.-S. Kim, E. Brueckner, J. Song, Y. Li, S. Kim, C. Lu, J. Sulkin, K. Choquette, Y. Huang, R. G. Nuzzo and J. A. Rogers, *Proc. Natl. Acad. Sci. USA* 2011, 108, 10072.

[2] S.-I. Park, Y. Xiong, R.-H. Kim, P. Elvikis, M. Meitle, D.-H. Kim, J. Wo, J. Yoon, C.-J. Yu, Z. Liu, Y. Huang, K.-c. Hwang, P. Ferreira, X. Li, K. Choqqette, and J. A. Rogers, *Science,* 2009, 325, 977.

[3] X. Hu, P Kull, B. d. Graff, K. Dowling, J. A. Rogers, and W. J. Arora, Adv. Mater. 2011, 23, 2933.

[4] R.-H. Kim, M.-H. Bae, D. G. Kim, H. Cheng, B. H. Kim, D.-H. Kim, M. Li, J. Wu, F. Du, H.-s. Kim, S. Kim, D. Estrada, S. W. Hong, Y. Huang, E. Pop, and J. A. Rogers, *Nano Lett.* 2011, 11. 3881.

[5] R.-H. Kim, D.-H. Kim, J. Xiao, B. H. Kim, S.-I. Park, B. Panilaitis, R. Ghaffari, J. Yao, M. Li, Z. Lui, V. Malyarchuk, D. G. Kim, A.-P. Le, R. G. Nuzzo, D. L. Kaplan, F. G. Omenetto, Y. Huang, Z. Kang, and J. A. Rogers, *Nat. Mater.* 2010, 9, 929.

[6] K. J. Lee, J. Lee, H. Hwang, Z. J. Reitmeier, R. F. Davis, J. A. Rogers, and R. G. Nuzzo, *Small,* 2005, 1, 1164.

[7] K. Chung, C.-H. Lee and G.-C. Yi, Science 2010, 330, 655

[8] C.-H. Lee, Y.-J. Kim, Y. J. Hong, S.-R. Jeon, S. Bae, B. H. Hong, and G.-C. Yi, *Adv Mater.* 2011, 23, 4614.

[9] W. Assmus et al, in *Handbook of Condensed Matter and Materials Data,* (Eds: W. Martinessen and H. Warlimont), Springer, Berlin, Germany 2005, Part 2.))

[10] Scientific group thermodata Europe (SGTE), P. Franke, D. Neuschutz, *Thermodynamics Properties, In—Pd (Indiun-Palladiun),* Vol 19B5: Binary Systems part 5 (Eds: P. Franks, D. Neuschutz), SpringerMaterials, 2007.

[11] (a) W. S. Wong, 1999, Integration of GaN thin films with dissimilar substrate materials by wafer bonding and laser lift-off, PhD thesis, University of California at Berkeley, USA.; (b) W. S. Wong, T. Sands, N. W. Cheung, M. Kneissl, D. P. Bour, P. Mei, L. T. Romano, N. W. Johnson, *Appl. Phys. Lett.* 2000, 77, 2822.

[12] B.-J. Pong, C.-H. Chen, S.-H. Yen, J.-F. Hsu, C.-J Tun, Y.-K. Kuo, C.-H. Kuo and G.-C. Chi, *Solid State Electron.* 2006, 50, 1588.

[13] Z. Gong, S. Jin, Y. Chen, J. Mckendry, D. Massoubre, I. M. Watson, E. Gu and M. D. Dawson, *J. Applied Phys.* 2010, 107, 013103.

[14] M. E. Llewellyn, K. R. Thompson, K. Deisseroth, and S. L. Delp, *Nat. Medicine,* 2010, 16, 1161.

Analytical Model of Printed µ-ILED on a PET Substrate

The approximately axisymmetric nature of the problem allows an analytical study of the thermal transport properties. The LED is modeled as a disk heat source with the total heat generation Q and a radius $r_0 = L\sqrt{\pi}$ such that it yields the same area as a square (L×L) LED. Schematic illustration of the device geometric and thermal parameters used in the model is shown in FIG. 31. The BCB layer encapsulating the entire LED on a PET substrate (thickness $H_p$ and thermal conductivity $k_p$) can be divided into two layers. The top layer (thickness $H_B$ and thermal conductivity $k_B$) is BCB only while the bottom layer (thickness $H_L$ and thermal conductivity $k_L$) includes both BCB and LED.

The temperature distribution T(r, z) at each layer can be obtained from the steady-state heat transfer governing equation $$\frac{\partial^2 T}{\partial r^2} + \frac{1}{r}\frac{\partial T}{\partial r} + \frac{\partial^2 T}{\partial z^2} = 0$$

in cylindrical coordinates (r, z) with the origin coincident with the center of the heat source. The boundary conditions include constant temperature $T = T_\infty$ at the bottom surface ($z = -H_P - H_L$) of PET and natural convection $-k_B \partial T/\partial z = h(T - T_\infty)$ at the top surface ($z = H_B$) of BCB, where h is the coefficient of natural convection. At the interface $z = -H_L$, the temperature and heat flux are continuous, i.e., [T]=0 and $$\left[k\frac{\partial T}{\partial z}\right] = 0,$$

where [ ] stands for the discontinuity between two adjacent layers. At the interface z=0, [T]=0 holds for all r, $$\left[k\frac{\partial T}{\partial z}\right] = 0$$

for $r \geq r_0$, and $$\left[k\frac{\partial T}{\partial z}\right] = \frac{Q}{\pi r_0^2}$$

for $r \leq r_0$. The steady-state heat transfer governing equation can be solved via Hankel transformation. The surface temperature is obtained as $$T_{surface}(r) = T_\infty + \int_0^\infty \frac{2k_B\xi}{k_B\xi + h} A_B e^{-\xi H_B} J_0(\xi r)\xi\, d\xi, \quad (1)$$

where $$A_B = \frac{\kappa_L + 1}{\left(1 - \frac{k_L}{k_B}\right)(\kappa_L - \kappa_B) + \left(1 + \frac{k_L}{k_B}\right)(1 - \kappa_L\kappa_B)} \frac{Q}{k_B\pi r_0\xi^2} J_1(\xi r_0),$$

$$\kappa_B = \frac{k_B\xi - h}{k_B\xi + h} e^{-2\xi H_B},$$

and $$\kappa_L = \frac{\left(1 + \frac{k_P}{k_L}\right)e^{-2\xi H_P} - \left(1 - \frac{k_P}{k_L}\right)}{\left(1 - \frac{k_P}{k_L}\right)e^{-2\xi H_P} - \left(1 + \frac{k_P}{k_L}\right)} e^{-2\xi H_L}.$$

The above temperature holds for $r \geq r_0$. For the temperature within the active region ($r \leq r_0$), it is approximately a constant (See FIG. 21B), which can be approximated by the average value as $$T_{Surface}(r; r \leq r_0) = T_\infty + \frac{2}{r_0}\int_0^\infty \frac{2k_B\xi}{k_B\xi + h} e^{-\xi H_B} J_1(\xi r_0) A_B\, d\xi, \quad (2)$$

The LED temperature is given by $$T_{LED} = T_\infty + \frac{2}{r_0}\int_0^\infty (1 + \kappa_B) J_1(\xi r_0) A_B\, d\xi. \quad (3)$$

FIG. 20C shows surface temperature in Eq. (2) versus the LED size for a power density 16 W/cm², ambient temperature $T_\infty = 30°$ C., coefficient of natural convection h=25

W/m²/K [1], thicknesses $H_P$=75 μm, $H_L$=6.54 μm and $H_B$=0.5 μM, and thermal conductivity $k_P$=0.15 W/m/K [2], $k_L$=1.6 W/m/K, and $k_B$=0.3 W/m/K [3], where $k_L$ is an effective thermal conductivity that accounts for the 3D effect of LED. The analytical results agree well with experiments (FIG. 21C). The temperature profile shown in FIG. 21B also agrees well with experiments and 3D finite element analysis.

The method of superposition is used to determine the temperature of μ-ILED arrays based on the solution for a single LED, i.e., $$T_{array}(r, z) = T_\infty + \sum_i [T_i(r, z) - T_\infty],$$

where $T_i(r, z)$ is the temperature distribution due to the $i^{th}$ μ-ILED. The surface temperature distributions for a single 500×500 μm² μ-ILED and 5 by 5 arrays of 100×100 μm² μ-ILEDs with different separations are shown in FIG. 33-36 at applied powers of 20 mW and 40 mW. The maximum temperature occurs at the center of the array and it decreases with increasing the spacing (FIG. 21C). Once the spacing is larger than the characteristic lateral decay length ~200 μm, the temperature remains unchanged and is equal to that of a single 100×100 μm² μ-ILED.

Finite Element Model to Determine the Temperature Distribution

A 3D finite element model is established using ABAQUS finite element software to obtain the temperature distribution in the LED systems (LED on a PET substrate in FIG. 31, LED on an aluminum substrate in FIG. 38 and LED on a hydrogel substrate in FIG. 39). The geometry is discretized by eight-node, hexahedral brick elements. A volume heat source is applied on the LED. The thermal convection boundary condition is imposed at the air-BCB or air-SU8 interface and a constant temperature is applied at the bottom of the substrate.

The thermal properties for the LED/PET system are given in the previous section. The properties for LED/aluminum and LED/hydrogel include the thermal conductivity, thermal capacity and mass density of 0.2 W/m/K, 1200 J/kg/K and 1190 kg/m³ for SU8 [4,5], 0.52 W/m/K, 1150 J/kg/K and 1430 kg/m³ for PI [6,7], 0.6 W/m/K, 2375 J/kg/K and 1112 kg/m³ for hydrogel [8], and 148 W/m/K, 700 J/kg/K and 2330 kg/m³ for an LED that is approximated by the properties of Si [9]. The thermal conductivity of aluminum and PDMS are 237 W/m/K [10] and 0.15 W/m/K [11], respectively. The comparisons of FEM simulations with experiments for constant power and pulsed power are shown in FIG. 22 and FIG. 40-42.

REFERENCES

[1] F. P. Incropera, D. P. DeWitt, T. L. Bergman, and A. S. Lavine A. S., "Fundamentals of Heat and Mass Transfer", Wiley, Hoboken (2007).
[2] J. G. Speight, "Lange's handbook of chemistry (16 ed.)", McGraw-Hill (2005).
[3] A. Modafe, N. Ghalichechian, M. Powers, M. Khbeis, and R. Ghodssi, Embedded benzocyclobutene in silicon: An integrated fabrication process for electrical and thermal isolation in MEMS, Microelectronic Engineering 82, 154-167 (2005).
[4] B. Solano, S. Rolt and D. Wood, Thermal and mechanical analysis of an SU8 polymeric actuator using infrared thermography, Proc. IMechE 222 Part C: J. Mechanical Engineering Science, 73-86 (2007).
[5] C. G. Mattsson, G. Thungstrom, K. Bertilsson, H. E. Nilsson, and H. Martin, Development of an infrared thermopile detector with a thin self-supporting SU-8 membrane, IEEE SENSORS 2007 Conference, 836-839 (2007).
[6] A. P. Dhorajiya, M. S. Mayeed, G. W. Auner, R. J. Baird, G. M. Newaz, R. Patwa, and H. Herfurth, Finite element thermal/mechanical analysis of transmission laser microjoining of titanium and polyimide, Journal of Engineering Materials and Technology 32, 011004 (2010).
[7] Z. Hu, B. Carlberg, C. Yue, X. Guo, and J. Liu, Modeling of nanostructured polymer-metal composite for thermal interface material applications, 2009 International Conference on Electronic Packaging Technology & High Density Packaging, 481-484 (2009).
[8] N. S. Satarkar, S. A. Meenach, K. W. Anderson, and J. Z. Hilt, Remote actuation of hydrogel nanocomposites: heating analysis, modeling and simulations, AICHE Journal 57, 852-860 (2011).
[9] S. A. Campbell, "The Science and Engineering of Microelectronic Fabrication", Oxford University Press, New York (2001).
[10] J. P. Bourgoin, G. G. Allogho, A. Hache, Thermal conduction in thin films measured by optical surface thermal lensing, Journal of Applied Physics 108, 073520 (2010).
[11] J. E. Mark (ed.), "Polymer Data Handbook", Oxford University Press, New York (1999).

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference here in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, method steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomers and enantiomer of the compound described individually or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

Many of the molecules disclosed herein contain one or more ionizable groups [groups from which a proton can be removed (e.g., —COOH) or added (e.g., amines) or which can be quaternized (e.g., amines)]. All possible ionic forms of such molecules and salts thereof are intended to be included individually in the disclosure herein. With regard to salts of the compounds herein, one of ordinary skill in the art can select from among a wide variety of available counterions those that are appropriate for preparation of salts of this invention for a given application. In specific applications, the selection of a given anion or cation for preparation of a salt may result in increased or decreased solubility of that salt.

Every formulation or combination of components described or exemplified herein can be used to practice the invention, unless otherwise stated.

Whenever a range is given in the specification, for example, a temperature range, a time range, a range of one or more physical dimensions (e.g., length, width, thickness, etc.) or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference here in their entirety to indicate the state of the art as of their publication or filing date and it is intended that this information can be employed herein, if needed, to exclude specific embodiments that are in the prior art. For example, when compositions of matter are claimed, it should be understood that compounds known and available in the art prior to Applicant's invention, including compounds for which an enabling disclosure is provided in the references cited herein, are not intended to be included in the composition of matter claims herein.

Unless defined otherwise, all technical and scientific terms used herein have the same meanings as commonly understood by one of ordinary skill in the art to which this invention belongs. Although any methods and materials similar or equivalent to those described herein can be used in the practice or testing of the present invention, the preferred methods and materials are now described. Nothing herein is to be construed as an admission that the invention is not entitled to antedate such disclosure by virtue of prior invention.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

It must be noted that as used herein and in the appended claims, the singular forms "a", "an", and "the" include plural reference unless the context clearly dictates otherwise. Thus, for example, reference to "a cell" includes a plurality of such cells and equivalents thereof known to those skilled in the art, and so forth. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:
1. An electronic device comprising:
a substrate; and
an array of light emitting diodes (LEDs) supported by said substrate, said array of LEDs comprising:
a plurality of printable LEDs, wherein each LED in said array of LEDs is a unitary structure having one or more lateral dimensions less than or equal to 1000 µm and a thickness dimension less than or equal to 50 µm, and wherein a spacing between adjacent

LEDs in said array of LEDs is greater than or equal to at least one lateral dimension of the adjacent LEDs in said array; and a plurality of electrical interconnects, wherein each LED in said array of LEDs is positioned in electrical communication and thermal communication with at least two of said plurality of electrical interconnects, wherein each of said electrical interconnects physically connects two LEDs and has lateral dimensions and an average thickness large enough such that the electrical interconnects act as a heat sink to provide dissipation of heat from said array of LEDs at a rate greater than or equal to 5 µJ s$^{-1}$ at room temperature.

2. The electronic device of claim 1, wherein said lateral dimensions and said average thickness of said electrical interconnects are large enough to provide heat dissipation from each of said LEDs in said array during operation at a rate selected over the range of 5 µJ s$^{-1}$ to 100 J s$^{-1}$.

3. The electronic device of claim 1, wherein said lateral dimensions and said thickness of said electrical interconnects are large enough to provide a maximum temperature of each of said LEDs in said array less than or equal to 373 K for a power consumption equal to or greater than 5 µW.

4. The electronic device of claim 1, wherein each of said electrical interconnects of said array has an average heat capacity equal to or greater than 7.3×10$^{-11}$ J/K.

5. The electronic device of claim 1, wherein an average thermal conductivity of each of said electrical interconnects is a factor of 0.4 to 50 of an average thermal conductivity of each of said LEDs.

6. The electronic device of claim 1, wherein said array has a density of said LEDs less than or equal to 100 LEDs mm$^{-2}$.

7. The electronic device of claim 1, wherein said array has an average spacing between adjacent LEDs selected over the range of 10 µm to 100 µm.

8. The electronic device of claim 1, wherein each of said LEDs in said array has average lateral dimensions selected over the range of 10 µm to 1 mm.

9. The electronic device of claim 1, wherein each of said LEDs in said array has an average thickness dimension selected over the range of 500 nm to 50 µm.

10. The electronic device of claim 1, wherein each of said electrical interconnects has an average thickness greater than or equal to 10 nm.

11. The electronic device of claim 1, wherein each of said electrical interconnects has lateral dimensions selected over the range of 10 µm to 10 cm.

12. The electronic device of claim 1, wherein each LED independently comprises a single crystalline inorganic semiconductor.

13. The electronic device of claim 1, further comprising an encapsulating layer provided on at least a portion of said array.

14. The electronic device of claim 1, wherein the spacing between adjacent LEDs in said array of LEDs is greater than or equal to 2 µm.

15. A method of making an electronic device, the method comprising the steps of:

providing a substrate;

assembling a plurality of printable LEDs onto said substrate by transfer printing said printable LEDs onto a receiving surface of said substrate, thereby making an array of LEDs, wherein each LED is a unitary structure having one or more lateral dimensions less than or equal to 1000 µm and a thickness dimension less than or equal to 50 µm and wherein a spacing between adjacent LEDs in said array of LEDs is greater than or equal to at least one lateral dimension of the adjacent LEDs in said array of LEDs; and providing a plurality of electrical interconnects to said array of LEDs, wherein each LED in said array of LEDs is positioned in electrical communication and thermal communication with two or more of said plurality of electrical interconnects, wherein each of said electrical interconnects physically connects two LEDs and has lateral dimensions and an average thickness large enough such that the electrical interconnects act as a heat sink to provide dissipation of heat from said array of LEDs at a rate greater than or equal to 5 µJ s$^{-1}$ at room temperature, thereby making said electronic device.

16. The method of claim 15 further comprising providing a polymer encapsulating layer that completely or partially encapsulates said printable LEDs, said electrical interconnects or both.

17. The method of claim 15, wherein the step of assembling a plurality of printable LEDs onto said substrate is achieved using dry contact transfer printing.

18. The method of claim 15, further comprising the steps of:

providing a photosensitive prepolymer layer over said array of LEDs, thereby encapsulating said array of LEDs;

exposing portions of said photosensitive prepolymer layer to electromagnetic radiation, wherein said electromagnetic radiation passes through said substrate and portions of said array of LEDs, thereby forming developed portions and undeveloped portions of said photosensitive prepolymer layer; and removing said undeveloped portions of said photosensitive prepolymer layer, thereby exposing portions of each LED in said array of LEDs.

19. A method of generating electromagnetic radiation, the method comprising the steps of:

providing an electronic device comprising:

a substrate; and an array of light emitting diodes (LEDs) supported by said substrate, said array of LEDs comprising:

a plurality of printable LEDs, wherein each LED in said array of LEDs is a unitary structure having one or more lateral dimensions less than or equal to 1000 µm and a thickness dimension less than or equal to 50 µm, and wherein a spacing between adjacent LEDs in said array of LEDs is greater than or equal to at least one lateral dimension of the adjacent LEDs in said array; and a plurality of electrical interconnects, wherein each LED in said array of LEDs is positioned in electrical communication and thermal communication with at least two of said plurality of electrical interconnects, wherein each of said electrical interconnects physically connects two LEDs and has lateral dimensions and an average thickness large enough such that the electrical interconnects act as a heat sink to provide dissipation of heat from said array of LEDs at a rate greater than or equal to 5 µJ s$^{-1}$ at room temperature; and providing a voltage across two or more of said plurality of electrical interconnects, thereby generating electromagnetic radiation from at least a portion of said array of LEDs.

20. The method of claim 19, wherein each of said electrical interconnects has an average thickness greater than or equal to 300 nm.

21. The method of claim 19, wherein said step of providing an electronic device comprises assembling said LED array on said substrate using a dry transfer contact printing method.

22. An electronic device comprising:
a substrate; and
an array of light emitting diodes (LEDs) supported by said substrate, said array of LEDs comprising:
a plurality of printable LEDs, wherein each LED in said array of LEDs is a unitary structure having one or more lateral dimensions less than or equal to 1000 μm and a thickness dimension less than or equal to 50 μm, and wherein a spacing between adjacent LEDs in said array of LEDs is greater than or equal to 10 μm; and
a plurality of electrical interconnects, wherein each LED in said array of LEDs is positioned in electrical communication with at least two of said plurality of electrical interconnects, wherein each of said electrical interconnects physically connects two LEDs and is characterized by lateral dimensions and an average thickness such that the electrical interconnects act as a heat sink to provide dissipation of heat from said array of LEDs at a rate greater than or equal to 5 μJ s$^{-1}$ at room temperature.

23. A method of making an electronic device, the method comprising the steps of:
providing a substrate;
assembling a plurality of printable LEDs onto said substrate by transfer printing said printable LEDs onto a receiving surface of said substrate, thereby making an array of LEDs, wherein each LED is a unitary structure having one or more lateral dimensions less than or equal to 1000 μm and a thickness dimension less than or equal to 50 μm and wherein a spacing between adjacent LEDs in said array of LEDs is greater than or equal to 10 μm; and
providing a plurality of electrical interconnects to said array of LEDs, wherein each LED in said array of LEDs is positioned in electrical communication with two or more of said plurality of electrical interconnects, wherein each of said electrical interconnects physically connects two LEDs and is characterized by lateral dimensions and an average thickness, thereby making said electronic device such that the electrical interconnects act as a heat sink to provide dissipation of heat from said array of LEDs at a rate greater than or equal to 5 μJ s$^{-1}$ at room temperature.

24. A method of generating electromagnetic radiation, the method comprising the steps of:
providing an electronic device comprising:
a substrate; and
an array of light emitting diodes (LEDs) supported by said substrate, said array of LEDs comprising:
a plurality of printable LEDs, wherein each LED in said array of LEDs is a unitary structure having one or more lateral dimensions less than or equal to 1000 μm and a thickness dimension less than or equal to 50 μm, and wherein a spacing between adjacent LEDs in said array of LEDs is greater than or equal to 10 μm; and
a plurality of electrical interconnects, wherein each LED in said array of LEDs is positioned in electrical communication with at least two of said plurality of electrical interconnects, wherein each of said electrical interconnects physically connects two LEDs and is characterized by lateral dimensions and an average thickness such that the electrical interconnects act as a heat sink to provide dissipation of heat from said array of LEDs at a rate greater than or equal to 5 μJ s$^{-1}$ at room temperature; and
providing a voltage across two or more of said plurality of electrical interconnects, thereby generating electromagnetic radiation from at least a portion of said array of LEDs.

25. The electronic device of claim 1, the plurality of printable LEDs being an array thereof with a density of 81 to 100 LEDs mm$^{-2}$.

26. The electronic device of claim 1, each the plurality of electrical interconnects having a length greater than a separation distance between the two LEDs each electrical interconnect is connecting.

27. The electronic device of claim 26, at least some of the plurality of electrical interconnects having at least one orthogonal portion.

28. The electronic device of claim 1, each of the plurality of printable LEDs having electrical contacts at opposing corners thereof.

29. The electronic device of claim 1, further including a polymer encapsulating the printable LEDs except at the location of electrical contacts of the plurality of printable LEDs.

30. The electronic device of claim 29, the polymer including positively sloped sidewalls proximate the location of the electrical contacts.

31. The electronic device of claim 28, the electrical contacts having a width, at least at the location of the electrical contacts, greater than a width of the electrical contacts.

32. The electronic device of claim 1, an average thermal conductivity of each of the electrical interconnects being a factor of 0.44 to 1.54 of the average thermal conductivity of the plurality of printable LEDs.

33. The method of claim 15, the plurality of printable LEDs being assembled in an array thereof with a density of 81 to 100 LEDs mm$^{-2}$.

34. The method of claim 15, each the plurality of electrical interconnects having a length greater than a separation distance between the two LEDs each electrical interconnect is connecting.

35. The method of claim 34, at least some of the plurality of electrical interconnects having at least one orthogonal portion.

36. The method of claim 15, each of the plurality of printable LEDs having electrical contacts at opposing corners thereof.

37. The method of claim 15, further including forming a polymer encapsulating the printable LEDs except at the location of electrical contacts of the plurality of printable LEDs.

38. The method of claim 37, the polymer including positively sloped sidewalls proximate the location of the electrical contacts.

39. The method of claim 36, the electrical contacts having a width, at least at the location of the electrical contacts, greater than a width of the electrical contacts.

40. The method of claim 15, an average thermal conductivity of each of the electrical interconnects being a factor of 0.44 to 1.54 of the average thermal conductivity of the plurality of printable LEDs.

* * * * *